United States Patent
Tsuchimura et al.

(10) Patent No.: US 7,635,181 B2
(45) Date of Patent: Dec. 22, 2009

(54) INK FOR INK JET-RECORDING CURABLE THROUGH IRRADIATION WITH A RADIOACTIVE RAY AND METHOD FOR PREPARING LITHOGRAPHIC PRINTING PLATES USING THE SAME

(75) Inventors: Tomotaka Tsuchimura, Haibara-gun (JP); Kazuto Kunita, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 431 days.

(21) Appl. No.: 11/289,327

(22) Filed: Nov. 30, 2005

(65) Prior Publication Data
US 2006/0139425 A1    Jun. 29, 2006

(30) Foreign Application Priority Data
Dec. 3, 2004    (JP) .............................. 2004-351853

(51) Int. Cl.
*G01D 11/00*    (2006.01)
(52) U.S. Cl. ........................ 347/100; 347/95; 523/160
(58) Field of Classification Search ................. 347/100, 347/95, 96, 102, 101; 106/31.6, 31.27, 31.13; 523/160
See application file for complete search history.

(56) References Cited

U.S. PATENT DOCUMENTS

| | | | |
|---|---|---|---|
| 5,514,505 A * | 5/1996 | Limburg et al. ................ 430/41 |
| 6,045,607 A * | 4/2000 | Breton et al. ............. 106/31.29 |
| 6,110,987 A | 8/2000 | Kamata et al. |
| 2004/0106700 A1 | 6/2004 | Yamanouchi et al. |

FOREIGN PATENT DOCUMENTS

| | | |
|---|---|---|
| EP | 0 658 607 A1 | 6/1995 |
| EP | 0 724 197 A1 | 7/1996 |
| EP | 1 035 435 A2 | 9/2000 |
| EP | 1 072 956 A2 | 1/2001 |
| EP | 1 262 829 A1 | 12/2002 |
| JP | 8-202035 A | 8/1996 |
| JP | 2003-192943 | 7/2003 |
| JP | 2004-310000 A | 11/2004 |
| JP | 2005-62482 A | 3/2005 |
| WO | WO 2004/099272 A1 | 11/2004 |
| WO | WO 2004/104051 A1 | 12/2004 |

* cited by examiner

*Primary Examiner*—Manish S Shah
(74) *Attorney, Agent, or Firm*—Sughrue Mion, PLLC

(57) ABSTRACT

An ink jet-recording ink capable of being cured through the irradiation with a radioactive ray, in which the ink jet-recording ink includes a coloring material, a polymerizable compound and a polymerization initiator system, wherein the polymerization initiator system includes a polymerization initiator and at least one co-sensitizing agent selected from the group consisting of compounds represented by the foregoing general formulas (i) to (iv) and (vii) to (ix), as well as a method for preparing a lithographic printing plate includes the steps of (1) A step for injecting an ink jet-recording ink as set forth in claim 1 on the surface of the substrate; and (2) A step for curing the ink by the irradiation of the substrate carrying the injected ink thereon with a radioactive ray to thus form an image of cured ink on the substrate. The ink is highly sensitive to a radioactive ray, permits the formation of a high quality image and has excellent storage stability. In addition, the method permits the formation of a high quality image excellent in the printing durability.

18 Claims, No Drawings

INK FOR INK JET-RECORDING CURABLE THROUGH IRRADIATION WITH A RADIOACTIVE RAY AND METHOD FOR PREPARING LITHOGRAPHIC PRINTING PLATES USING THE SAME

BACKGROUND OF THE INVENTION

The present invention relates to an ink jet-recording ink as well as a method for making a lithographic printing plate which makes use of the ink jet-recording ink. More specifically, the present invention pertains to an ink for the ink jet-recording, which is highly susceptible to the irradiation with a radioactive ray, capable of forming an image of high quality and excellent in the storage stability and a method for preparing a lithographic printing plate, which never requires any developing treatment and which can form an image excellent in the printing durability and having high image quality.

There have been known, for instance, the electro-photography technique, the sublimation or melting type heat transfer printing technique and the ink jet-recording technique, as the image-recording techniques in which an image is formed on a substrate such as a sheet of paper on the basis of image data signals. Among them, the ink jet-recording technique comprises the step of injecting an ink only on the desired image areas of a substrate to thus directly form a desired image on the substrate and therefore, the technique permits the efficient use of such an ink. This technique is also excellent in that the structure thereof is very simple and that it only generates reduced noise.

There have been adopted, for instance, a method for drying an ink in the air to thus remove the solvent from the ink and a method which makes use of an ink curable through the irradiation with a radioactive ray such as ultraviolet light rays for the immobilization of the injected ink on the surface of a substrate, in the image-recording method according to such an ink jet-recording system. In particular, the ink jet-recording ink curable through the irradiation with a radioactive ray such as ultraviolet light rays (radiation-curable ink jet-recording ink) only gives out a slight smell and is excellent in quick-drying characteristics and thus permits the formation of an image even on a substrate which has a poor ink-absorbing ability, whose direct recording is in general quite difficult, without being accompanied by any bleeding, while holding excellent sensitivity and which permits the formation of an image excellent in the adhesion to the substrate. For instance, in the patent article 1 as will be specified later, there is provided an ink jet-recording ink having the following desired properties in addition to the foregoing: it has only a reduced stimulation and sensitization even when it is applied onto the skin and it is thus excellent in safety. When using such a radiation-curable ink jet-recording ink, the ink should satisfy the following requirements such that it must have a sufficiently high sensitivity to the a radioactive ray used and it can form a high quality image after curing the same. Such an ink would have a variety of advantages, for instance, it can ensure a sufficiently high curing ability, it can reduce the electric power consumption required for the source of a radioactive ray used for curing the same, it can extend the service life of the source of a radioactive ray through the reduction of the load applied thereto and it can prevent the generation of any low molecular weight substance due to the insufficient curing of the ink, insofar as the ink has a sufficiently high sensitivity to a radioactive ray. In particular, when this ink jet-recording ink is used for forming image areas of a lithographic printing plate for use in the offset printing, the improvement of the sensitivity of the ink would permit the considerable enhancement of the strength of an image after the curing thereof and the resulting lithographic printing plate would thus have high printing durability.

In general, methods, which make use of a variety of polymerization initiator systems, have been proposed as means for improving the sensitivity, to a radioactive ray, of a radiation-curable, polymerizable compound (see non-patent article 1 specified later). Generally used include, in particular, benzil, benzoin, benzoin ethyl ether, Michler's ketone, anthraquinone, acridine, phenazine, benzophenone, and 2-ethyl anthraquinone (see non-patent article 1). However, the use of these polymerization initiator systems would reduce the susceptibility, to curing, of the polymerizable compositions containing the systems such as ink jet-recording inks and this accordingly requires the use of a longer exposure time for forming an image. For this reason, in case of a fine image, any image of good quality cannot be reproduced when there is a slight vibration during image-forming operations and the radiant energy from the source thereof should considerably be increased and accordingly, one should devise any means for radiating or eliminating a large amount of heat proportional to the increase in the radiant energy. In addition, a problem also arises such that the film of the composition is liable to undergo deformation or any change in quality.

In addition, there has also been known such a method which comprises the use of a combination of a sensitizing dye and a polymerization initiator as the foregoing polymerization initiator system to thus improve the sensitivity of the foregoing composition through the interaction between these components. However, the use of such a polymerization initiator system would be attended by such a drawback that the image obtained by polymerizing the ink jet-recording ink containing the system has a reduced storage stability.

Patent Article 1: Japanese Un-Examined Patent Publication 2003-192943

Non-Patent Article 1: Bruce M. Monroe et al., Chemical Revue, 1993, 93: 435-448.

DISCLOSURE OF THE INVENTION

Accordingly, it is an object of the present invention to provide an ink jet-recording ink having high sensitivity even to a radioactive ray of a low output, capable of forming an image of high quality and excellent in the storage stability as well as an image-forming method which makes use of the foregoing ink.

It is another object of the present invention to provide a method for preparing a lithographic printing plate, which does not require any development treatment, can ensure high printing durability of the resulting printing plate and permits the formation of an image of high quality.

It is a further object of the present invention to provide an imagewise film having considerably high strength and prepared by polymerizing a polymerizable compound-containing ink through the irradiation thereof with a radioactive ray and to thus improve the printing durability, during printing operations, of a lithographic printing plate for the offset printing, which is obtained by the use of such an image.

The inventors of this invention have conducted various studies to solve the foregoing problems associated with the conventional techniques and as a result, the inventors have found that the use of a specific co-sensitizing agent in combination with a polymerization initiator would permit the formation of an ink jet-recording ink which is sensitive even to a radioactive ray of a low output, permits the formation of an image of high quality and is excellent in the storage stability. The inventors have further found that when applying the ink jet-recording ink to the preparation of a lithographic printing plate, the resulting lithographic printing plate satisfies requirements for various characteristics such as high printing durability, an ability of forming an image of high quality and excellent storage stability.

According to the present invention, there is thus provided an ink jet-recording ink capable of being cured through the irradiation with a radioactive ray, in which the ink jet-recording ink comprises a coloring material, a polymerizable compound and a polymerization initiator system, wherein the polymerization initiator system comprises a polymerization initiator and at least one co-sensitizing agent selected from the group consisting of compounds represented by the following general formulas (i) to (iv) and (vii) to (ix):

General Formula (i):

(i)

wherein $R_1$, $R_2$ and $R_3$ may be the same or different and each represents a monovalent organic group;

General Formula (ii):

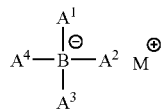
(ii)

wherein $A^1$ to $A^4$ each independently represents an aromatic group or a heterocyclic group and $M^+$ represents a monovalent cationic atom or atomic group;

General Formula (iii):

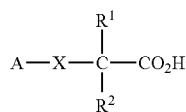
(iii)

wherein A represents a monovalent non-metallic atomic group, X represents a divalent connecting group selected from the group consisting of —O—, —S—, —SO$_2$—, —NH—, —N(R$^3$)—, —CO—, —CH$_2$—, —CH(R$^4$)— and —C(R$^4$)(R$^5$)—, wherein R$^3$, R$^4$ and R$^5$ each independently represents a hydrogen atom or a monovalent substituent and $R_1$ and $R_2$ each independently represents a hydrogen atom or a monovalent substituent;

General Formula (iv):

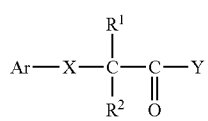
(iv)

wherein Ar represents an aromatic group or a heterocyclic group, X represents —O—, —S—, SO$_2$—, or —N(R$^3$)—, R$^1$, R$^2$ and R$^3$ each independently represents a hydrogen atom or a monovalent substituent comprising non-metallic atoms, and Y represents —OR$^4$ or —NR$^5$R$^6$, wherein R$^4$ represents a monovalent substituent comprising non-metallic atoms, other than a hydroxyl group, and R$^5$ and R$^6$ each independently represents a hydrogen atom or a monovalent substituent comprising non-metallic atoms;

General Formula (vii):

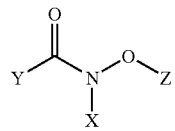
(vii)

wherein X, Y and Z each independently represents a monovalent substituent;

General Formula (viii):

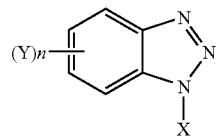
(viii)

wherein X and Y each independently represents a monovalent substituent, and n represents an integer ranging from 1 to 4, provided that, when n is not less than 2, a plurality of Ys present in the formula may be the same or different or may form a ring structure;

General Formula (ix):

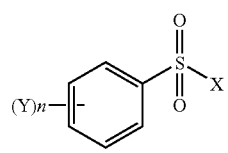
(ix)

wherein X and Y each independently represents a monovalent substituent, and n represents an integer ranging from 1 to 5, provided that, when n is not less than 2, a plurality of Ys present in the formula may be the same or different or may form a ring structure.

According to the present invention, there is also provided a method for preparing a lithographic printing plate which comprises a substrate and an image formed on the surface of the substrate and the method comprises the following steps:

(1) A step for injecting an ink jet-recording ink according to the present invention on the surface of the substrate; and (2) A step for curing the ink by the irradiation of the substrate carrying the injected ink thereon with a radioactive ray to thus form an image of cured ink on the substrate.

According to the present invention, there is also provided a method for forming an image on a substrate and the method comprises the following steps:

(a) A step for applying an ink jet-recording ink according to the present invention onto the surface of a substrate;

(b) A step for curing the ink jet-recording ink applied onto the substrate by the irradiation of the ink with a radioactive ray which have a peak wavelength ranging from 350 to 420 nm at an irradiation energy of not more than 2000 mJ/cm²; and (c) A step for forming a desired image of cured ink on the surface of the substrate.

According to the present invention, the incorporation, into a polymerizable compound, of a co-sensitizing agent represented by the general formula (i) to (iv) or (vii) to (ix) in combination with a polymerization initiator would permit the improvement of the storage stability of the polymerizable composition containing these components and an ink jet-recording ink which contains the polymerizable composition. The reason for this would be as follows: The co-sensitizing agent according to the present invention forms a complex with the polymerization initiator in the ink jet-recording ink containing the foregoing composition and when the ink jet-recording ink is applied onto a recording medium such as a sheet of paper and then cured, the polymerization initiator included in the ink is thermally stabilized and the ink is correspondingly thermally stabilized even when a recording medium to which the ink has been applied is stored.

The ink jet-recording ink according to the present invention is highly susceptible to the irradiation with a radioactive ray, permits the formation of high image quality, has excellent storage stability, and permits the formation of a lithographic printing plate, without using any developing treatment, which has high printing durability and carries a desired image having high quality.

According to the present invention, there can be provided an ink jet-recording ink which is highly susceptible to the irradiation with a radioactive ray, permits the formation of high image quality, has excellent storage stability, and has excellent storage stability. The present invention also provides a method for the preparation of a lithographic printing plate, without using any developing treatment, which has high printing durability and carries a desired image having high quality.

BEST MODE FOR CARRYING OUT THE INVENTION

As has been described above, the present invention relates to an ink jet-recording ink capable of being cured through the irradiation with a radioactive ray, in which the ink jet-recording ink comprises a coloring material, a polymerizable compound and a polymerization initiator system, wherein the polymerization initiator system comprises a polymerization initiator and at least one co-sensitizing agent selected from the group consisting of compounds represented by the following general formulas (i) to (iv) and (vii) to (ix). The present invention will hereunder be described in more detail.

(1) Polymerization Initiator System

The polymerization initiator system used in the present invention comprises at least one co-sensitizing agent selected from the group consisting of compounds represented by the following general formulas (i) to (iv) and (vii) to (ix), a polymerization initiator, an optional sensitizing dye and optional other additives.

The function of the present invention has not yet been clearly elucidated, but it would be recognized that at least one of the following effects (A) to (E) takes place if using at least one co-sensitizing agent selected from the group consisting of compounds represented by the following general formulas (i) to (iv) and (vii) to (ix), as a characteristic component of the present invention, in an ink jet-recording ink in combination with a polymerization initiator:

(A) When the foregoing ink jet-recording ink of the present invention is exposed to a radioactive ray, the co-sensitizing agent may undergo an interaction with the sensitizing dye to thus improve the rate of decomposition of the polymerization initiator;

(B) Polymerization-initiating radicals and/or polymerization-promoting radicals originated from the polymerization initiator may undergo radical chain-transfer to the co-sensitizing agent to promote or accelerate the polymerization reaction of the polymerizable compound and to thus form firm cured products (images) having a high curing density;

(C) The co-sensitizing agent never generates, in itself, any initiating radical under the stimuli of heat or light rays, but it shows (a) a function of increasing the decomposed amount of the polymerization initiator and/or (b) a function of improving the radical polymerization ability of the polymerization initiator by the use thereof in combination with the polymerization initiator;

(D) Excited species derived from the polymerization initiator form excitation complexes with the co-sensitizing agent and then the resulting complexes may induce electron-transfer to the polymerization initiator to thus accelerate the decomposition of the initiator through the irradiation with a radioactive ray; and (E) Excited species derived from the polymerization initiator are oxidatively or reductively added to the co-sensitizing agent to thus induce the generation of radicals. As a result, the polymerization reaction of the polymerizable compound would be initiated by the action of these radical species thus generated or highly active radical species generated through the further cleavage and/or decomposition of the former.

The reason why the co-sensitizing agent used in the invention may show various kinds of effects such as the improvement of the sensitivity of the ink jet-recording ink according to the present invention due to either of the foregoing functions (A) to (E) has not yet been clearly elucidated. However, at least the use of a co-sensitizing agent in combination with the polymerization initiator according to the present invention would permit the improvement of the polymerization ability of the polymerizable compound upon the polymerization thereof by the irradiation with a radioactive ray and likewise permit the impartment of stability to the resulting cured product obtained through the curing of the polymerizable compound in such a manner that the cured product never undergoes any deterioration even under the influence of light rays or heat.

(1-1) Co-Sensitizing Agent

The co-sensitizing agent used in the present invention is at least one compound selected from those represented by the following general formulas (i) to (iv) and (vii) to (ix):

General Formula (i):

$(R_1)(R_2)C=N-O-R_3$       (i)

In Formula (i), $R_1$, $R_2$ and $R_3$ may be the same or different and each represents a monovalent organic group.

In the general formula (i), $R_1$ and $R_2$, which may be the same or different, each more preferably represents a hydrogen atom, a halogen atom, a hydrocarbon group which may contain a substituent and may have an unsaturated bond, a heterocyclic group, a hydroxyl group, a substituted oxy group, a mercapto group, a substituted thio group, an amino group, a substituted amino group, a substituted carbonyl group, a carboxylate group, a sulfo group, a sulfonate group, a substituted sulfinyl group, a substituted sulfonyl group, a phosphono group, a substituted phosphono group, a phosphonate group, a substituted phosphonate group, a cyano group or a nitro group, and $R_1$ and $R_2$ may be combined with each other to form a ring.

$R_3$ represents a hydrocarbon group which may have a substituent and may contain an unsaturated bond, or a heterocyclic group, and $R_3$ and $R_2$ may be combined with each other to form a ring. then examples of $R_1$, $R_2$ and $R_3$ in the general formula (i) will be described below. The hydrocarbon group which may have a substituent and may contain an unsaturated bond includes, for instance, an alkyl group, a substituted alkyl group, an aryl group, a substituted aryl group, an alkenyl group, a substituted alkenyl group, an alkynyl group and a substituted alkynyl group.

The alkyl group includes, for instance, a linear, branched or cyclic alkyl group having from 1 to 20 carbon atoms and specific examples thereof include a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eicosyl group, an isopropyl group, an isobutyl group, an s-butyl group, a t-butyl group, an isopentyl group, a neopentyl group, a 1-methylbutyl group, an isohexyl group, a 2-ethylhexyl group, a 2-methylhexyl group, a cyclohexyl group, a cyclopentyl group and a 2-norbornyl group. Among these, preferred are a linear alkyl group having from 1 to 12 carbon atoms, a branched alkyl group having from 3 to 12 carbon atoms and a cyclic alkyl group having from 5 to 10 carbon atoms.

The substituted alkyl group is constructed by bonding a substituent to an alkylene group and the substituent for the substituted alkyl group is a monovalent nonmetallic atomic group exclusive of hydrogen. Preferred examples of the substituent include a halogen atom (e.g., —F, —Br, —Cl, —I), a hydroxyl group, an alkoxy group, an aryloxy group, a mercapto group, an alkylthio group, an arylthio group, an alkyldithio group, an aryldithio group, an amino group, an N-alkylamino group, an N,N-dialkylamino group, an N-arylamino group, an N,N-di-arylamino group, an N-alkyl-N-arylamino group, an acyloxy group, a carbamoyloxy group, an N-alkyl-carbamoyloxy group, an N-aryl-carbamoyloxy group, an N,N-dialkyl-carbamoyloxy group, an N,N-diaryl-carbamoyloxy group, an N-alkyl-N-aryl-carbamoyloxy group, an alkylsulfoxy group, an arylsulfoxy group, an acylthio group, an acylamino group, an N-alkyl-acylamino group, an N-aryl-acylamino group, a ureido group, an N'-alkylureido group, an N',N'-di-alkylureido group, an N'-arylureido group, an N',N'-di-arylureido group, an N'-alkyl-N'-arylureido group, an N-alkylureido group, an N'-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkyl-ureido group, an N',N'-diaryl-N-arylureido group, an N'-alkyl-N'-aryl-N-alkylureido group, an N'-alkyl-N'-aryl-N-arylureido group, an alkoxy-carbonylamino group, an aryloxy-carbonylamino group, an N-alkyl-N-alkoxy-carbonylamino group, an N-alkyl-N-aryloxy-carbonylamino group, an N-aryl-N-alkoxy-carbonylamino group, an N-aryl-N-aryloxy-carbonylamino group, a formyl group, an acyl group, a carboxyl group and a conjugated base group thereof (hereinafter referred to as "carboxylate"), an alkoxy-carbonyl group, an aryloxycarbonyl group, a carbamoyl group, an N-alkyl-carbamoyl group, an N,N-dialkyl-carbamoyl group, an N-aryl-carbamoyl group, an N,N-diaryl-carbamoyl group, an N-alkyl-N-aryl-carbamoyl group, an alkyl-sulfinyl group, an aryl-sulfinyl group, an alkylsulfonyl group, an arylsulfonyl group, a sulfo group (—SO$_3$H) and a conjugated base group thereof (hereinafter referred to as "sulfonate group"), an alkoxy-sulfonyl group, an aryloxy-sulfonyl group, a sulfinamoyl group, an N-alkyl-sulfinamoyl group, an N,N-dialkyl-sulfinamoyl group, an N-aryl-sulfinamoyl group, an N,N-diaryl-sulfinamoyl group, an N-alkyl-N-aryl-sulfinamoyl group, a sulfamoyl group, an N-alkyl-sulfamoyl group, an N,N-dialkyl-sulfamoyl group, an N-aryl-sulfamoyl group, an N,N-diaryl-sulfamoyl group, an N alkyl-N-aryl-sulfamoyl group, an N-acyl-sulfamoyl group and a conjugated base group thereof, an N-alkylsulfonyl-sulfamoyl group (—SO$_2$NHSO$_2$(alkyl)) and a conjugated base group thereof, an N-allylsulfonyl-sulfamoyl group (—SO$_2$NHSO$_2$(allyl)) and a conjugated base group thereof, an N-alkylsulfonyl-carbamoyl group (—CONHSO$_2$(alkyl)) and a conjugated base group thereof, an N-allylsulfonyl-carbamoyl group (—CONHSO$_2$(allyl)) and a conjugated base group thereof, an alkoxysilyl group (—Si(O-alkyl)$_3$), an allyloxy-silyl group (—Si(O-allyl)$_3$), a hydroxy-silyl group (—Si(OH)$_3$) and a conjugated base group thereof, a phosphono group (—PO$_3$H$_2$) and a conjugated base group thereof (hereinafter referred to as "phosphonate group"), a dialkyl-phosphono group (—PO$_3$(alkyl)$_2$), a diaryl-phosphono group (—PO$_3$(aryl)$_2$), an alkylaryl-phosphono group (—PO$_3$(alkyl)(aryl)), a monoalkyl-phosphono group (—PO$_3$H(alkyl)) and a conjugated base group thereof (hereinafter referred to as "alkyl phosphonate group"), a monoaryl-phosphono group (—PO$_3$H(aryl)) and a conjugated base group thereof (hereinafter referred to as "aryl phosphonate group"), a phosphono-oxy group (—OPO$_3$H$_2$) and a conjugated base group thereof (hereinafter referred to as "phosphonate oxy group"), a dialkyl-phosphono-oxy group (—OPO$_3$H(alkyl)$_2$), a diaryl-phosphono-oxy group (—OPO$_3$(aryl)$_2$), an alkyl-aryl-phosphono-oxy group (—OPO$_3$(alkyl)(aryl)), a monoalkyl-phosphono-oxy group (—OPO$_3$H(alkyl)) and a conjugated base group thereof (hereinafter referred to as "alkyl phosphonate oxy group"), a monoaryl-phosphono-oxy group (—OPO$_3$H(aryl)) and a conjugated base group thereof (hereinafter referred to as "aryl phosphonate oxy group"), a cyano group, a nitro group, an aryl group, an alkenyl group and an alkynyl group. Specific examples of the alkyl group in these substituents include the above-described alkyl groups and specific examples of the aryl group include a phenyl group, a biphenyl group, a naphthyl group, a tolyl group, a xylyl group, a mesityl group, a cumenyl group, a fluorophenyl group, a chloro-phenyl group, a bromophenyl group, a chloromethyl-phenyl group, a hydroxyphenyl group, a methoxyphenyl group, an ethoxy-phenyl group, a phenoxy-phenyl group, an acetoxy-phenyl group, a benzoyloxy-phenyl group, a methylthio-phenyl group, a phenylthio-phenyl group, a methyl-aminophenyl group, a dimethyl-aminophenyl group, an acetyl-aminophenyl group, a carboxyphenyl group, a methoxy-carbonyl-phenyl group, an ethoxy-carbonylphenyl group, a phenoxy-carbonylphenyl group, an N-phenyl-carbamoyl-phenyl group, a phenyl group, a nitrophenyl group, a cyanophenyl group, a sulfophenyl group, a sulfonate phenyl group, a phosphono-phenyl group and a phosphonate phenyl group. Examples of the alkenyl group include a vinyl group, a 1-propenyl group, a 1-butenyl group, a cinnamyl group and a 2-chloro-1-ethenyl group and examples of the alkynyl group include an ethynyl group, a 1-propynyl group, a 1-butynyl group, a trimethyl-silyl-ethynyl group and a phenyl-ethynyl group.

The acyl group ($R_4CO$—) includes those in which $R_4$ is a hydrogen atom or the above-described alkyl, aryl, alkenyl or alkynyl group. The alkylene group in the substituted alkyl group includes a divalent organic residue formed through the elimination of any one of hydrogen atoms on the above-described alkyl group having from 1 to 20 carbon atoms and preferred are a linear alkylene group having from 1 to 12 carbon atoms, a branched alkylene group having from 3 to 12 carbon atoms and a cyclic alkylene group having from 5 to 10 carbon atoms. Specific preferred examples of the substituted alkyl group include a chloromethyl group, a bromo-methyl group, a 2-chloroethyl group, a trifluoromethyl group, a methoxy-methyl group, a methoxy-ethoxyethyl group, an allyloxy-methyl group, a phenoxy-methyl group, a methylthio-methyl group, a tolylthio-methyl group, an ethylamino-ethyl group, a diethyl-aminopropyl group, a morpholino-propyl group, an acetyl-oxy-methyl group, a benzoyloxy-methyl group, an N-cyclohexyl-carbamoyl-oxyethyl group, an N-phenyl-carbamoyloxy-ethyl group, an acetyl-aminoethyl group, an N-methylbenzoyl-aminopropyl group, a 2-oxoethyl group, a 2-oxopropyl group, a carboxypropyl group, a methoxycarbonyl-ethyl group, a methoxycarbonyl-methyl group, a methoxycarbonyl-butyl group, an ethoxycarbonyl-methyl group, a butoxy-carbonylmethyl group, an allyloxy-carbonylmethyl group, a benzyloxy-carbonyl-methyl group, a methoxycarbonyl-phenylmethyl group, a trichloromethyl-carbonyl methyl group, an allyloxy-carbonyl-butyl group, a chlorophenoxy-carbonylmethyl group, a carbamoyl-methyl group, an N-methyl-carbamoyl-ethyl group, an N,N-di-propyl-carbamoylmethyl group, an N-(methoxyphenyl)carbamoylethyl group, an N-methyl-N-(sulfophenyl)carbamoylmethyl group, a sulfopropyl group, a sulfobutyl group, a sulfonate butyl group, a sulfamoyl-butyl group, an N-ethyl-sulfamoyl-methyl group, an N,N-dipropyl-sulfamoylpropyl group, an N-tolyl-sulfamoyl-propyl group, an N-methyl-N-(phosphono-phenyl)sulfamoyl-octyl group,

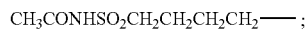

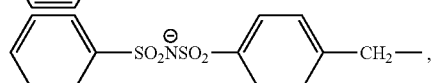

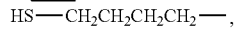

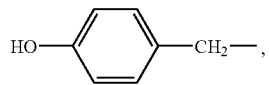

a phosphono-butyl group, a phosphonate hexyl group, a diethyl-phosphono-butyl group, a diphenyl-phosphono-propyl group, a methyl-phosphono-butyl group, a methyl phosphonate butyl group, a tolyl-phosphono-hexyl group, a tolyl phosphonate hexyl group, a phosphono-oxypropyl group, a phosphonate oxybutyl group, a benzyl group, a phenethyl group, an α-methyl-benzyl group, a 1-methyl-1-phenylethyl group, a p-methylbenzyl group, a cinnamyl group, an allyl group, a 1-propenyl-methyl group, a 2-butenyl group, a 2-methylallyl group, a 2-methyl-propenyl-methyl group, a 2-propynyl group, a 2-butynyl group and a 3-butynyl group.

The aryl group includes a condensed ring formed from 1 to 3 benzene rings and a condensed ring formed from a benzene ring and a 5-membered unsaturated ring and specific examples thereof include a phenyl group, a naphthyl group, an anthryl group, a phenanthryl group, an indenyl group, an acenaphthenyl group and a fluorenyl group, with the phenyl group and the naphthyl group being preferred.

The substituted aryl group is constructed by bonding a substituent to an aryl group and includes those having a monovalent nonmetallic atomic group exclusive of hydrogen atom as a substituent on the ring-forming carbon atoms of the foregoing aryl group. Preferred examples of the substituent include the above-described alkyl groups, substituted alkyl groups and the foregoing substituents listed above as those for the substituted alkyl group. Specific examples of the substituted aryl group preferably include a biphenyl group, a tolyl group, a xylyl group, a mesityl group, a cumenyl group, a chlorophenyl group, a bromophenyl group, a fluorophenyl group, a chloromethyl-phenyl group, a trifluoromethyl-phenyl group, a hydroxy-phenyl group, a methoxyphenyl group, a methoxy-ethoxyphenyl group, an allyloxy-phenyl group, a phenoxy-phenyl group, a methyl-thiophenyl group, a tolylthio-phenyl group, a phenylthio-phenyl group, an ethylamino-phenyl group, a di-ethyl-aminophenyl group, a morpholino-phenyl group, an acetyloxy-phenyl group, a benzoyloxy-phenyl group, an N-cyclohexyl-carbamoyloxy-phenyl group, an N-phenyl-carbamoyloxy-phenyl group, an acetylamino-phenyl group, an N-methyl-benzoyl-aminophenyl group, a carboxyphenyl group, a methoxycarbonyl-phenyl group, an allyloxy-carbonylphenyl group, a chlorophenoxy-carbonylphenyl group, a carbamoyl-phenyl group, an N-methyl-carbamoylphenyl group, an N,N-dipropyl-carbamoylphenyl group, an N-(methoxyphenyl)carbamoylphenyl group, an N-methyl-N-(sulfophenyl)carbamoylphenyl group, a sulfophenyl group, a sulfonate phenyl group, a sulfamoylphenyl group, an N-ethyl-sulfamoylphenyl group, an N,N-dipropyl-sulfamoylphenyl group, an N-tolyl-sulfamoylphenyl group, an N-methyl-N-(phosphono-phenyl)sulfamoylphenyl group, a phosphonophenyl group, a phosphonate phenyl group, a diethyl-phosphonophenyl group, a diphenyl-phosphonophenyl group, a methyl-phosphonophenyl group, a methyl phosphonate phenyl group, a tolyl-phosphonophenyl group, a tolyl phosphonate phenyl group, an allyl group, a 1-propenylmethyl group, 2-butenyl group, a 2-methylallylphenyl group, a 2-methylpropenylphenyl group, a 2-propynylphenyl group, a 2-butynyl-phenyl group and a 3-butynylphenyl group.

The alkenyl group may be those described above. The substituted alkenyl group is constructed by substituting a substituent for a hydrogen atom present on an alkenyl group. Examples of the substituent include those listed above in connection with the substituted alkyl group and the alkenyl group may be those listed above. Preferred examples of the substituted alkenyl group include those listed below:

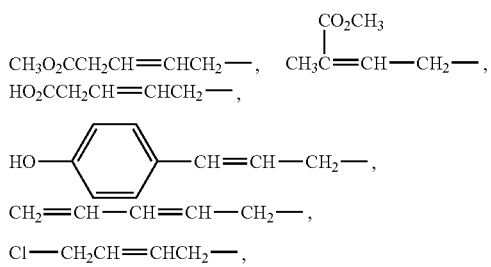

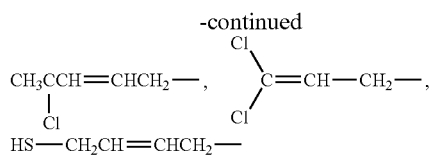

The alkynyl group may be those described above. The substituted alkynyl group is constructed by substituting a substituent for a hydrogen atom present on an alkynyl group. Examples of the substituent include those listed above in connection with the substituted alkyl group. On the other hand, the alkynyl group usable herein may be those described above.

The heterocyclic group herein used means a monovalent group formed through the elimination of a hydrogen atom present on a heterocyclic ring and a monovalent group (substituted heterocyclic group) obtained by further replacing a substituent such as those described above in connection with the substituted alkyl group for a hydrogen atom present on the foregoing monovalent heterocyclic group. Preferred examples of the heterocyclic ring include:

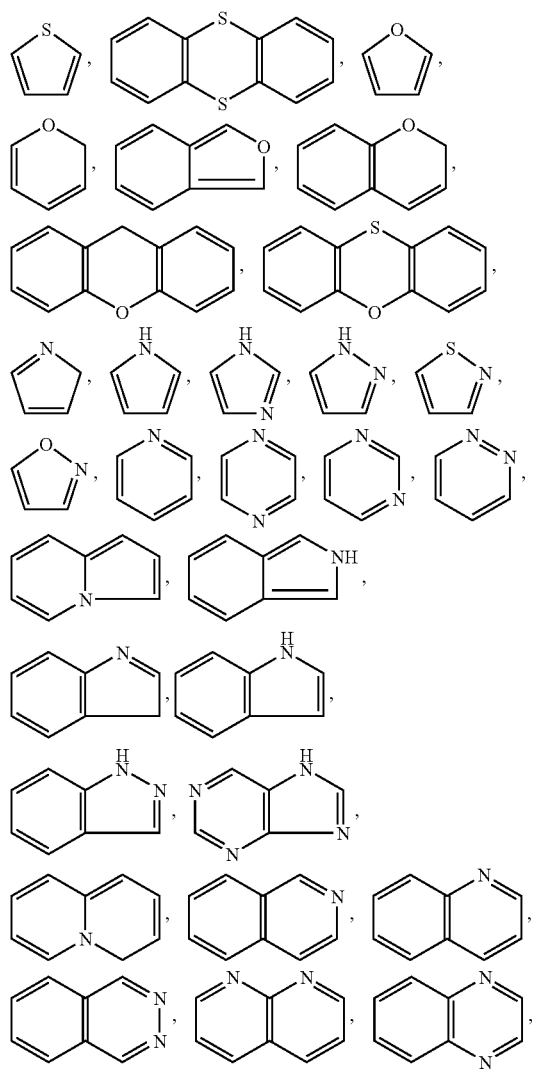

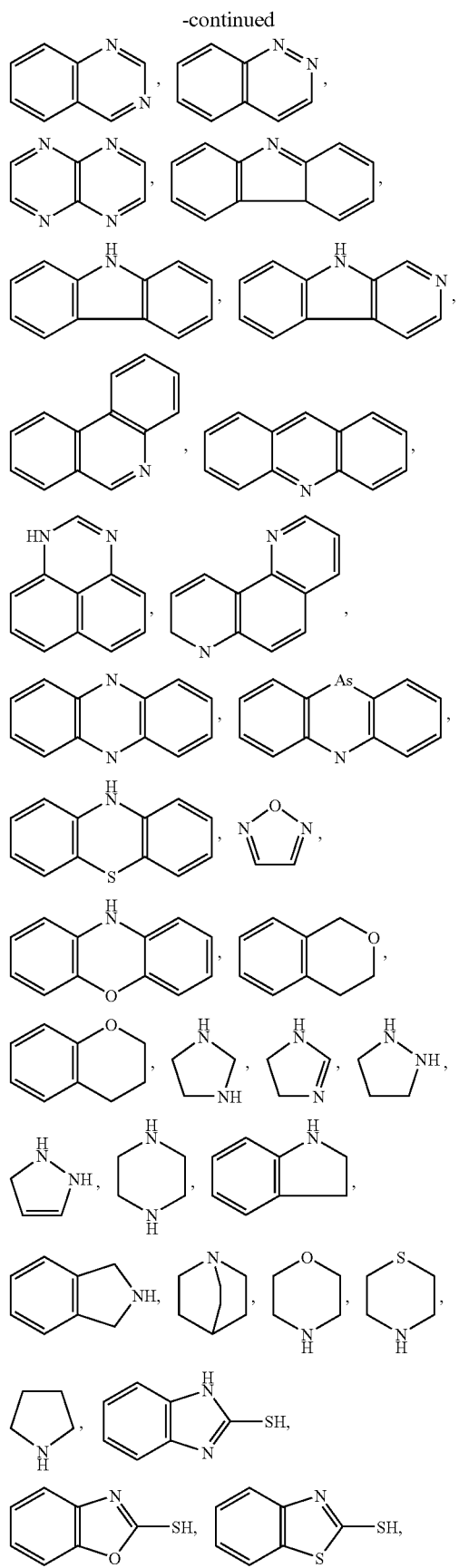

-continued

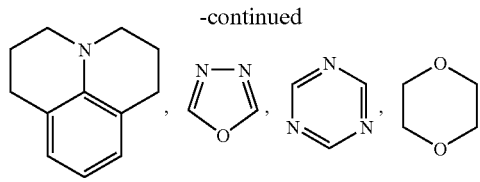

The substituted oxy group (R₅O—) includes those in which R₅ is a monovalent nonmetallic atomic group exclusive of hydrogen atom. Preferred examples thereof include an alkoxy group, an aryloxy group, an acyloxy group, a carbamoyloxy group, an N-alkyl-carbamoyloxy group, an N-aryl-carbamoyloxy group, an N,N-dialkyl-carbamoyloxy group, an N,N-diaryl-carbamoyloxy group, an N-alkyl-N-aryl-carbamoyloxy group, an alkylsulfoxy group, an arylsulfoxy group, a phosphono-oxy group and a phosphonate oxy group. The alkyl groups and the aryl groups present in these groups include, for instance, the foregoing alkyl groups and the substituted alkyl groups and the aryl groups and the substituted aryl groups, described above, respectively. The acyl group (R₆O—) present in the acyloxy group includes those in which R₆ is the above-described alkyl group, substituted alkyl group, aryl group or substituted aryl group. Among these substituents, more preferred are an alkoxy group, an aryloxy group, an acyloxy group and an arylsulfoxy group. Specific examples of the substituted oxy group preferably include a methoxy group, an ethoxy group, a propyloxy group, an isopropyloxy group, a butyloxy group, a pentyloxy group, a hexyloxy group, a dodecyloxy group, a benzyloxy group, an allyloxy group, a phenethyloxy group, a carboxy-ethyloxy group, a methoxy-carbonyl-ethyloxy group, an ethoxycarbonyl-ethyloxy group, a methoxyethoxy group, a phenoxy-ethoxy group, a methoxyethoxy-ethoxy group, an ethoxy-ethoxyethoxy group, a morpholino-ethoxy group, a morpholino-propyloxy group, an allyloxy-ethoxyethoxy group, a phenoxy group, a tolyloxy group, a xylyl-oxy group, a mesityl-oxy group, a cumenyl-oxy group, a methoxy-phenyloxy group, an ethoxy-phenyloxy group, a chloro-phenyloxy group, a bromo-phenyloxy group, an acetyloxy group, a benzoyloxy group, a naphthyl-oxy group, a phenyl-sulfonyloxy group, a phosphono-oxy group and a phosphonate oxy group.

The substituted thio group (R₇S—) includes those wherein R₇ is a monovalent nonmetallic atomic group exclusive of hydrogen atom. Preferred examples thereof include an alkylthio group, an arylthio group, an alkyldithio group, an aryldithio group and an acylthio group. The alkyl groups or the aryl groups present in these groups include the alkyl group and the substituted alkyl group and the aryl group and the substituted aryl group, described above, respectively. The substituent R₆ of the acyl group (R₆ CO—) in the acylthio group has the same meaning as defined above. Among these, an alkylthio group and an arylthio group are more preferred. Specific examples of the substituted thio group preferably include a methylthio group, an ethylthio group, a phenylthio group, an ethoxy-ethylthio group, a carboxy-ethylthio group and a methoxycarbonyl-thio group.

The substituted amino group (R₈NH—, (R₉)(R₁₀)N—) include those wherein R₈, R₉ and R₁₀ each represents a monovalent nonmetallic atomic group exclusive of hydrogen atom. Preferred examples of the substituted amino group include an N-alkylamino group, an N,N-dialkylamino group, an N-arylamino group, an N,N-di-arylamino group, an N-alkyl-N-arylamino group, an acylamino group, an N-alkyl-acylamino group, an N-aryl-acylamino group, a ureido group, an N'-alkylureido group, an N',N'-dialkyl-ureido group, an N'-arylureido group, an N',N'-diaryl-ureido group, an N'-alkyl-N'-arylureido group, an N-alkylureido group, an N-arylureido group, an N'-alkyl-N-alkylureido group, an N'-aryl-N-alkylureido group, an N',N'-di-alkyl-N-alkylureido group, an N',N'-dialkyl-N-arylureido group, an N'-aryl-N-alkyl-ureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxy-carbonylamino group, an aryloxy-carbonylamino group, an N-alkyl-N-alkoxy-carbonylamino group, an N-alkyl-N-aryloxy-carbonylamino group, an N-aryl-N-alkoxy-carbonylamino group and an N-aryl-N-aryloxy-carbonylamino group. The alkyl groups and the aryl groups present in these groups include the alkyl group and the substituted alkyl group and the aryl group and the substituted aryl group, described above, respectively, and R₆ of the acyl group (R₆CO—) in the acylamino group, the N-alkyl-acylamino group and the N-arylacyl-amino group has the same meaning as defined above. Among these groups, more preferred are an N-alkylamino group, an N,N-dialkylamino group, an N-arylamino group and an acylamino group. Specific examples of the substituted amino group preferably include a methylamino group, an ethylamino group, a diethylamino group, a morpholino group, a piperidino group, a pyrrolidino group, a phenylamino group, a benzoylamino group and an acetylamino group.

The substituted carbonyl group (R₁₁—CO—) includes those wherein R₁₁ is a monovalent nonmetallic atomic group. Preferred examples thereof include a formyl group, an acyl group, a carboxyl group, an alkoxycarbonyl group, an aryloxy-carbonyl group, a carbamoyl group, an N-alkyl-carbamoyl group, an N,N-dialkyl-carbamoyl group, an N-aryl-carbamoyl group, an N,N-diaryl-carbamoyl group and an N-alkyl-N-aryl-carbamoyl group. The alkyl groups and the aryl groups present in these groups include the alkyl group and the substituted alkyl group and the aryl group and the substituted aryl group, described above, respectively. Among these, more preferably used herein are a formyl group, an acyl group, a carboxyl group, an alkoxycarbonyl group, an aryloxycarbonyl group, a carbamoyl group, an N-alkyl-carbamoyl group, an N,N-dialkyl-carbamoyl group or an N-aryl-carbamoyl group, still more preferred are a formyl group, an acyl group, an alkoxycarbonyl group and an aryloxycarbonyl group. Specific examples of preferred substituents include a formyl group, an acetyl group, a benzoyl group, a carboxyl group, a methoxy-carbonyl group, an allyloxy-carbonyl group, an N-methyl-carbamoyl group, an N-phenyl-carbamoyl group, an N,N-diethyl-carbamoyl group and a morpholino-carbonyl group.

The substituted sulfinyl group (R₁₂—SO—) includes those wherein R₁₂ is a monovalent nonmetallic atomic group. Preferred examples thereof include an alkylsulfinyl group, an arylsulfinyl group, a sulfinamoyl group, an N-alkyl-sulfinamoyl group, an N,N-dialkyl-sulfinamoyl group, an N-aryl-sulfinamoyl group, an N,N-diaryl-sulfinamoyl group and an N-alkyl-N-aryl-sulfinamoyl group. The alkyl groups and the aryl groups present in these groups include the alkyl group and the substituted alkyl group and the aryl group and the substituted aryl group, described above, respectively. Among these, more preferably used herein are an alkylsulfinyl group and an arylsulfinyl group. Specific examples of the substituted sulfinyl group include a hexyl-sulfinyl group, a benzyl-sulfinyl group and a tolyl-sulfinyl group.

The substituted sulfonyl group ($R_{13}$—$SO_2$—) includes those in which $R_{13}$ is a monovalent nonmetallic atomic group. More preferred examples thereof include an alkylsulfonyl group and an arylsulfonyl group. The alkyl group and the aryl group present in these groups include the alkyl group and the substituted alkyl group and the aryl group and the substituted aryl group, listed above, respectively. Specific examples of the substituted sulfonyl group include a butyl-sulfonyl group and a chlorophenyl-sulfonyl group.

The sulfonate group (—$SO_3^-$) herein used means an anionic conjugate base group of a sulfo group (—$SO_3H$) as has been described above and it is usually used preferably in combination with a counter cation. The counter cation includes commonly known ones and, more specifically, various oniums (e.g., ammoniums, sulfoniums, phosphoniums, iodoniums, aziniums) and metal ions (e.g., $Na^+$, $K^+$, $Ca^{2+}$, $Zn^{2+}$).

The carboxylate group (—$CO_2^-$) means an anionic conjugate base group of a carboxyl group (—$CO_2H$) as has been descried above and it is usually used preferably in combination with a counter cation. The counter cation includes commonly known ones and, more specifically, various oniums (e.g., ammoniums, sulfoniums, phosphoniums, iodoniums, aziniums) and metal ions (e.g., $Na^+$, $K^+$, $Ca^{2+}$, $Zn^{2+}$).

The substituted phosphono group means a group obtained by substituting other organic oxo groups for one or two hydroxyl groups on the phosphono group and preferred examples thereof include a dialkyl-phosphono group, a diaryl-phosphono group, an alkylaryl-phosphono group, a monoalkyl-phosphono group and a monoaryl-phosphono group already described above. Among these, preferred are a dialkyl-phosphono group and a diaryl-phosphono group. Specific examples thereof include a diethyl-phosphono group, a dibutyl-phosphono group and a diphenyl-phosphono group.

The phosphonato group (—$PO_3^{2-}$—, $PO_3H^-$) means an anionic conjugated base group derived from the primary acid-dissociation or the secondary acid-dissociation of a phosphono group (—$PO_3H_2$). It is usually used preferably in combination with a counter cation. The counter cation includes commonly known ones and, more specifically, various kinds of oniums (e.g., ammoniums, sulfoniums, phosphoniums, iodoniums, aziniums) and metal ions (e.g., $Na^+$, $K^+$, $Ca^{2+}$, $Zn^{2+}$).

The substituted phosphonate group herein used means an anionic conjugated base group of the above-described substituted phosphono group wherein one of the hydroxyl groups present therein is replaced with an organic oxo group. Specific examples thereof include conjugated bases of the foregoing monoalkyl-phosphono groups (—$PO_3H(alkyl)$) and monoaryl-phosphono groups (—$PO_3H(aryl)$). Preferably, the conjugated base is usually used in combination with a counter cation. The counter cation includes commonly known ones and, more specifically, various oniums (e.g., ammoniums, sulfoniums, phosphoniums, iodoniums, aziniums) and metal ions (e.g., $Na^+$, $K^+$, $Ca^{2+}$, $Zn^{2+}$).

Examples in which $R^1$ and $R^2$ or $R^2$ and $R^3$ are linked together to form a ring will be described below. The aliphatic ring formed by combining $R^1$ and $R^2$ or $R^2$ and $R^3$ with each other includes a 5-, 6-, 7- or 8-membered aliphatic ring and more preferably a 5- or 6-membered aliphatic ring. The aliphatic ring may further have a substituent on the carbon atoms constituting the ring (examples of the substituent include those already described above in connection with the substi tuted alkyl group) or a part of the ring-constituting carbons may be substituted with a hetero atom (e.g., oxygen atom, sulfur atom, nitrogen atom). Further, a part of the aliphatic ring may constitute a part of an aromatic ring.

The oxime ether compound is more preferably an α-substituted ketoxime ether compound represented by the following general formula (i-1):

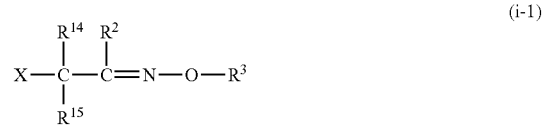

Wherein $R^2$ and $R^3$ may be the same or different and each represents a hydrocarbon group which may have a substituent and may contain an unsaturated bond, or a heterocyclic group or $R^2$ and $R^3$ may be combined with each other to form a ring; $R^{14}$ and $R^{15}$ may be the same or different and each represents a hydrogen atom, a hydrocarbon group which may have a substituent and may contain an unsaturated bond, a heterocyclic group, a hydroxyl group, a substituted oxy group, a mercapto group, a substituted thio group, an amino group or a substituted amino group or $R^{14}$ and $R^{15}$ may be combined with each other to form a ring and represent an alkylene group having 2 to 8 carbon atoms which may contain the following group in the main chain thereof:

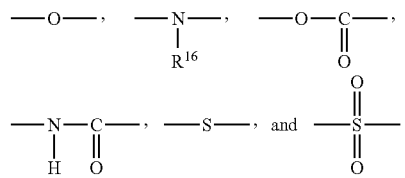

$R^{16}$ represents a hydrogen atom, a hydrocarbon group which may have a substituent and may contain an unsaturated bond, or a substituted carbonyl group; and X represents a hydrogen atom, a halogen atom, a hydrocarbon group which may have a substituent and may contain an unsaturated bond, a hydroxyl group, a substituted oxy group, a mercapto group, a substituted thio group, an amino group, a substituted amino group, a substituted carbonyl group, a carboxylate group, a sulfo group, a sulfonate group, a substituted sulfinyl group, a substituted sulfonyl group, a phosphono group, a substituted phosphono group, a phosphonate group, a substituted phosphonate group, a cyano group or a nitro group.

The oxime ether compound is more preferably an α-amino-ketoxime ether compound represented by the following general formula (i-2):

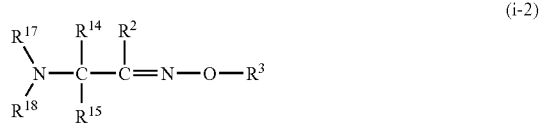

wherein each of $R^2$, $R^3$, $R^{14}$ and $R^{15}$ may have the same meaning as defined above; $R^{17}$ and $R^{18}$ may be the same or different and each represents a hydrogen atom or a hydrocarbon group which may have a substituent and may contain an unsaturated bond or $R^{17}$ and $R^{18}$ may be combined with each other to form a ring and represent an alkylene group having 2 to 8 carbon atoms which may contain the following group in the main chain thereof:

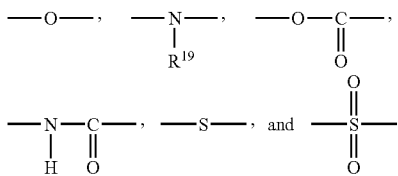

$R^{19}$ represents a hydrogen atom, a hydrocarbon group which may have a substituent and may contain an unsaturated bond, or a substituted carbonyl group. The above-described ketoxime ether compound is most preferably an α-aminoketoxime ether compound represented by the following general formula (i-3):

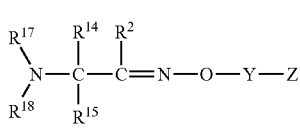

(i-3)

wherein each of $R^2$, $R^{14}$, $R^{15}$, $R^{17}$ and $R^{18}$ may have the same meaning as defined above; Y represents a hydrocarbon linking group which may have a substituent and may contain an unsaturated bond (a divalent group formed by the elimination of one hydrogen atom from the hydrocarbon group); Z represents an acid group having a pKa for the first acid-dissociation of not less than 0 and not more than 16, a precursor thereof, a conjugated base group thereof or a group formed by replacing the dissociable hydrogen atom of the acid group with a hydrocarbon group which may have a substituent (hereunder referred to as "substituted acid group").

Among these, particularly preferred examples of the acid group, the precursor thereof, the conjugated base group thereof and the substituted acid group include those listed above such as a hydroxyl group, a substituted oxy group, a mercapto group, a substituted carbonyl group, a carboxylate group, a sulfo group, a sulfonate group, a sulfamoyl group and a conjugated base group thereof, an N-alkyl-sulfamoyl group and a conjugated base group thereof, an N-aryl-sulfamoyl group and a conjugated base group thereof, an N-acyl-sulfamoyl group and a conjugated base group thereof, an N-alkyl-sulfonyl-sulfamoyl group and a conjugated base group thereof, an N-arylsulfonyl-sulfamoyl group and a conjugated base group thereof, an N-alkylsulfonyl-carbamoyl group and a conjugated base group thereof, an N-arylsulfonyl-carbamoyl group and a conjugated base group thereof, a phosphono group, a substituted phosphono group, a phosphonate group, a substituted phosphonate group, a cyano group, an alkoxysilyl group, an aryloxysilyl group, and a hydroxy-silyl group and a conjugated base group thereof.

Examples of the compounds are set froth below, but the present invention is by no means limited thereto. Specific examples of the ketoxime ether compound represented by Formula (i-1) preferably include those listed below:

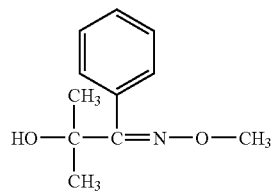

Compound II-1

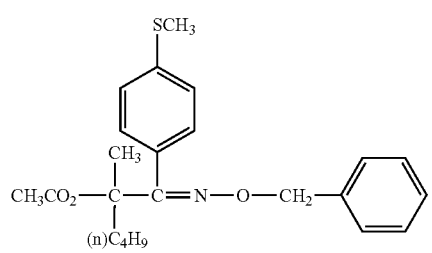

II-2

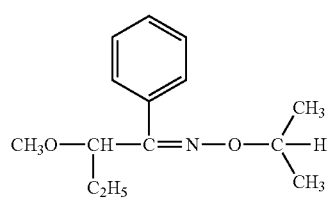

II-3

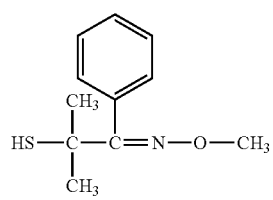

II-4

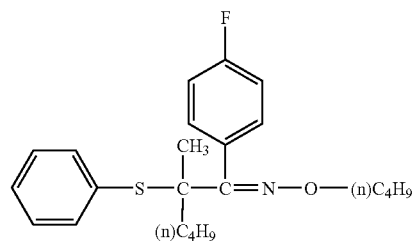

II-5

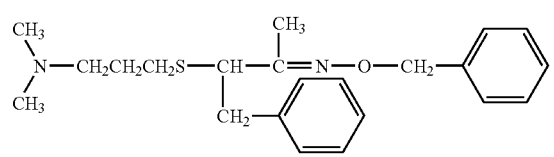

II-6

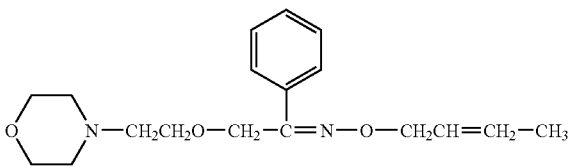

II-7

II-8
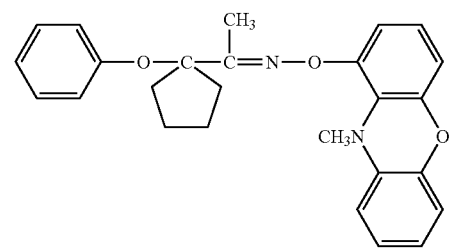
II-9
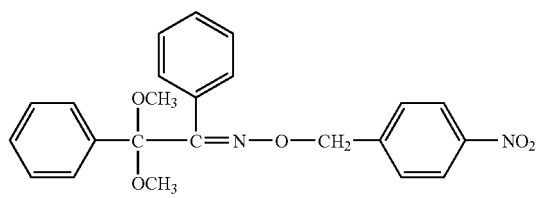
II-10
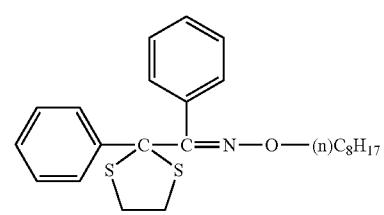
II-11
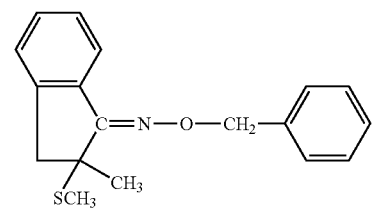
II-12
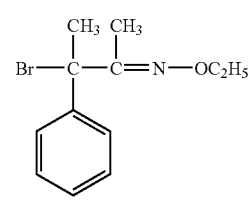
Specific examples of the α-amino-ketoxime ether compound represented by Formula (i-2) preferably include those listed below:
Compound III-1
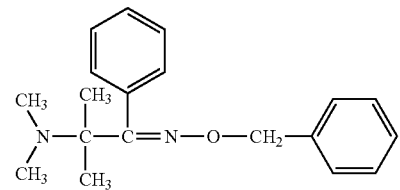
III-2
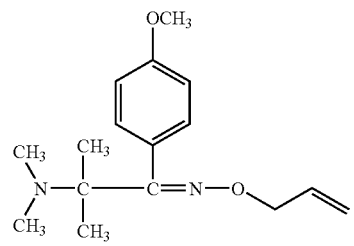
III-3
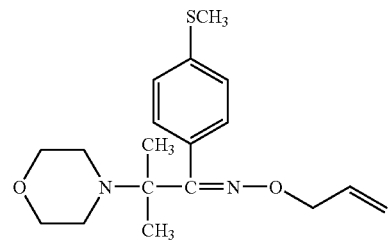
III-4
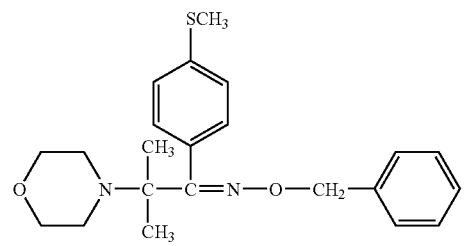
III-5
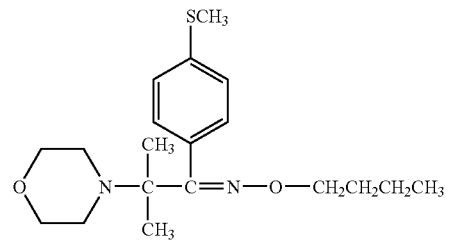
III-6
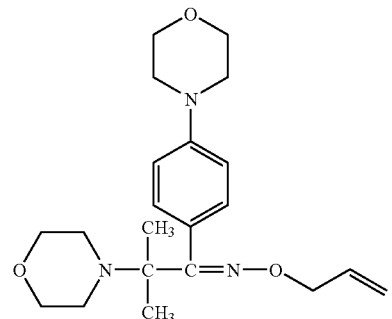
III-7
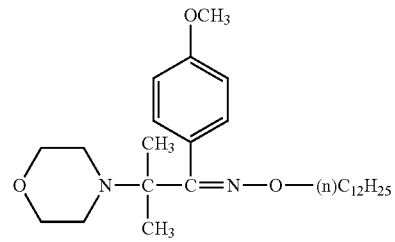

-continued
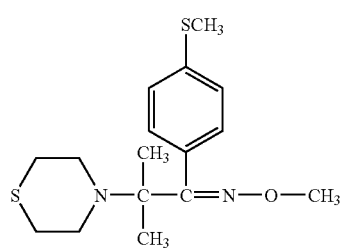
III-8
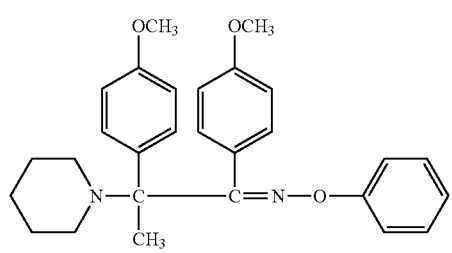
III-9
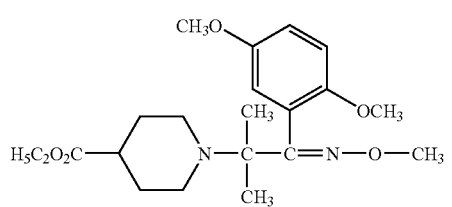
III-10
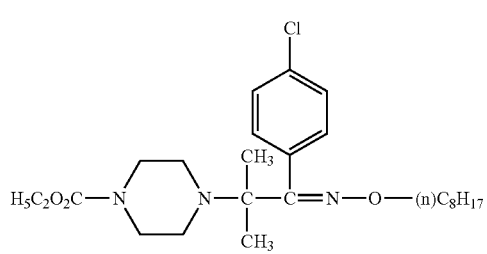
III-11
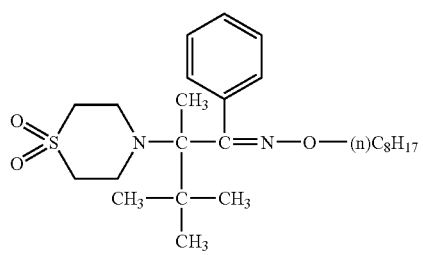
III-12
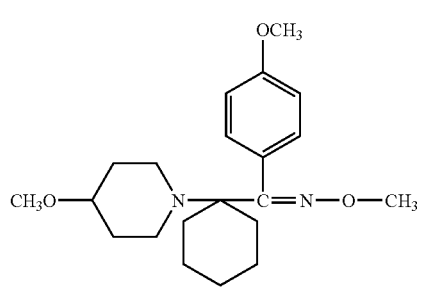
III-13
-continued
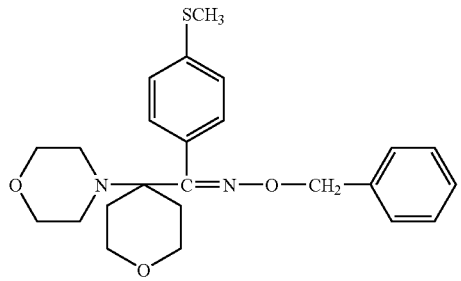
III-14
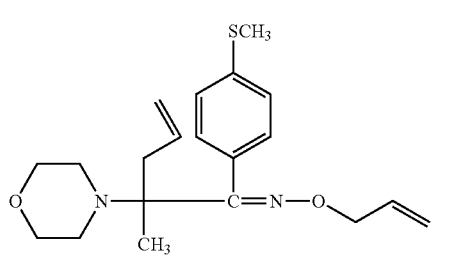
III-15
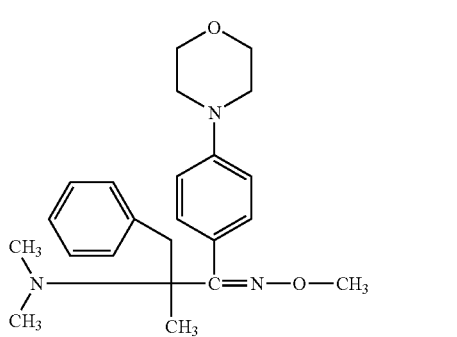
III-16
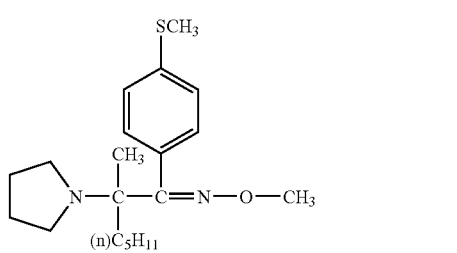
III-17
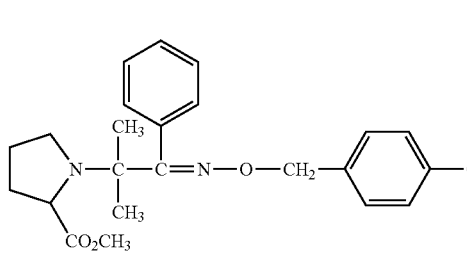
III-18
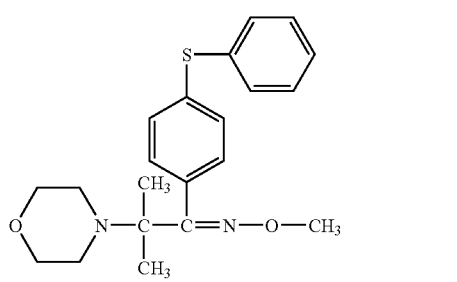
III-19

-continued
III-20
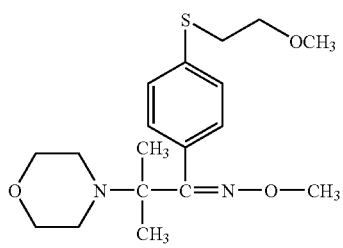
III-21
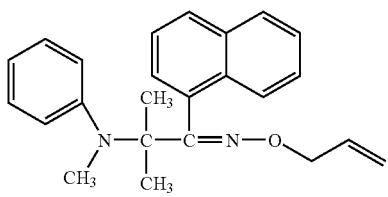
III-22
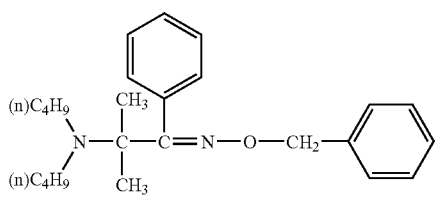
III-23
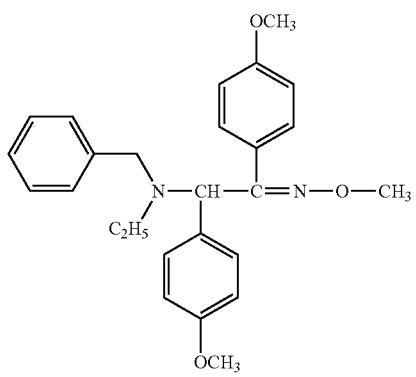
III-24
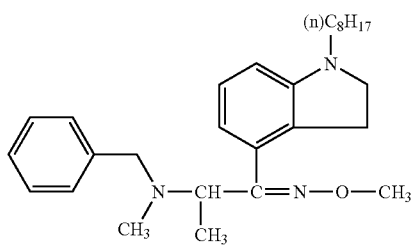
III-25
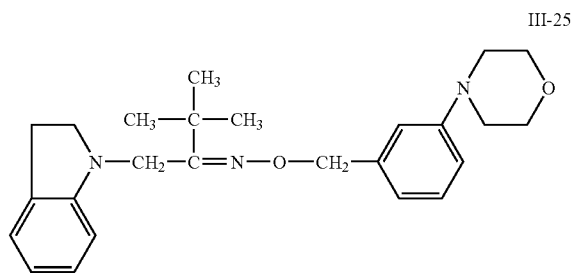
-continued
III-26
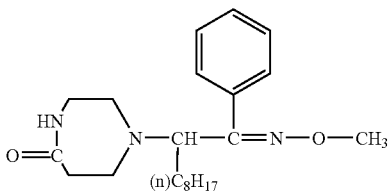
III-27
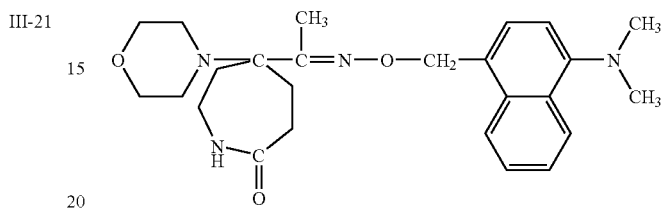
III-28
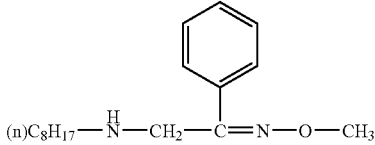
III-29
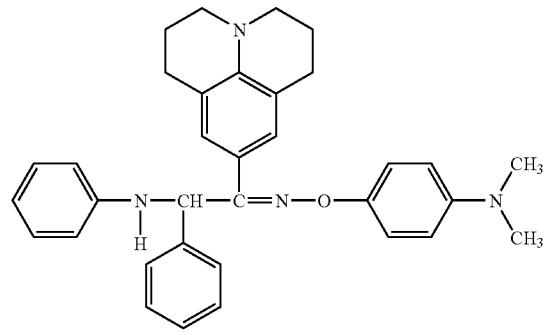
III-30
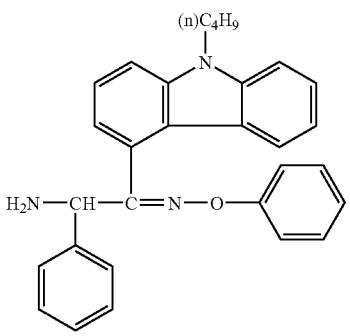
III-31
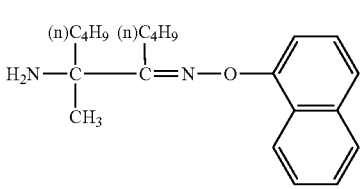

III-32
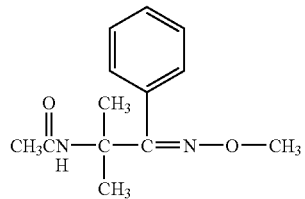
III-33
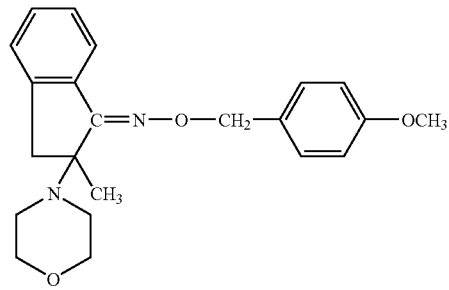
Specific examples of the α-amino-ketoxime ether compound represented by Formula (i-3) preferably include those listed below:
Compound IV-1
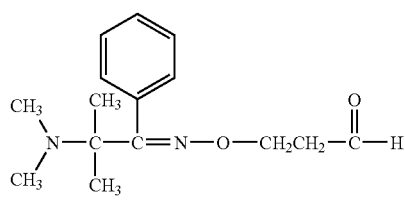
IV-2
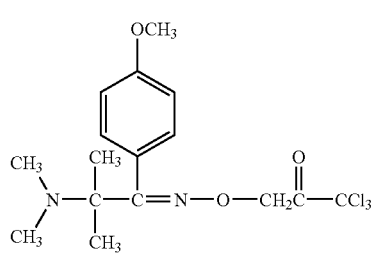
IV-3
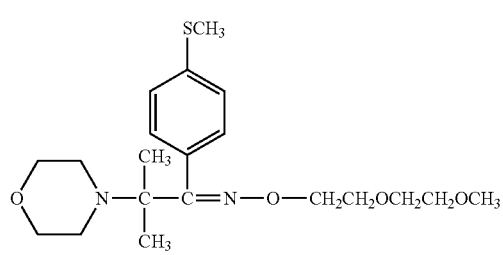
IV-4
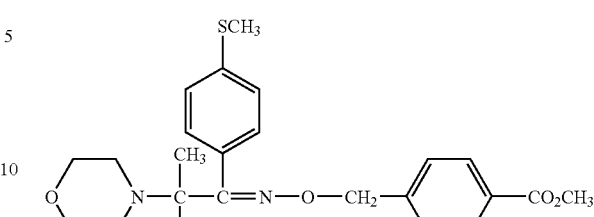
IV-5
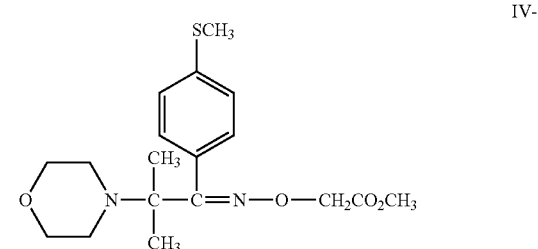
IV-6
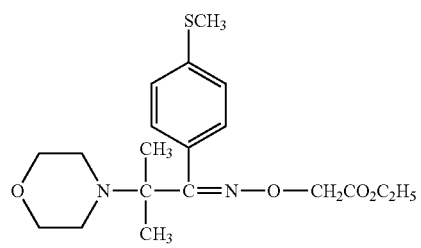
IV-7
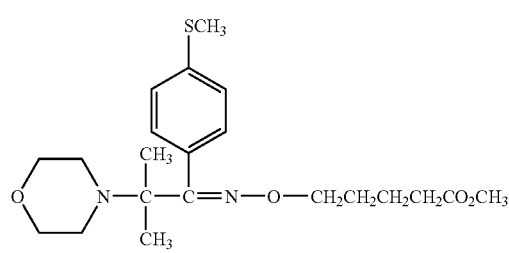
IV-8
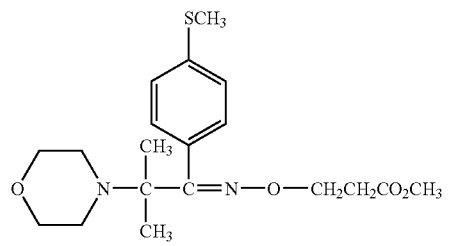
IV-9
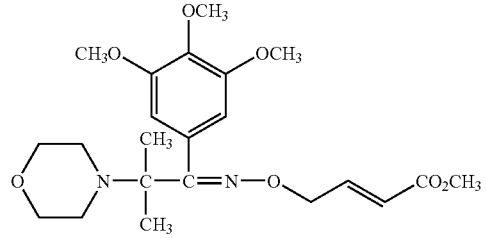

-continued
IV-10
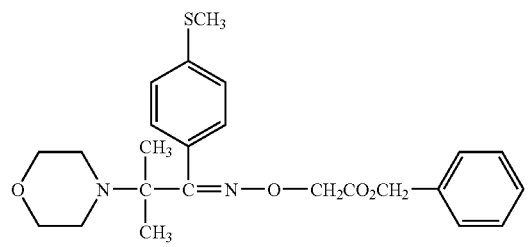
IV-11
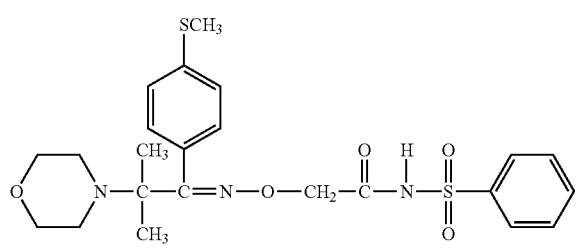
IV-12
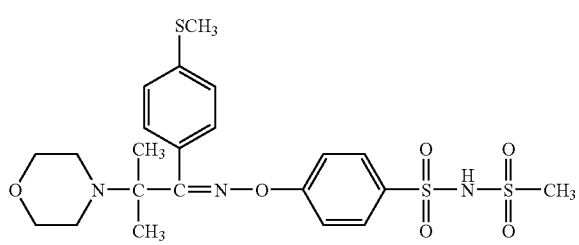
IV-13
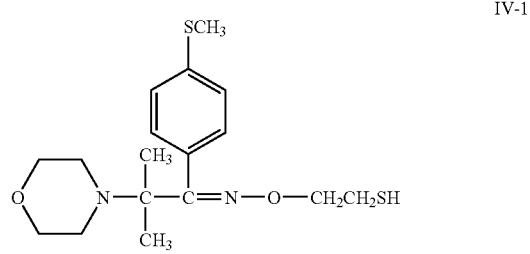
IV-14
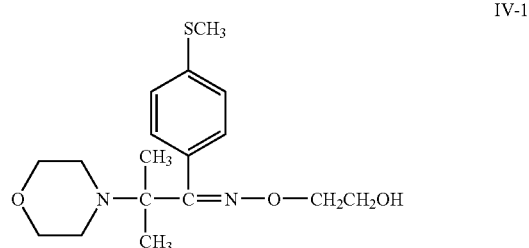
IV-15
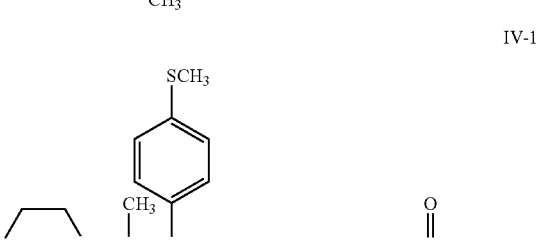
IV-16
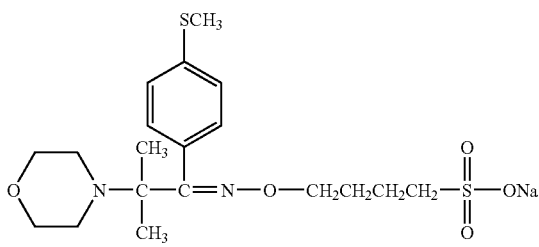
IV-17
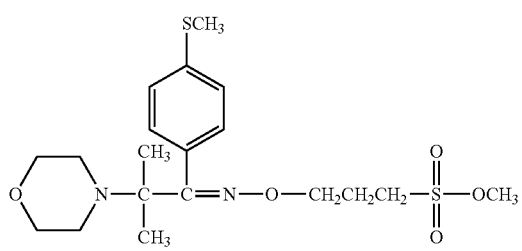
IV-18
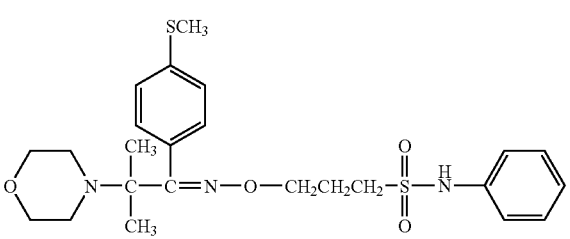
IV-19
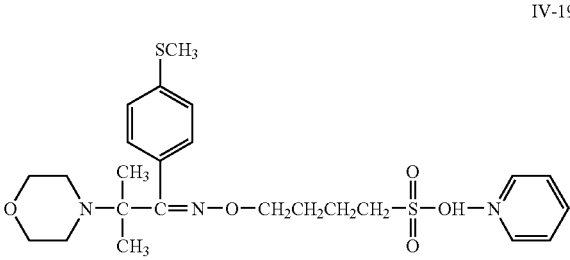
IV-20
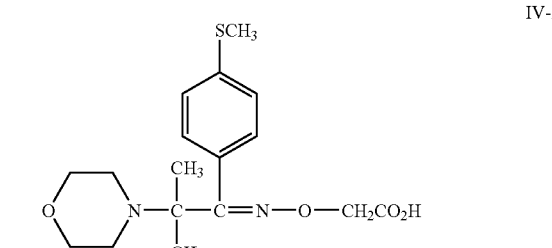
IV-21
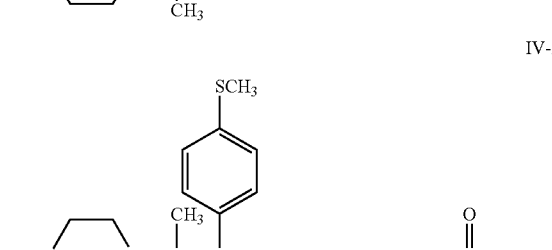
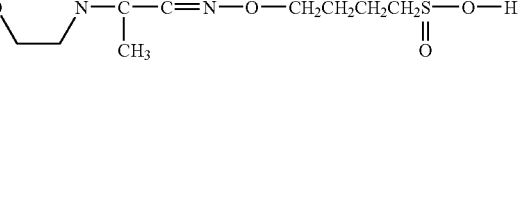
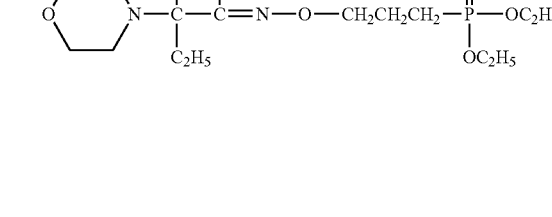

-continued
IV-22
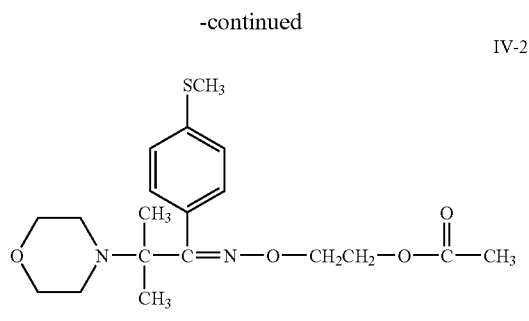
IV-23
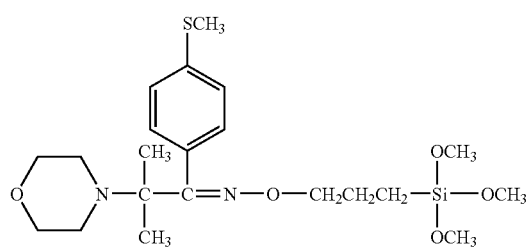
IV-24
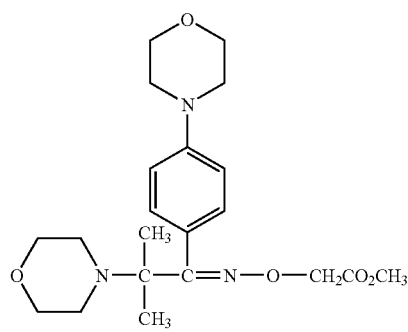
IV-25
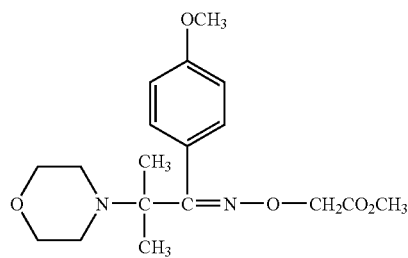
IV-26
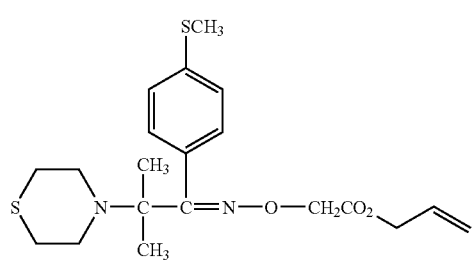
-continued
IV-27
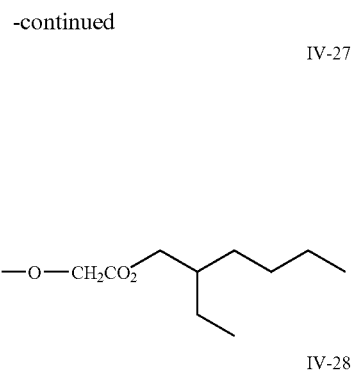
IV-28
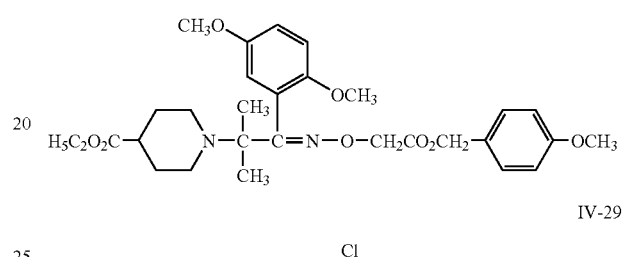
IV-29
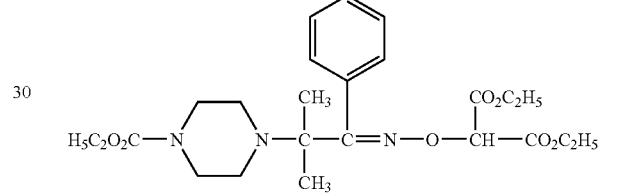
IV-30
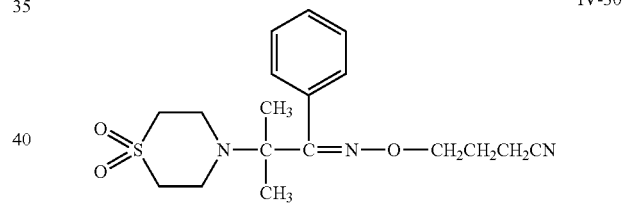
IV-31
IV-32
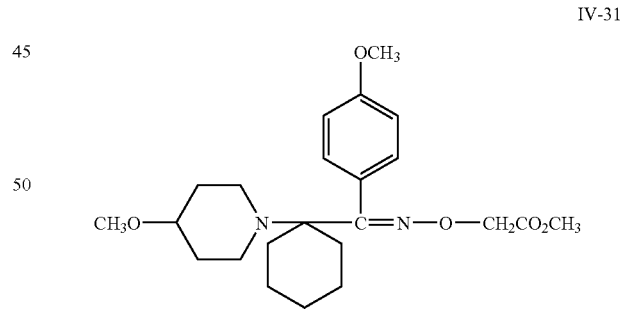

-continued
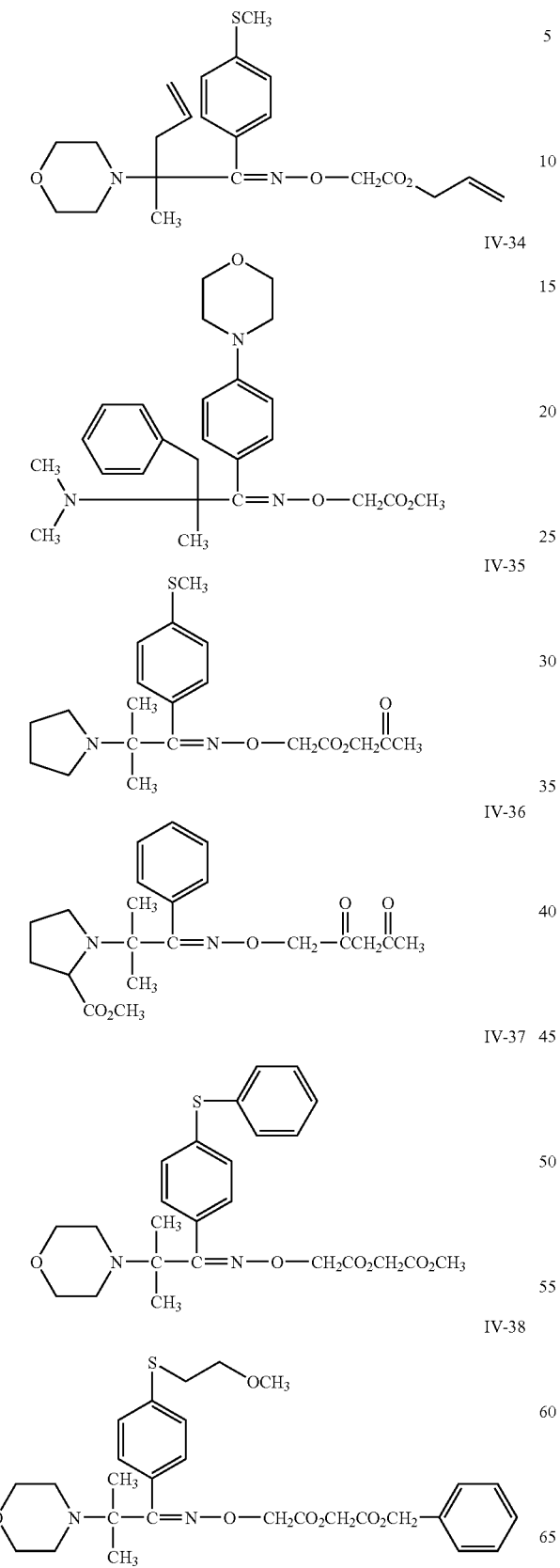
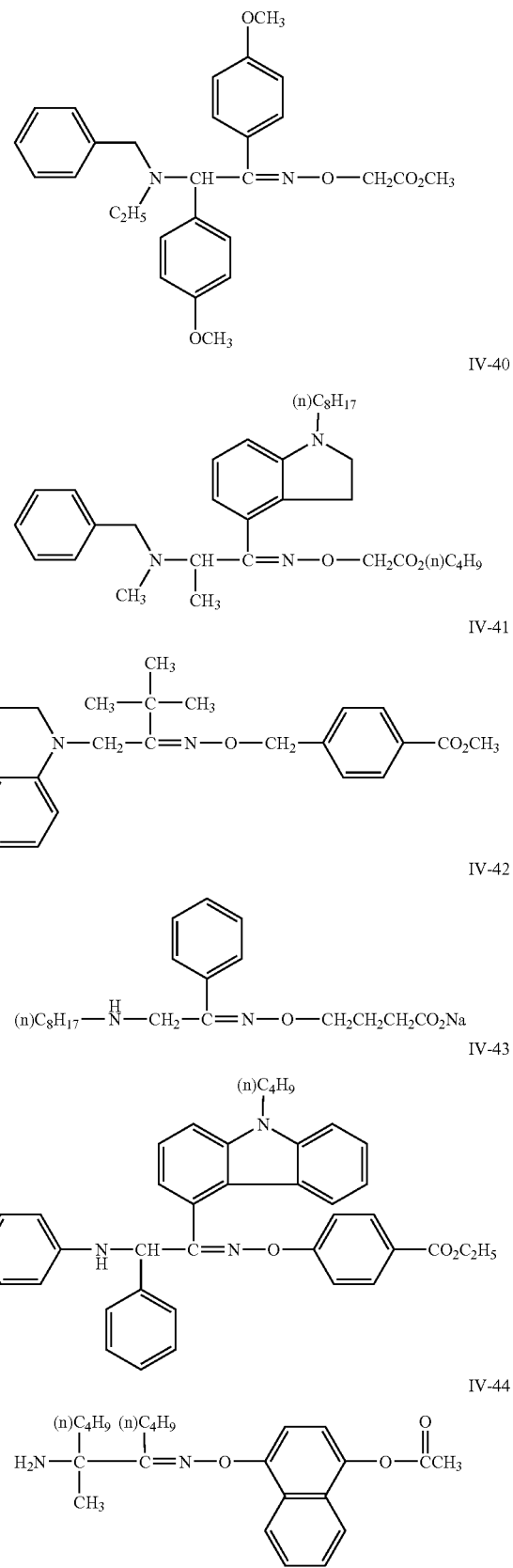

-continued

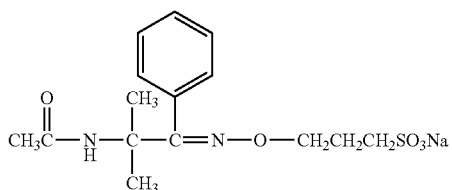

IV-45

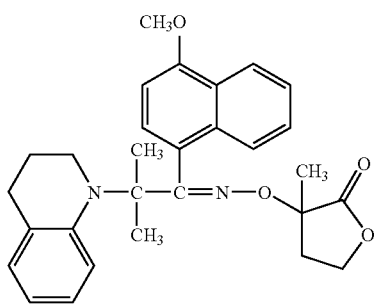

IV-46

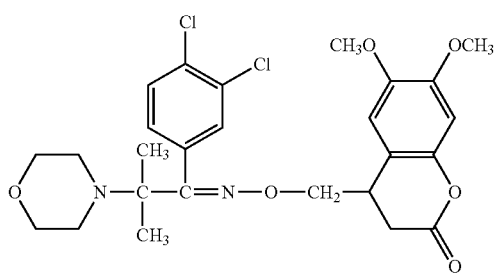

IV-47

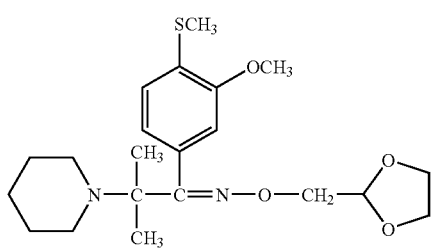

IV-48

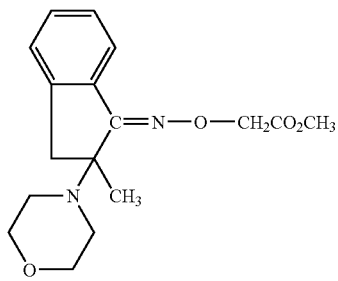

IV-49

The aforementioned oxime ether compounds represented by Formula (i) or Formula (i-1), (i-2) or (i-3) for use in the photopolymerizable composition of the present invention may be used individually or as a mixture of at least two of them. The compound represented by Formula (i) and Formulas (i-1), (i-2) and (i-3) may be used in an amount usually ranging from 0.05 to 50% by mass, preferably from 0.5 to 35% by mass and more preferably from 1 to 25% by mass on the basis of the total mass of the components constituting the ink jet-recording ink. If the amount exceeds 50%, an insufficient film-formation (formation of cracks) is observed, while the use of these compounds in an amount of less than 0.05% would result in insufficient curing and accordingly, they should be used in an amount specified above.

Compounds of General Formula (ii):

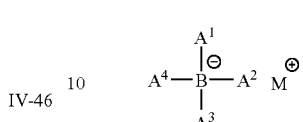

(ii)

In Formula (ii), $A^1$ to $A^4$ each independently represents an aromatic group or a heterocyclic group. Among them, preferred are those having partial structures in which a nitrogen atom and/or a sulfur atom are directly linked with the aromatic group or the heterocyclic group; or borate compounds represented by the foregoing general formula (ii), from the viewpoint of the sensitivity thereof.

Further, preferably used herein also include those each having an electrondonative substituent on the heterocyclic group and such electrondonative substituents preferably used herein include, for instance, those each having a Hammett rho ($\rho$) para constant of not more than $-0.10$. Examples of substituents preferably used herein and having a Hammett $\rho$ para constant of not more than $-0.10$ are alkyl groups (whose $\rho$ para constant ranges from about $-0.12$ to $-0.20$) such as methyl, ethyl and propyl groups; a hydroxyl group (having a $\rho$ para constant of $-0.37$); alkoxy groups (having a $\rho$ para constant ranging from about $-0.24$ to $-0.45$) such as methoxy, ethoxy, propyloxy and butoxy groups; aryloxy groups (having a $\rho$ para constant of about $-0.32$) such as phenoxy and toluyloxy groups; and (substituted) amino groups (having a $\rho$ para constant ranging from $-0.50$ to $-0.35$) such as amino, methylamino, ethylamino, butylamino, dimethylamino, diethylamino, phenylamino and di-phenylamino groups, and particularly preferred are, for instance, alkoxy groups and (substituted) amino groups because of their high electrondonative characteristics.

The foregoing aromatic groups may be a benzene ring, fused rings each formed by condensing 2 to 3 benzene rings and fused rings each formed by condensing a benzene ring with a 5-membered unsaturated ring and specific examples thereof are phenyl, naphthyl, anthryl, phenanthryl, indenyl, acenaphthenyl, and fluorenyl groups, with phenyl and naphthyl groups being preferably used herein.

Examples of the foregoing heterocyclic groups are those derived from pyrrole rings, furan rings, thiophene rings, benzo-pyrrole rings, benzo-furan rings, benzo-thiophene rings, pyrazole rings, isoxazole rings, isothiazole rings, indazole rings, benzo-isoxazole rings, benzo-isothiazole rings, imidazole rings, oxazole rings, thiazole rings, benzimidazole rings, benzoxazole rings, benzothiazole rings, pyridine rings, quinoline rings, iso-quinoline rings, pyridazine rings, pyrimidine rings, pyrazine rings, phthalazine rings, quinazoline rings, quinoxaline rings, aziridine rings, phenanthridine rings, carbazole rings, purine rings, pyran rings, piperidine rings, piperazine rings, morpholine rings, indole rings, indolizine rings, chromene rings, cinnoline rings, acridine rings, phenothiazine rings, tetrazole rings and triazine rings.

In addition, $M^+$ is a monovalent cationic atom or atomic group. Preferred examples thereof are alkali metal ions such as $Li^+$; or a cationic moiety derived from an azonium salt (such as an ammonium or diazonium salt); an oxonium salt; a phosphoniums salt; sulfonium salt, a halonium salt; a siliconium salt; or a pyridinium salt; and an iodonium salt, as disclosed in "onium ions" (written by A. Olha, Kenneth K., Laali, Qi Wang, G. K. Surya Prakash et al., published by A Wiley-Interscience Publication, 1998), with azonium, pyridinium and alkali metal ions being more preferred from the viewpoint of their sensitivity.

The following are specific examples of the compounds represented by the general formula (ii) which can suitably be used in the present invention and which have an oxidation potential of not more than +1.10 V (vs. SCE) and the corresponding oxidation potentials are also specified below, but the present invention is not restricted to these specific examples at all. The term "oxidation potential" used herein means the value which is determined, in a polar solvent such as acetonitrile or methanol, by the potentiometry which makes use of an indicator electrode such as a hydrogen electrode, a glass electrode or a quinhydrone electrode; a reference electrode such as a saturated calomel electrode or a silver-silver chloride electrode and which is then converted into the value relative to the standard calomel electrode. The oxidation potential for each of the following compounds given below is one which is determined in a polar solvent (0.1M $Et_4NClO_4$/MeCN), at ordinary temperature using a rotatable disc-like Pt electrode as an indicator electrode, and a counter Ag/AgCl (silver-silver chloride) electrode as a reference electrode and which is then converted into the value relative to the standard calomel electrode.

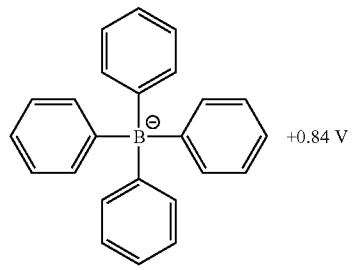
(A-9) +0.84 V

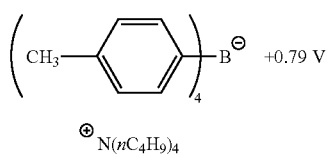
(A-10) +0.79 V

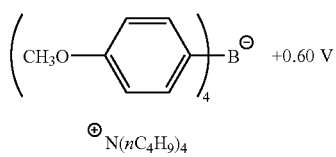
(A-11) +0.60 V

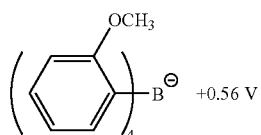
(A-17) +0.56 V

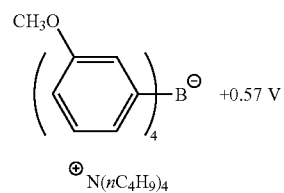
(A-18) +0.57 V

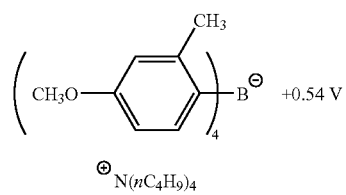
(A-19) +0.54 V

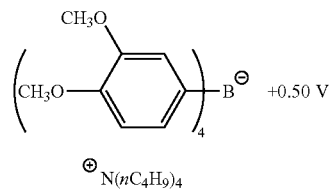
(A-20) +0.50 V

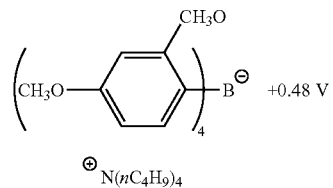
(A-21) +0.48 V

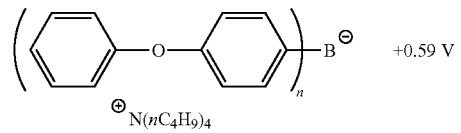
(A-22) +0.59 V

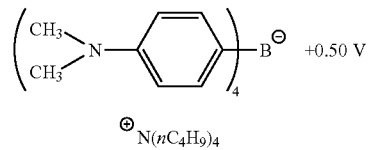
(A-23) +0.50 V

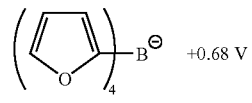
(A-24) +0.68 V

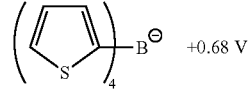
(A-25) +0.68 V

Compounds of Formula (iii):

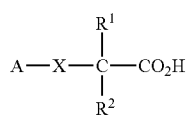

In the general formula (iii), A represents a monovalent non-metallic atomic group and preferably an aromatic or heterocyclic group; X represents a divalent connecting group selected from the group consisting of —O—, —S—, —SO$_2$—, —NH—, —N(R$^3$)—, —CO—, —CH$_2$—, —CH(R$^4$)— and —C(R$^4$)(R$^5$)—, wherein R$^3$, R$^4$ and R$^5$ each independently represents a hydrogen atom or a monovalent substituent; and R$^1$ and R$^2$ each independently represents a hydrogen atom or a monovalent substituent. In this respect, R$^1$ and R$^2$, or either R$^1$ or R$^2$ and R$^3$ may be linked together to form a ring structure together with the carbon atoms to which they are bonded. The substituents appearing in Formula (iii) will then be detailed below:

In Formula (iii), the aromatic group represented by A may be, for instance, a benzene ring, a fused ring formed by condensing 2 to 3 benzene rings or a fused ring formed by condensing a benzene ring with a 5-membered unsaturated ring and specific examples thereof are phenyl, naphthyl, anthryl, phenanthryl, indenyl, acenaphthenyl, and fluorenyl groups, with phenyl and naphthyl groups being more preferably used herein.

In addition, the aromatic group may have a substituent and such an aromatic group carrying a substituent may be, for instance, an aryl group, as will be described later, whose ring-forming carbon atom has a group consisting of a monovalent non-metallic atomic group other than hydrogen atom as a substituent. In this respect, preferred substituents capable of being introduced into the aryl group may be, for instance, the alkyl groups and substituted alkyl groups, as well as the substituents for the substituted alkyl groups, as will be described below.

Examples of the foregoing heterocyclic groups represented by A are groups derived from pyrrole rings, furan rings, thiophene rings, benzo-pyrrole rings, benzo-furan rings, benzo-thiophene rings, pyrazole rings, isoxazole rings, isothiazole rings, indazole rings, benzo-isoxazole rings, benzo-isothiazole rings, imidazole rings, oxazole rings, thiazole rings, benzimidazole rings, benzoxazole rings, benzothiazole rings, pyridine rings, quinoline rings, iso-quinoline rings, pyridazine rings, pyrimidine rings, pyrazine rings, phthalazine rings, quinazoline rings, quinoxaline rings, aziridine rings, phenanthridine rings, carbazole rings, purine rings, pyran rings, piperidine rings, piperazine rings, morpholine rings, indole rings, indolizine rings, chromene rings, cinnoline rings, acridine rings, phenothiazine rings, tetrazole rings and triazine rings.

In addition, the heterocyclic group may have a substituent and such an heterocyclic group carrying a substituent may be, for instance, an aryl group, as will be described later, whose ring-forming carbon atom has a group consisting of a monovalent non-metallic atomic group other than hydrogen atom as a substituent. In this respect, preferred substituents capable of being introduced into the aryl group may be, for instance, the alkyl groups and substituted alkyl groups, as well as the substituents for the substituted alkyl groups, as will be described below.

Then the monovalent substituents represented by R$^1$ and R$^2$ appearing in Formula (iii) will hereunder be described in detail. When R$^1$ and R$^2$ each represents a monovalent substituent, examples of such substituents are halogen atoms, amino groups which may have substituents, alkoxycarbonyl groups, hydroxyl group, ether groups, thiol groups, thio-ether groups, silyl groups, nitro group, cyano groups, and alkyl, alkenyl, alkynyl, aryl and heterocyclic groups which may have substituents.

Such alkyl groups may be, for instance, linear, branched and cyclic alkyl groups having 1 to 20 carbon atoms and specific examples thereof are methyl, ethyl, propyl, butyl, pentyl, hexyl, heptyl, octyl, nonyl, decyl, undecyl, dodecyl, tridecyl, hexadecyl, octadecyl, eicosyl, isopropyl, isobutyl, s-butyl, t-butyl, isopentyl, neo-pentyl, 1-methylbutyl, isohexyl, 2-ethylhexyl, 2-methylhexyl, cyclohexyl, cyclo-pentyl and 2-norbornyl groups. Among them, preferably used herein are linear alkyl groups having 1 to 12 carbon atoms, branched alkyl groups having 3 to 12 carbon atoms and cyclic alkyl groups having 5 to 10 carbon atoms.

The substituents with which these alkyl groups can be substituted may be monovalent non-metallic atomic groups other than hydrogen atom and specific examples thereof preferably used herein are a halogen atom (such as —F, —Br, —Cl, —I); a hydroxyl group, an alkoxy group, an aryloxy group, a mercapto group, an alkylthio group, an arylthio group, an alkyldithio group, an aryldithio group, an amino group, an N-alkylamino group, an N,N-dialkylamino group, an N-arylamino group, an N,N-di-arylamino group, an N-alkyl-N-arylamino group, an acyloxy group, a carbamoyloxy group, an N-alkyl-carbamoyloxy group, an N-aryl-carbamoyloxy group, an N,N-dialkyl-carbamoyloxy group, an N,N-diaryl-carbamoyloxy group, an N-alkyl-N-aryl-carbamoyloxy group, an alkylsulfoxy group, an arylsulfoxy group, an acylthio group, an acylamino group, an N-alkyl-acylamino group, an N-aryl-acylamino group, a ureido group, an N'-alkylureido group, an N',N'-di-alkylureido group, an N'-arylureido group, an N',N'-di-arylureido group, an N'-alkyl-N'-aryl-ureido group, an N-alkylureido group, an N-arylureido group, an N'-alkyl-N-alkyl-ureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkyl-ureido group, an N',N'-diaryl-N-aryl-ureido group, an N'-alkyl-N'-aryl-N-alkylureido group, an N'-alkyl-N'-aryl-N-aryl-ureido group, an alkoxy-carbonylamino group, an aryloxy-carbonylamino group, an N-alkyl-N-alkoxy-carbonylamino group, an N-alkyl-N-aryloxy-carbonylamino group, an N-aryl-N-alkoxy-carbonylamino group, an N-aryl-N-aryloxy-carbonyl-amino group, a formyl group, an acyl group, a carboxyl group, an alkoxycarbonyl group, an aryloxycarbonyl group, a carbamoyl group, an N-alkyl-carbamoyl group, an N,N-di-alkyl-carbamoyl group, an N-aryl-carbamoyl group, an N,N-diaryl-carbamoyl group, an N-alkyl-N-aryl-carbamoyl group, an alkyl-sulfinyl group, an aryl-sulfinyl group, an alkylsulfonyl group, an arylsulfonyl group, a sulfo group (—SO$_3$H) and a conjugated base group thereof (hereinafter referred to as "sulfonate group"), an alkoxy-sulfonyl group, an aryloxy-sulfonyl group, a sulfinamoyl group, an N-alkyl-sulfinamoyl group, an N,N-dialkyl-sulfinamoyl group, an N-aryl-sulfinamoyl group, an N,N-diaryl-sulfinamoyl group, an N-alkyl-N-aryl-sulfinamoyl group, a sulfamoyl group, an N-alkyl-sulfamoyl group, an N,N-dialkyl-sulfamoyl group, an N-aryl-sulfamoyl group, an N,N-diaryl-sulfamoyl group, an N-alkyl-N-aryl-sulfamoyl group, a phosphono group (—PO$_3$H$_2$) and a conjugated base group thereof (hereinafter referred to as "phosphonate group"), a dialkyl-phosphono group (—PO$_3$(alkyl)$_2$), a diaryl-phosphono group (—PO$_3$(aryl)$_2$), an alkylaryl-phosphono group (—PO$_3$(alkyl)(aryl)), a monoalkyl-phosphono group (—PO$_3$H(alkyl)) and a conjugated base group thereof (hereinafter referred to as "alkyl phosphonate group"), a monoaryl-phosphono group (—PO$_3$H(aryl)) and a conjugated base group thereof (hereinafter referred to as "aryl phosphonate group"), a phosphono-oxy group (—OPO$_3$H$_2$) and a conjugated base group thereof (hereinafter referred to as "phosphonate oxy group"), a dialkyl-phosphono-oxy group (—OPO$_3$H(alkyl)$_2$), a diaryl-phosphono-oxy group (—OPO$_3$(aryl)$_2$), an alkyl-aryl-phosphono-oxy group (—OPO$_3$ (alkyl)(aryl)), a mono-alkyl-phosphono-oxy group (—OPO$_3$H(alkyl)) and a conjugated base group thereof (hereinafter referred to as "alkyl phosphonate oxy group"), a monoaryl-phosphono-oxy group (—OPO$_3$H(aryl)) and a conjugated base group thereof (hereinafter referred to as "aryl phosphonate oxy group"), a cyano group, a nitro group, an aryl group, an alkenyl group, an alkynyl group, a heterocyclic group and a silyl group.

Specific examples of the alkyl group in these substituents include the above-described alkyl groups and specific examples of the aryl group include a phenyl group, a biphenyl group, a naphthyl group, a tolyl group, a xylyl group, a mesityl group, a cumenyl group, a chlorophenyl group, a bromophenyl group, a chloromethyl-phenyl group, a hydroxyphenyl group, a methoxy-phenyl group, an ethoxy-phenyl group, a phenoxy-phenyl group, an acetoxy-phenyl group, a benzoyl-oxy-phenyl group, a methylthio-phenyl group, a phenylthio-phenyl group, a methyl-aminophenyl group, a dimethyl-aminophenyl group, an acetyl-aminophenyl group, a carboxyphenyl group, a methoxy-carbonyl-phenyl group, an ethoxy-carbonylphenyl group, a phenoxy-carbonylphenyl group, an N-phenyl-carbamoyl-phenyl group, a cyanophenyl group, a sulfophenyl group, a sulfonate phenyl group, a phosphono-phenyl group and a phosphonate phenyl group.

In addition, examples of the alkenyl group include a vinyl group, a 1-propenyl group, a 1-butenyl group, a cinnamyl group and a 2-chloro-1-ethenyl group and examples of the alkynyl group include an ethynyl group, a 1-propynyl group, a 1-butynyl group and a trimethyl-silyl-ethynyl group.

R$^{O1}$ in the acyl group (R$^{O1}$CO—) may be a hydrogen atom or the above-described alkyl or aryl group. Among these substituents, more preferably used herein are a halogen atom (such as —F, —Br, —Cl, —I); an alkoxy group, an aryloxy group, an alkylthio group, an arylthio group, an N-alkylamino group, an N,N-dialkylamino group, an acyloxy group, an N-alkyl-carbamoyloxy group, an N-aryl-carbamoyloxy group, an acylamino group, a formyl group, an acyl group, a carboxyl group, an alkoxy-carbonyl group, an aryloxy-carbonyl group, a carbamoyl group, an N-alkyl-carbamoyl group, an N,N-dialkyl-carbamoyl group, an N-aryl-carbamoyl group, an N-alkyl-N-aryl-carbamoyl group, a sulfo group, a sulfonate group, a sulfamoyl group, an N-alkyl-sulfamoyl group, an N,N-dialkyl-sulfamoyl group, an N-aryl-sulfamoyl group, an N-alkyl-N-aryl-sulfamoyl group, a phosphono group, a phosphonate group, a dialkyl-phosphono group, a diaryl-phosphono group, a monoalkyl-phosphono group, an alkyl-phosphonate group, a monoaryl-phosphono group, an aryl-phosphonate group, a phosphono-oxy group, a phosphonate-oxy group, an aryl group and an alkenyl group.

Examples of the heterocyclic group are a pyridyl group and a piperidyl group. The silyl group may be, for instance, a trimethyl silyl group.

On the other hand, the alkylene group in the substituted alkyl group includes a divalent organic residue formed through the elimination of any one of hydrogen atoms present on the above-described alkyl group having from 1 to 20 carbon atoms and preferred are a linear alkylene group having from 1 to 12 carbon atoms, a branched alkylene group having from 3 to 12 carbon atoms and a cyclic alkylene group having from 5 to 10 carbon atoms. Specific preferred examples of the substituted alkyl group formed through the combination of such a substituent with an alkylene group include a chloromethyl group, a bromomethyl group, a 2-chloro-ethyl group, a trifluoromethyl group, a methoxy-methyl group, an isopropoxy-methyl group, a butoxy-methyl group, an s-butoxybutyl group, a methoxy-ethoxy-ethyl group, an allyloxy-methyl group, a phenoxy-methyl group, a methyl-thio-methyl group, a tolylthio-methyl group, a pyridyl-methyl group, tetramethyl-piperidinyl-methyl group, an N-acetyl-tetramethyl-piperidinyl-methyl group, a trimethylsilyl-methyl group, a methoxy-ethyl group, an ethylamino-ethyl group, a diethyl-aminopropyl group, a morpholino-propyl group, an acetyloxy-methyl group, a benzoyloxy-methyl group, an N-cyclohexyl-carbamoyl-oxyethyl group, an N-phenyl-carbamoyloxy-ethyl group, an acetyl-aminoethyl group, an N-methyl-benzoyl-aminopropyl group, a 2-oxoethyl group, a 2-oxopropyl group, a carboxy-propyl group, a methoxycarbonyl-ethyl group, an allyloxy-carbonyl-butyl group, a chlorophenoxy-carbonyl-methyl group, a carbamoyl-methyl group, an N-methyl-carbamoyl-ethyl group, an N,N-dipropyl-carbamoylmethyl group, an N-(methoxy-phenyl)carbamoylethyl group, an N-methyl-N-(sulfophenyl)carbamoylmethyl group, a sulfobutyl group, a sulfonate butyl group, a sulfamoyl-butyl group, an N-ethyl-sulfamoyl-methyl group, an N,N-dipropyl-sulfamoylpropyl group, an N-tolyl-sulfamoyl-propyl group, an N-methyl-N-(phosphono-phenyl)sulfamoyl-octyl group, a phosphono-butyl group, a phosphonate hexyl group, a diethyl-phosphono-butyl group, a diphenyl-phosphono-propyl group, a methyl-phosphono-butyl group, a methyl phosphonate butyl group, a tolyl-phosphono-hexyl group, a phosphono-oxypropyl group, a tolyl phosphonate hexyl group, a phosphonate oxybutyl group, a benzyl group, a phenethyl group, an α-methyl-benzyl group, a 1-methyl-1-phenyl-ethyl group, a p-methylbenzyl group, a cinnamyl group, an allyl group, a 1-propenyl-methyl group, a 2-butenyl group, a 2-methylallyl group, a 2-methyl-propenyl-methyl group, a 2-propynyl group, a 2-butynyl group and a 3-butynyl group.

The aryl group includes a benzene ring, a fused ring formed from 2 to 3 benzene rings and a fused ring formed from a benzene ring and a 5-membered unsaturated ring and specific examples thereof include a phenyl group, a naphthyl group, an anthryl group, a phenanthryl group, an indenyl group, an acenaphthenyl group and a fluorenyl group, with the phenyl group and the naphthyl group being more preferably used herein.

The substituted aryl group is constructed by bonding a substituent such as a monovalent non-metallic atomic group other than a hydrogen atom onto a ring-forming carbon atom of the foregoing aryl group. Examples of such substituents preferably used herein are alkyl groups and substituted alkyl groups listed above as well as those specified above in connection with the substituted alkyl groups.

Specific examples of the substituted aryl group preferably used in the present invention include a biphenyl group, a tolyl group, a xylyl group, a mesityl group, a cumenyl group, a chlorophenyl group, a bromophenyl group, a fluorophenyl group, a chloromethyl-phenyl group, a trifluoromethyl-phenyl group, a hydroxy-phenyl group, a methoxyphenyl group, a methoxy-ethoxyphenyl group, an allyloxy-phenyl group, a phenoxy-phenyl group, a methyl-thiophenyl group, a tolylthio-phenyl group, an ethylamino-phenyl group, a diethyl-aminophenyl group, a morpholino-phenyl group, an acetyloxy-phenyl group, a benzoyloxy-phenyl group, an N-cyclohexyl-carbamoyloxy-phenyl group, an N-phenyl-carbamoyloxy-phenyl group, an acetylamino-phenyl group, an N-methyl-benzoyl-aminophenyl group, a carboxy-phenyl group, a methoxycarbonyl-phenyl group, an allyloxy-carbonylphenyl group, a chlorophenoxy-carbonylphenyl group, a carbamoyl-phenyl group, an N-methyl-carbamoylphenyl group, an N,N-dipropyl-carbamoylphenyl group, an N-(methoxy-phenyl)carbamoylphenyl group, an N-methyl-N-(sulfophenyl)carbamoylphenyl group, a sulfophenyl group, a sulfonate phenyl group, a sulfamoylphenyl group, an N-ethyl-sulfamoylphenyl group, an N,N-dipropyl-sulfamoylphenyl group, an N-tolyl-sulfamoylphenyl group, an N-methyl-N-(phosphono-phenyl)sulfamoyl-phenyl group, a phosphonophenyl group, a phosphonate phenyl group, a diethyl-phosphonophenyl group, a diphenyl-phosphonophenyl group, a methyl-phosphono-phenyl group, a methyl phosphonate phenyl group, a tolyl-phosphonophenyl group, a tolyl phosphonate phenyl group, an allyl phenyl group, a 1-propenylmethyl phenyl group, 2-butenyl phenyl group, a 2-methylallyl-phenyl group, a 2-methylpropenyl-phenyl group, a 2-propynylphenyl group, a 2-butynyl-phenyl group and a 3-butynyl-phenyl group.

The alkenyl, substituted alkenyl, alkynyl and substituted alkynyl groups ($-C(R^{02})=C(R^{03})(R^{04})$ and $-C{\equiv}C(R^{05})$) usable herein may be those represented by these general formulas in which $R^{02}$, $R^{03}$, $R^{04}$ and $R^{05}$ each independently represents a monovalent nonmetallic atomic group. Preferred examples of these substituents: $R^{02}$, $R^{03}$, $R^{04}$ and $R^{05}$ are a hydrogen atom, a halogen atom, an alkyl group, a substituted alkyl group, an aryl group and a substituted aryl group. Specific examples thereof are those listed above in connection with such substituents. Examples of $R^{02}$, $R^{03}$, $R^{04}$ and $R^{05}$ more preferably used herein are a hydrogen atom, a halogen atom or a linear, branched or cyclic alkyl group having 1 to 10 carbon atoms.

Examples of the these alkenyl, substituted alkenyl, alkynyl and substituted alkynyl groups are vinyl, 1-propenyl, 1-butenyl, 1-pentenyl, 1-hexenyl, 1-octenyl, 1-methyl-1-propenyl, 2-methyl-1-propenyl, 2-methyl-1-butenyl, 2-phenyl-1-ethenyl, 2-chloro-1-ethenyl, ethynyl, 1-propynyl, 1-butynyl, and phenyl-ethynyl groups.

Examples of the heterocyclic group are those listed above in connection with the substituents for the substituted alkyl groups such as pyridyl groups.

The foregoing substituted oxy group ($R^{06}O-$) may be, for instance, those in which $R^{06}$ represents a monovalent nonmetallic atomic group other than a hydrogen atom. Preferred substituted oxy groups are, for instance, alkoxy, aryloxy, acyloxy, carbamoyloxy, N-alkyl-carbamoyloxy, N-aryl-carbamoyloxy, N,N-dialkyl-carbamoyl-oxy, N,N-diaryl-carbamoyloxy, N-alkyl-N-aryl-carbamoyloxy, alkylsulfoxy, aryl-sulfoxy, phosphono-oxy and phosphonate-oxy groups. The alkyl and aryl groups present in these substituted oxy groups may be the alkyl, substituted alkyl, aryl and substituted aryl groups listed above. In addition, the acyl group ($R^{07}CO-$) in the acyloxy group may be those in which $R^{07}$ is an alkyl, substituted alkyl, aryl or substituted aryl group as has been described above. Among these substituents, more preferably used herein are, for instance, alkoxy, aryloxy, acyloxy and arylsulfoxy groups. Specific examples of the substituted oxy groups preferably used in the invention are methoxy, ethoxy, propyloxy, isopropyloxy, butyloxy, pentyloxy, hexyloxy, dodecyloxy, benzyloxy, allyloxy, phenethyloxy, carboxyethyl-oxy, methoxy-carbonylethyl-oxy, ethoxy-carbonyl-ethyl-oxy, methoxy-ethoxy, phenoxy-ethoxy, methoxy-ethoxy-ethoxy, ethoxy-ethoxy-ethoxy, morpholino-ethoxy, morpholino-propyloxy, allyloxy-ethoxy-ethoxy, phenoxy, tolyloxy, xylyl-oxy, mesityl-oxy, cumenyl-oxy, methoxy-phenyloxy, ethoxy-phenyloxy, chloro-phenyloxy, bromo-phenyloxy, acetyloxy, benzoyloxy, naphthyloxy, phenyl-sulfonyloxy, phosphono-oxy and phosphonate-oxy groups.

The substituted amino group ($R^{08}NH-$; $(R^{09})(R^{010})N-$) included in the amide group may be, for instance, those in which the substituents $R^{08}$, $R^{09}$ and $R^{010}$ each represents a monovalent nonmetallic atomic group other than a hydrogen atom. In this respect, $R^{09}$ and $R^{010}$ may be bonded together to form a ring. Examples of the substituted amino group preferably used herein are N-alkylamino, N,N-dialkyl-amino, N-arylamino, N,N-diaryl-amino, N-alkyl-N-arylamino, acylamino, N-alkyl-acylamino, N-aryl-acylamino, ureido, N'-alkyl-ureido, N',N'-dialkyl-ureido, N'-aryl-ureido, N',N'-diaryl-ureido, N'-alkyl-N'-aryl-ureido, N-alkyl-ureido, N-aryl-ureido, N'-alkyl-N-alkyl-ureido, N'-alkyl-N-aryl-ureido, N',N'-dialkyl-N-alkyl-ureido, N',N'-dialkyl-N'-aryl-ureido, N'-aryl-N-alkyl-ureido, N'-aryl-N-aryl-ureido, N',N'-diaryl-N-alkyl-ureido, N',N'-diaryl-N-aryl-ureido, N'-alkyl-N'-aryl-N-alkylureido, N'-alkyl-N'-aryl-N-arylureido, alkoxycarbonyl-amino, aryloxy-carbonylamino, N-alkyl-N-alkoxycarbonyl-amino, N-alkyl-N-aryloxycarbonyl-amino, N-aryl-N-alkoxy-carbonyl-amino and N-aryl-N-aryloxycarbonyl-amino groups. The alkyl and aryl groups present in these substituted amino groups may be the alkyl, substituted alkyl, aryl and substituted aryl groups listed above, and the substituent $R^{07}$ of the acyl group ($R^{07}CO-$) in the acylamino, N-alkyl-acylamino and N-aryl-acylamino groups may be the same as those specified above. Among them, more preferably used herein are N-alkylamino, N,N-dialkyl-amino, N-arylamino, and acylamino groups. Specific examples of the substituted amino group preferably used in the invention are methylamino, ethylamino, diethylamino, morpholino, piperidino, pyrrolidino, phenylamino, benzoylamino and acetylamino groups.

The substituted sulfonyl ($R^{011}-SO_2-$) usable herein may be those in which the substituent $R^{011}$ represents a monovalent nonmetallic atomic group. More preferred examples thereof are alkylsulfonyl and arylsulfonyl groups. The alkyl and aryl groups present in these substituted sulfonyl groups may be the alkyl, substituted alkyl, aryl and substituted aryl groups specified above. Specific examples of such substituted sulfonyl group include butyl-sulfonyl, phenylsulfonyl, and chloro-phenylsulfonyl groups.

The sulfonate group ($-SO_3-$) herein used means, as has been described above, an anionic conjugated base group derived from a sulfo group ($-SO_3H$) and preferably this is usually used in combination with a counter cation. The counter cation includes commonly known ones and, more specifically, various oniums (e.g., ammoniums, sulfoniums, phosphoniums, iodoniums, aziniums) and metal ions (e.g., $Na^+$, $K^+$, $Ca^{2+}$, $Zn^{2+}$).

The substituted carbonyl ($R^{013}-CO-$) usable herein may be those in which the substituent $R^{013}$ represents a monovalent nonmetallic atomic group. Preferred examples thereof are formyl, acyl, carboxyl, alkoxycarbonyl, aryloxycarbonyl, carbamoyl, N-alkyl-carbamoyl, N,N-dialkyl-carbamoyl, N-aryl-carbamoyl, N,N-di-aryl-carbamoyl and N-alkyl-N'-aryl-carbamoyl groups. The alkyl and aryl groups present in these substituted carbonyl groups may be the alkyl, substituted alkyl, aryl and substituted aryl groups specified above. Among them, examples thereof more preferably used in the present invention are formyl, acyl, carboxyl, alkoxy-carbonyl, aryloxycarbonyl, carbamoyl, N-alkyl-carbamoyl, N,N- dialkyl-carbamoyl and N-aryl-carbamoyl groups and still more preferably used herein are formyl, acyl, alkoxycarbonyl and aryloxycarbonyl groups. Specific examples thereof preferably used in the invention include formyl, acetyl, benzoyl, carboxyl, methoxycarbonyl, ethoxycarbonyl, allyloxycarbonyl, dimethylamino-phenylethenylcarbonyl, methoxy-carbonyl-methoxycarbonyl, N-methylcarbamoyl, N-phenyl-carbamoyl, N,N-diethyl-carbamoyl and morpholino-carbonyl groups.

The substituted sulfinyl ($R^{O14}$—SO—) usable herein may be those in which the substituent $R^{O14}$ represents a monovalent nonmetallic atomic group. Preferred examples thereof are alkylsulfinyl, arylsulfinyl, sulfinamoyl, N-alkyl-sulfinamoyl, N,N-dialkyl-sulfinamoyl, N-aryl-sulfinamoyl, N,N-diaryl-sulfinamoyl and N-alkyl-N-aryl-sulfinamoyl groups. The alkyl and aryl groups present in these substituted sulfinyl groups may be the alkyl, substituted alkyl, aryl and substituted aryl groups specified above. Among them, more preferred examples thereof are alkylsulfinyl and arylsulfinyl groups. Specific examples thereof are hexyl-sulfinyl, benzyl-sulfinyl and tolyl-sulfinyl groups.

The substituted phosphono group herein used means a phosphono group in which one or two hydroxyl groups present thereon are substituted with other organic oxo groups and preferred examples thereof are dialkyl-phosphono, diaryl-phosphono, alkylaryl-phosphono, monoalkyl-phosphono and monoaryl-phosphono groups as has been described above. Among these, more preferred are dialkyl-phosphono and diaryl-phosphono groups. Specific examples thereof include diethyl-phosphono, dibutyl-phosphono and diphenyl-phosphono groups.

The phosphonate group (—$PO_3H_2$—; —$PO_3H$—) herein used means, as has been discussed above, an anionic conjugated base ion derived from the primary acid-dissociation or the secondary acid-dissociation of the phosphono group (—$PO_3H_2$). Preferably, this group is in general used in combination with its counter cation. The counter cation of this kind includes commonly known ones and, more specifically, various oniums (e.g., ammoniums, sulfoniums, phosphoniums, iodoniums, aziniums) and metal ions (e.g., $Na^+$, $K^+$, $Ca^{2+}$, $Zn^{2+}$).

The substituted phosphonate group herein used means an anionic conjugated base group derived from the foregoing substituted phosphono group in which one of the hydroxyl groups present therein is substituted with an organic oxo group and specific examples thereof are conjugated base groups derived from the above-described monoalkyl-phosphono group (—$PO_3H$(alkyl)) and monoaryl-phosphono group (—$PO_3H$(aryl)).

Next, X will be described in more detail below, which is a substituent of the compound of Formula (iii). X represents a divalent connecting group selected from the group consisting of —O—, —S—, —$SO_2$—, —NH—, —N($R^3$)—, —CO—, —$CH_2$—, —CH($R^4$)— and —C($R^4$)($R^5$)—. Among these, preferred are —O—, —S—, —NH— and —N($R^3$)—, with —O— and —N($R^3$)— being particularly preferred, from the viewpoint of the sensitivity.

$R^3$, $R^4$ and $R^5$, appearing in the foregoing substituent X, each independently represents a hydrogen atom or a monovalent substituent and such a monovalent substituent may be the same as that defined above in connection with the foregoing substituents $R_1$ and $R_2$ appearing in the general formula (iii).

In particular, $R^3$ preferably represents a substituted or unsubstituted alkyl, alkenyl, alkynyl, aryl or heterocyclic group. Moreover, $R^3$ preferably has at least one of the groups —$CO_2$— and/or —CON($R^8$)— in the structure thereof. In this respect, the most preferred structure of the substituent $R^3$ is one having an ester structure represented by the following formula (iii-1), or one having an amide structure represented by the following formula (iii-2), with the structure having an amide structure represented by the formula (iii-2) being particularly preferred.

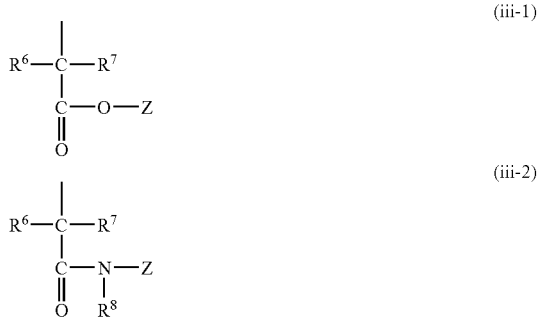

In the foregoing Formulas, $R^6$, $R^7$ and $R^8$ each independently represents a hydrogen atom or a monovalent substituent; and Z represents a monovalent substituent. Such monovalent substituents are the same as those specified above in connection with the substituent $R^1$ or $R^2$ appearing in the foregoing general formula (iii).

The following compounds (1) to (72) are specific examples of those represented by the general formula (iii) and suitably used in the present invention, but the present invention is not restricted to these specific examples at all:

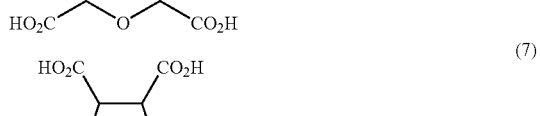

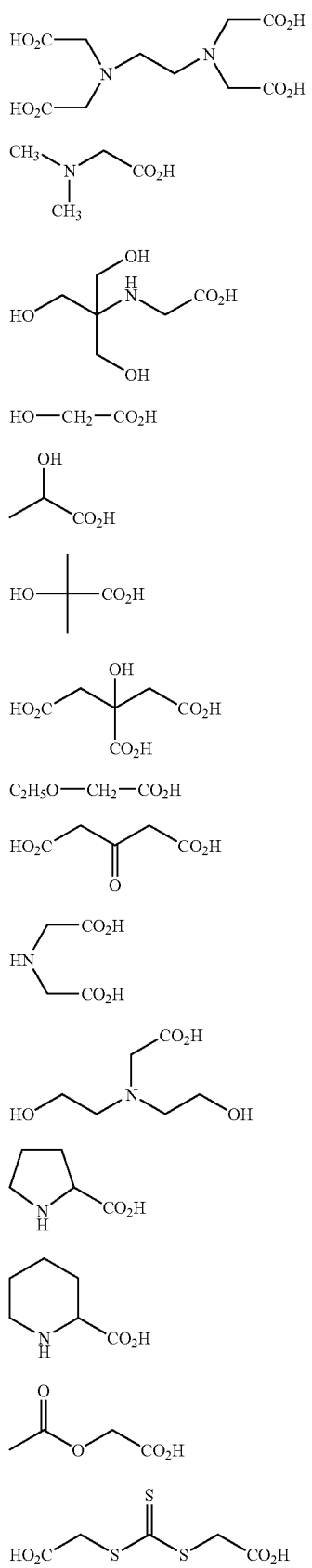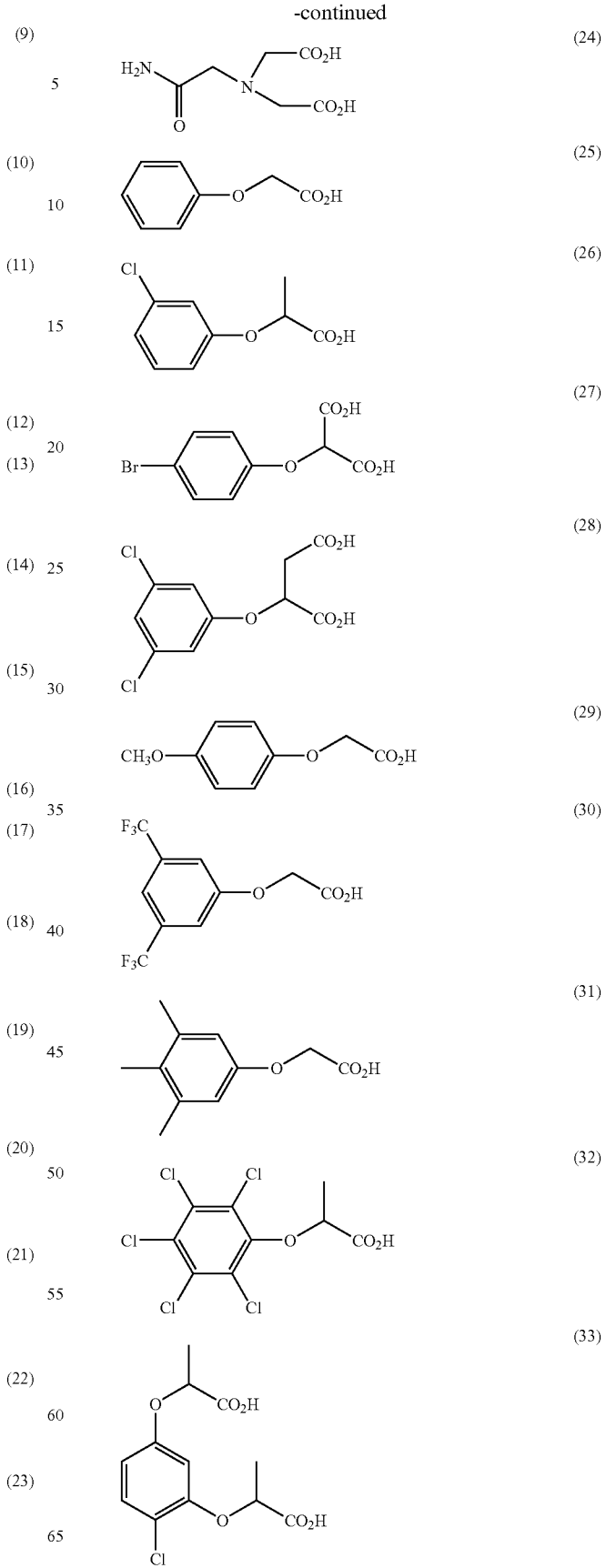

-continued
(34) 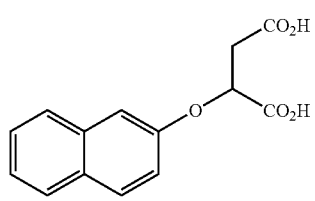
(35) 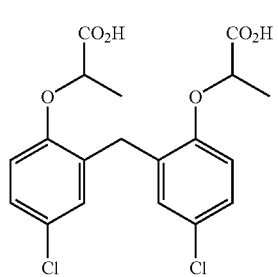
(36) 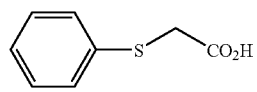
(37) 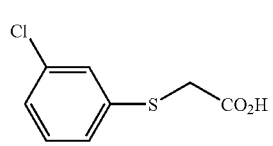
(38) 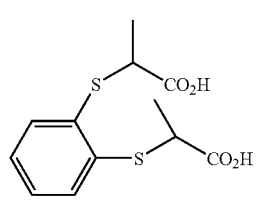
(39) 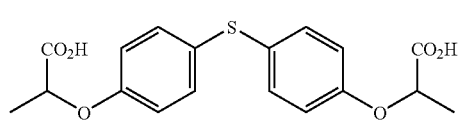
(40) 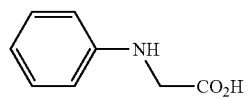
(41) 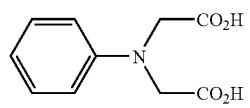
(42) 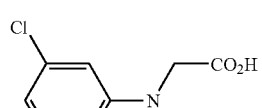
(43) 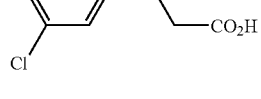
-continued
(44) 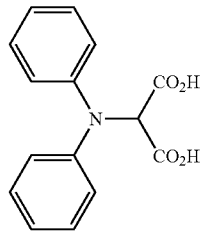
(45) 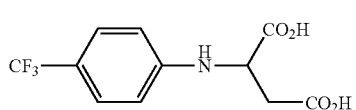
(46) 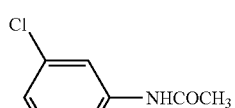
(47) 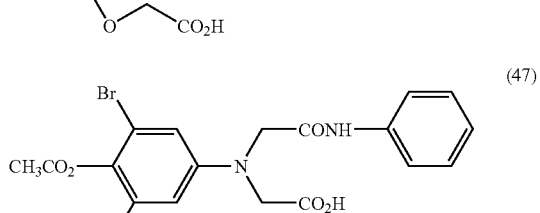
(48) 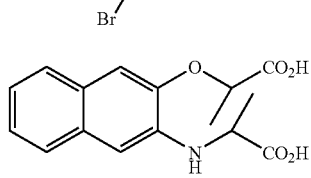
(49) 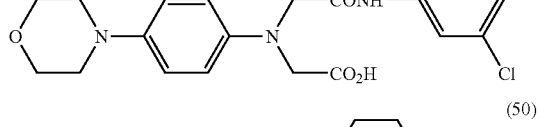
(50) 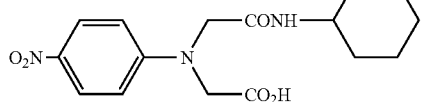
(51) 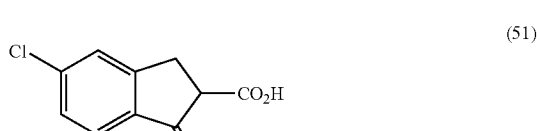
(52) 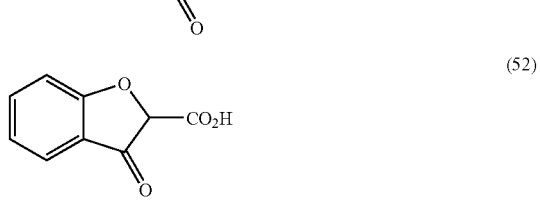

-continued
(53) 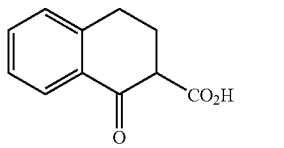
(54) 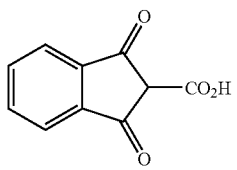
(55) 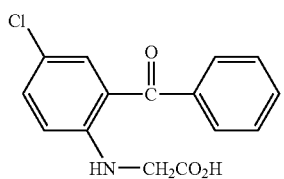
(56) 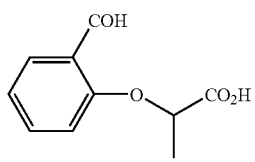
(57) 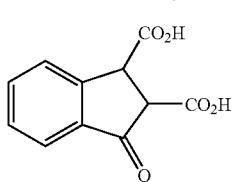
(58) 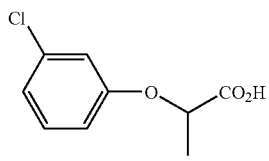
(59) 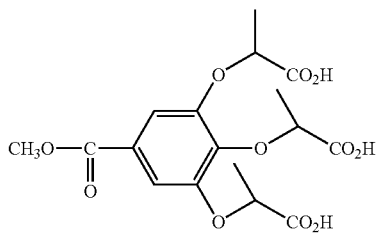
(60) 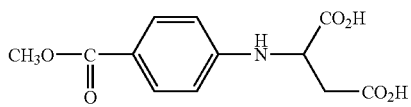
(61) 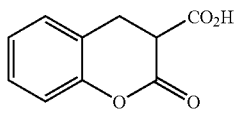
(62) 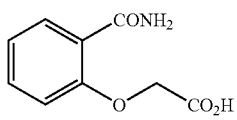
-continued
(63) 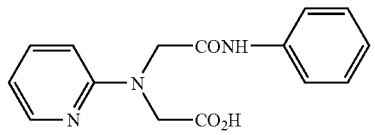
(64) 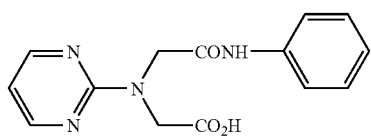
(65) 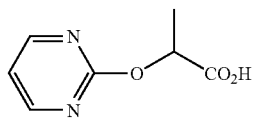
(66) 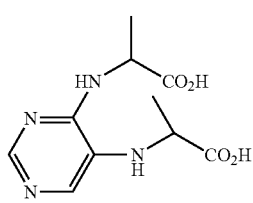
(67) 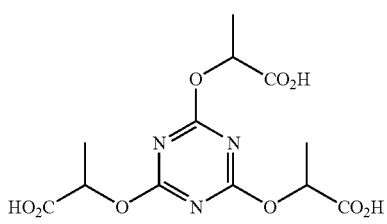
(68) 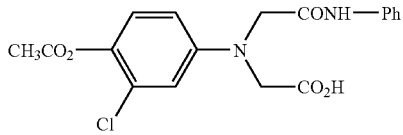
(69) 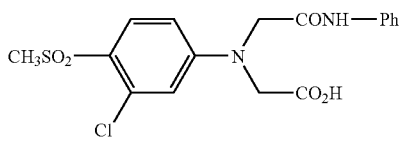
(70) 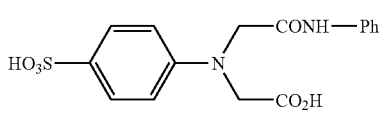
(71) 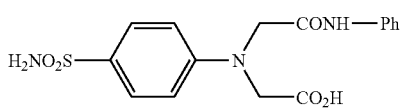
(72) 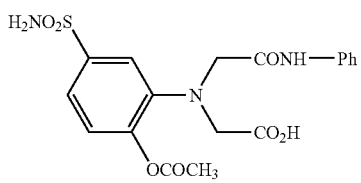
The following [Compounds (A-1) to (A-87)] are specific examples of the mono-carboxylic acid compounds represented by the general formula (iii), but the present invention is not likewise restricted to these specific examples at all:
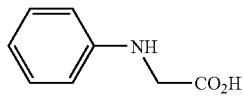 (A-1)
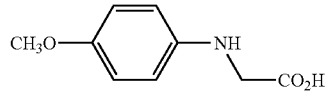 (A-2)
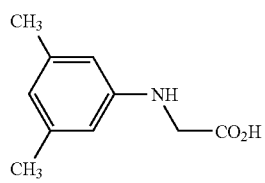 (A-3)
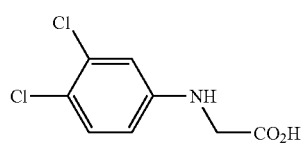 (A-4)
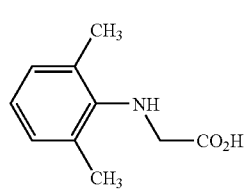 (A-5)
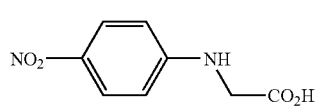 (A-6)
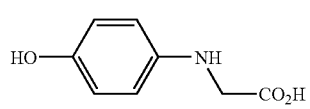 (A-7)
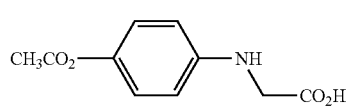 (A-8)
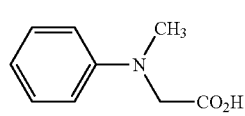 (A-9)
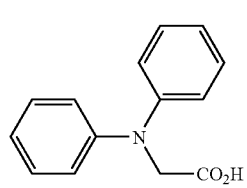 (A-10)
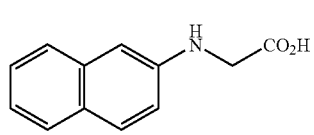 (A-11)
-continued
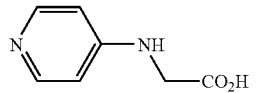 (A-12)
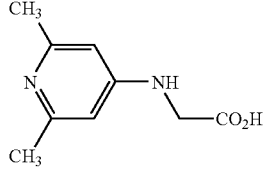 (A-13)
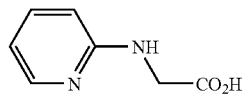 (A-14)
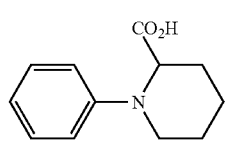 (A-15)
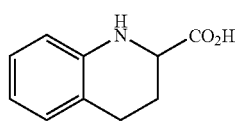 (A-16)
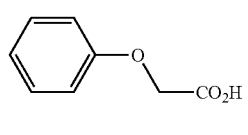 (A-17)
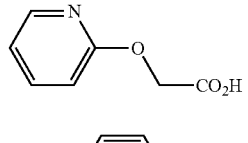 (A-18)
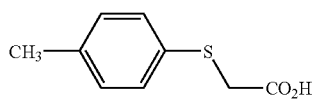 (A-19)
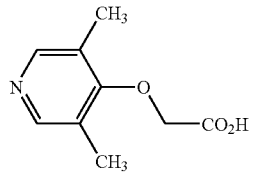 (A-20)
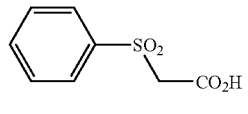 (A-21)
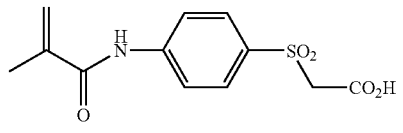 (A-22)
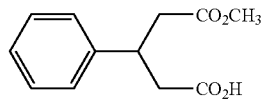 (A-23)

-continued
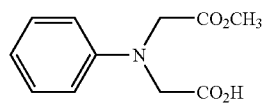 (A-24)
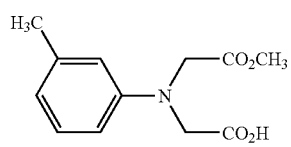 (A-25)
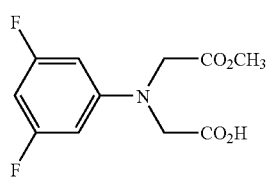 (A-26)
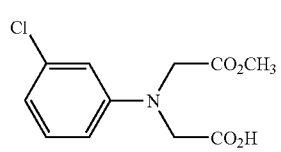 (A-27)
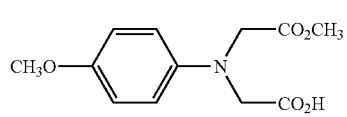 (A-28)
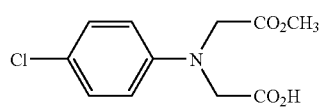 (A-29)
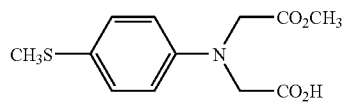 (A-28)
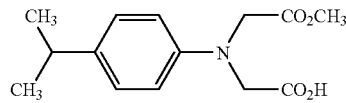 (A-29)
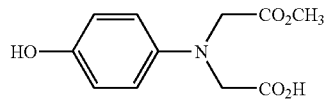 (A-30)
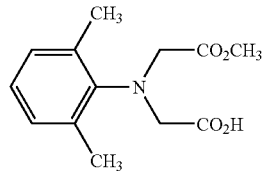 (A-31)
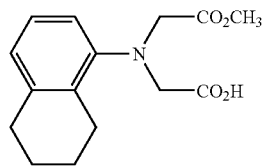 (A-32)
-continued
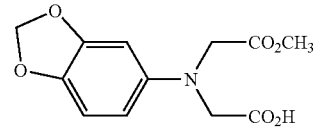 (A-33)
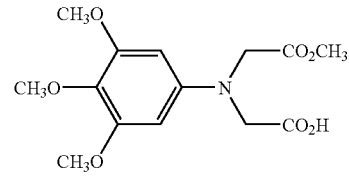 (A-34)
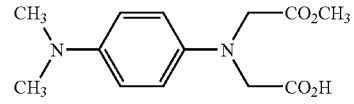 (A-35)
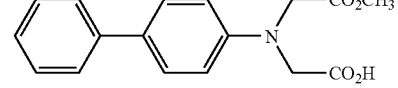 (A-36)
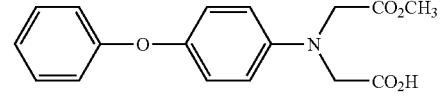 (A-37)
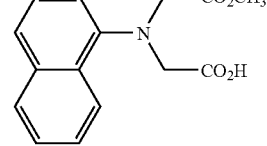 (A-38)
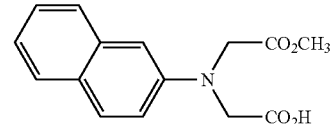 (A-39)
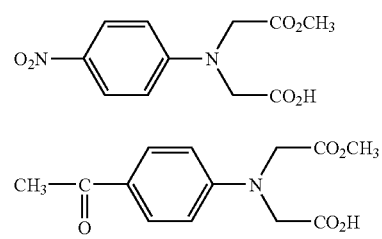 (A-40)
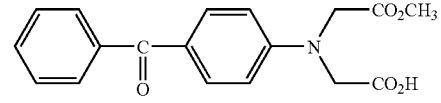 (A-41)
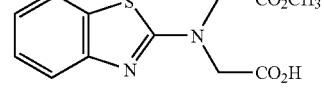 (A-42)
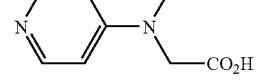 (A-43)
 (A-44)

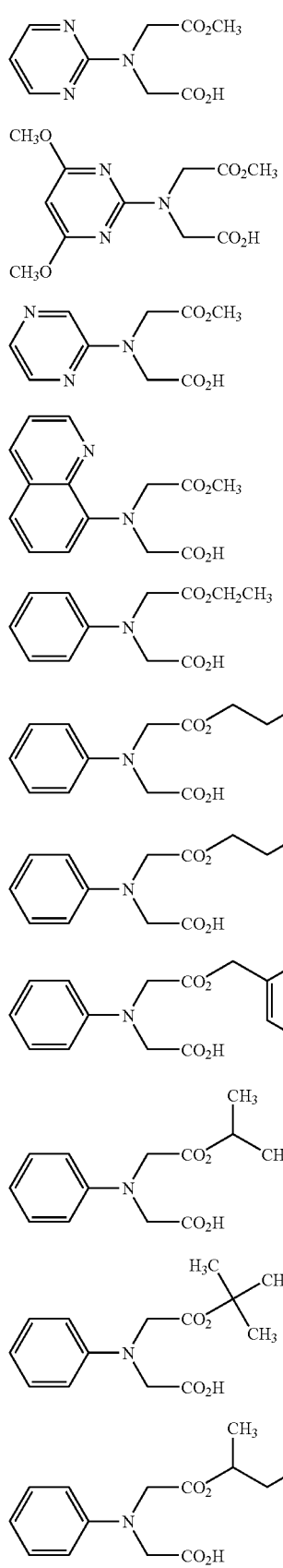
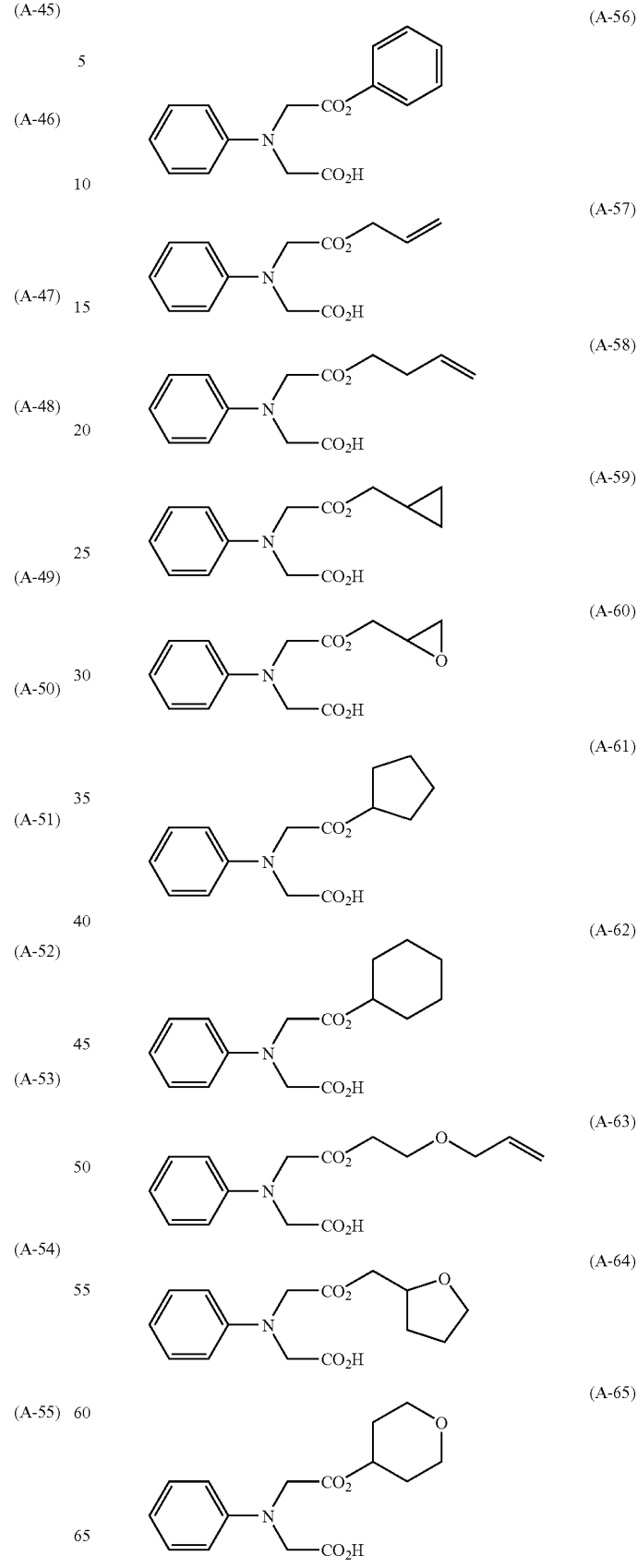

-continued

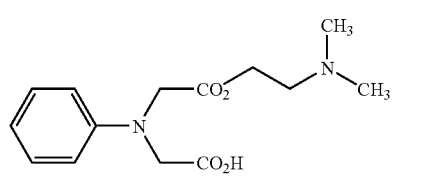 (A-66)

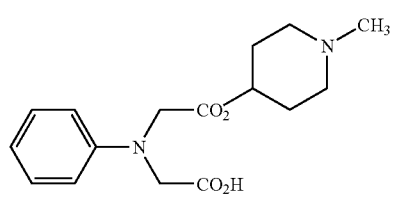 (A-67)

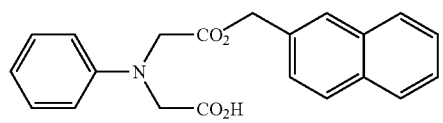 (A-76)

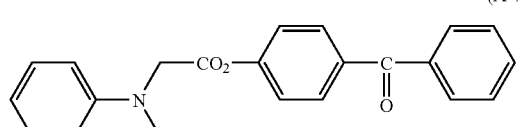 (A-77)

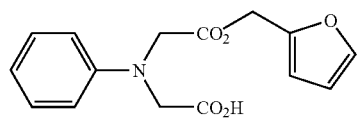 (A-78)

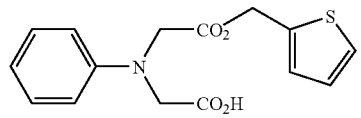 (A-79)

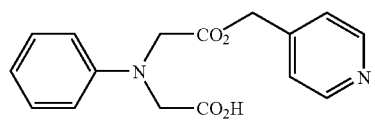 (A-80)

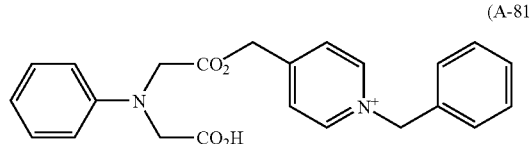 (A-81)

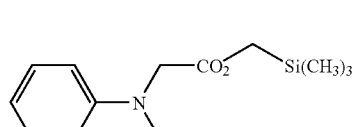 (A-82)

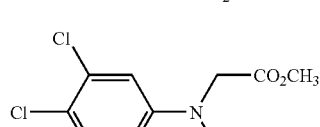 (A-83)

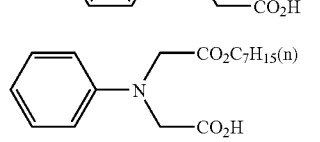 (A-84)

-continued

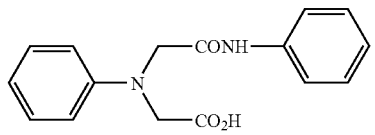 (A-85)

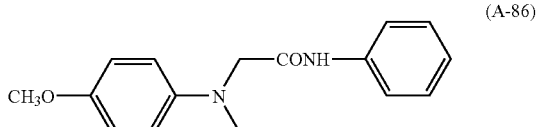 (A-86)

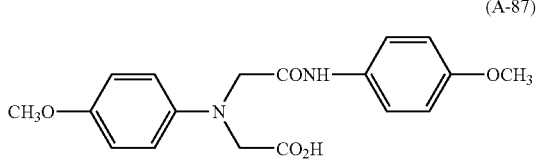 (A-87)

Then the method for preparing the foregoing compound (46) will be described below as a typical example of the synthesis of the compound represented by the general formula (iii) according to the present invention, but the present invention is not likewise restricted to these specific examples at all:

[Synthesis of Compound (46)]

To a 200 mL volume round-bottomed flask, there were added 9.9 g of methyl 3-hydroxybenzoate and 8.4 g of methyl 2-chloropropionate, followed by the addition of 65 mL of N,N-dimethyl-acetamide. After the addition of 5.8 g of potassium carbonate and 2.8 g of potassium iodide to the flask, the latter was heated to 100° C. After the continuation of the reaction over 10 hours, the reaction solution was poured into 300 mL of water and then extracted with 300 mL of ethyl acetate. The organic solvent of the extract was distilled off under reduced pressure to give a residue in an amount of 14.5 g. Apart (7.2 g) of the resulting residue was introduced into a 100 mL volume round-bottomed flask, then there were added thereto 8 mL of water and 8 mL of methanol and then the resulting mixture was cooled to 0° C. To the mixture, there was added 2.4 g of sodium hydroxide and they were reacted at room temperature for 12 hours. The reaction solution was poured into 200 mL of water and the pH value thereof was adjusted to 2 with a hydrochloric acid solution. The resulting precipitates were filtered off to thus give 5.0 g of the target compound (46). The product was confirmed to be the target one according to the NMR spectroscopic, IR spectroscopic and mass spectroscopic analyses.

Moreover, other preferred compounds represented by the general formula (iii) likewise include, for instance, those each having a structure represented by the following general formula (iii-3) wherein the substituent A as an aromatic or heterocyclic group is combined with a plurality of groups each represented by Formula (iii) from which A is eliminated:

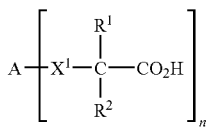 (iii-3)

In Formula (iii-3), A, $R^1$ and $R^2$ are the same as those defined above in connection with Formula (iii), respectively, but at least one of $R^1$ and $R^2$ represent a carboxyl group, an alkyl group having 1 to 10 carbon atoms or an alkyl group having 1 to 10 carbon atoms and having a carboxyl group at the terminal thereof. In addition, n is an integer ranging from 2 to 6.

Compounds of General Formula (iv):

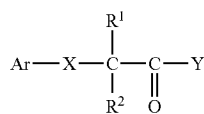 (iv)

In Formula (iv), Ar represents an aromatic group or a heterocyclic group, X represents —O—, —S—, —SO$_2$—, or —N(R$^3$)—, $R^1$, $R^2$ and $R^3$ each independently represents a hydrogen atom or a monovalent substituent comprising non-metallic atoms, and Y represents —OR$^4$ or —NR$^5$R$^6$, wherein $R^4$ represents a monovalent substituent comprising non-metallic atoms, other than a hydroxyl group, and $R^5$ and $R^6$ each independently represents a hydrogen atom or a monovalent substituent comprising non-metallic atoms.

Incidentally, in the present invention, the substituent Y appearing in Formula (iv) is preferably —NR$^5$R$^6$ and more preferably, the substituent X appearing in Formula (iv) is —N(R$^3$)— and the substituent Y appearing therein is —NR$^5$R$^6$.

The aromatic group represented by Ar may be, for instance, a benzene ring, a fused ring formed from 2 to 3 benzene rings or a fused ring formed from a benzene ring and a 5-membered unsaturated ring and specific examples thereof include a phenyl group, a naphthyl group, an anthryl group, a phenanthryl group, an indenyl group, an acenaphthenyl group and a fluorenyl group, with the phenyl group and the naphthyl group being more preferably used herein.

These aromatic groups may have substituents and such a substituent may be, for instance, a monovalent non-metallic atomic group other than a hydrogen atom. Examples of such substituents preferably used herein are alkyl groups and substituted alkyl groups as well as those for the substituted alkyl groups, as will be detailed later.

In addition, examples of the foregoing heterocyclic groups represented by Ar are groups derived from pyrrole rings, furan rings, thiophene rings, benzo-pyrrole rings, benzo-furan rings, benzo-thiophene rings, pyrazole rings, isoxazole rings, isothiazole rings, indazole rings, benzo-isoxazole rings, benzo-isothiazole rings, imidazole rings, oxazole rings, thiazole rings, benzimidazole rings, benzoxazole rings, benzothiazole rings, pyridine rings, quinoline rings, isoquinoline rings, pyridazine rings, pyrimidine rings, pyrazine rings, phthalazine rings, quinazoline rings, quinoxaline rings, aziridine rings, phenanthridine rings, carbazole rings, purine rings, pyran rings, piperidine rings, piperazine rings, morpholine rings, indole rings, indolizine rings, chromene rings, cinnoline rings, acridine rings, phenothiazine rings, tetrazole rings and triazine rings. Among them, particularly preferred are those derived from furan rings, thiophene rings, imidazole rings, thiazole rings, benzothiazole rings, pyridine rings, indole rings and acridine rings.

Moreover, these heterocyclic groups may have substituents and such a substituent may be, for instance, a monovalent non-metallic atomic group other than a hydrogen atom. Examples of such substituents preferably used herein are alkyl groups and substituted alkyl groups as well as those for the substituted alkyl groups, as will be detailed later.

Examples of the monovalent substituent comprising non-metallic atoms represented by $R^1$ and $R^2$ appearing in Formula (iv) are halogen atoms, amino groups which may have substituents, alkoxycarbonyl groups, hydroxyl group, ether groups, thiol groups, thio-ether groups, silyl groups, nitro group, cyano groups, and alkyl, alkenyl, alkynyl, aryl and heterocyclic groups which may have substituents.

Further, examples of the monovalent substituent comprising nonmetallic atoms represented by $R^3$, $R^4$, $R^5$ and $R^6$ are alkyl, alkenyl, alkynyl, aryl and heterocyclic groups which may have substituents, respectively.

Such alkyl groups represented by the foregoing substituents $R^1$, $R^2$, $R^3$, $R^4$, $R^5$ and $R^6$ may be, for instance, linear, branched and cyclic alkyl groups having 1 to 20 carbon atoms and specific examples thereof are methyl, ethyl, propyl, butyl, pentyl, hexyl, heptyl, octyl, nonyl, decyl, undecyl, dodecyl, tridecyl, hexadecyl, octadecyl, eicosyl, isopropyl, isobutyl, s-butyl, t-butyl, isopentyl, neopentyl, 1-methylbutyl, isohexyl, 2-ethylhexyl, 2-methylhexyl, cyclohexyl, cyclopentyl and 2-norbornyl groups. Among them, preferably used herein are linear alkyl groups having 1 to 12 carbon atoms, branched alkyl groups having 3 to 12 carbon atoms and cyclic alkyl groups having 5 to 10 carbon atoms.

The substituents with which these alkyl groups can be substituted may be monovalent ones each comprising non-metallic atoms, other than hydrogen atom and specific examples thereof preferably used herein are a halogen atom (such as —F, —Br, —Cl, —I); a hydroxyl group, an alkoxy group, an aryloxy group, a mercapto group, an alkylthio group, an arylthio group, an alkyldithio group, an aryldithio group, an amino group, an N-alkylamino group, an N,N-dialkylamino group, an N-arylamino group, an N,N-di-arylamino group, an N-alkyl-N-arylamino group, an acyloxy group, a carbamoyloxy group, an N-alkyl-carbamoyloxy group, an N-aryl-carbamoyloxy group, an N,N-dialkyl-carbamoyloxy group, an N,N-diaryl-carbamoyloxy group, an N-alkyl-N-aryl-carbamoyloxy group, an alkylsulfoxy group, an arylsulfoxy group, an acylthio group, an acylamino group, an N-alkyl-acylamino group, an N-aryl-acylamino group, a ureido group, an N'-alkylureido group, an N',N'-di-alkylureido group, an N'-arylureido group, an N',N'-di-arylureido group, an N'-alkyl-N'-aryl-ureido group, an N-alkylureido group, an N-arylureido group, an N'-alkyl-N-alkyl-ureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkyl-ureido group, an N',N'-diaryl-N-aryl-ureido group, an N'-alkyl-N'-aryl-N-alkylureido group, an N'-alkyl-N'-aryl-N-aryl-ureido group, an alkoxy-carbonylamino group, an aryloxy-carbonylamino group, an N-alkyl-N-alkoxy-carbonylamino group, an N-alkyl-N-aryloxy-carbonylamino group, an N-aryl-N-alkoxy-carbonylamino group, an N-aryl-N-aryloxy-carbonylamino group, a formyl group, an acyl group, a carboxyl group, an alkoxycarbonyl group, an aryloxycarbonyl group, a carbamoyl group, an N-alkyl-carbamoyl group, an N,N-di-alkyl-carbamoyl group, an N-aryl-carbamoyl group, an N,N-diaryl-carbamoyl group, an N-alkyl-N-aryl-carbamoyl group, an alkyl-sulfinyl group, an aryl-sulfinyl group, an alkylsulfonyl group, an arylsulfonyl group, a sulfo group (—SO$_3$H) and a conjugated base group thereof (hereinafter referred to as "sulfonate group"), an alkoxy-sulfonyl group, an aryloxy-sulfonyl group, a sulfinamoyl group, an N-alkyl-sulfinamoyl group, an N,N-di-alkyl-sulfinamoyl group, an N-aryl-sulfinamoyl group, an N,N-diaryl-sulfinamoyl group, an N-alkyl-N-aryl-sulfinamoyl group, a sulfamoyl group, an N-alkyl-sulfamoyl group, an N,N-dialkyl-sulfamoyl group, an N-aryl-sulfamoyl group, an N,N-diaryl-sulfamoyl group, an N-alkyl-N-aryl-sulfamoyl group, a phosphono group ($—PO_3H_2$) and a conjugated base group thereof (hereinafter referred to as "phosphonate group"), a dialkyl-phosphono group ($—PO_3(alkyl)_2$), a diaryl-phosphono group ($—PO_3(aryl)_2$), an alkylaryl-phosphono group ($—PO_3(alkyl)(aryl)$), a monoalkyl-phosphono group ($—PO_3H(alkyl)$) and a conjugated base group thereof (hereinafter referred to as "alkyl phosphonate group"), a monoaryl-phosphono group ($—PO_3H(aryl)$) and a conjugated base group thereof (hereinafter referred to as "aryl phosphonate group"), a phosphono-oxy group ($—OPO_3H_2$) and a conjugated base group thereof (hereinafter referred to as "phosphonate oxy group"), a dialkyl-phosphono-oxy group ($—OPO_3H(alkyl)_2$), a diaryl-phosphono-oxy group ($—OPO_3(aryl)_2$), an alkylaryl-phosphono-oxy group ($—OPO_3(alkyl)(aryl)$), a mono-alkyl-phosphono-oxy group ($—OPO_3H(alkyl)$) and a conjugated base group thereof (hereinafter referred to as "alkyl phosphonate oxy group"), a monoaryl-phosphono-oxy group ($—OPO_3H(aryl)$) and a conjugated base group thereof (hereinafter referred to as "aryl phosphonate oxy group"), a cyano group, a nitro group, an aryl group, an alkenyl group, an alkynyl group, a heterocyclic group and a silyl group.

Specific examples of the alkyl group present in these substituents include the above-described alkyl groups and specific examples of the aryl group include a phenyl group, a biphenyl group, a naphthyl group, a tolyl group, a xylyl group, a mesityl group, a cumenyl group, a chlorophenyl group, a bromophenyl group, a chloromethyl-phenyl group, a hydroxyphenyl group, a methoxy-phenyl group, an ethoxy-phenyl group, a phenoxy-phenyl group, an acetoxy-phenyl group, a benzoyl-oxy-phenyl group, a methylthio-phenyl group, a phenylthio-phenyl group, a methyl-aminophenyl group, a dimethyl-aminophenyl group, an acetyl-aminophenyl group, a carboxyphenyl group, a methoxy-carbonyl-phenyl group, an ethoxy-carbonylphenyl group, a phenoxy-carbonylphenyl group, an N-phenyl-carbamoyl-phenyl group, a cyanophenyl group, a sulfophenyl group, a sulfonate phenyl group, a phosphono-phenyl group and a phosphonate phenyl group.

In addition, examples of the alkenyl group include a vinyl group, a 1-propenyl group, a 1-butenyl group, a cinnamyl group and a 2-chloro-1-ethenyl group and examples of the alkynyl group include an ethynyl group, a 1-propynyl group, a 1-butynyl group and a trimethyl-silyl-ethynyl group.

$R^{01}$ in the acyl group ($R^{01}CO—$) may be a hydrogen atom or the above-described alkyl or aryl group. Among these substituents, more preferably used herein are a halogen atom (such as —F, —Br, —Cl, —I); an alkoxy group, an aryloxy group, an alkylthio group, an arylthio group, an N-alkylamino group, an N,N-dialkylamino group, an acyloxy group, an N-alkyl-carbamoyloxy group, an N-aryl-carbamoyloxy group, an acylamino group, a formyl group, an acyl group, a carboxyl group, an alkoxy-carbonyl group, an aryloxy-carbonyl group, a carbamoyl group, an N-alkyl-carbamoyl group, an N,N-dialkyl-carbamoyl group, an N-aryl-carbamoyl group, an N-alkyl-N-aryl-carbamoyl group, a sulfo group, a sulfonate group, a sulfamoyl group, an N-alkyl-sulfamoyl group, an N,N-dialkyl-sulfamoyl group, an N-aryl-sulfamoyl group, an N-alkyl-N-aryl-sulfamoyl group, a phosphono group, a phosphonate group, a dialkyl-phosphono group, a diaryl-phosphono group, a monoalkyl-phosphono group, an alkyl-phosphonate group, a monoaryl-phosphono group, an aryl-phosphonate group, a phosphono-oxy group, a phosphonate-oxy group, an aryl group and an alkenyl group.

Examples of the heterocyclic group are a pyridyl group and a piperidyl group. The silyl group may be, for instance, a trimethyl silyl group.

On the other hand, the alkylene group in the substituted alkyl group includes a divalent organic residue formed through the elimination of any one of hydrogen atoms present on the above-described alkyl group having from 1 to 20 carbon atoms and preferred are a linear alkylene group having from 1 to 12 carbon atoms, a branched alkylene group having from 3 to 12 carbon atoms and a cyclic alkylene group having from 5 to 10 carbon atoms. Specific preferred examples of the substituted alkyl group formed through the combination of such a substituent with an alkylene group include a chloromethyl group, a bromomethyl group, a 2-chloro-ethyl group, a trifluoromethyl group, a methoxy-methyl group, an isopropoxy-methyl group, a butoxy-methyl group, an s-butoxy-butyl group, a methoxy-ethoxy-ethyl group, an allyloxy-methyl group, a phenoxy-methyl group, a methyl-thio-methyl group, a tolylthio-methyl group, a pyridyl-methyl group, tetramethyl-piperidinyl-methyl group, an N-acetyl-tetramethyl-piperidinyl-methyl group, a trimethylsilyl-methyl group, a methoxy-ethyl group, an ethylamino-ethyl group, a diethyl-aminopropyl group, a morpholino-propyl group, an acetyl-oxy-methyl group, a benzoyloxy-methyl group, an N-cyclohexyl-carbamoyl-oxyethyl group, an N-phenyl-carbamoyloxy-ethyl group, an acetyl-aminoethyl group, an N-methyl-benzoyl-aminopropyl group, a 2-oxoethyl group, a 2-oxopropyl group, a carboxy-propyl group, a methoxycarbonyl-ethyl group, an allyloxy-carbonyl-butyl group, a chlorophenoxy-carbonyl-methyl group, a carbamoyl-methyl group, an N-methyl-carbamoyl-ethyl group, an N,N-dipropyl-carbamoylmethyl group, an N-(methoxy-phenyl)carbamoylethyl group, an N-methyl-N-(sulfophenyl)carbamoylmethyl group, a sulfobutyl group, a sulfonate butyl group, a sulfamoyl-butyl group, an N-ethyl-sulfamoyl-methyl group, an N,N-dipropyl-sulfamoylpropyl group, an N-tolyl-sulfamoyl-propyl group, an N-methyl-N-(phosphono-phenyl)sulfamoyl-octyl group, a phosphono-butyl group, a phosphonate hexyl group, a diethyl-phosphono-butyl group, a diphenyl-phosphono-propyl group, a methyl-phosphono-butyl group, a methyl phosphonate butyl group, a tolyl-phosphono-hexyl group, a tolyl-phosphonate hexyl group, a phosphono-oxypropyl group, a phosphonate oxybutyl group, a benzyl group, a phenethyl group, an α-methyl-benzyl group, a 1-methyl-1-phenyl-ethyl group, a p-methylbenzyl group, a cinnamyl group, an allyl group, a 1-propenyl-methyl group, a 2-butenyl group, a 2-methylallyl group, a 2-methyl-propenyl-methyl group, a 2-propynyl group, a 2-butynyl group and a 3-butynyl group.

The aryl group includes, for instance, a benzene ring, a fused ring formed from 2 to 3 benzene rings and a fused ring formed from a benzene ring and a 5-membered unsaturated ring and specific examples thereof include a phenyl group, a naphthyl group, an anthryl group, a phenanthryl group, an indenyl group, an acenaphthenyl group and a fluorenyl group, with phenyl and naphthyl groups being more preferably used herein.

The substituted aryl group is constructed by bonding a substituent such as a monovalent non-metallic atomic group other than a hydrogen atom onto a ring-forming carbon atom of the foregoing aryl group. Examples of such substituents preferably used herein are alkyl groups and substituted alkyl groups listed above as well as those specified above in connection with the substituted alkyl groups.

Specific examples of the substituted aryl group preferably used in the present invention include a biphenyl group, a tolyl group, a xylyl group, a mesityl group, a cumenyl group, a chlorophenyl group, a bromophenyl group, a fluorophenyl group, a chloromethyl-phenyl group, a trifluoromethyl-phenyl group, a hydroxy-phenyl group, a methoxyphenyl group, a methoxy-ethoxyphenyl group, an allyloxy-phenyl group, a phenoxy-phenyl group, a methyl-thiophenyl group, a tolylthio-phenyl group, an ethylamino-phenyl group, a diethyl-aminophenyl group, a morpholino-phenyl group, an acetyloxy-phenyl group, a benzoyloxy-phenyl group, an N-cyclohexyl-carbamoyloxy-phenyl group, an N-phenyl-carbamoyloxy-phenyl group, an acetylamino-phenyl group, an N-methyl-benzoyl-aminophenyl group, a carboxy-phenyl group, a methoxycarbonyl-phenyl group, an allyloxy-carbonylphenyl group, a chlorophenoxy-carbonylphenyl group, a carbamoyl-phenyl group, an N-methyl-carbamoylphenyl group, an N,N-dipropyl-carbamoylphenyl group, an N-(methoxy-phenyl)carbamoyl-phenyl group, an N-methyl-N-(sulfophenyl)carbamoyl-phenyl group, a sulfophenyl group, a sulfonate phenyl group, a sulfamoylphenyl group, an N-ethyl-sulfamoylphenyl group, an N,N-dipropyl-sulfamoylphenyl group, an N-tolyl-sulfamoylphenyl group, an N-methyl-N-(phosphono-phenyl)sulfamoyl-phenyl group, a phosphonophenyl group, a phosphonate phenyl group, a diethyl-phosphonophenyl group, a diphenyl-phosphonophenyl group, a methyl-phosphono-phenyl group, a methyl phosphonate phenyl group, a tolyl-phosphonophenyl group, a tolyl phosphonate phenyl group, an allyl phenyl group, a 1-propenylmethyl phenyl group, 2-butenyl phenyl group, a 2-methylallyl-phenyl group, a 2-methylpropenyl-phenyl group, a 2-propynylphenyl group, a 2-butynyl-phenyl group and a 3-butynyl-phenyl group.

The alkenyl, substituted alkenyl, alkynyl and substituted alkynyl groups ($-C(R^{02})=C(R^{03})(R^{04})$ and $-C\equiv C(R^{05})$) usable herein may be those represented by these general formulas in which $R^{02}$, $R^{03}$, $R^{04}$ and $R^{05}$ each independently represents a monovalent nonmetallic atomic group. Preferred examples of these substituents: $R^{02}$, $R^{03}$, $R^{04}$ and $R^{05}$ are a hydrogen atom, a halogen atom, an alkyl group, a substituted alkyl group, an aryl group and a substituted aryl group. Specific examples thereof are those listed above in connection with such substituents. Examples of $R^{02}$, $R^{03}$, $R^{04}$ and $R^{05}$ more preferably used herein are a hydrogen atom, a halogen atom or a linear, branched or cyclic alkyl group having 1 to 10 carbon atoms.

Specific examples of the these alkenyl, substituted alkenyl, alkynyl and substituted alkynyl groups preferably used herein are vinyl, 1-propenyl, 1-butenyl, 1-pentenyl, 1-hexenyl, 1-octenyl, 1-methyl-1-propenyl, 2-methyl-1-propenyl, 2-methyl-1-butenyl, 2-phenyl-1-ethenyl, 2-chloro-1-ethenyl, ethynyl, 1-propynyl, 1-butynyl and phenyl-ethynyl groups.

Examples of the heterocyclic group are those listed above in connection with the substituents for the substituted alkyl groups such as pyridyl groups.

The foregoing substituted oxy group ($R^{06}O-$) may be, for instance, those in which $R^{06}$ represents a monovalent nonmetallic atomic group other than a hydrogen atom. Preferred substituted oxy groups are, for instance, alkoxy, aryloxy, acyloxy, carbamoyloxy, N-alkyl-carbamoyloxy, N-aryl-carbamoyloxy, N,N-dialkyl-carbamoyl-oxy, N,N-diaryl-carbamoyloxy, N-alkyl-N-aryl-carbamoyloxy, alkylsufoxy, aryl-sulfoxy, phosphono-oxy and phosphonate-oxy groups. The alkyl and aryl groups present in these substituted oxy groups may be the alkyl, substituted alkyl, aryl and substituted aryl groups listed above. In addition, the acyl group ($R^{07}CO-$) in the acyloxy group may be those in which $R^{07}$ is an alkyl, substituted alkyl, aryl or substituted aryl group as has been described above. Among these substituents, more preferably used herein are, for instance, alkoxy, aryloxy, acyloxy and arylsulfoxy groups. Specific examples of the substituted oxy groups preferably used in the invention are methoxy, ethoxy, propyloxy, isopropyloxy, butyloxy, pentyloxy, hexyloxy, dodecyloxy, benzyloxy, allyloxy, phenethyloxy, carboxyethyl-oxy, methoxy-carbonylethyl-oxy, ethoxy-carbonylethyl-oxy, methoxy-ethoxy, phenoxy-ethoxy, methoxy-ethoxy-ethoxy, ethoxy-ethoxy-ethoxy, morpholino-ethoxy, morpholino-propyloxy, allyloxy-ethoxy-ethoxy, phenoxy, tolyloxy, xylyl-oxy, mesityl-oxy, cumenyl-oxy, methoxyphenyloxy, ethoxy-phenyloxy, chloro-phenyloxy, bromophenyloxy, acetyloxy, benzoyloxy, naphthyloxy, phenyl-sulfonyloxy, phosphono-oxy and phosphonate-oxy groups.

The substituted amino group ($R^{08}NH-$; $(R^{09})(R^{010})N-$) included in the amide group may be, for instance, those in which the substituents $R^{08}$, $R^{09}$ and $R^{010}$ each represents a monovalent nonmetallic atomic group other than a hydrogen atom. In this respect, $R^{09}$ and $R^{010}$ may be bonded together to form a ring. Examples of the substituted amino group preferably used herein are N-alkylamino, N,N-dialkyl-amino, N-arylamino, N,N-diaryl-amino, N-alkyl-N-arylamino, acylamino, N-alkyl-acylamino, N-aryl-acylamino, ureido, N'-alkyl-ureido, N',N'-dialkyl-ureido, N'-aryl-ureido, N',N'-diaryl-ureido, N'-alkyl-N'-aryl-ureido, N-alkyl-ureido, N-aryl-ureido, N'-alkyl-N-alkyl-ureido, N'-alkyl-N-aryl-ureido, N',N'-dialkyl-N-alkyl-ureido, N',N'-dialkyl-N'-aryl-ureido, N'-aryl-N-alkyl-ureido, N'-aryl-N-aryl-ureido, N',N'-diaryl-N-alkylureido, N',N'-diaryl-N-aryl-ureido, N'-alkyl-N'-aryl-N-alkylureido, N'-alkyl-N'-aryl-N-arylureido, alkoxycarbonyl-amino, aryloxy-carbonylamino, N-alkyl-N-alkoxycarbonylamino, N-alkyl-N-aryloxycarbonyl-amino, N-aryl-N-alkoxy-carbonyl-amino and N-aryl-N-aryloxycarbonyl-amino groups. The alkyl and aryl groups present in these substituted amino groups may be the alkyl, substituted alkyl, aryl and substituted aryl groups listed above, and the substituent $R^{07}$ of the acyl group ($R^{07}CO-$) in the acylamino, N-alkyl-acylamino and N-aryl-acylamino groups may be the same as those specified above. Among them, more preferably used herein are N-alkylamino, N,N-dialkylamino, N-arylamino, and acylamino groups. Specific examples of the substituted amino group preferably used in the invention are methylamino, ethylamino, diethylamino, morpholino, piperidino, pyrrolidino, phenylamino, benzoylamino and acetylamino groups.

The substituted sulfonyl ($R^{011}-SO_2-$) usable herein may be those in which the substituent $R^{011}$ represents a monovalent nonmetallic atomic group. More preferred examples thereof are alkylsulfonyl and arylsulfonyl groups. The alkyl and aryl groups present in these substituted sulfonyl groups may be the alkyl, substituted alkyl, aryl and substituted aryl groups specified above. Specific examples of such substituted sulfonyl group include butyl-sulfonyl, phenylsulfonyl, and chloro-phenylsulfonyl groups.

The sulfonate group ($-SO_3-$) herein used means, as has been described above, an anionic conjugated base group derived from a sulfo group ($-SO_3H$) and preferably this is usually used in combination with a counter cation. The counter cation includes commonly known ones and, more specifically, various oniums (e.g., ammoniums, sulfoniums, phosphoniums, iodoniums, aziniums) and metal ions (e.g., $Na^+$, $K^+$, $Ca^{2+}$, $Zn^{2+}$).

The substituted carbonyl ($R^{013}-CO-$) usable herein may be those in which the substituent $R^{013}$ represents a monovalent nonmetallic atomic group. Preferred examples thereof are formyl, acyl, carboxyl, alkoxycarbonyl, aryloxycarbonyl, carbamoyl, N-alkyl-carbamoyl, N,N-dialkyl-carbamoyl, N-aryl-carbamoyl, N,N-di-aryl-carbamoyl and N-alkyl-N'-aryl-carbamoyl groups. The alkyl and aryl groups present in these substituted carbonyl groups may be the alkyl, substituted alkyl, aryl and substituted aryl groups specified above. Among them, examples thereof more preferably used in the present invention are formyl, acyl, carboxyl, alkoxy-carbonyl, aryloxycarbonyl, carbamoyl, N-alkyl-carbamoyl, N,N-dialkyl-carbamoyl and N-aryl-carbamoyl groups and still more preferably used herein are formyl, acyl, alkoxycarbonyl and aryloxycarbonyl groups. Specific examples thereof preferably used in the invention include formyl, acetyl, benzoyl, carboxyl, methoxycarbonyl, ethoxycarbonyl, allyloxy-carbonyl, dimethylamino-phenylethenyl-carbonyl, methoxycarbonyl-methoxycarbonyl, N-methylcarbamoyl, N-phenylcarbamoyl, N,N-diethyl-carbamoyl and morpholino-carbonyl groups.

The substituted sulfinyl ($R^{o14}$—SO—) usable herein may be those in which the substituent $R^{o14}$ represents a monovalent nonmetallic atomic group. Preferred examples thereof are alkylsulfinyl, arylsulfinyl, sulfinamoyl, N-alkyl-sulfinamoyl, N,N-dialkyl-sulfinamoyl, N-aryl-sulfinamoyl, N,N-diaryl-sulfinamoyl and N-alkyl-N-aryl-sulfinamoyl groups. The alkyl and aryl groups present in these substituted sulfinyl groups may be the alkyl, substituted alkyl, aryl and substituted aryl groups specified above. Among them, more preferred examples thereof are alkylsulfinyl and arylsulfinyl groups. Specific examples of such substituted sulfinyl groups are hexyl-sulfinyl, benzyl-sulfinyl and tolyl-sulfinyl groups.

The substituted phosphono group herein used means a phosphono group in which one or two hydroxyl groups present thereon are substituted with other organic oxo groups and preferred examples thereof are dialkyl-phosphono, diaryl-phosphono, alkylaryl-phosphono, monoalkyl-phosphono and monoaryl-phosphono groups as has been described above. Among these, more preferably used herein are dialkyl-phosphono and diaryl-phosphono groups. Specific examples thereof include diethyl-phosphono, dibutyl-phosphono and diphenyl-phosphono groups.

The phosphonate group (—$PO_3H_2^-$; —$PO_3H^-$) herein used means, as has been discussed above, an anionic conjugated base ion derived from the primary acid-dissociation or the secondary acid-dissociation of the phosphono group (—$PO_3H_2$). Preferably, this group is in general used in combination with its counter cation. The counter cation of this kind includes commonly known ones and, more specifically, various oniums (e.g., ammoniums, sulfoniums, phosphoniums, iodoniums, aziniums) and metal ions (e.g., $Na^+$, $K^+$, $Ca^{2+}$, $Zn^{2+}$).

The substituted phosphonate group herein used means an anionic conjugated base group derived from the foregoing substituted phosphono group in which one of the hydroxyl groups present therein is substituted with an organic oxo group and specific examples thereof are conjugated base groups derived from the above-mentioned monoalkyl-phosphono group (—$PO_3H(alkyl)$) and monoaryl-phosphono group (—$PO_3H(aryl)$).

In addition, the compounds represented by the following general formula (iv-1) may be used in the most preferred embodiment of the present invention:

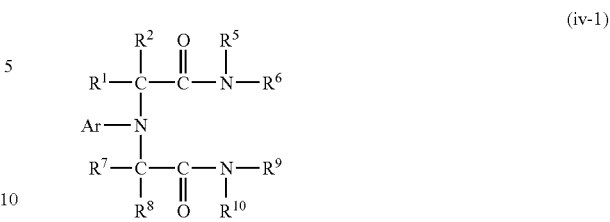

(iv-1)

In Formula (iv-1), $R^1$, $R^2$, $R^7$ and $R^8$ have the same meaning as that for the substituents $R^1$ and $R^2$ appearing in Formula (iv) defined above and $R^5$, $R^6$, $R^9$ and $R^{10}$ likewise have the same meaning as that for the substituents $R^1$ and $R^2$ defined above and appearing in Y of the general formula (iv).

The following are specific preferred examples of the compounds represented by Formula (iv) according to the present invention, but the present invention is not restricted to these specific examples at all:

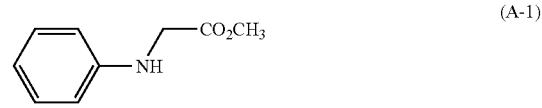

(A-1)

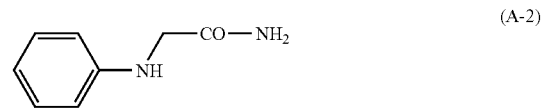

(A-2)

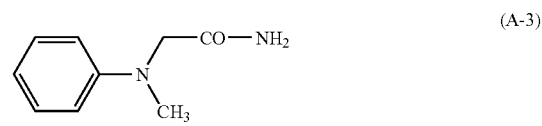

(A-3)

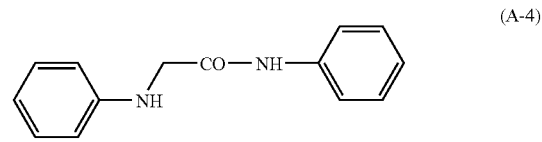

(A-4)

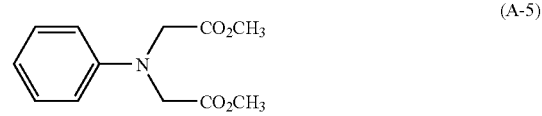

(A-5)

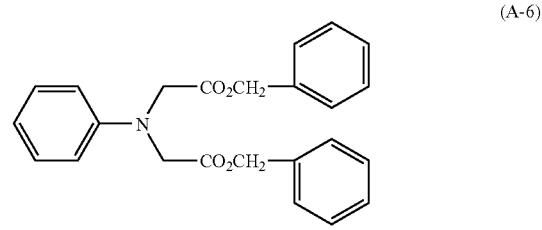

(A-6)

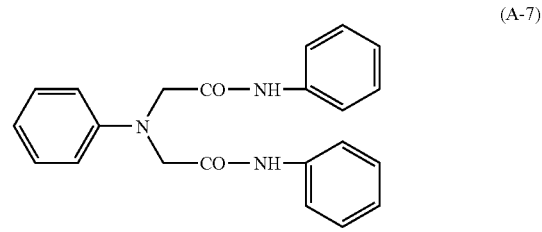

(A-7)

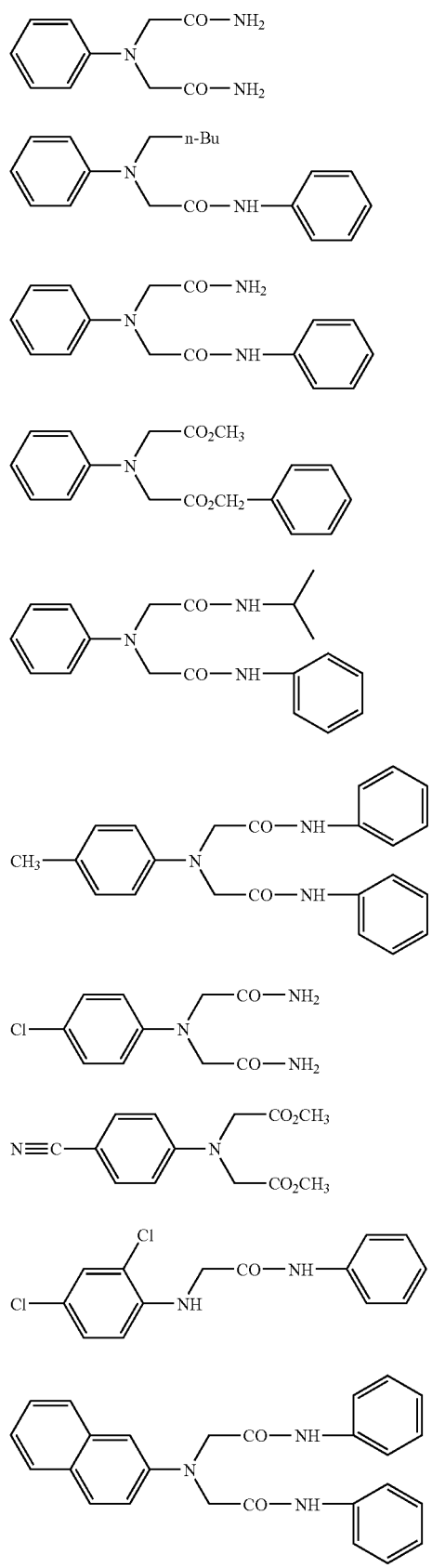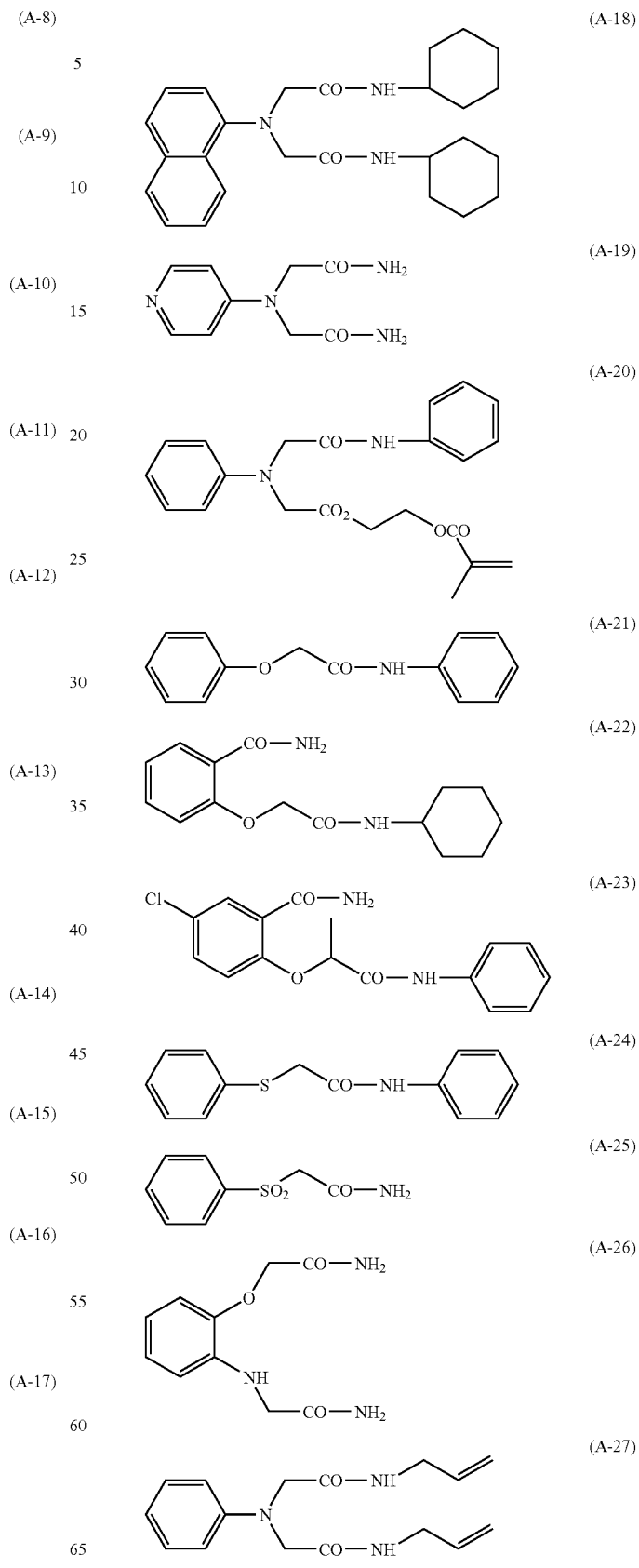

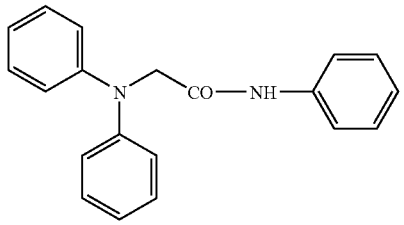
(A-28)

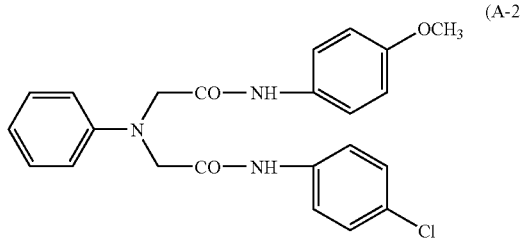
(A-29)

(A-30)

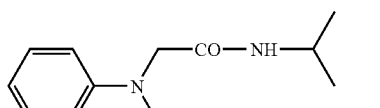
(A-31)

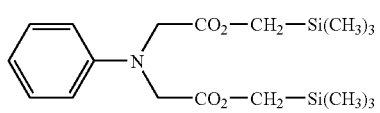
(A-32)

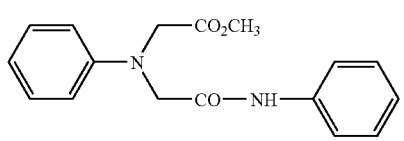

Compounds of General Formula (vii)

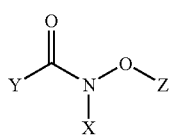
(vii)

In Formula (vii), X, Y and Z each independently represents a monovalent substituent. In this respect, however, each pair: X and Y; Y and Z; or X and Z may be bonded together to form a ring.

Specific examples of X appearing in Formula (vii) are a hydrogen atom; and alkyl, substituted alkyl, aryl, substituted aryl, alkenyl, substituted alkenyl, alkynyl, substituted alkynyl, substituted carbonyl, substituted sulfinyl and substituted sulfonyl groups.

Specific examples of Y appearing in Formula (vii) are a hydrogen atom; and alkyl, substituted alkyl, aryl, substituted aryl, alkenyl, substituted alkenyl, alkynyl, substituted alkynyl, substituted carbonyl, substituted oxy, substituted thio and substituted amino groups.

Specific examples of Y appearing in Formula (vii) are a hydrogen atom; and alkyl, substituted alkyl, aryl, substituted aryl, alkenyl, substituted alkenyl, alkynyl, substituted alkynyl, substituted carbonyl, substituted sulfinyl, substituted sulfonyl and silyl groups.

These substituents will hereunder be described in more specifically.

The alkyl groups may be, for instance, linear, branched and cyclic alkyl groups having 1 to 20 carbon atoms and specific examples thereof are methyl, ethyl, propyl, butyl, pentyl, hexyl, heptyl, octyl, nonyl, decyl, undecyl, dodecyl, tridecyl, hexadecyl, octadecyl, eicosyl, isopropyl, isobutyl, s-butyl, t-butyl, isopentyl, neopentyl, 1-methylbutyl, isohexyl, 2-ethylhexyl, 2-methylhexyl, cyclohexyl, cyclopentyl and 2-norbornyl groups. Among them, preferably used herein are linear alkyl groups having 1 to 12 carbon atoms, branched alkyl groups having 3 to 12 carbon atoms and cyclic alkyl groups having 5 to 10 carbon atoms.

The substituted alkyl group comprises a substituent and a corresponding alkylene group linked thereto, such a substituent may be a monovalent nonmetallic atomic group other than hydrogen and specific examples thereof preferably used herein are a halogen atom (such as —F, —Br, —Cl, —I); a hydroxyl group, an alkoxy group, an aryloxy group, a mercapto group, an alkylthio group, an arylthio group, an alkyldithio group, an aryldithio group, an amino group, an N-alkylamino group, an N,N-dialkylamino group, an N-arylamino group, an N,N-di-arylamino group, an N-alkyl-N-arylamino group, an acyloxy group, a carbamoyloxy group, an N-alkyl-carbamoyloxy group, an N-aryl-carbamoyloxy group, an N,N-dialkyl-carbamoyloxy group, an N,N-diaryl-carbamoyloxy group, an N-alkyl-N-aryl-carbamoyloxy group, an alkylsulfoxy group, an arylsulfoxy group, an acylthio group, an acylamino group, an N-alkyl-acylamino group, an N-aryl-acylamino group, a ureido group, an N'-alkylureido group, an N',N'-di-alkylureido group, an N'-arylureido group, an N',N'-di-arylureido group, an N'-alkyl-N'-aryl-ureido group, an N-alkylureido group, an N-arylureido group, an N'-alkyl-N-alkyl-ureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkyl-ureido group, an N',N'-diaryl-N-aryl-ureido group, an N'-alkyl-N'-aryl-N-alkyl-ureido group, an N'-alkyl-N'-aryl-N-aryl-ureido group, an alkoxy-carbonylamino group, an aryloxy-carbonylamino group, an N-alkyl-N-alkoxy-carbonylamino group, an N-alkyl-N-aryloxy-carbonylamino group, an N-aryl-N-alkoxy-carbonylamino group, an N-aryl-N-aryloxy-carbonylamino group, a formyl group, an acyl group, a carboxyl group and a conjugated base group thereof (hereunder referred to as "carboxylate"), an alkoxycarbonyl group, an aryloxycarbonyl group, a carbamoyl group, an N-alkyl-carbamoyl group, an N,N-di-alkyl-carbamoyl group, an N-aryl-carbamoyl group, an N,N-diaryl-carbamoyl group, an N-alkyl-N-aryl-carbamoyl group, an alkyl-sulfinyl group, an aryl-sulfinyl group, an alkylsulfonyl group, an arylsulfonyl group, a sulfo group (—SO$_3$H) and a conjugated base group thereof (hereinafter referred to as "sulfonate group"), an alkoxy-sulfonyl group, an aryloxy-sulfonyl group, a sulfinamoyl group, an N-alkyl-sulfinamoyl group, an N,N-dialkyl-sulfinamoyl group, an N-aryl-sulfinamoyl group, an N,N-diaryl-sulfinamoyl group, an N-alkyl-N-aryl-sulfinamoyl group, a sulfamoyl group, an N-alkyl-sulfamoyl group, an N,N-dialkyl-sulfamoyl group, an N-aryl-sulfamoyl group, an N,N-diaryl-sulfamoyl group, an N-alkyl-N-aryl-sulfamoyl group, an N-acyl-sulfamoyl group and a conjugated base group thereof, an N-alkylsulfonyl-sulfamoyl group (—SO$_2$NH—SO$_2$(alkyl)) and a conjugated base group thereof, an N-allylsulfonyl-sulfamoyl group (—SO$_2$NHSO$_2$(allyl)) and a conjugated base group thereof, an N-alkylsulfonyl-carbamoyl group (—CONHSO$_2$(alkyl)) and a conjugated base group thereof, an N-allylsulfonyl-carbamoyl group (—CONHSO$_2$(allyl)) and a conjugated base group thereof, an alkoxy-silyl group (—Si(O-alkyl)$_3$) and a conjugated base group thereof, an allyloxy-silyl group (—Si(O-allyl)$_3$) and a conjugated base group thereof, a hydroxy silyl group (—Si(OH)$_3$) and a conjugated base group thereof, a phosphono group (—PO$_3$H$_2$) and a conjugated base group thereof (hereinafter referred to as "phosphonate group"), a dialkyl-phosphono group (—PO$_3$(alkyl)$_2$), a diaryl-phosphono group (—PO$_3$(aryl)$_2$), an alkylaryl-phosphono group (—PO$_3$(alkyl)(aryl)), a monoalkyl-phosphono group (—PO$_3$H(alkyl)) and a conjugated base group thereof (hereinafter referred to as "alkyl phosphonate group"), a monoaryl-phosphono group (—PO$_3$H (aryl)) and a conjugated base group thereof (hereinafter referred to as "aryl phosphonate group"), a phosphono-oxy group (—OPO$_3$H$_2$) and a conjugated base group thereof (hereinafter referred to as "phosphonate oxy group"), a dialkyl-phosphono-oxy group (—OPO$_3$H(alkyl)$_2$), a diaryl-phosphono-oxy group (—OPO$_3$(aryl)$_2$), an alkylaryl-phosphono-oxy group (—OPO$_3$(alkyl)(aryl)), a monoalkyl-phosphono-oxy group (—OPO$_3$H(alkyl)) and a conjugated base group thereof (hereinafter referred to as "alkyl phosphonate oxy group"), a monoaryl-phosphono-oxy group (—OPO$_3$H(aryl)) and a conjugated base group thereof (hereinafter referred to as "aryl phosphonate oxy group"), a cyano group, a nitro group, an aryl group, an alkenyl group and an alkynyl group.

Specific examples of the alkyl group present in these substituents include the above-described alkyl groups and specific examples of the aryl group include a phenyl group, a biphenyl group, a naphthyl group, a tolyl group, a xylyl group, a mesityl group, a cumenyl group, a fluorophenyl group, a chlorophenyl group, a bromophenyl group, a chloromethyl-phenyl group, a hydroxyphenyl group, a methoxyphenyl group, an ethoxy-phenyl group, a phenoxy-phenyl group, an acetoxy-phenyl group, a benzoyl-oxy-phenyl group, a methylthio-phenyl group, a phenylthio-phenyl group, a methyl-aminophenyl group, a dimethyl-aminophenyl group, an acetyl-aminophenyl group, a carboxyphenyl group, a methoxy-carbonyl-phenyl group, an ethoxy-carbonylphenyl group, a phenoxy-carbonylphenyl group, an N-phenyl-carbamoyl-phenyl group, a nitrophenyl group, a cyanophenyl group, a sulfophenyl group, a sulfonate phenyl group, a phosphono-phenyl group and a phosphonate phenyl group. In addition, examples of the alkenyl group include a vinyl group, a 1-propenyl group, a 1-butenyl group, a cinnamyl group and a 2-chloro-1-ethenyl group and examples of the alkynyl group include an ethynyl group, a 1-propynyl group, a 1-butynyl group, a trimethyl-silyl-ethynyl group and a phenyl-ethynyl group.

The foregoing acyl group (R$_4$'CO—) may be, for instance, those in which the substituent R$_4$' represents a hydrogen atom or the alkyl, aryl, alkenyl or alkynyl group specified above.

On the other hand, examples of the alkylene group in the substituted alkyl group includes a divalent organic residue formed through the elimination of any one of hydrogen atoms present on the above-described alkyl group having from 1 to 20 carbon atoms and preferred are a linear alkylene group having from 1 to 12 carbon atoms, a branched alkylene group having from 3 to 12 carbon atoms and a cyclic alkylene group having from 5 to 10 carbon atoms.

Specific preferred examples of the substituted alkyl group include a chloromethyl group, a bromomethyl group, a 2-chloro-ethyl group, a trifluoromethyl group, a methoxymethyl group, a methoxy-ethoxy-ethyl group, an allyloxymethyl group, a phenoxy-methyl group, a methyl-thio-methyl group, a tolylthio-methyl group, an ethylamino-ethyl group, a diethyl-aminopropyl group, a morpholino-propyl group, an acetyl-oxy-methyl group, a benzoyloxy-methyl group, an N-cyclohexyl-carbamoyl-oxyethyl group, an N-phenyl-carbamoyloxy-ethyl group, an acetyl-aminoethyl group, an N-methyl-benzoyl-aminopropyl group, a 2-oxoethyl group, a 2-oxopropyl group, a carboxy-propyl group, a methoxycarbonyl-ethyl group, a methoxycarbonyl-methyl group, a methoxycarbonyl-butyl group, an ethoxy-carbonyl-methyl group, a butoxy-carbonyl-methyl group, an allyloxycarbonyl-butyl group, a benzyloxy-carbonyl-methyl group, a methoxycarbonyl-phenylmethyl group, a trichloromethyl-carbonylmethyl group, an allyloxy-carbonyl-butyl group, a chlorophenoxy-carbonyl-methyl group, a carbamoyl-methyl group, an N-methyl-carbamoyl-ethyl group, an N,N-dipropyl-carbamoylmethyl group, an N-(methoxy-phenyl)carbamoylethyl group, an N-methyl-N-(sulfophenyl)carbamoylmethyl group, a sulfopropyl group, a sulfobutyl group, a sulfonate butyl group, a sulfamoyl-butyl group, an N-ethyl-sulfamoyl-methyl group, an N,N-dipropyl-sulfamoylpropyl group, an N-tolyl-sulfamoyl-propyl group, an N-methyl-N-(phosphono-phenyl)sulfamoyl-octyl group, a phosphono-butyl group, a phosphonate hexyl group, a diethyl-phosphonobutyl group, a diphenyl-phosphono-propyl group, a methyl-phosphono-butyl group, a methyl phosphonate butyl group, a tolyl-phosphono-hexyl group, a tolyl-phosphonate hexyl group, a phosphono-oxypropyl group, a phosphonate oxybutyl group, a benzyl group, a phenethyl group, an α-methylbenzyl group, a 1-methyl-1-phenyl-ethyl group, a p-methylbenzyl group, a cinnamyl group, an allyl group, a 1-propenylmethyl group, a 2-butenyl group, a 2-methylallyl group, a 2-methyl-propenyl-methyl group, a 2-propynyl group, a 2-butynyl group and a 3-butynyl group, as well as the groups listed below:

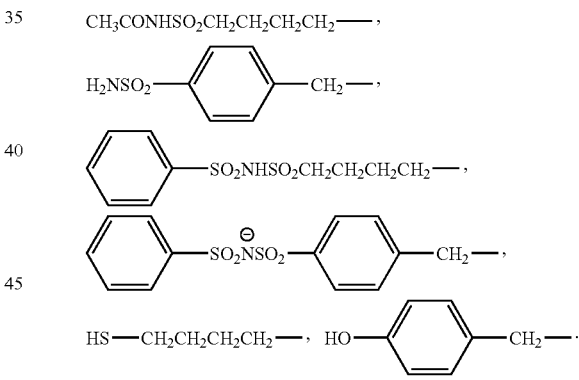

The aryl group includes, for instance, a benzene ring, a fused ring formed from 2 to 3 benzene rings and a fused ring formed from a benzene ring and a 5-membered unsaturated ring and specific examples thereof include a phenyl group, a naphthyl group, an anthryl group, a phenanthryl group, an indenyl group, an acenaphthenyl group and a fluorenyl group, with phenyl and naphthyl groups being more preferably used herein.

The substituted aryl group comprises a corresponding aryl group and a substituent bonded thereto, usable herein include, for instance, a group obtained by bonding a monovalent non-metallic atomic group other than a hydrogen atom onto a ring-forming carbon atom of the foregoing aryl group. Examples of such substituents preferably used herein are alkyl groups and substituted alkyl groups listed above as well as those specified above in connection with the substituted alkyl groups.

Specific examples of the substituted aryl group preferably used in the present invention include a biphenyl group, a tolyl group, a xylyl group, a mesityl group, a cumenyl group, a chlorophenyl group, a bromophenyl group, a fluorophenyl group, a chloromethyl-phenyl group, a trifluoromethyl-phenyl group, a hydroxy-phenyl group, a methoxyphenyl group, a methoxy-ethoxyphenyl group, an allyloxy-phenyl group, a phenoxy-phenyl group, a methyl-thiophenyl group, a tolylthio-phenyl group, a phenylthio-phenyl group, an ethylamino-phenyl group, a diethyl-aminophenyl group, a morpholino-phenyl group, an acetyloxy-phenyl group, a benzoyloxy-phenyl group, an N-cyclohexyl-carbamoyloxy-phenyl group, an N-phenyl-carbamoyloxy-phenyl group, an acetylamino-phenyl group, an N-methyl-benzoyl-aminophenyl group, a carboxy-phenyl group, a methoxycarbonyl-phenyl group, an allyloxy-carbonylphenyl group, a chlorophenoxy-carbonylphenyl group, a carbamoyl-phenyl group, an N-methyl-carbamoylphenyl group, an N,N-dipropyl-carbamoylphenyl group, an N-(methoxy-phenyl)carbamoyl-phenyl group, an N-methyl-N-(sulfophenyl)carbamoyl-phenyl group, a sulfophenyl group, a sulfonate phenyl group, a sulfamoylphenyl group, an N-ethyl-sulfamoylphenyl group, an N,N-dipropyl-sulfamoylphenyl group, an N-tolyl-sulfamoylphenyl group, an N-methyl-N-(phosphono-phenyl)sulfamoyl-phenyl group, a phosphonophenyl group, a phosphonate phenyl group, a diethyl-phosphonophenyl group, a diphenyl-phosphonophenyl group, a methyl-phosphono-phenyl group, a methyl phosphonate phenyl group, a tolyl-phosphonophenyl group, a tolyl phosphonate phenyl group, an allyl-phenyl group, a 1-propenylmethyl-phenyl group, 2-butenyl-phenyl group, a 2-methylallyl-phenyl group, a 2-methylpropenyl-phenyl group, a 2-propynylphenyl group, a 2-butynyl-phenyl group, a 3-butynyl-phenyl group, a tetra-chlorophenyl group, a tetra-bromophenyl group and a tetra-fluorophenyl group.

Examples of the alkenyl group include vinyl, 1-propenyl, 1-butenyl, cinnamyl and 2-chloro-1-ethenyl groups and examples of the alkynyl group are ethynyl, 1-propynyl, 1-butynyl and trimethylsilyl-ethynyl groups.

The substituted alkenyl group is an alkenyl group whose hydrogen atom(s) is replaced with a substituent (or substituents), such a substituent may be, for instance, those described above in connection with the substituted alkyl group, while the alkenyl group usable herein may be those listed above. The following are examples of preferred substituted alkenyl groups usable herein:

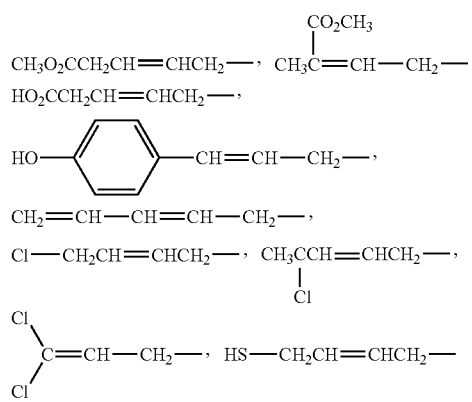

The substituted alkynyl group is an alkynyl group whose hydrogen atom(s) is replaced with a substituent (or substituents), such a substituent may be, for instance, those described above in connection with the substituted alkyl group, while the alkynyl group usable herein may be those listed above.

The halogen atom preferably used herein includes, for instance, fluorine, chlorine, bromine and iodine atoms.

The foregoing substituted oxy group ($R^{14}O$—) may be, for instance, those in which $R^{14}$ represents a monovalent nonmetallic atomic group other than a hydrogen atom. Preferred substituted oxy groups are, for instance, alkoxy, aryloxy, acyloxy, carbamoyloxy, N-alkyl-carbamoyloxy, N-aryl-carbamoyloxy, N,N-dialkyl-carbamoyl-oxy, N,N-diaryl-carbamoyloxy, N-alkyl-N-aryl-carbamoyloxy, alkylsulfoxy, aryl-sulfoxy, phosphono-oxy and phosphonate-oxy groups. The alkyl and aryl groups present in these substituted oxy groups may be the alkyl, substituted alkyl, aryl and substituted aryl groups listed above. In addition, the acyl group ($R^{15}CO$—) in the acyloxy group may be those in which $R^{15}$ is an alkyl, substituted alkyl, aryl or substituted aryl group as has been described above. Among these substituents, more preferably used herein are, for instance, alkoxy, aryloxy, acyloxy and arylsulfoxy groups.

Specific examples of the substituted oxy groups preferably used in the invention are methoxy, ethoxy, propyloxy, isopropyloxy, butyloxy, pentyloxy, hexyloxy, dodecyloxy, benzyloxy, allyloxy, phenethyloxy, carboxyethyl-oxy, methoxycarbonylethyl-oxy, ethoxy-carbonylethyl-oxy, methoxy-ethoxy, phenoxy-ethoxy, methoxy-ethoxy-ethoxy, ethoxy-ethoxy-ethoxy, morpholino-ethoxy, morpholino-propyloxy, allyloxy-ethoxy-ethoxy, phenoxy, tolyloxy, xylyl-oxy, mesityl-oxy, cumenyl-oxy, methoxy-phenyloxy, ethoxy-phenyloxy, chloro-phenyloxy, bromo-phenyloxy, acetyloxy, benzoyloxy, naphthyloxy, phenyl-sulfonyloxy, phosphono-oxy and phosphonate-oxy groups.

The substituted thio group is represented by the general formula: $R^{16}S$— and usable herein are those in which $R^{16}$ represents a monovalent nonmetallic atomic group other than a hydrogen atom. Examples of preferred substituted thio groups are alkylthio groups, arylthio groups, alkyl-dithio groups, aryl-dithio groups and acylthio groups. The alkyl and aryl groups present in these substituted thio groups may be the alkyl, substituted alkyl, aryl and substituted aryl groups listed above. In addition, the acyl group ($R^{15}CO$—) in the acylthio group may be those in which $R^{15}$ has the same meaning as that described above. Among these substituted thio groups, preferably used herein are, for instance, alkylthio and arylthio groups. Specific examples of preferred substituted thio groups are methylthio, ethylthio, phenylthio, ethoxy-ethylthio, carboxy-ethylthio and methoxy-carbonyl-thio groups.

The substituted amino group is represented by the general formula: $R^{17}NH$—; or ($R^{18}$)($R^{19}$)N— may be, for instance, those in which each of the substituents $R^{17}$, $R^{18}$ and $R^{19}$ represents a monovalent nonmetallic atomic group other than a hydrogen atom. Examples of the substituted amino group preferably used herein are N-alkylamino, N,N-dialkyl-amino, N-arylamino, N,N-diaryl-amino, N-alkyl-N-aryl-amino, acylamino, N-alkyl-acylamino, N-aryl-acylamino, ureido, N'-alkyl-ureido, N',N'-dialkyl-ureido, N'-aryl-ureido, N',N'-diaryl-ureido, N'-alkyl-N'-aryl-ureido, N-alkyl-ureido, N-aryl-ureido, N'-alkyl-N-alkyl-ureido, N'-alkyl-N-aryl-ureido, N',N'-dialkyl-N-alkyl-ureido, N',N'-dialkyl-N'-aryl-ureido, N'-aryl-N-alkyl-ureido, N'-aryl-N-aryl-ureido, N',N'-diaryl-N-alkyl-ureido, N',N'-diaryl-N-aryl-ureido, N'-alkyl-N'-aryl-N-alkylureido, N'-alkyl-N'-aryl-N-arylureido, alkoxycarbonyl-amino, aryloxy-carbonylamino, N-alkyl-N-alkoxy-carbonylamino, N-alkyl-N-aryloxy-carbonyl-amino, N-aryl-N-alkoxy-carbonyl-amino and N-aryl-N-aryloxycarbonyl-amino groups. The alkyl and aryl groups present in these substituted amino groups may be the alkyl, substituted alkyl, aryl and substituted aryl groups listed above, and the substituent $R^{15}$ of the acyl group ($R^{15}CO—$) in the acylamino, N-alkyl-acylamino and N-aryl-acylamino groups may be the same as those specified above.

Among them, more preferably used herein are N-alkylamino, N,N-dialkyl-amino, N-arylamino and acylamino groups. Specific examples of the substituted amino group preferably used in the invention are methylamino, ethylamino, diethylamino, morpholino, piperidino, pyrrolidino, phenylamino, benzoylamino and acetylamino groups.

The substituted carbonyl group usable herein can be represented by the general formula: $R^{20}—CO—$ and may be those in which the substituent $R^{20}$ represents a monovalent nonmetallic atomic group. Preferred examples thereof are formyl, acyl, carboxyl, alkoxycarbonyl, aryloxycarbonyl, carbamoyl, N-alkyl-carbamoyl, N,N-dialkyl-carbamoyl, N-aryl-carbamoyl, N,N-diaryl-carbamoyl and N-alkyl-N-aryl-carbamoyl groups. The alkyl and aryl groups present in these substituted carbonyl groups may be the alkyl, substituted alkyl, aryl and substituted aryl groups specified above.

Among them, examples thereof more preferably used in the present invention are formyl, acyl, carboxyl, alkoxy-carbonyl, aryloxycarbonyl, carbamoyl, N-alkyl-carbamoyl, N',N-dialkyl-carbamoyl and N-aryl-carbamoyl groups and still more preferably used herein are formyl, acyl, alkoxycarbonyl and aryloxycarbonyl groups. Specific examples thereof preferably used in the invention include formyl, acetyl, benzoyl, carboxyl, methoxycarbonyl, allyloxy-carbonyl, N-methyl-carbamoyl, N-phenyl-carbamoyl, N,N-diethyl-carbamoyl and morpholino-carbonyl groups.

The substituted sulfinyl group usable herein can be represented by the general formula: $R^{21}—SO—$ and may be those in which the substituent $R^{21}$ represents a monovalent nonmetallic atomic group. Preferred examples thereof are alkylsulfinyl, arylsulfinyl, sulfinamoyl, N-alkyl-sulfinamoyl, N,N-dialkyl-sulfinamoyl, N-aryl-sulfinamoyl, N,N-diaryl-sulfinamoyl and N-alkyl-N-aryl-sulfinamoyl groups. The alkyl and aryl groups present in these substituted sulfinyl groups may be the alkyl, substituted alkyl, aryl and substituted aryl groups specified above. Among them, more preferred examples thereof are alkylsulfinyl and arylsulfinyl groups. Specific examples thereof are hexyl-sulfinyl, benzylsulfinyl and tolyl-sulfinyl groups.

The substituted sulfonyl group usable herein can be represented by the general formula: $R^{25}—SO_2—$ and may be those in which the substituent $R^{25}$ represents a monovalent nonmetallic atomic group. More preferred examples thereof are alkylsulfonyl and arylsulfonyl groups. The alkyl and aryl groups present in these substituted sulfonyl groups may be the alkyl, substituted alkyl, aryl and substituted aryl groups specified above. Specific examples of such substituted sulfonyl group include butyl-sulfonyl and chlorophenyl-sulfonyl groups.

The silyl group usable herein can be represented by the general formula: $(R^{22})(R^{23})(R^{24})Si—$ and may be those in which each of the substituents $R^{22}$, $R^{23}$ and $R^{24}$ represents a monovalent nonmetallic atomic group. Preferred examples thereof are those in which these substituents are the alkyl, substituted alkyl, aryl and substituted aryl groups as has been described above. Examples of the silyl groups preferably used herein are trimethyl-silyl, tributyl-silyl, t-butyl-dimethyl-silyl and dimethyl-phenyl-silyl groups.

These substituents may additionally have substituents and specific examples of such substituents are those described above, as specific examples, in connection with X, Y and Z.

In addition, X, Y and Z may be bonded together to form a ring structure.

Such a ring structure may be, for instance, a saturated or unsaturated aliphatic ring formed through the linkage of X with Y; Y with Z; or X with Z. Preferred are 5-, 6-, 7- and 8-membered aliphatic rings formed from these substituents together with the carbon atoms to which they are bonded. More preferably used herein are such 5- and 6-membered aliphatic rings. Further, they may additionally comprise substituents on the carbon atoms constituting the same (examples of such additional substituents are those for the substituted alkyl groups as has been described above) and a part of the carbon atoms constituting each ring may likewise be substituted with a hetero atom (such as oxygen, sulfur and/or nitrogen atoms). In addition, a part of each aliphatic ring may likewise be form a part of an aromatic ring. Preferred examples thereof are cyclopentane, cyclohexane, cycloheptane, cyclooctane, cyclo-1,3-dioxa-pentane, cyclopentene, cyclohexene, cycloheptene, cyclooctene, cyclo-1,3-dioxapentene, cyclo-1,3-dioxa-hexene, cyclo-hexadiene, benzocyclohexene, benzo-cyclohexadiene, tetrahydro-pyranone, maleimide, succinimide, phthalimide, 1,2,3,6-tetrahydro-phthalimide, 1,2-cyclo-hexane-di-carboxy-imide, 2,4,6-piperidine-trione and 1,4,5,6,7,7-hexachloro-5-norbornene-2,3-dicarboxyimide rings.

Then examples of aromatic rings formed through the linkage of X with Y; Y with Z; or X with Z are quinoline, isoquinoline, acridine, phenanthridine, benzo-quinoline, and benzo-isoquinoline rings, with the combinations forming quinoline rings being more preferably used herein. In addition, they may additionally comprise substituents on the carbon atoms constituting the same (examples of such additional substituents are those for the substituted alkyl groups as has been described above).

Further, such a ring structure may comprise additional substituents and examples thereof are specifically described above in connection with the substituents X, Y and Z.

The following are specific examples of the compounds represented by the general formula (vii) used in the present invention, but the present invention is not restricted to these specific examples at all:

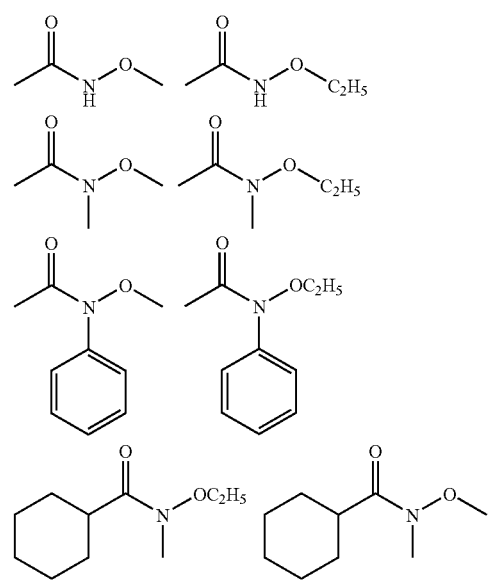

-continued
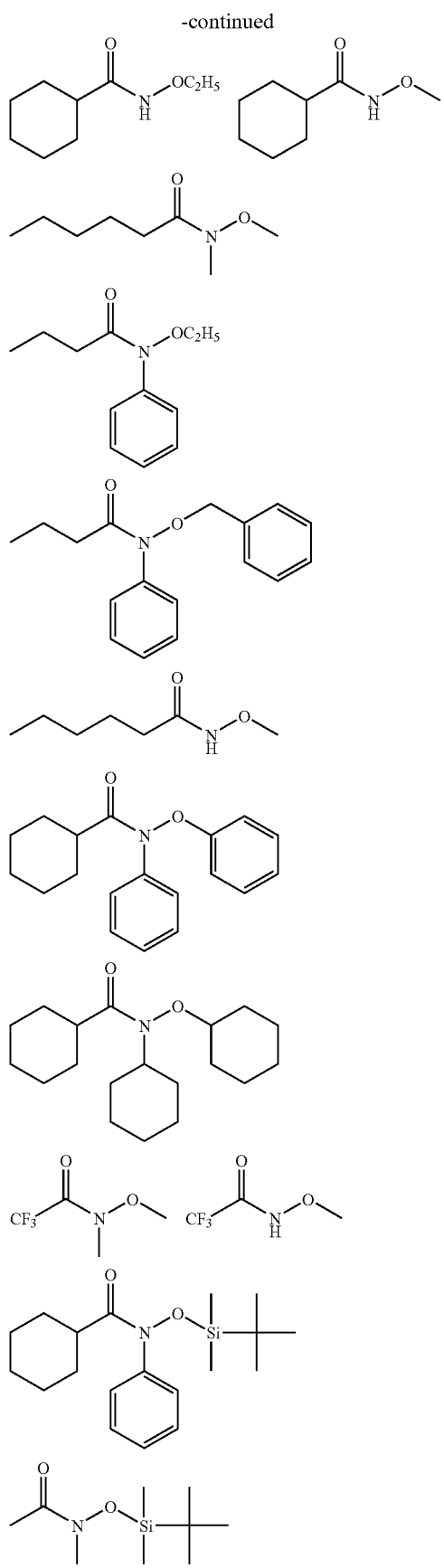
-continued
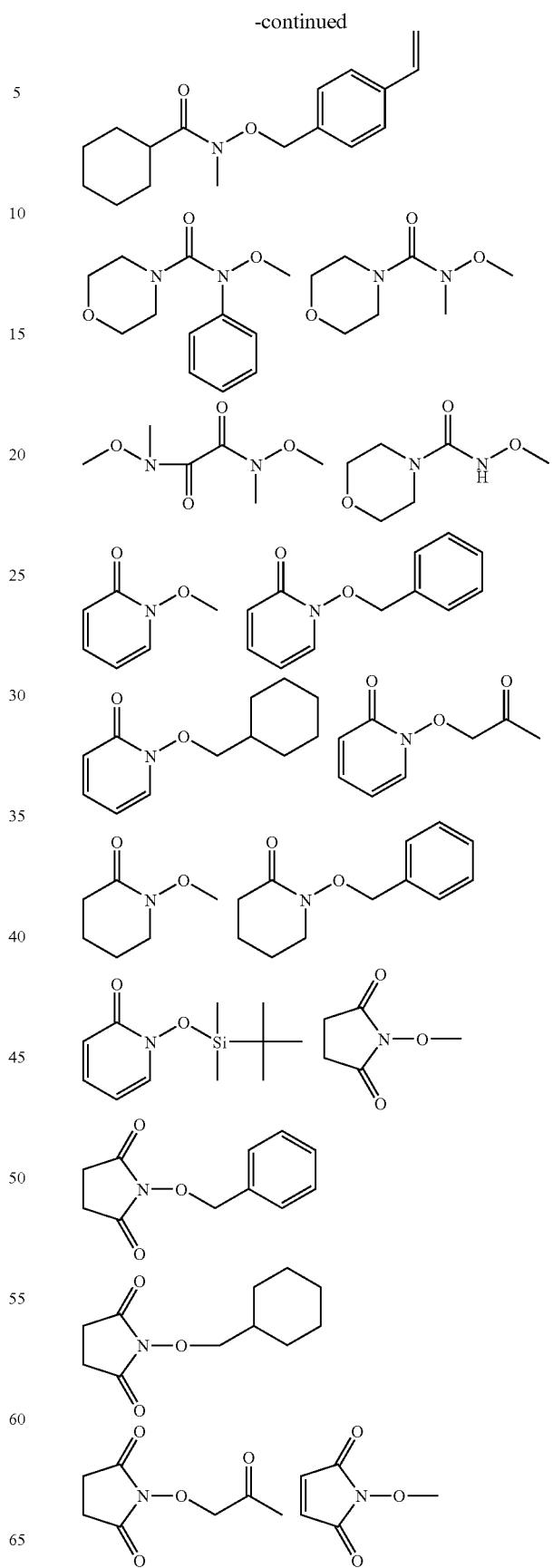

-continued
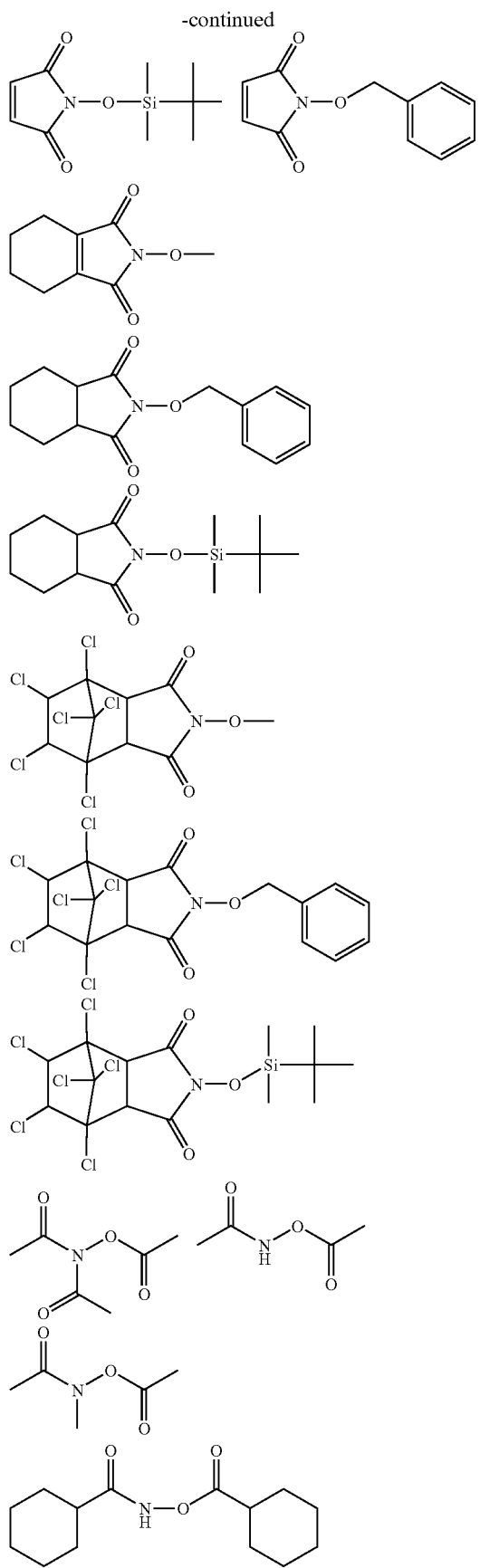
-continued
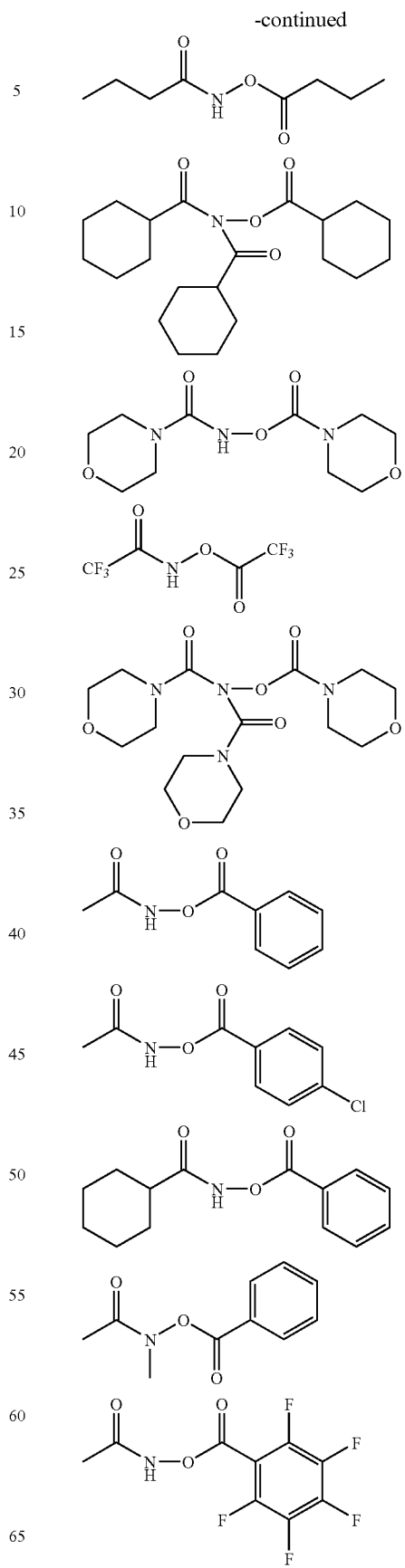

81
-continued
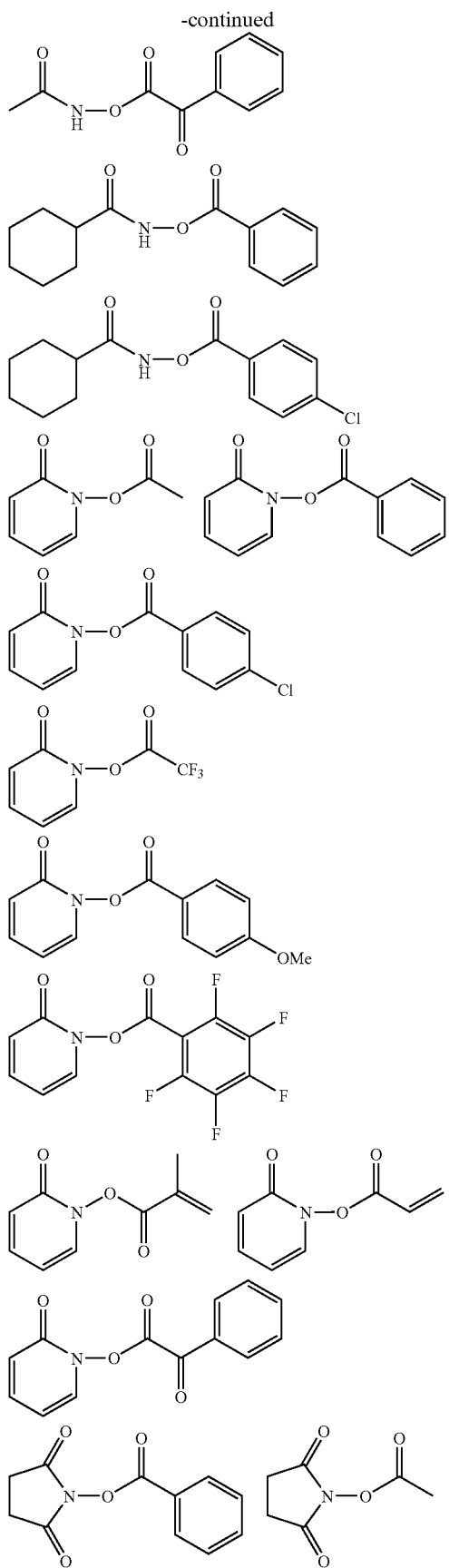
82
-continued
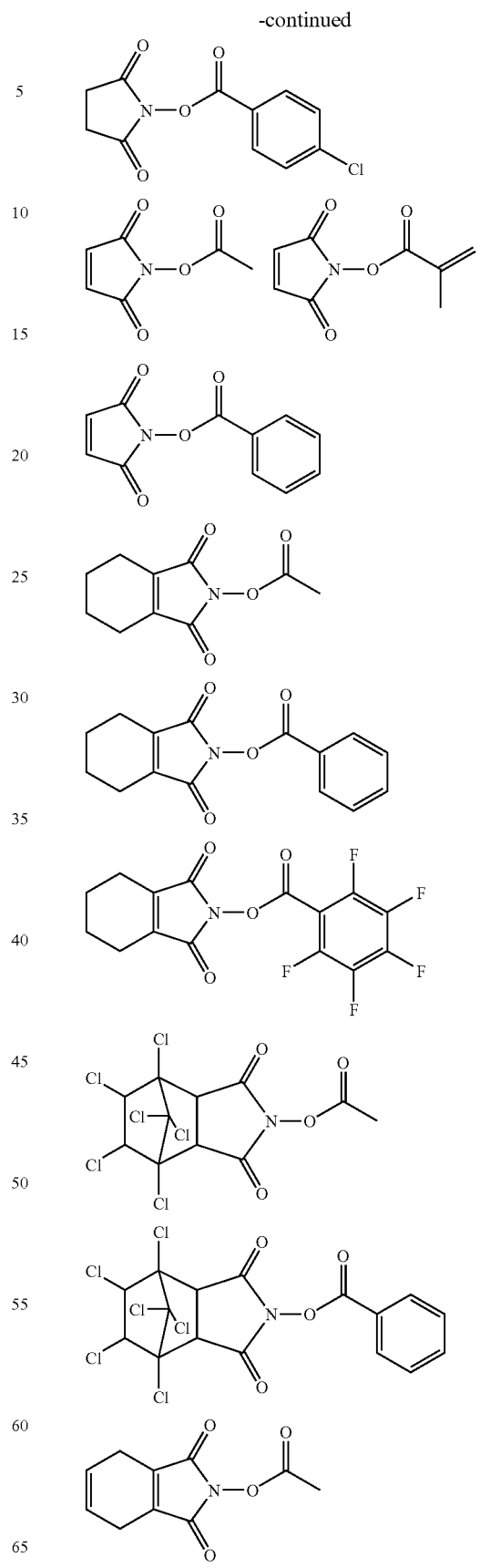

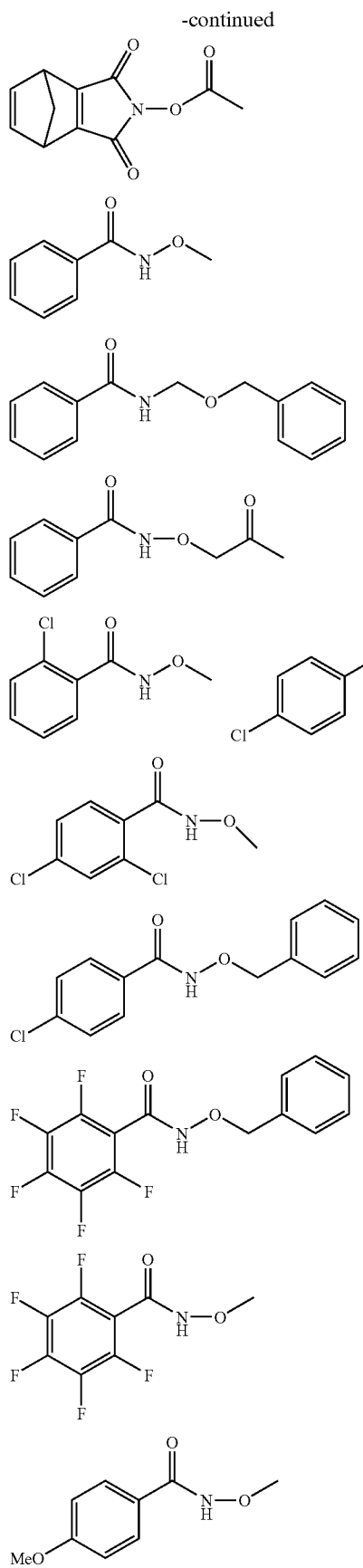
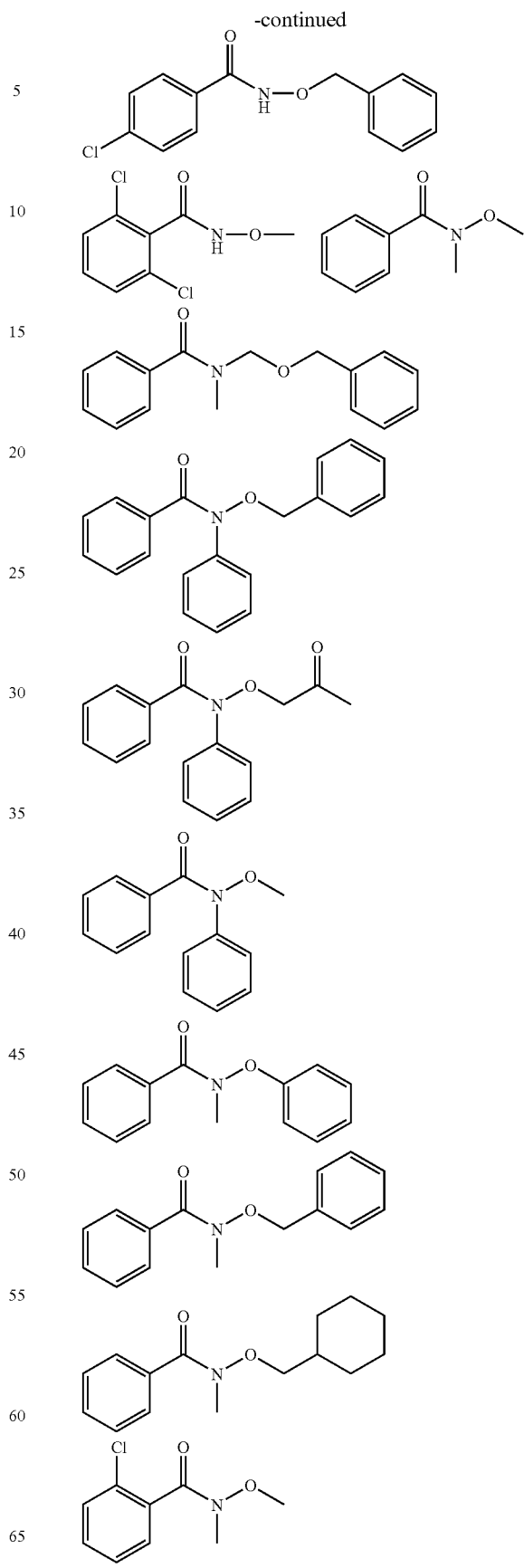

-continued
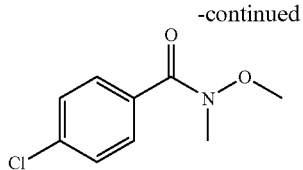
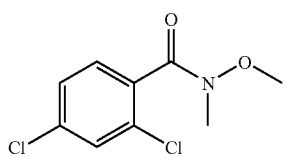
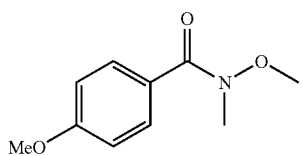
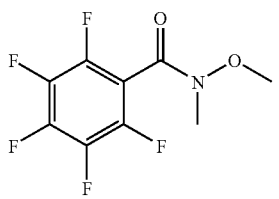
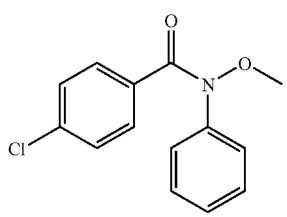
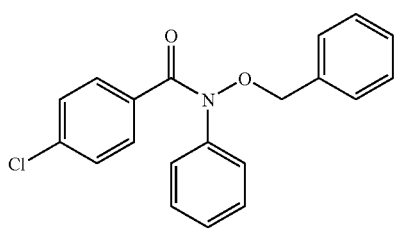
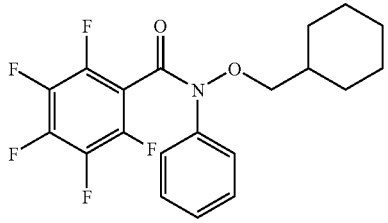
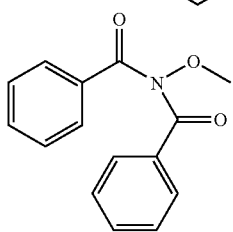
-continued
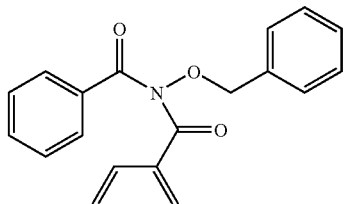
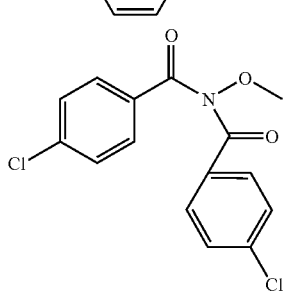
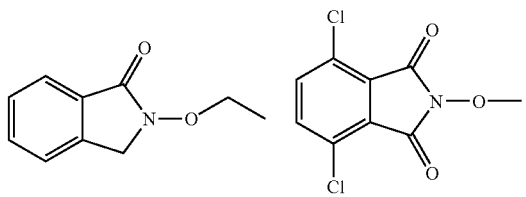
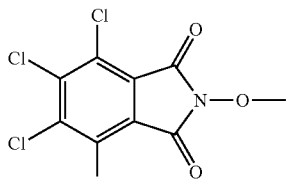
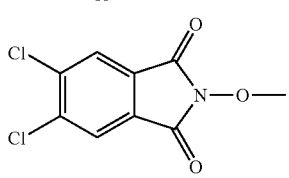
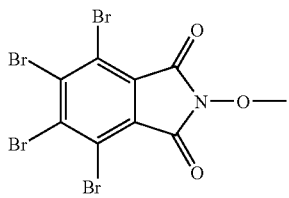
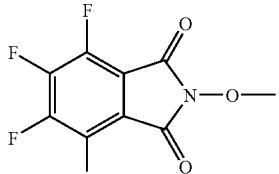
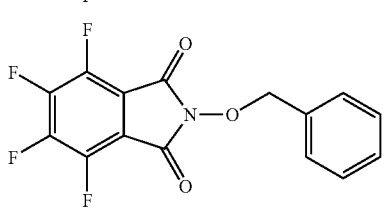

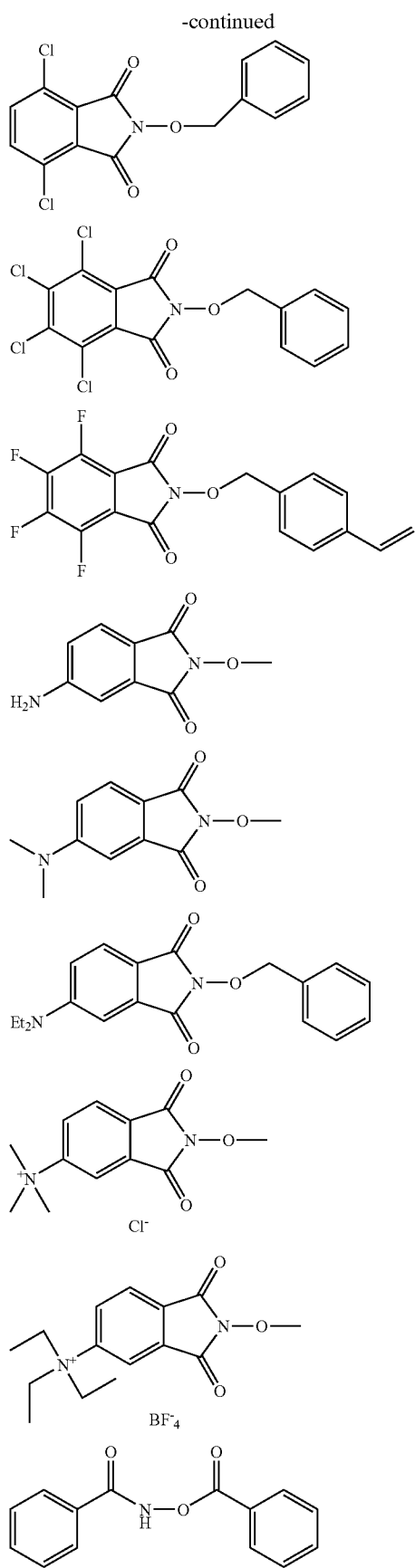
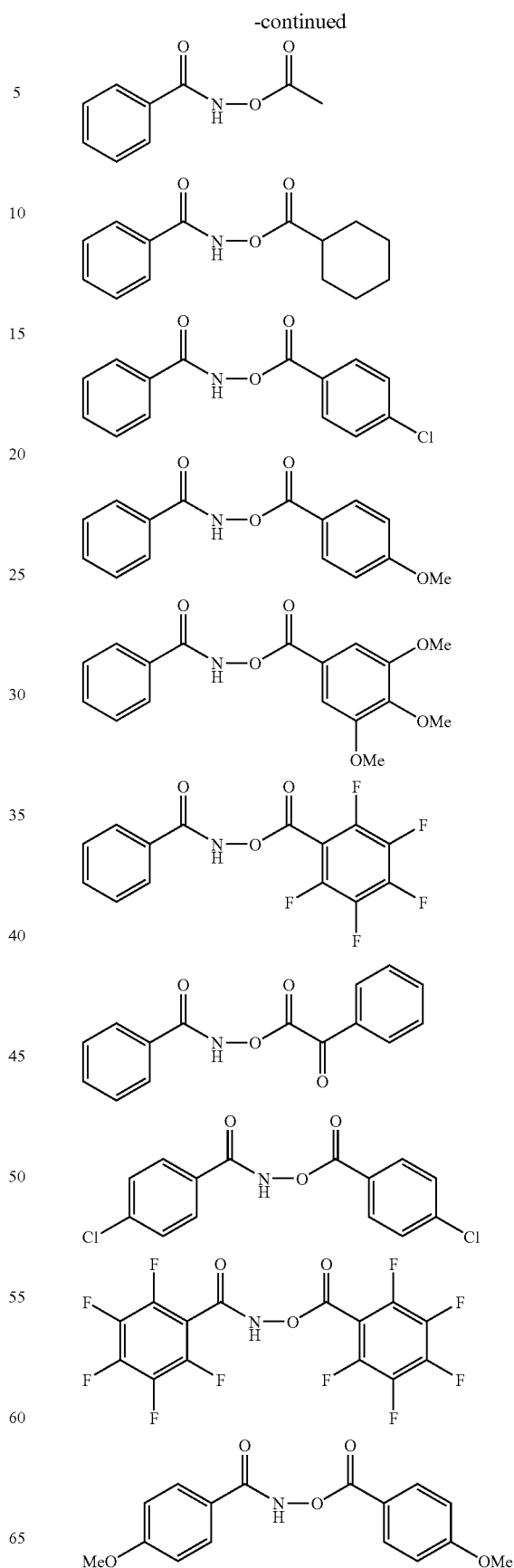

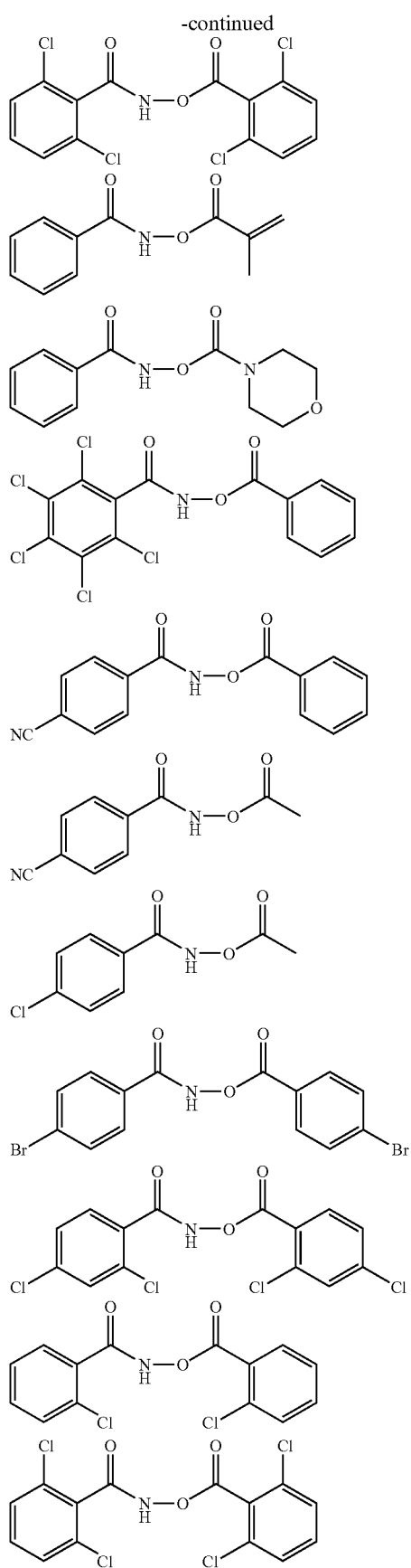
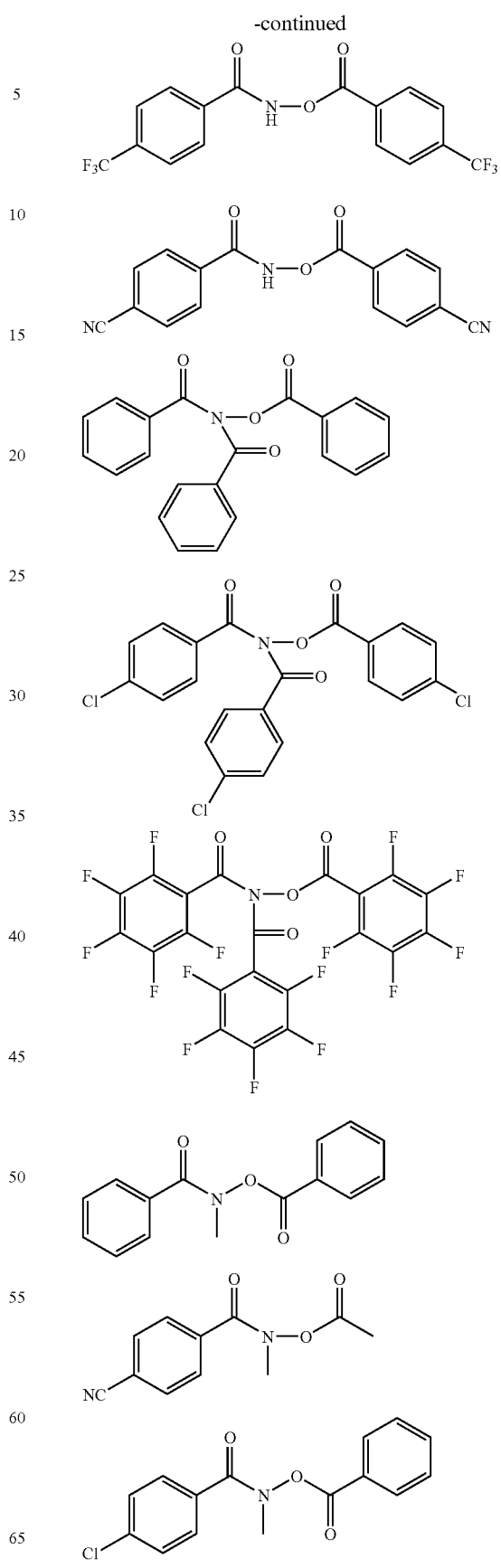

-continued
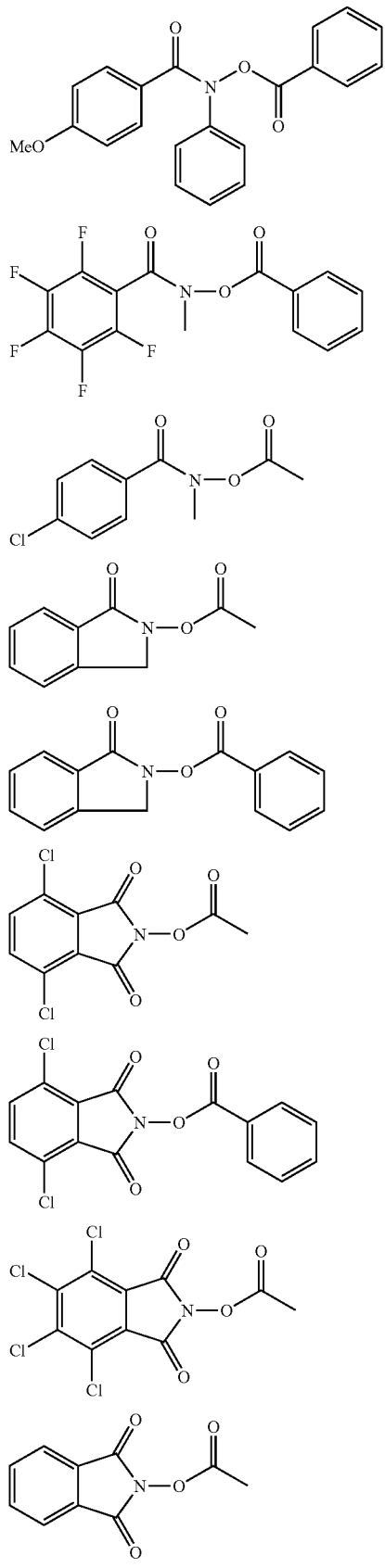
-continued
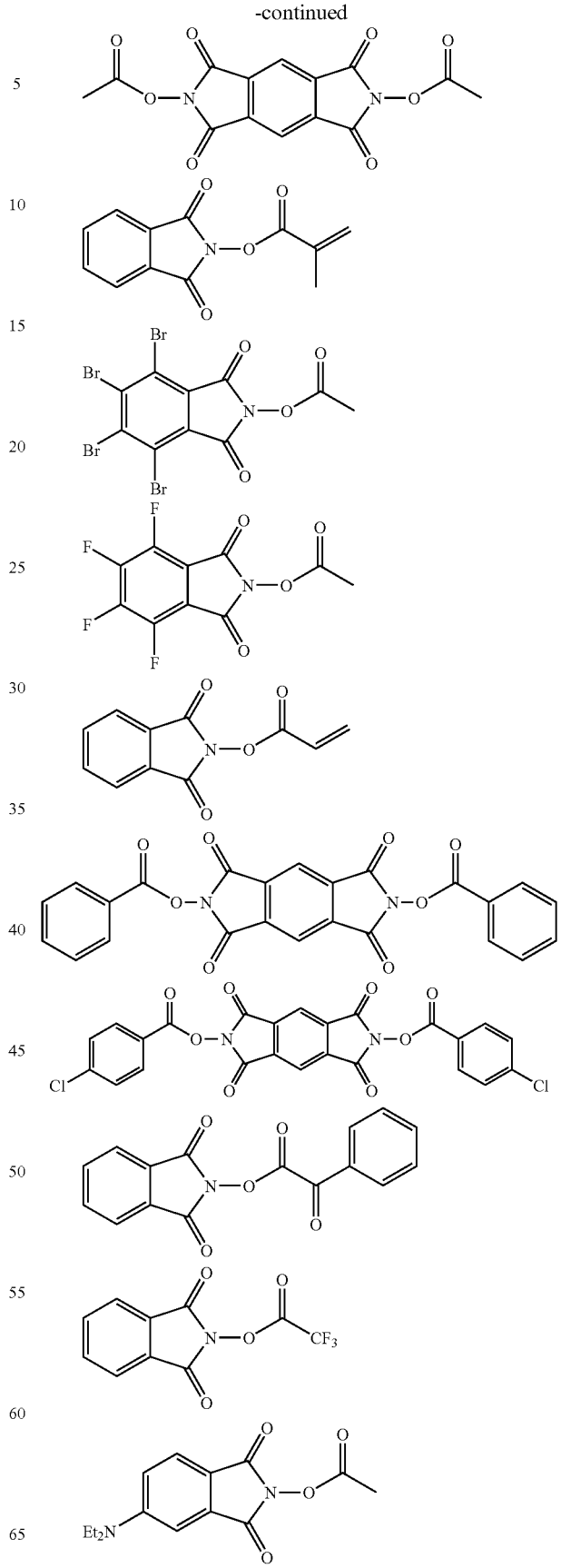

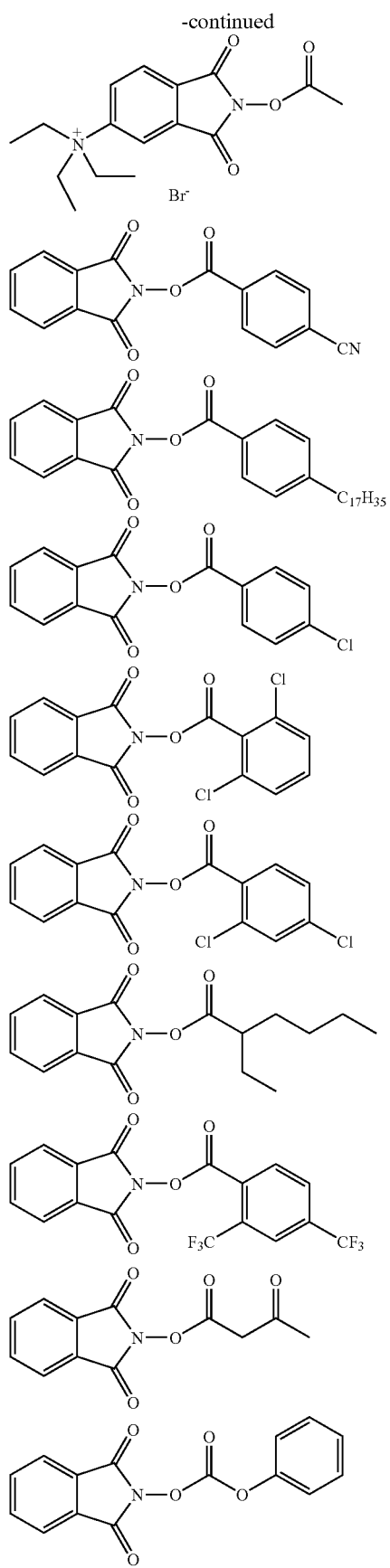
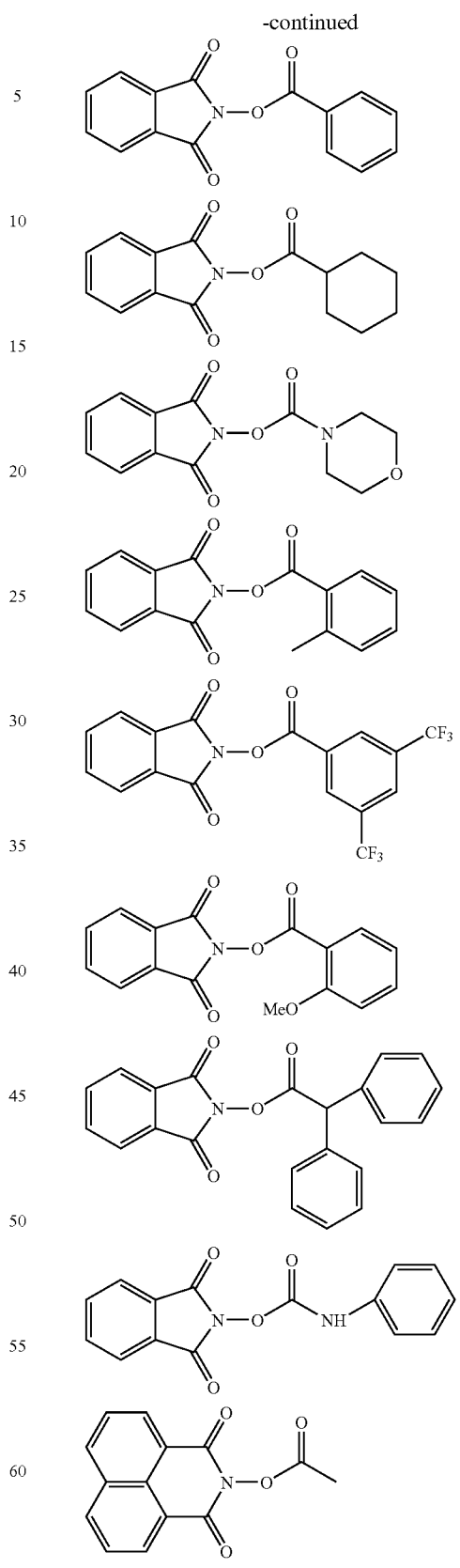
Moreover, the compound represented by Formula (vii) is more preferably selected from the group consisting of those represented by the following general formula (vii-1), from the viewpoint of the improvement of the sensitivity of the resulting ink jet-recording ink:

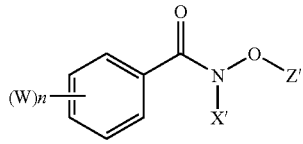

In the general formula (vii-1), X', W and Z' each independently represents a monovalent substituent and n is an integer ranging from 1 to 5.

Specific examples of X' appearing in the general formula (vii-1) are those listed above in connection with the substituent X.

Specific examples of Z' appearing in the general formula (vii-1) are those listed above in connection with the substituent Z.

Specific examples of W appearing in the general formula (vii-1) are a hydrogen atom, a halogen atom, an alkyl or substituted alkyl group, an aryl or substituted aryl group, an alkenyl or substituted alkenyl group, an alkynyl or substituted alkynyl group, a substituted carbonyl, substituted sulfinyl or substituted sulfonyl group, a hydroxyl group, a substituted oxy group, a mercapto group, a substituted thio group, an amino or substituted amino group, a phosphono or substituted phosphono group, a phosphonate or substituted phosphonate group, a cyano, nitro or silyl group and a substituted onium group.

In the foregoing specific examples of W, the alkyl, substituted alkyl, aryl, substituted aryl, alkenyl or substituted alkenyl, alkynyl or substituted alkynyl, substituted carbonyl, substituted sulfinyl, substituted sulfonyl, substituted oxy, substituted thio, amino and substituted amino groups are preferably the same as those specified above in connection with the foregoing substituents X, Y and Z.

The sulfonate group (—$SO_3$—) herein used means an anionic conjugated base group derived from a sulfo group (—$SO_3H$) and it is usually used preferably in combination with a counter cation. The counter cation includes commonly known ones and, more specifically, various kinds of oniums (e.g., ammoniums, sulfoniums, phosphoniums, iodoniums, aziniums) and metal ions (e.g., $Na^+$, $K^+$, $Ca^{2+}$, $Zn^{2+}$).

The substituted phosphono group herein used means a group obtained by substituting other organic oxo groups for one or two hydroxyl groups present on the phosphono group and preferred examples thereof include a dialkyl-phosphono group, a diaryl-phosphono group, an alkylaryl-phosphono group, a monoalkyl-phosphono group and a monoaryl-phosphono group already described above. Among these, more preferably used herein are a dialkyl-phosphono group and a diaryl-phosphono group. Specific examples thereof include a diethyl-phosphono group, a dibutyl-phosphono group and a diphenyl-phosphono group.

The phosphonato group (—$PO_3^{2-}$—, —$PO_3H^-$) means an anionic conjugated base group derived from the primary acid-dissociation or the secondary acid-dissociation of a phosphono group (—$PO_3H_2$). It is usually used preferably in combination with a counter cation. The counter cation includes commonly known ones and, more specifically, various oniums (e.g., ammoniums, sulfoniums, phosphoniums, iodoniums, aziniums) and metal ions (e.g., $Na^+$, $K^+$, $Ca^{2+}$, $Zn^{2+}$).

The substituted phosphonate group herein used means an anionic conjugated base group of the above-described substituted phosphono group wherein one of the hydroxyl groups present therein is replaced with an organic oxo group. Specific examples thereof include conjugated bases of the foregoing monoalkyl-phosphono groups (—$PO_3H(alkyl)$) and monoaryl-phosphono groups (—$PO_3H(aryl)$). Preferably, the conjugated base is usually used in combination with a counter cation. The counter cation includes commonly known ones and, more specifically, various kinds of oniums (e.g., ammoniums, sulfoniums, phosphoniums, iodoniums, aziniums) and metal ions (e.g., $Na^+$, $K^+$, $Ca^{2+}$, $Zn^{2+}$).

Examples of the substituted onium groups are ammoniums, sulfoniums, phosphoniums, iodoniums and aziniums and examples of the counter anion therefor include conjugated base ions of carboxyl groups, sulfonate groups, phosphonate groups, substituted phosphonate groups, $Cl^-$, $Br^-$, $I^-$, $BF_4^-$, $ClO_4^-$ and $SbF_6^-$.

In addition, X', W and Z' may be bonded together to form a ring structure.

In this respect, when n is an integer of not less than 2, the plurality of W's present may be the same or different from one another, or they may be linked together to form a ring structure.

Such a ring structure may be, for instance, a saturated or unsaturated aliphatic ring formed through the linkage of X' with W; W with Z'; X' with Z'; or plurality of W's. Preferred are 5-, 6-, 7- and 8-membered aliphatic rings formed from these substituents together with the carbon atoms to which they are bonded. More preferably used herein are such 5- and 6-membered aliphatic rings. Further, they may additionally comprise substituents on the carbon atoms constituting the same (examples of such additional substituents are those for the substituted alkyl groups as has been described above) and a part of the carbon atoms constituting each ring may likewise be substituted with a hetero atom (such as oxygen, sulfur and/or nitrogen atoms). In addition, a part of each aliphatic ring may likewise be form a part of an aromatic ring. Preferred examples thereof are cyclopentane, cyclohexane, cycloheptane, cyclooctane, cyclo-1,3-dioxa-pentane, cyclopentene, cyclohexene, cycloheptene, cyclooctene, cyclo-1,3-dioxa-pentene, cyclo-1,3-dioxa-hexene, cyclo-hexadiene, benzo-cyclohexene, benzo-cyclohexadiene, tetrahydro-pyranone, maleimide, succinimide, phthalimide, 1,2,3,6-tetrahydro-phthalimide, 1,2-cyclo-hexane-di-carboxy-imide, 2,4,6-piperidine-trione and 1,4,5,6,7,7-hexachloro-5-norbornene-2,3-di-carboxyimide rings.

Then examples of aromatic rings formed through the linkage of X' with W; W with Z'; X' with Z'; or a plurality of W's are quinoline, isoquinoline, acridine, phenanthridine, benzoquinoline, and benzo-isoquinoline rings, with the combinations forming quinoline rings being more preferably used herein. In addition, they may additionally comprise substituents on the carbon atoms constituting the same (examples of such additional substituents are those for the substituted alkyl groups as has been described above).

The following are specific examples of the compounds represented by the general formula (vii-1) used in the present invention, but the present invention is not restricted to these specific examples at all:

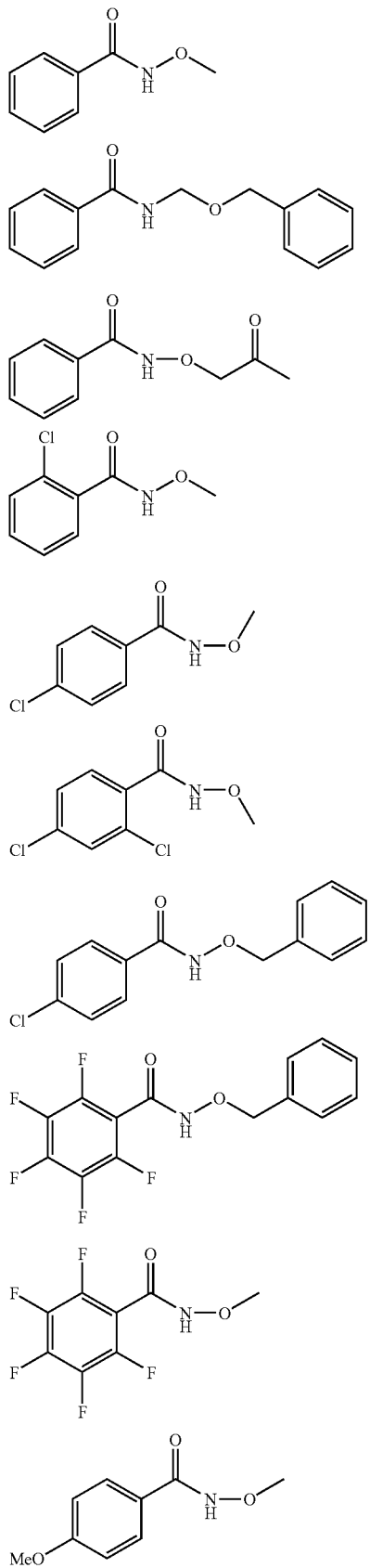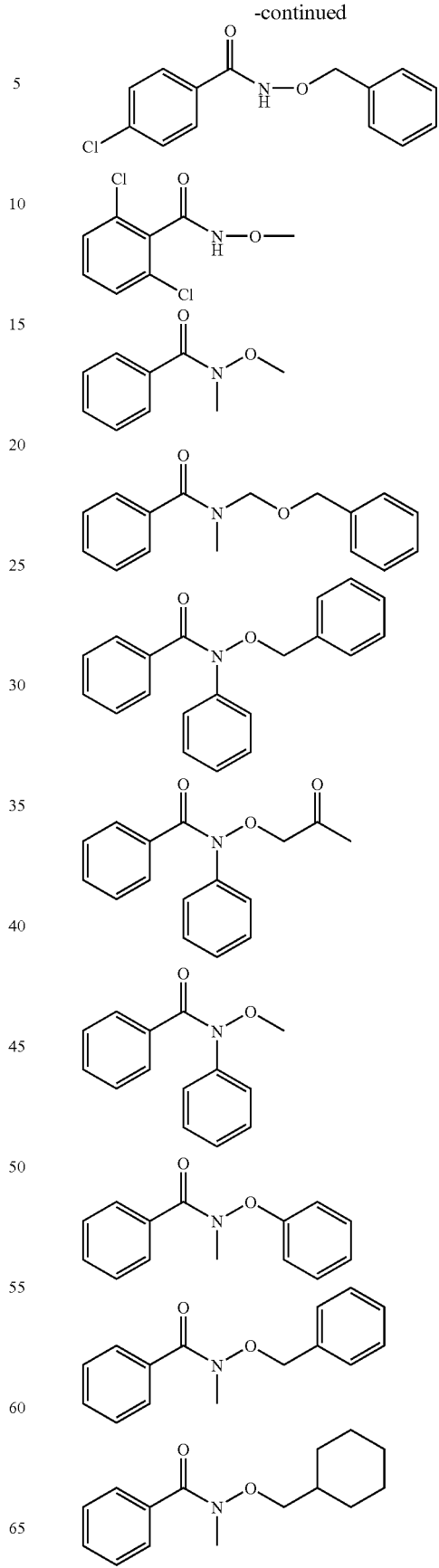

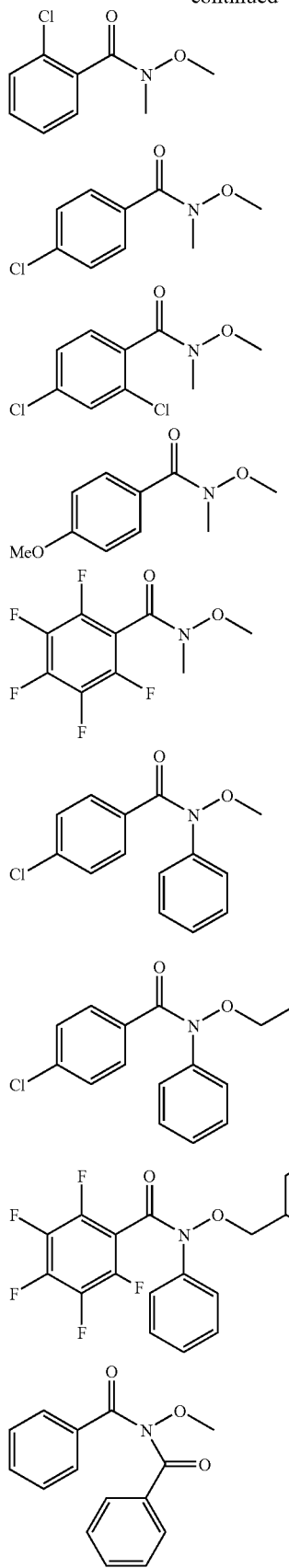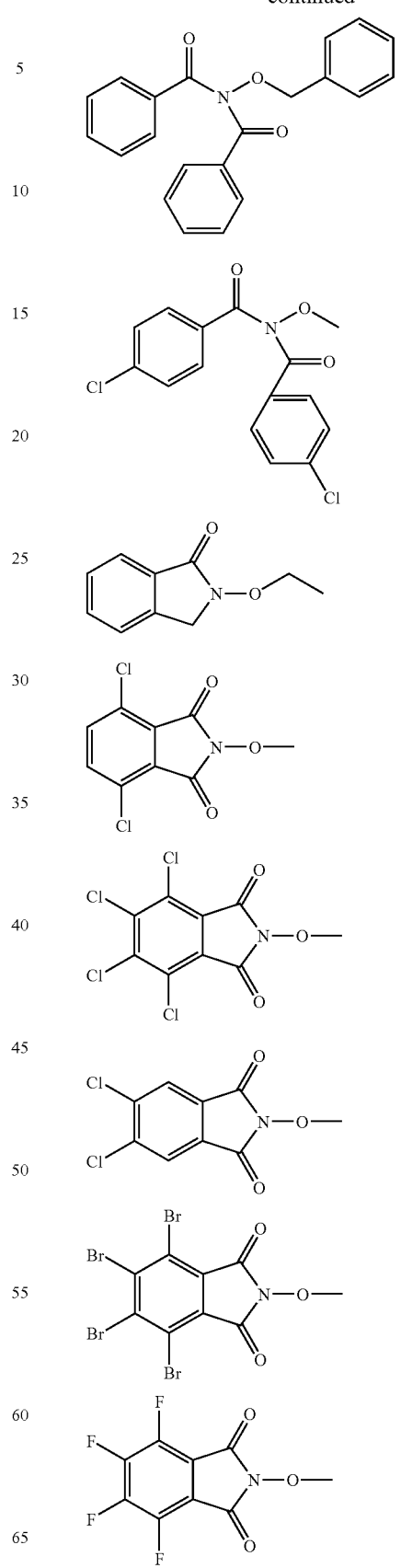

101
-continued
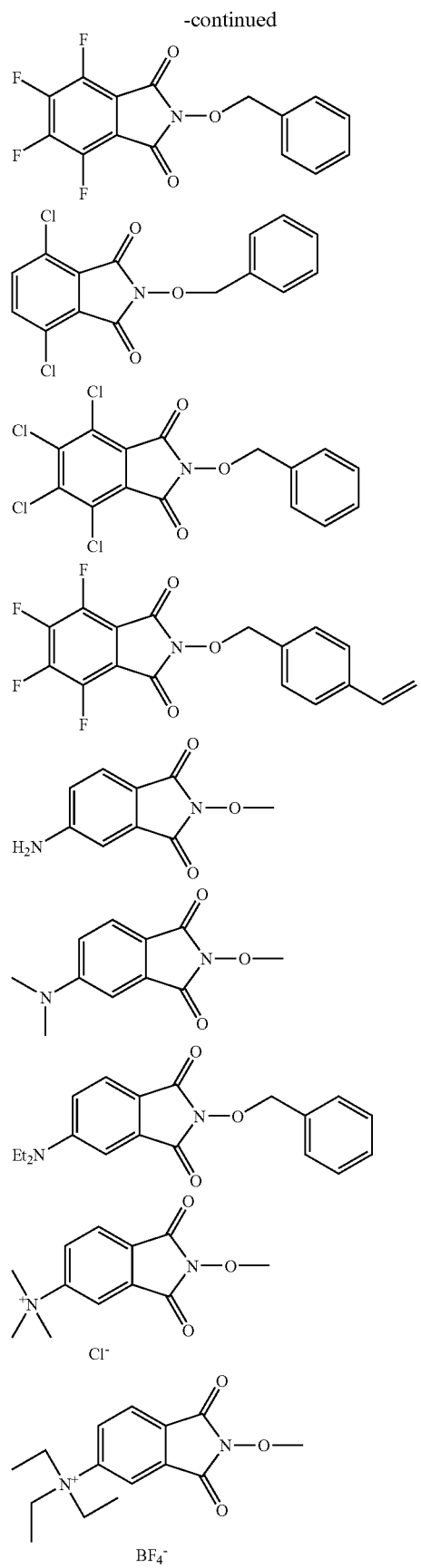
102
-continued
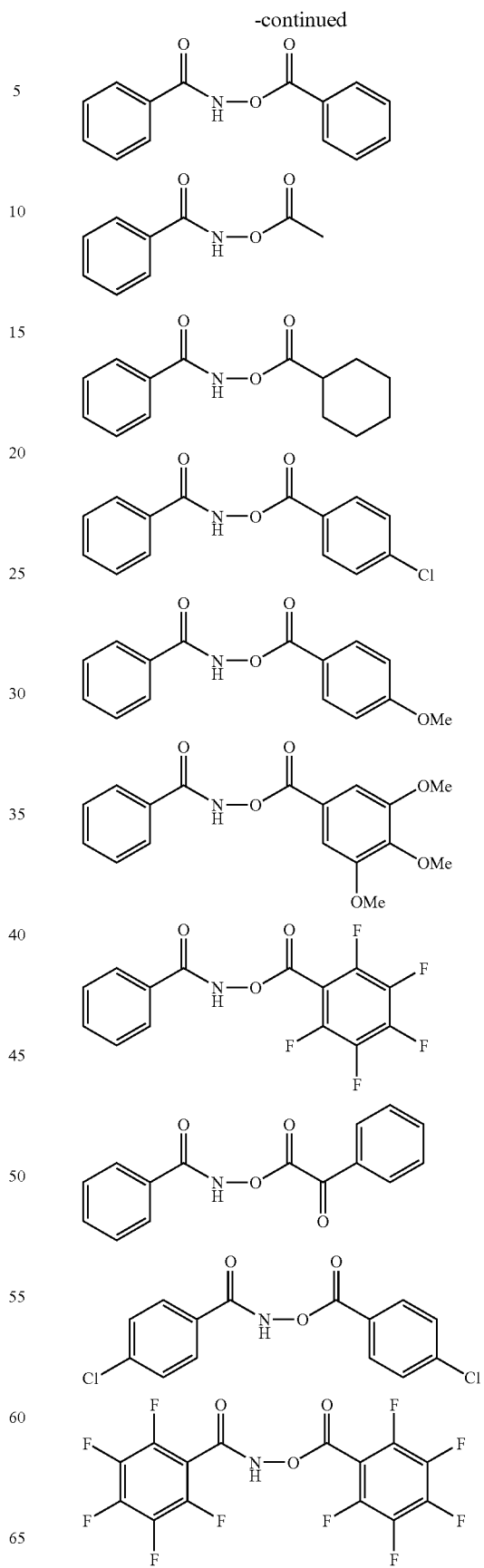

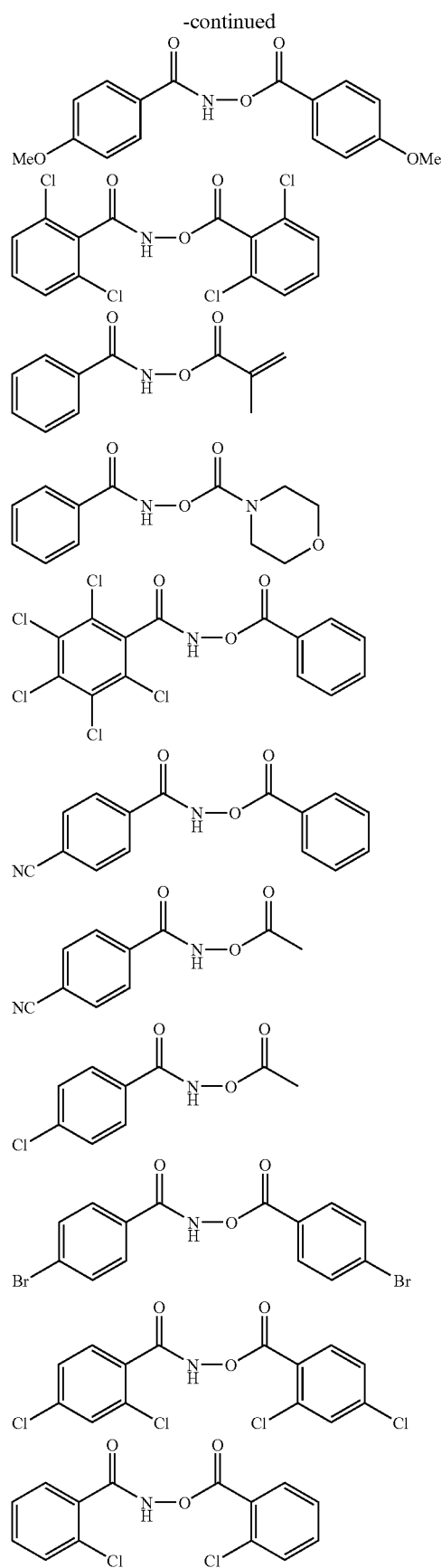
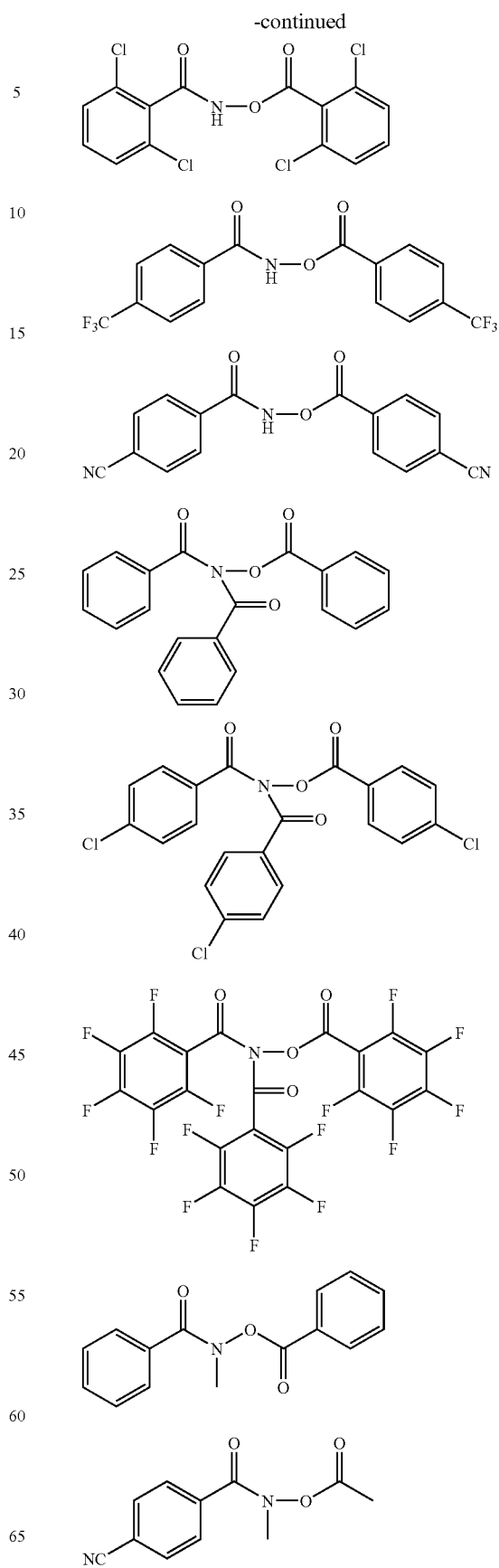

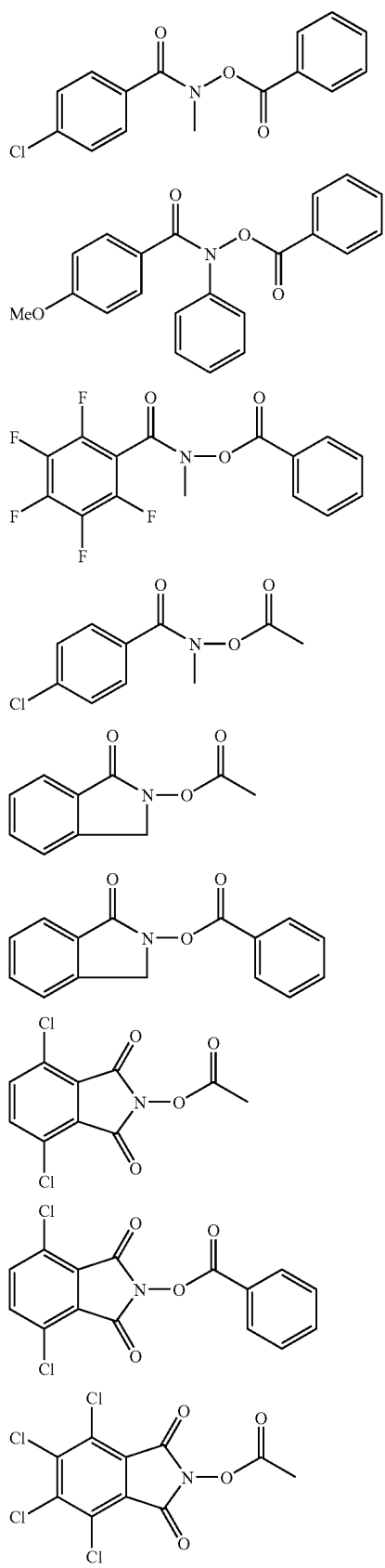
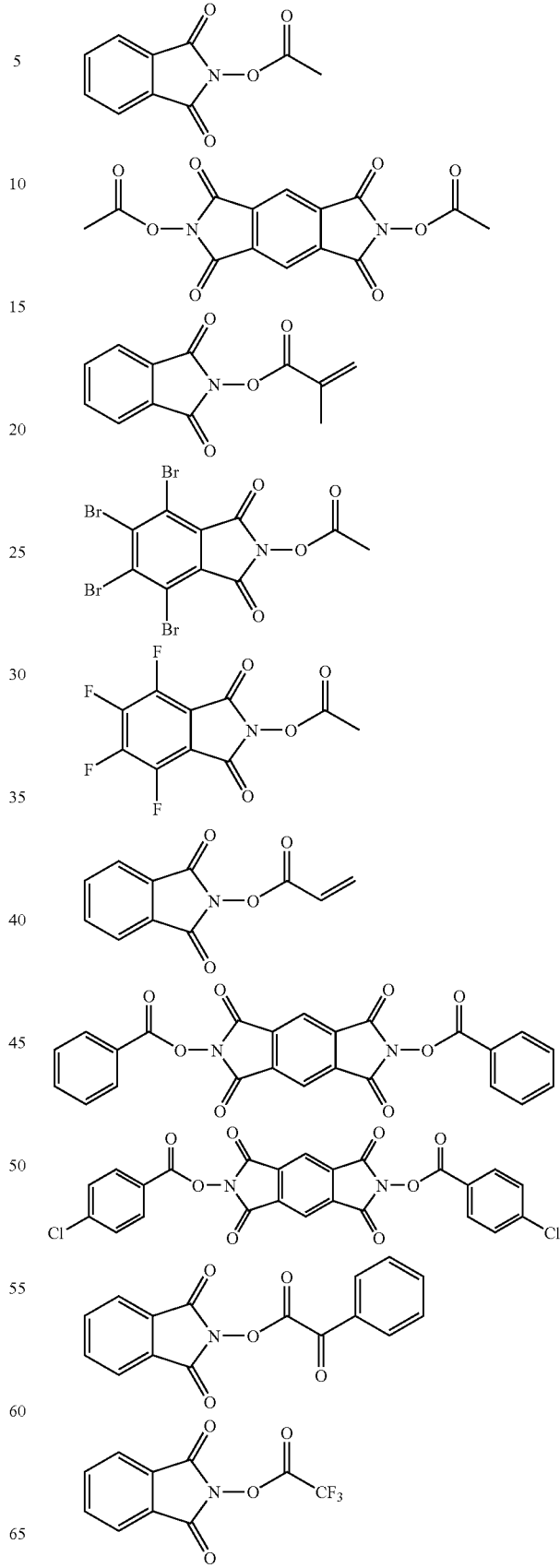

107
-continued
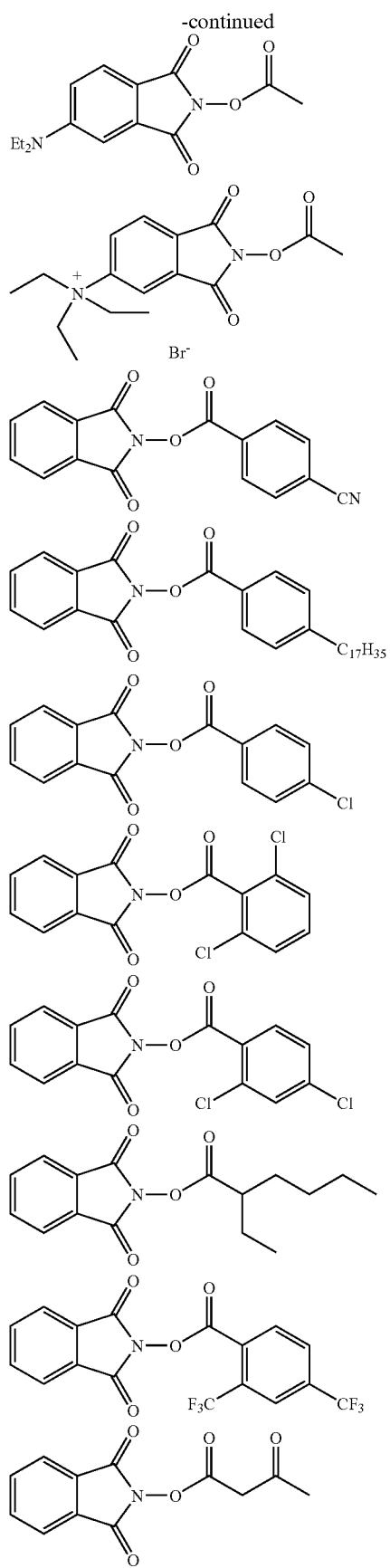
108
-continued
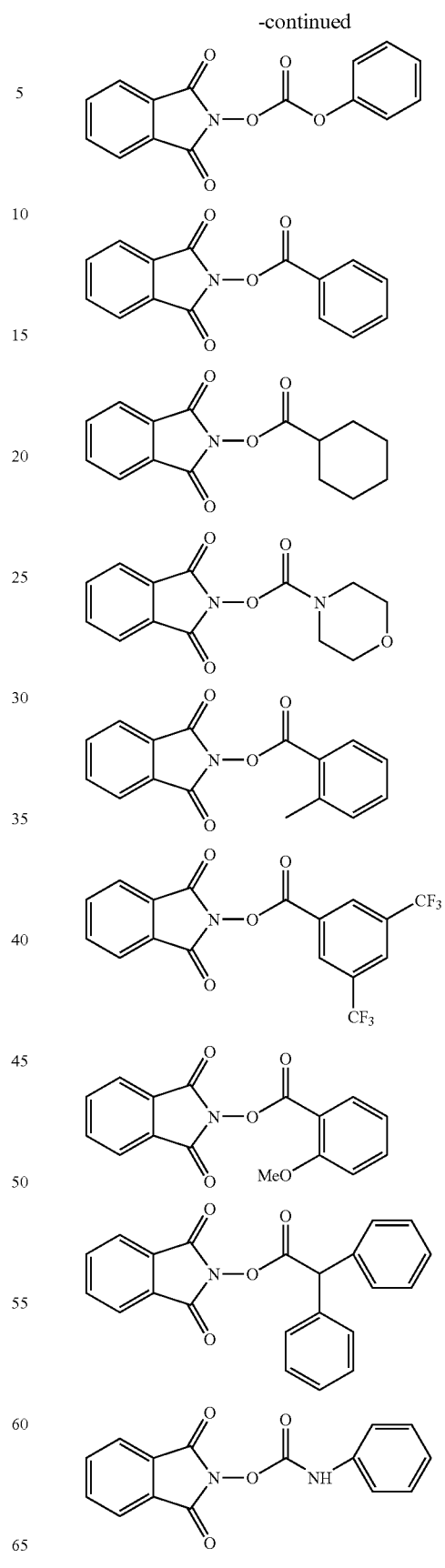

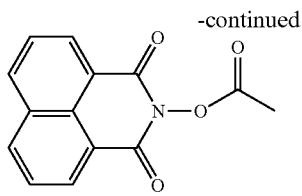

Furthermore, the compounds represented by the general formula (vii) are preferably those represented by the following general formula (vii-2) for the purpose of improving the ability of the same to interact with titanocene:

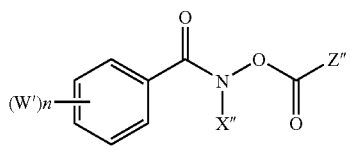

(vii-2)

In Formula (vii-2), each of X", W' and Z" independently represents a monovalent substituent and n is an integer ranging from 1 to 5.

Specific examples of X" appearing in Formula (vii-2) are the same as those described above in connection with the substituent X.

Specific examples of Z" appearing in Formula (vii-2) are the same as those described above in connection with the substituent Z.

Specific examples of W' appearing in Formula (vii-2) are the same as those described above in connection with the substituent W.

In addition, X", W' and Z" may be bonded together to form a ring structure.

Further, when n is not less than 2, a plurality of W's present in the formula may be the same or different and may likewise be bonded to one another to form a ring structure.

Examples of such ring structures are saturated and unsaturated aliphatic rings formed through the linkage between X" and W'; W' and Z"; W' and Z"; and at least two of W's and preferably, they form 5-, 6-, 7- and 8-membered aliphatic rings together with the carbon atoms to which they are bonded, with 5- and 6-membered aliphatic rings being more preferably used herein. These aliphatic rings may likewise have substituents on the carbon atoms as constituents of these rings (examples of such substituents include those for the substituted alkyl groups as has been described above) or parts of the carbon atoms as constituents of these rings may be replaced with hetero atoms (such as oxygen, sulfur and nitrogen atoms). Alternatively, a part of each aliphatic ring may constitute a part of an aromatic ring. Specific examples of such ring structure are cyclopentane, cyclohexane, cycloheptane, cyclooctane, cyclo-1,3-dioxa-pentane, cyclopentene, cyclohexene, cycloheptene, cyclooctene, cyclo-1,3-dioxa-pentene, cyclo-1,3-dioxa-hexene, cyclohexadiene, benzo-cyclohexene, benzo-cyclohexadiene, tetrahydro-pyranone, maleimide, succinimide, phthalimide, 1,2,3,6-tetrahydro-phthalimide, 1,2-cyclo-hexane-dicarboxy-imide, 2,4,6-piperidine-trione and 1,4,5,6,7,7-hexachloro-5-norbornene-2,3-dicarboxyimide rings.

Then examples of aromatic rings formed through the linkage of X' with W; W with Z'; X' with Z'; or a plurality of W's are quinoline, isoquinoline, acridine, phenanthridine, benzo-quinoline, and benzo-isoquinoline rings, with the combinations forming quinoline rings being more preferably used herein. In addition, they may additionally comprise substituents on the ring-constituting carbon atoms (examples of such additional substituents are those for the substituted alkyl groups as has been described above).

The following are specific examples of the compounds represented by the general formula (vii-2) used in the present invention, but the present invention is not restricted to these specific examples at all:

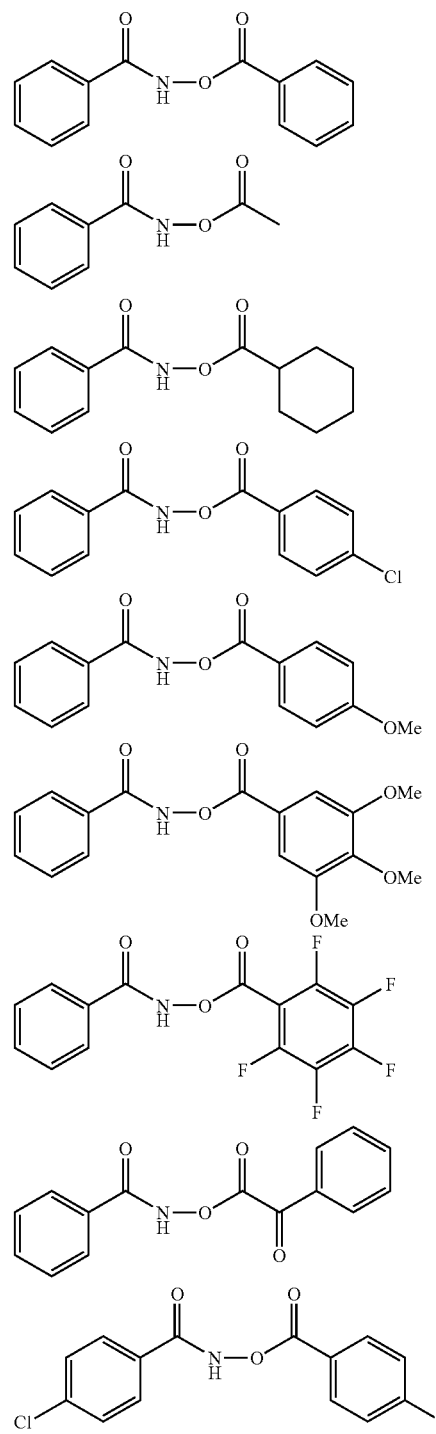

111    112
-continued    -continued
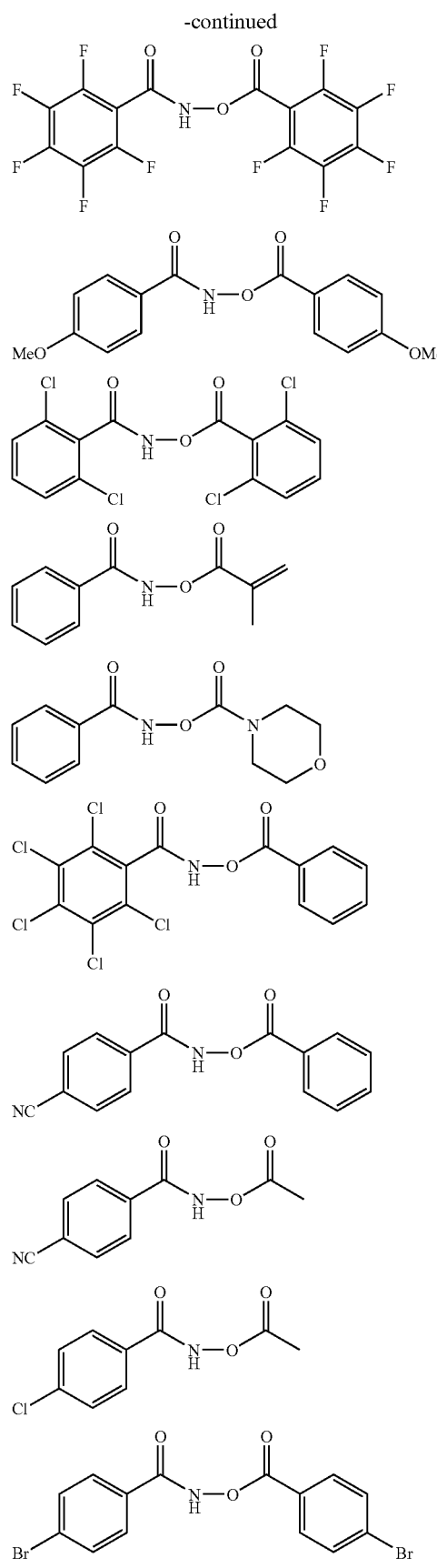
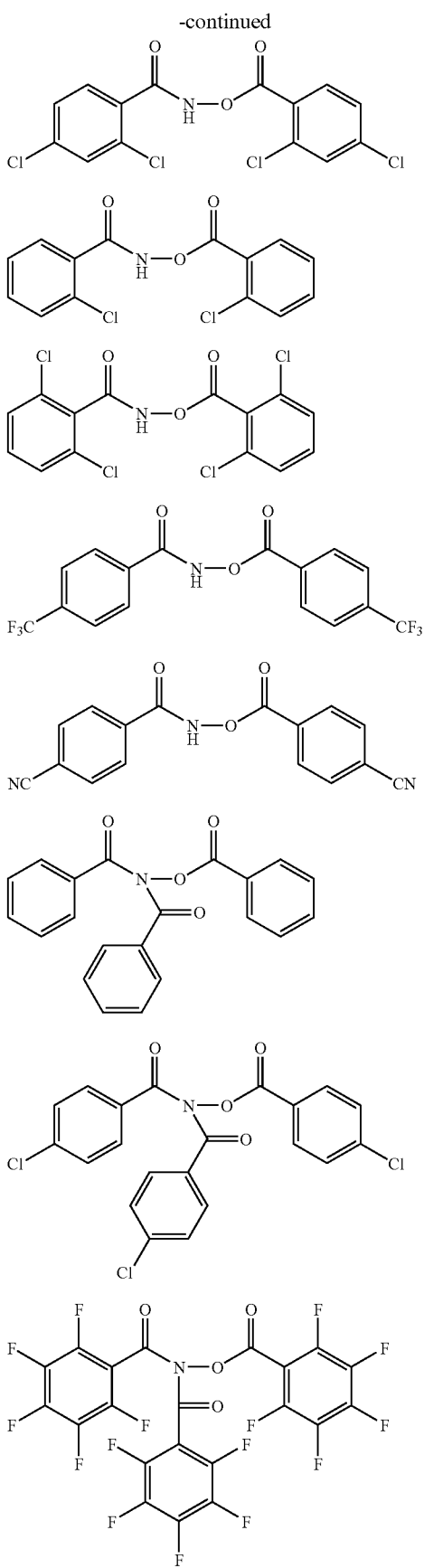

113
-continued
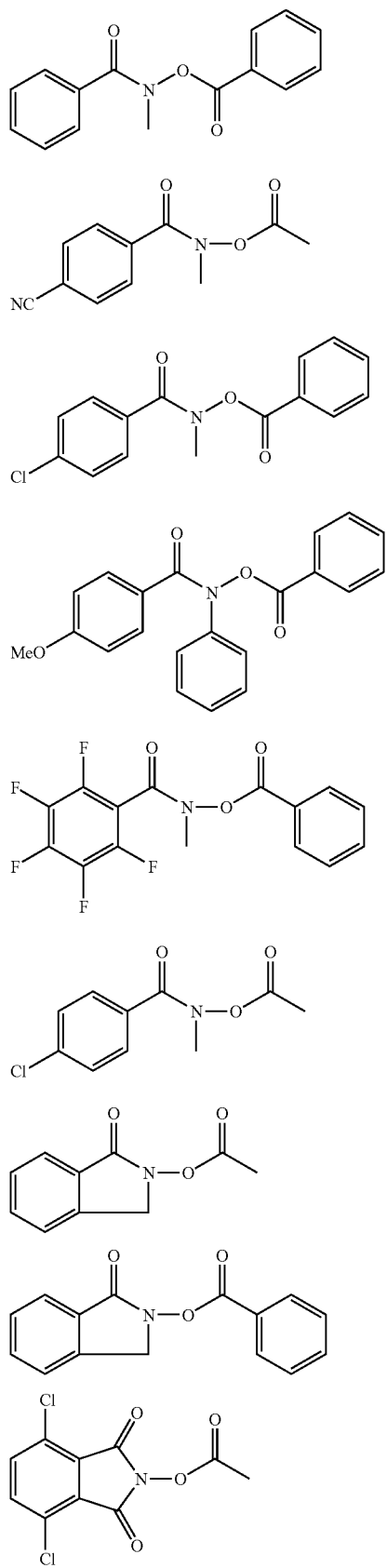
114
-continued
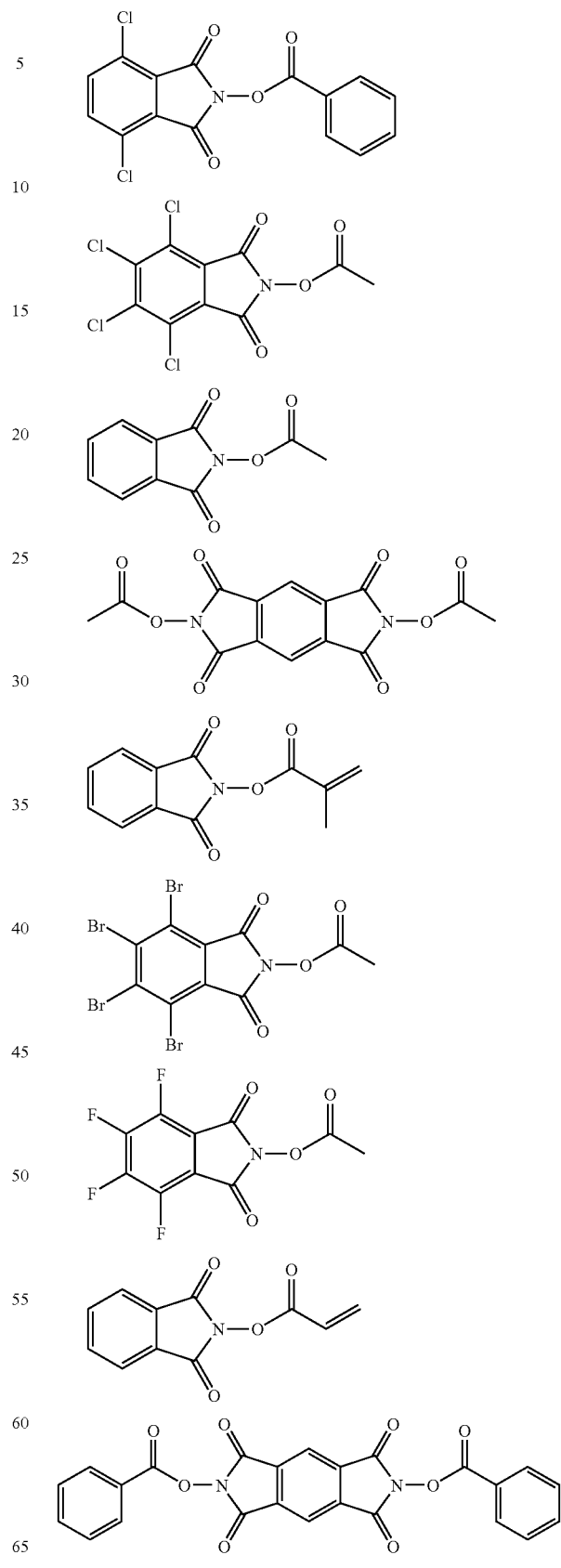

-continued
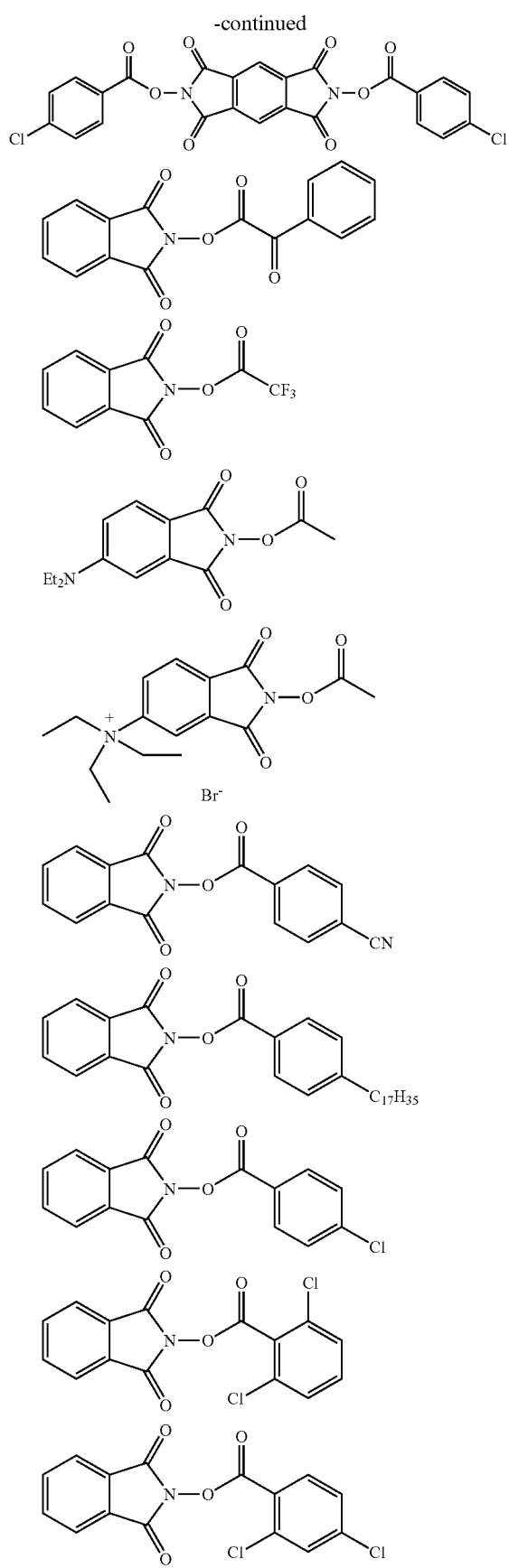
-continued
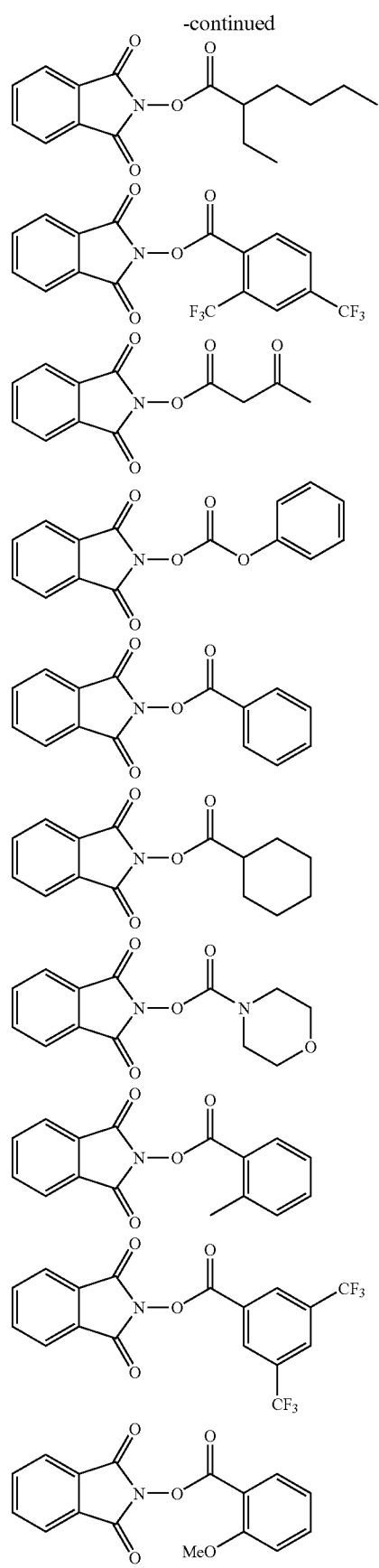

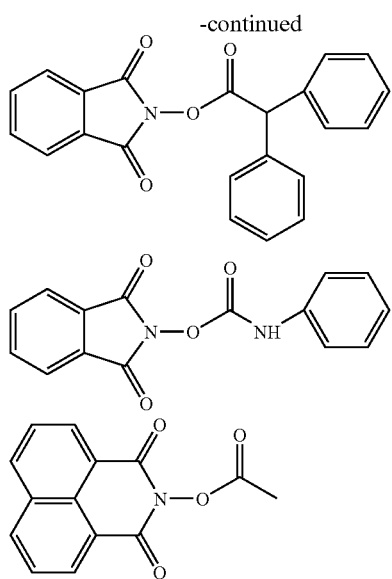

Further, the compounds represented by Formula (3) are more preferably those represented by the following general formulas (vii-3) and (vii-4) for the purpose of satisfying the requirements for the both sensitivity and stability with time:

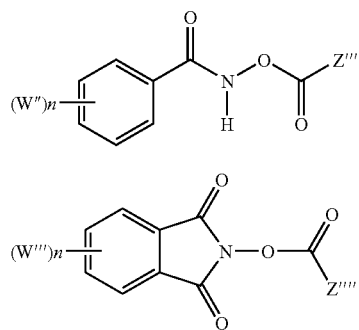

In Formulas (vii-3) and (vii-4), each of W", W'", Z'" and Z"" independently represents a monovalent substituent and n is an integer ranging from 1 to 5.

Specific examples of Z'" and Z"" appearing in Formulas (vii-3) and (vii-4) are the same as those described above in connection with the substituent Z.

Specific examples of W", W'" appearing in Formula (vii-3) and (vii-4) are the same as those described above in connection with the substituent W.

In addition, W" and Z'" or W'" and Z"" may be bonded together to form a ring structure.

Further, when n is not less than 2, a plurality of the substituents W" or W'" may be the same or different and may likewise be bonded to one another to form a ring structure.

Examples of such ring structures are saturated and unsaturated aliphatic rings formed through the linkage between W" and Z'"; W'" and Z""; and at least two of the substituents W" or W'" and preferably, they form 5-, 6-, 7- and 8-membered aliphatic rings together with the carbon atoms to which they are bonded, with 5- and 6-membered aliphatic rings being more preferably used herein. These aliphatic rings may likewise have substituents on the carbon atoms as constituents of these rings (examples of such substituents include those for the substituted alkyl groups as has been described above) or parts of the carbon atoms serving as constituents of these rings may be replaced with hetero atoms (such as oxygen, sulfur and nitrogen atoms). Alternatively, a part of each aliphatic ring may constitute a part of an aromatic ring. Specific examples of such ring structure are cyclopentane, cyclohexane, cycloheptane, cyclooctane, cyclo-1,3-dioxa-pentane, cyclopentene, cyclohexene, cycloheptene, cyclooctene, cyclo-1,3-dioxa-pentene, cyclo-1,3-dioxa-hexene, cyclohexadiene, benzo-cyclohexene, benzo-cyclohexadiene and tetrahydro-pyranone rings.

Then examples of aromatic rings formed through the linkage of W" with Z'"; W'" with Z""; or a plurality of W" or W'" are quinoline, isoquinoline, acridine, phenanthridine, benzoquinoline, and benzo-isoquinoline rings, with the combinations forming quinoline rings being more preferably used herein. In addition, they may additionally comprise substituents on the ring-constituting carbon atoms (examples of such additional substituents are those for the substituted alkyl groups as has been described above).

The following are specific examples of the compounds represented by the general formulas (vii-3) and (vii-4) used in the present invention, but the present invention is not restricted to these specific examples at all:

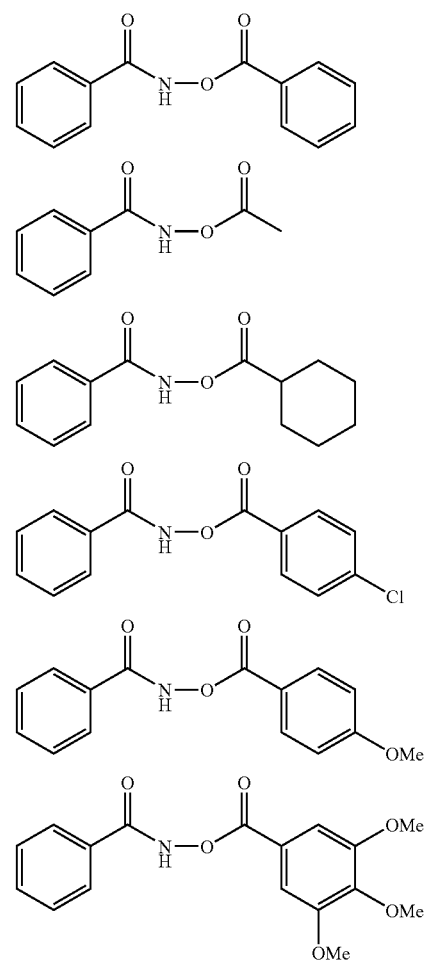

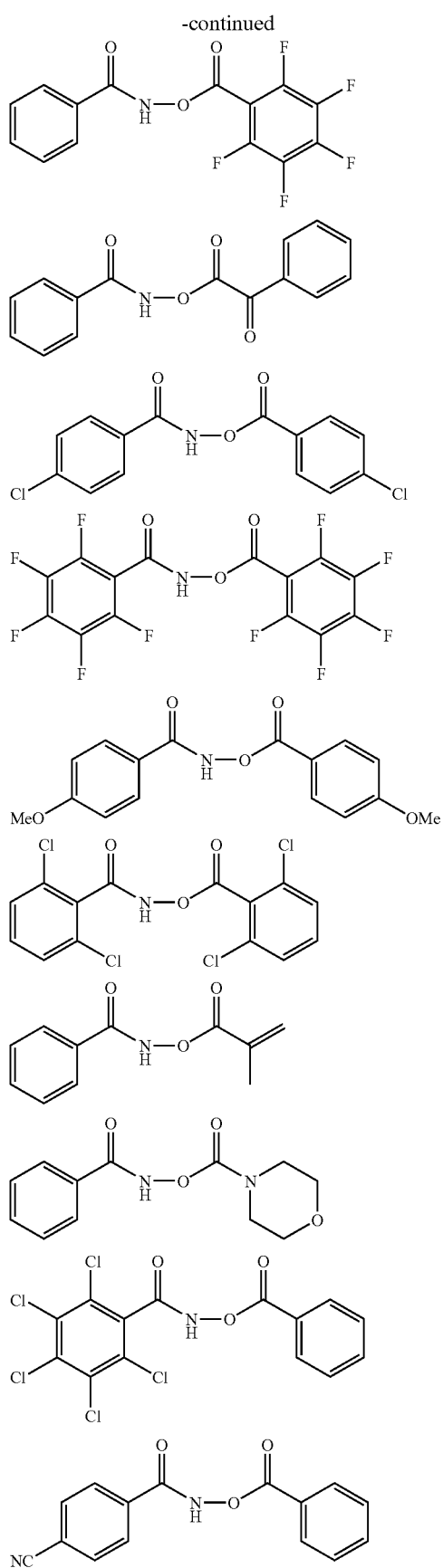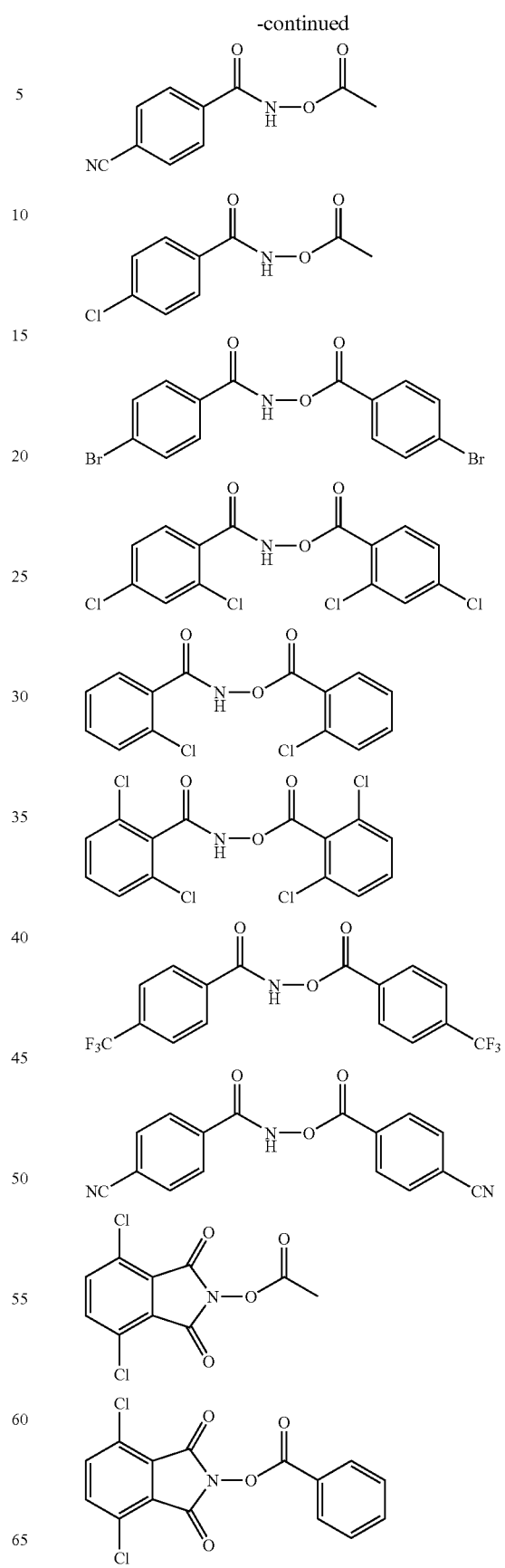

121
-continued
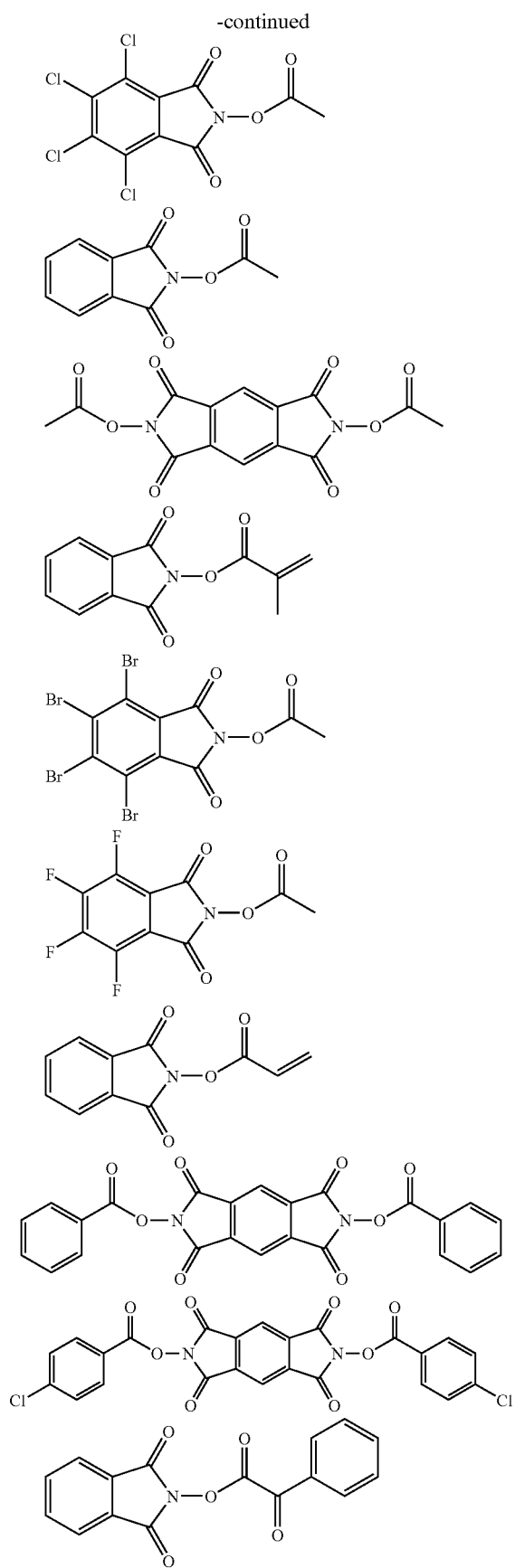
122
-continued
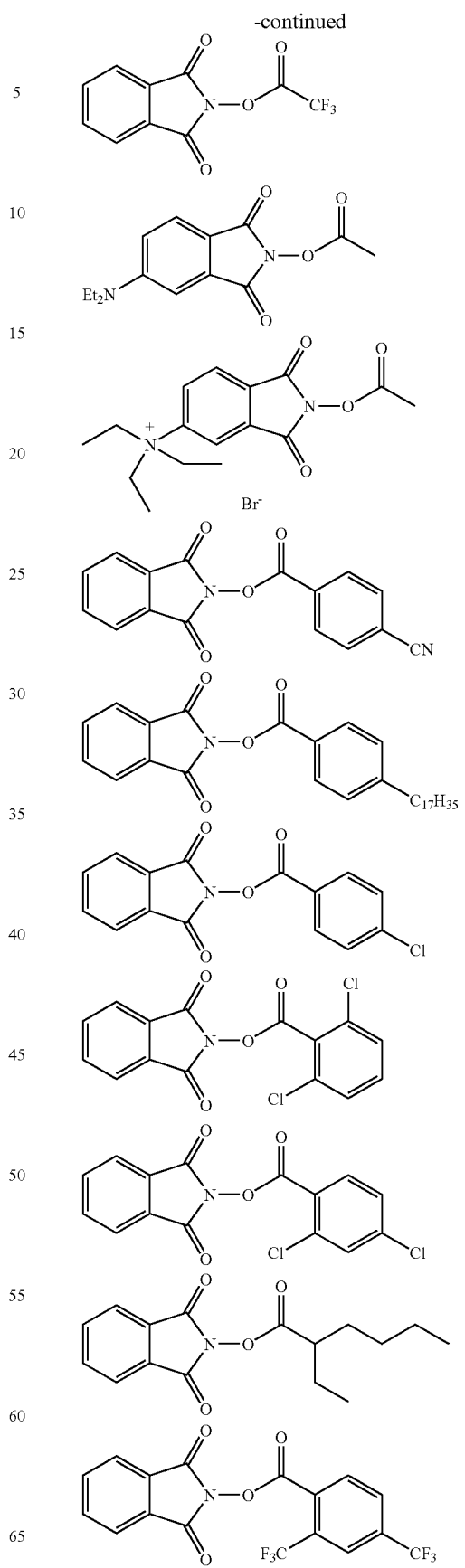

-continued

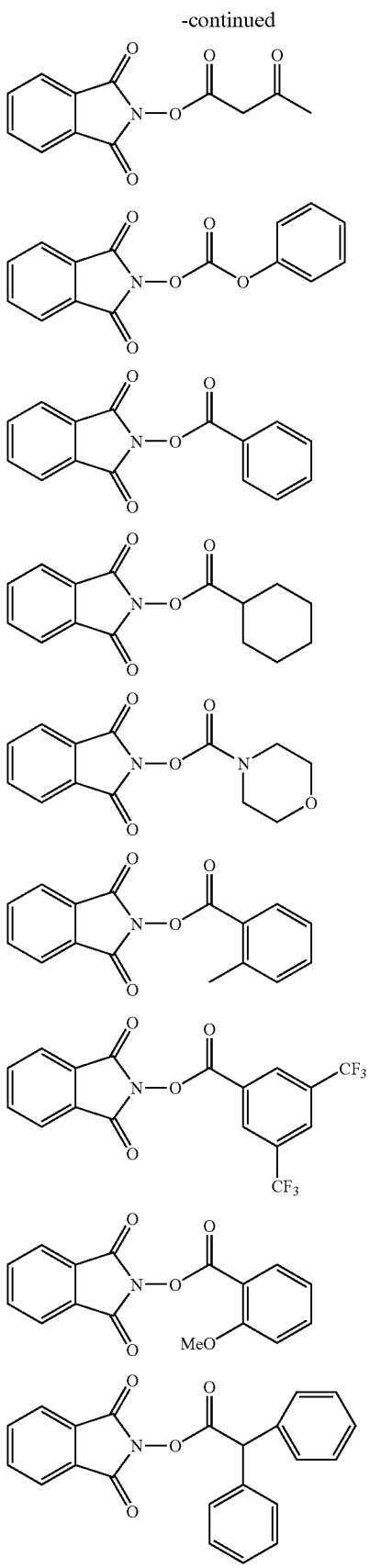

-continued

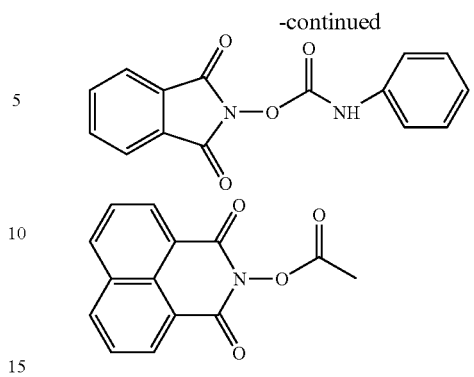

Compounds of General Formula (viii):

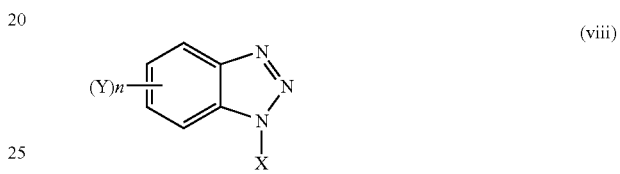

(viii)

In the general formula (viii), each of X and Y independently represents a monovalent substituent, n is an integer ranging from 1 to 4, provided that, when n is not less than 2, a plurality of Ys present may be the same or different or they may form a ring structure.

Specific examples of the monovalent substituents represented by X and Y appearing in Formula (viii) are linear or branched, chain or cyclic alkyl groups having 1 to 20 carbon atoms; linear or branched, chain or cyclic alkenyl groups having 2 to 20 carbon atoms; alkynyl groups having 2 to 20 carbon atoms; aryl groups having 6 to 20 carbon atoms; acyloxy groups having 1 to 20 carbon atoms; alkoxy-carbonyloxy groups having 2 to 20 carbon atoms; aryloxy-carbonyloxy groups having 7 to 20 carbon atoms; carbamoyloxy groups having 1 to 20 carbon atoms; carbonamide groups having 1 to 20 carbon atoms; sulfonamide groups having 1 to 20 carbon atoms; carbamoyl groups having 1 to 20 carbon atoms; sulfamoyl groups having 0 to 20 carbon atoms; alkoxy groups having 1 to 20 carbon atoms; aryloxy groups having 6 to 20 carbon atoms; aryloxycarbonyl groups having 7 to 20 carbon atoms; alkoxycarbonyl groups having 2 to 20 carbon atoms; N-acyl-sulfamoyl groups having 1 to 20 carbon atoms; N-sulfamoyl-carbamoyl groups having 1 to 20 carbon atoms; alkylsulfonyl groups having 1 to 20 carbon atoms; arylsulfonyl groups having 6 to 20 carbon atoms; alkoxy-carbonylamino groups having 2 to 20 carbon atoms; aryloxy-carbonylamino groups having 7 to 20 carbon atoms; amino groups having 0 to 20 carbon atoms; imino groups having 1 to 20 carbon atoms; ammonio groups having 3 to 20 carbon atoms; carboxyl groups, sulfo groups, oxy groups, mercapto groups; alkylsulfinyl groups having 1 to 20 carbon atoms; arylsulfinyl groups having 6 to 20 carbon atoms; alkylthio groups having 1 to 20 carbon atoms; arylthio groups having 6 to 20 carbon atoms; ureido groups having 1 to 20 carbon atoms; heterocyclic groups having 2 to 20 carbon atoms; acyl groups having 1 to 20 carbon atoms; sulfamoyl-amino groups having 0 to 20 carbon atoms; silyl groups having 2 to 20 carbon atoms; isocyanate groups, isocyanide groups, halogen atoms (such as fluorine, chlorine and bromine atoms), cyano groups, nitro groups, onium groups; and hydrogen atom. These substituents may further have additional substituents. In addition, when n is not less than 2, a plurality of substituents Y may be the same or different or may form a ring structure. Examples of such ring structures thus formed are aliphatic rings (such as cycloalkane, cycloalkene and cycloalkyne rings), spiro rings, hetero rings and aromatic rings.

In addition, such ring structures may have additional substituents and examples of such substituents are those listed above as specific examples for the foregoing substituents X and Y.

The following are specific examples of the compounds represented by the general formula (viii) used in the present invention, but the present invention is not restricted to these specific examples at all:

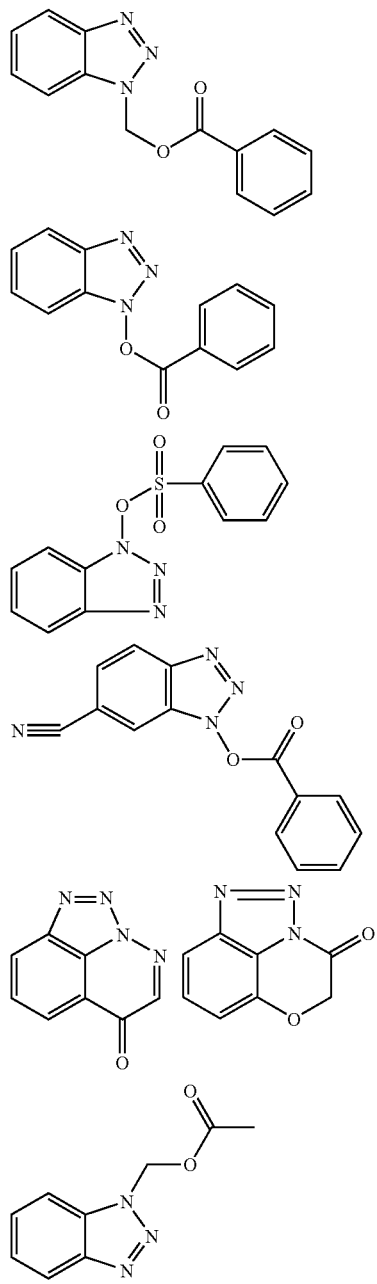

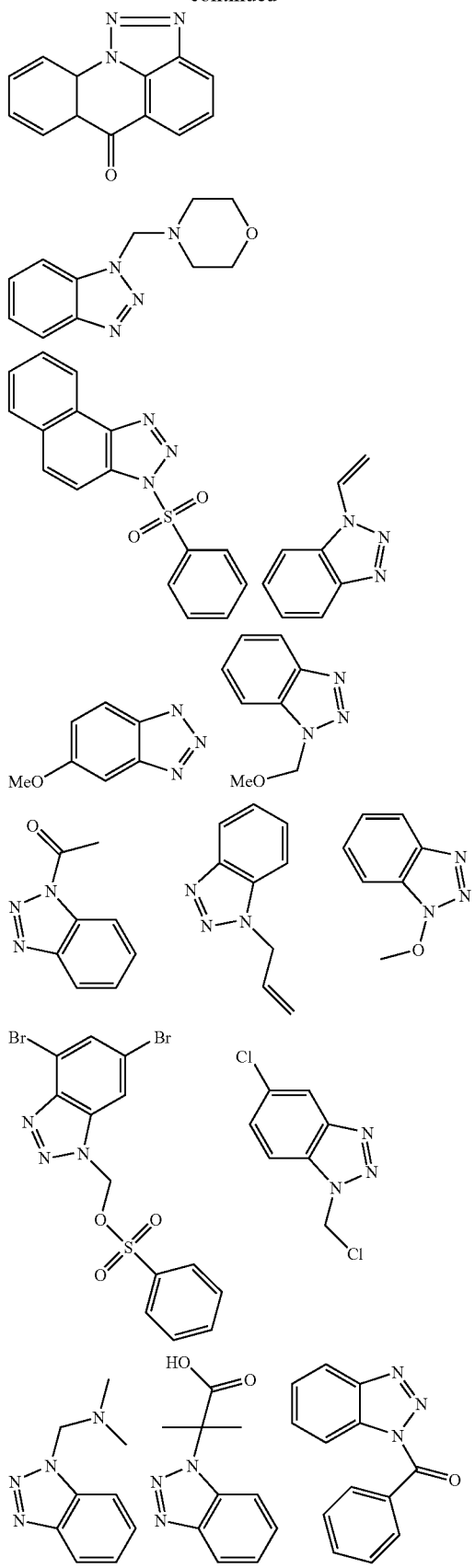

-continued
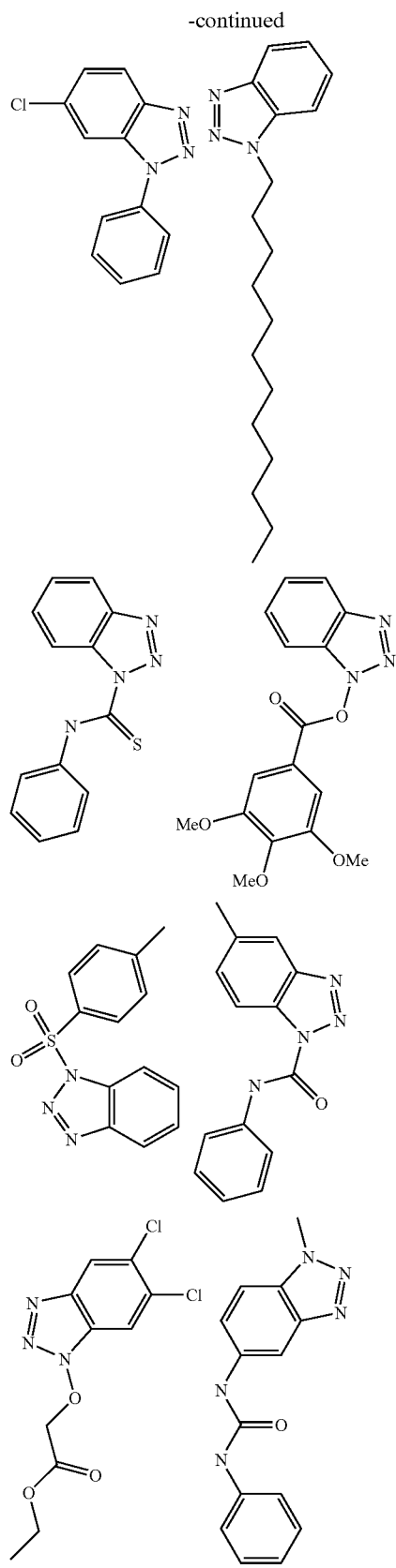
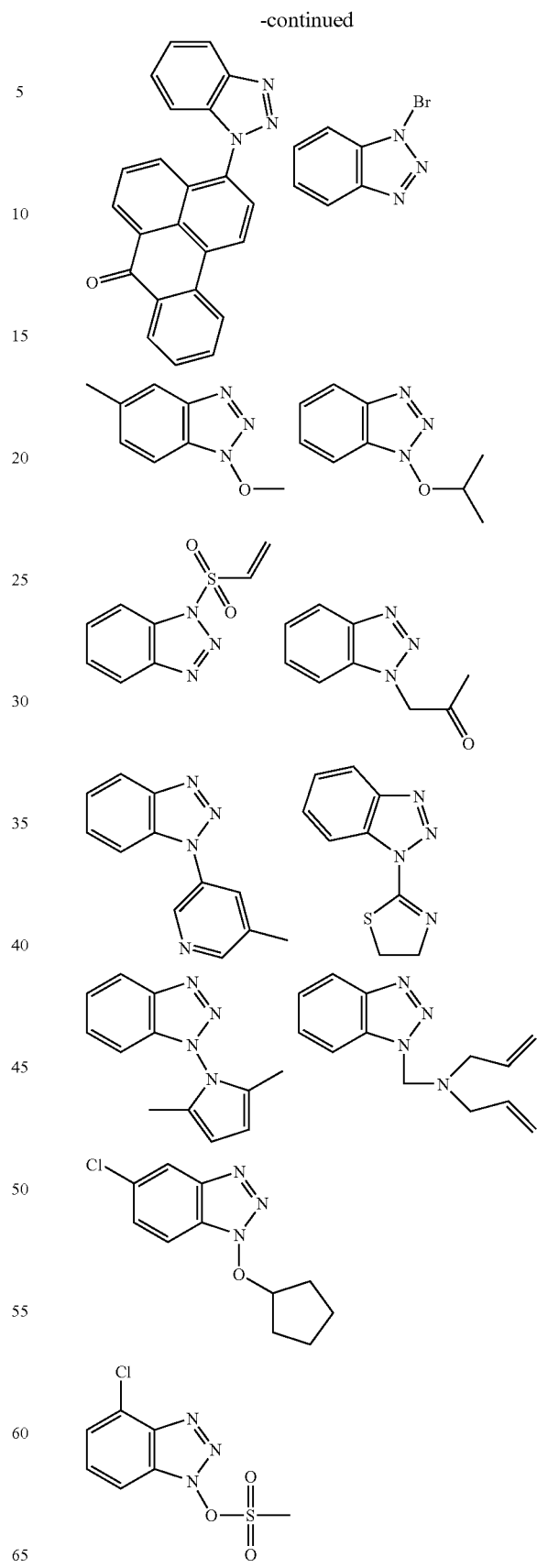

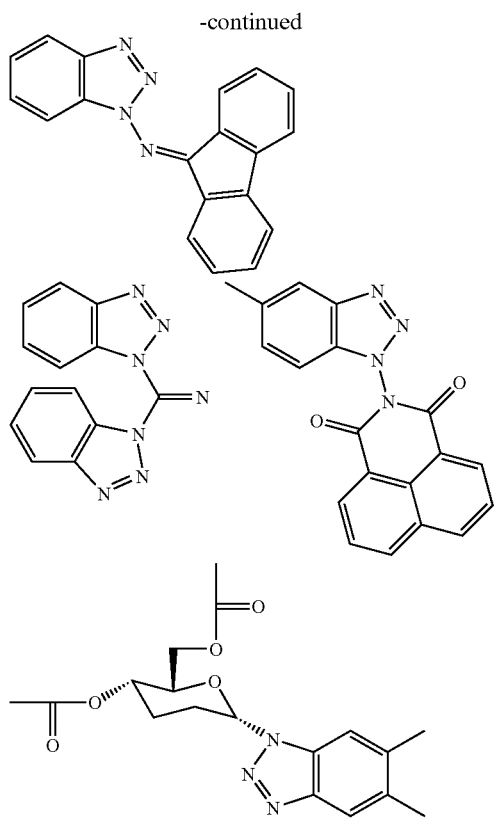

Moreover, the compounds of Formula (viii) are more preferably those represented by the following general formulas (viii-1) and (viii-2):

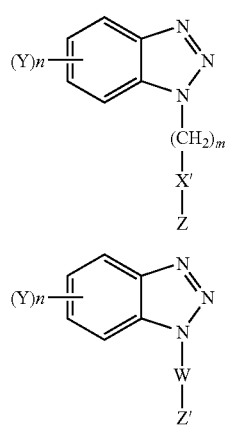

In Formulas (viii-1) and (viii-2), X' represents O, S or NZ'; each of Z, Z' and Y independently represents a monovalent substituent and n is an integer ranging from 1 to 4, provided that n is not less than 2, a plurality of substituents Y may be the same or different and they may form a ring structure. W represents —C(=O)— or —S(=O)$_2$—; and m is an integer ranging from 0 to 3.

The suffix m appearing in Formula (viii-1) is preferably 0 or 1 and X is preferably O from the viewpoint of the stability of the resulting ink jet-recording ink. On the other hand, in Formula (viii-2), W is preferably —C(=O)—.

Incidentally, in Formulas (viii-1) and (viii-2), Z, Z' and Y are, respectively, the same as those specified above in connection with the substituents X and Y appearing in Formula (viii).

The following are specific examples of the compounds represented by the general formulas (viii-1) and (viii-2) preferably used in the present invention, but the present invention is not restricted to these specific examples at all:

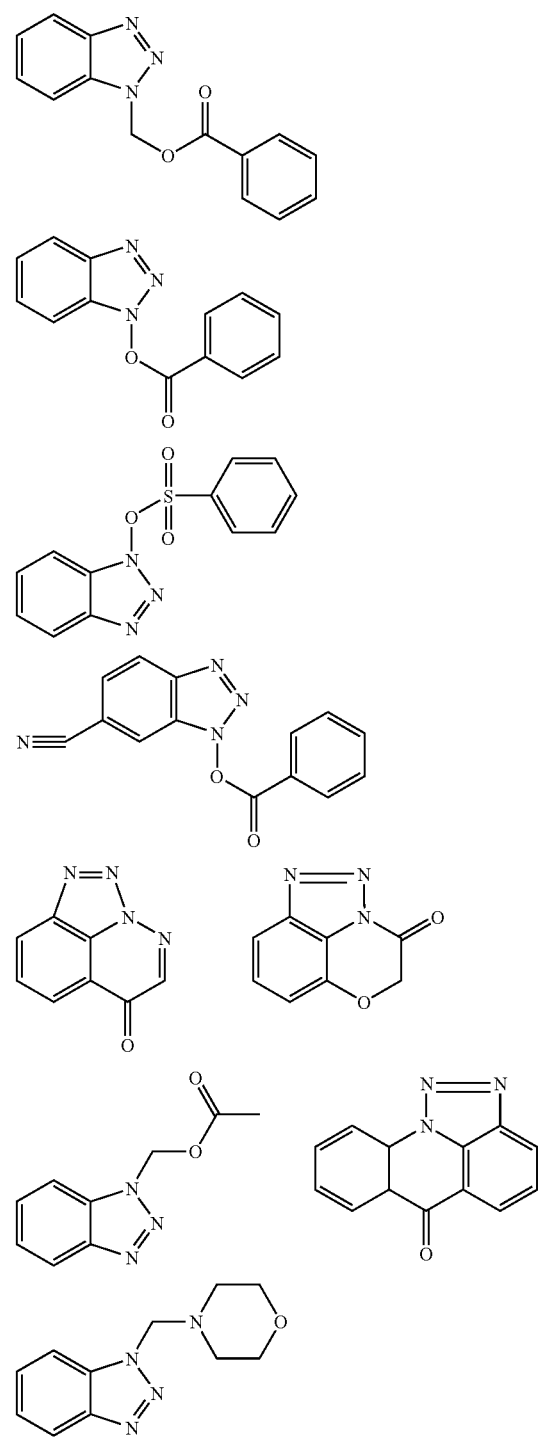

131
-continued
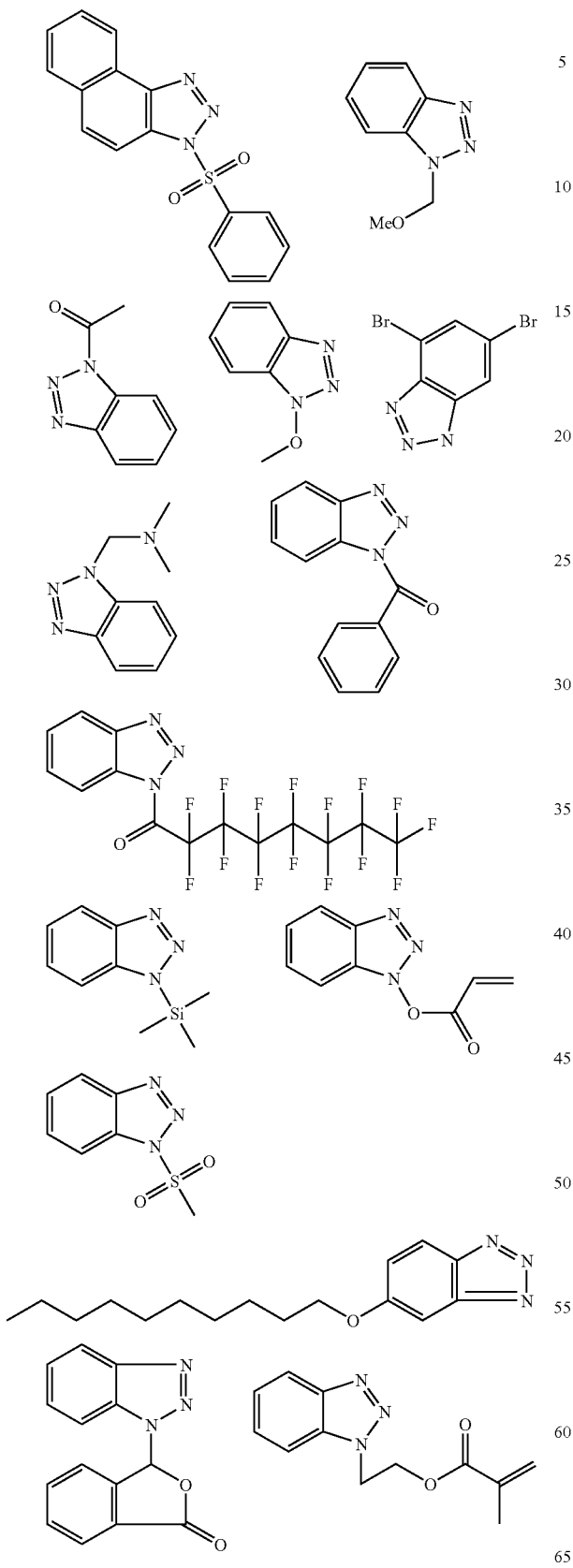
132
-continued
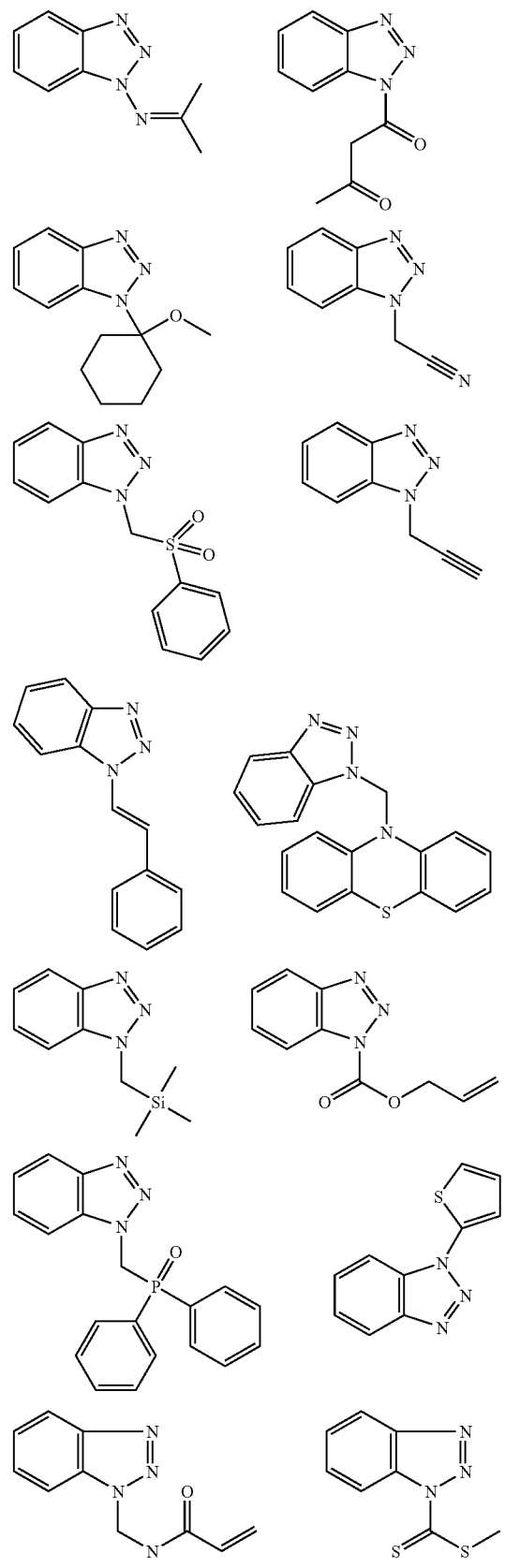

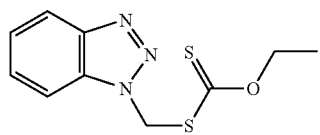
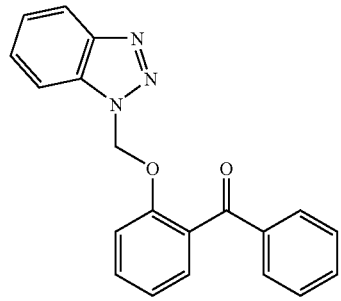
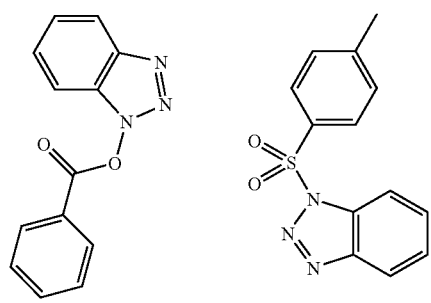
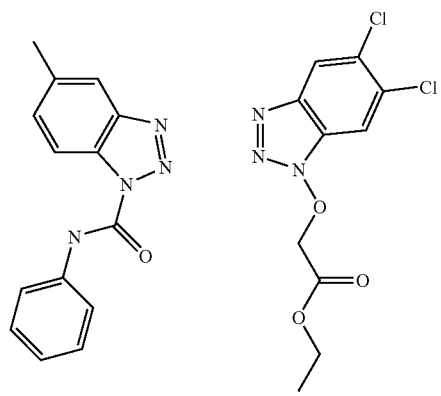
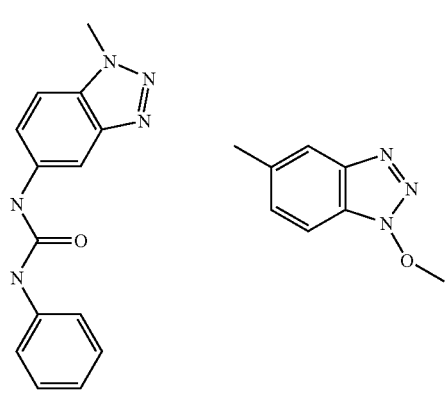
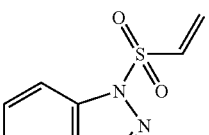
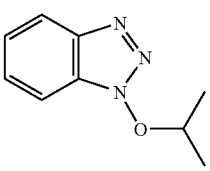
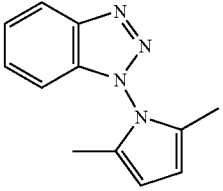
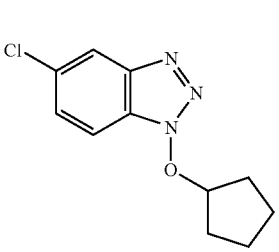
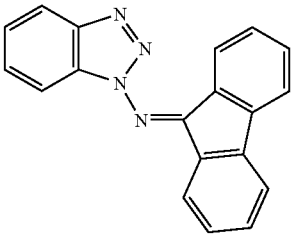
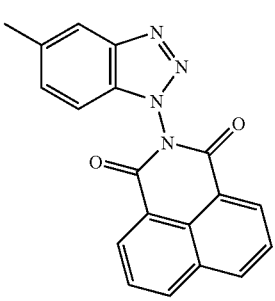
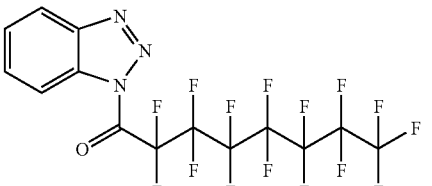
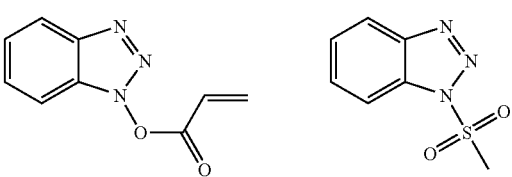

-continued

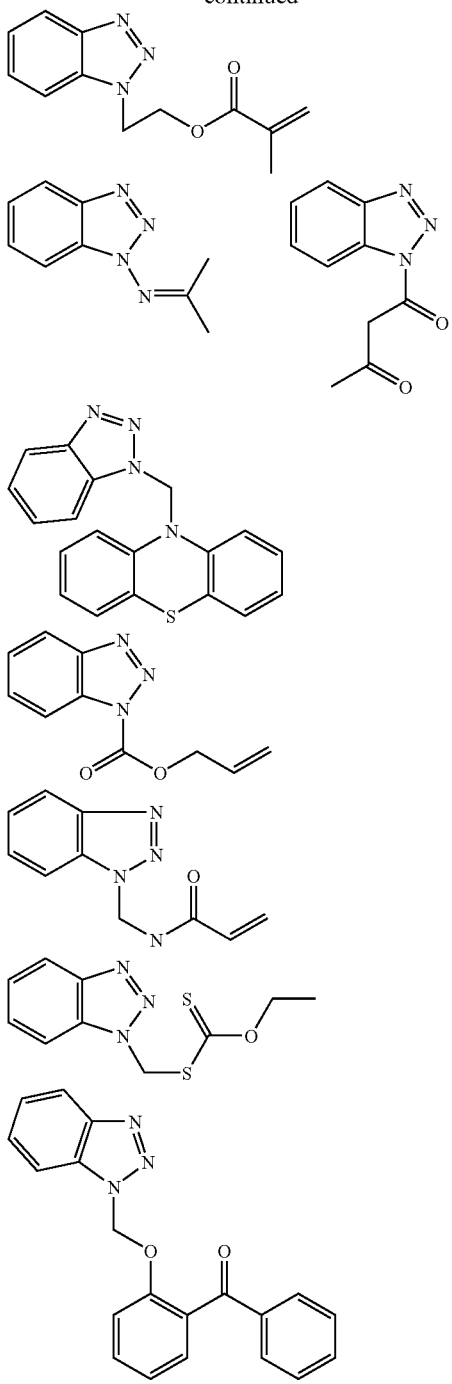

Compounds of General Formula (ix):

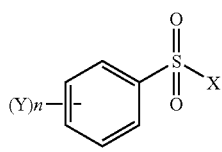

(ix)

In Formula (ix), each of X and Y independently represents a monovalent substituent and n is an integer ranging from 1 to 5, provided that when n is not less than 2, a plurality of substituents Y may be the same or different and they may form a ring structure.

Specific examples of the monovalent substituents represented by X and Y appearing in Formula (ix) are linear or branched, chain or cyclic alkyl groups having 1 to 20 carbon atoms; linear or branched, chain or cyclic alkenyl groups having 2 to 20 carbon atoms; alkynyl groups having 2 to 20 carbon atoms; aryl groups having 6 to 20 carbon atoms; acyloxy groups having 1 to 20 carbon atoms; alkoxy-carbonyloxy groups having 2 to 20 carbon atoms; aryloxy-carbonyloxy groups having 7 to 20 carbon atoms; carbamoyloxy groups having 1 to 20 carbon atoms; carbonamide groups having 1 to 20 carbon atoms; sulfonamide groups having 1 to 20 carbon atoms; carbamoyl groups having 1 to 20 carbon atoms; sulfamoyl groups having 0 to 20 carbon atoms; alkoxy groups having 1 to 20 carbon atoms; aryloxy groups having 6 to 20 carbon atoms; aryloxycarbonyl groups having 7 to 20 carbon atoms; alkoxycarbonyl groups having 2 to 20 carbon atoms; N-acyl-sulfamoyl groups having 1 to 20 carbon atoms; N-sulfamoyl-carbamoyl groups having 1 to 20 carbon atoms; alkylsulfonyl groups having 1 to 20 carbon atoms; arylsulfonyl groups having 6 to 20 carbon atoms; alkoxy-carbonylamino groups having 2 to 20 carbon atoms; aryloxy-carbonylamino groups having 7 to 20 carbon atoms; amino groups having 0 to 20 carbon atoms; imino groups having 1 to 20 carbon atoms; ammonio groups having 3 to 20 carbon atoms; carboxyl groups, sulfo groups, oxy groups, mercapto groups; alkylsulfinyl groups having 1 to 20 carbon atoms; arylsulfinyl groups having 6 to 20 carbon atoms; alkylthio groups having 1 to 20 carbon atoms; arylthio groups having 6 to 20 carbon atoms; ureido groups having 1 to 20 carbon atoms; heterocyclic groups having 2 to 20 carbon atoms; acyl groups having 1 to 20 carbon atoms; sulfamoyl-amino groups having 0 to 20 carbon atoms; silyl groups having 2 to 20 carbon atoms; isocyanate groups, hydroxyl group, isocyanide groups, halogen atoms (such as fluorine, chlorine and bromine atoms), cyano groups, nitro groups, onium groups; and hydrogen atom. These substituents may further have additional substituents.

In addition, when n is not less than 2, a plurality of substituents Y may be the same or different or may form a ring structure. Examples of such ring structures thus formed are aliphatic rings (such as cycloalkane, cycloalkene and cycloalkyne rings), spiro rings, hetero rings and aromatic rings.

In addition, such ring structures may have additional substituents and examples of such substituents are those listed above as specific examples for the foregoing substituents X and Y.

The following are specific examples of the compounds represented by the general formula (ix) used in the present invention, but the present invention is not restricted to these specific examples at all:

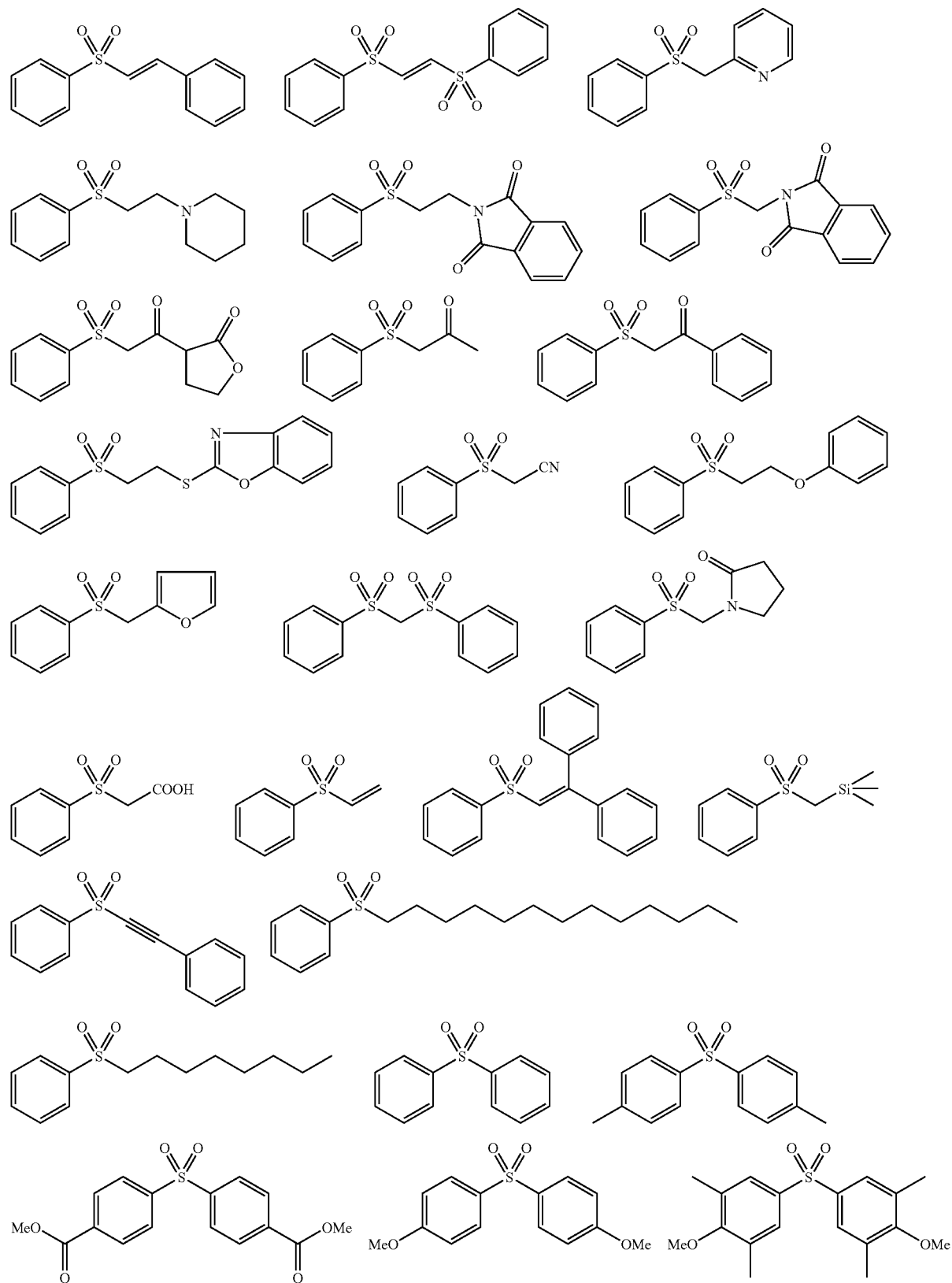

-continued
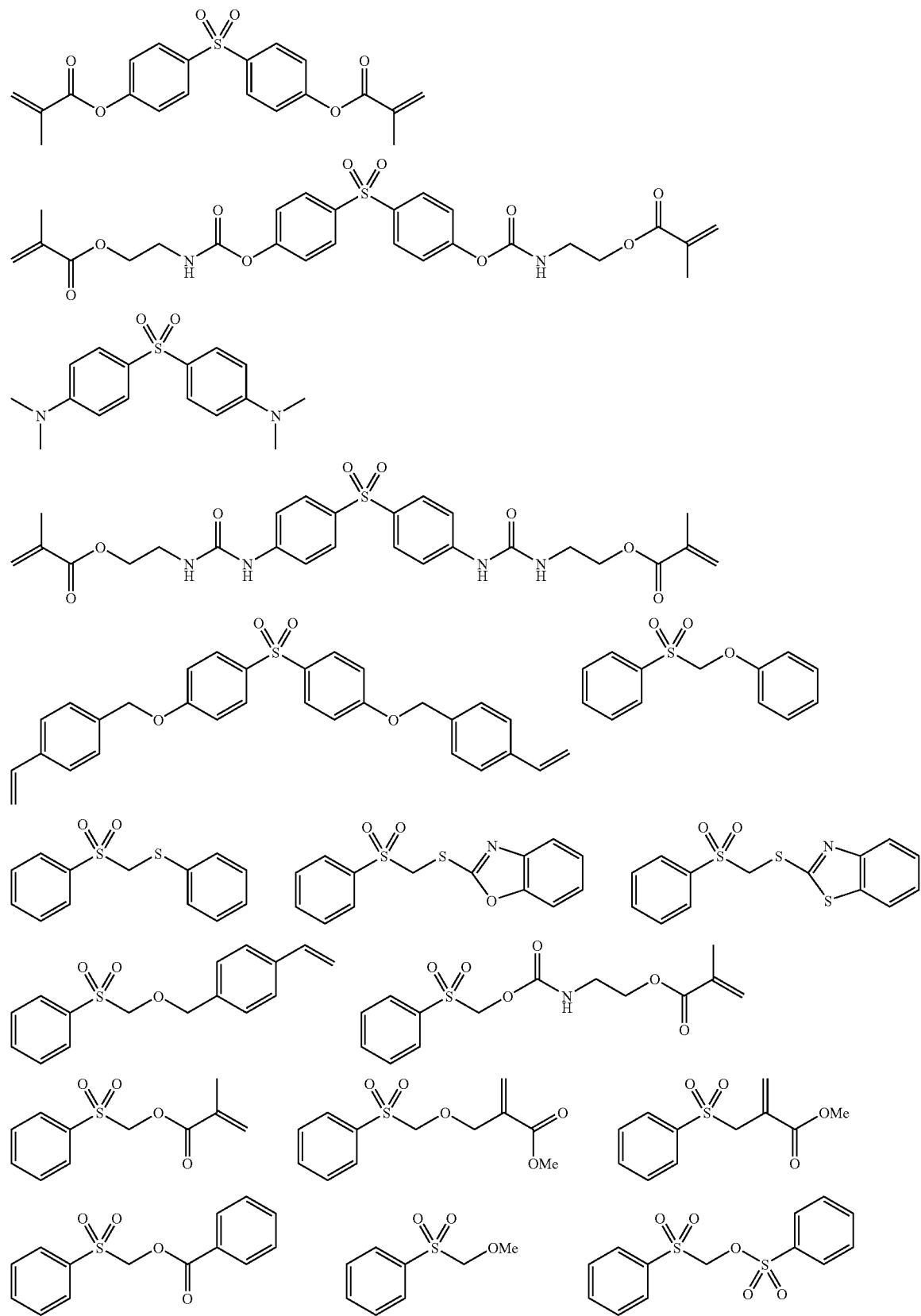

The compounds represented by the foregoing general formula (ix) are preferably those represented by the following general formulas (ix-1) and (ix-2):

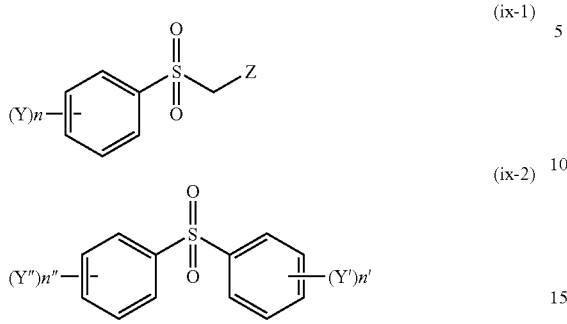

In Formulas (ix-1) and (ix-2), Z, Y, Y' and Y" have the meanings identical to those specified above for the foregoing substituents X and Y appearing in Formula (ix), and n, n', n" each independently represents an integer ranging from 1 to 5, provided that, when n, n' and n" are not less than 2, a plurality of each substituent Y, Y' or Y" may be the same or different and may form a ring structure.

More preferably, the compounds represented by the foregoing general formula (ix) are those represented by the following general formula (ix-3):

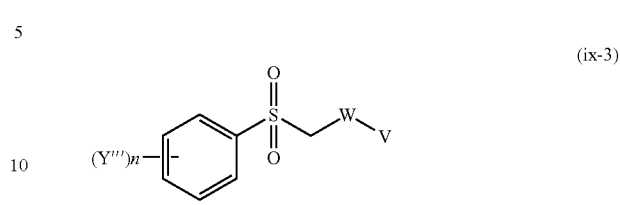

In Formula (ix-3), Y''' and V have the meanings identical to those specified above for the foregoing substituents X and Y appearing in Formula (ix), and n represents an integer ranging from 1 to 5, provided that, when n is not less than 2, a plurality of the substituents Y''' may be the same or different and may form a ring structure. In addition, W represents an O or S atom.

The following are specific examples of the compounds of Formulas (ix-1) and (ix-2) preferably used in the invention, but the present invention is not restricted to these specific examples at all:

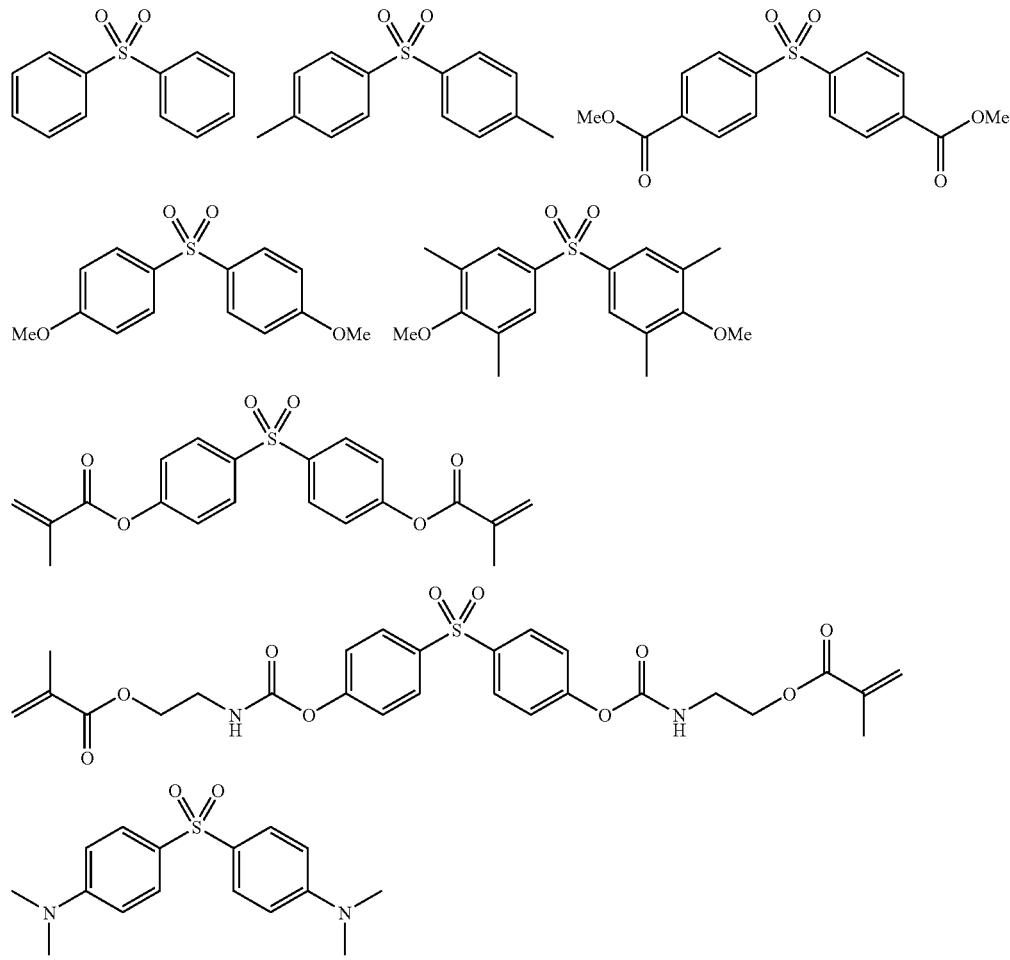

-continued

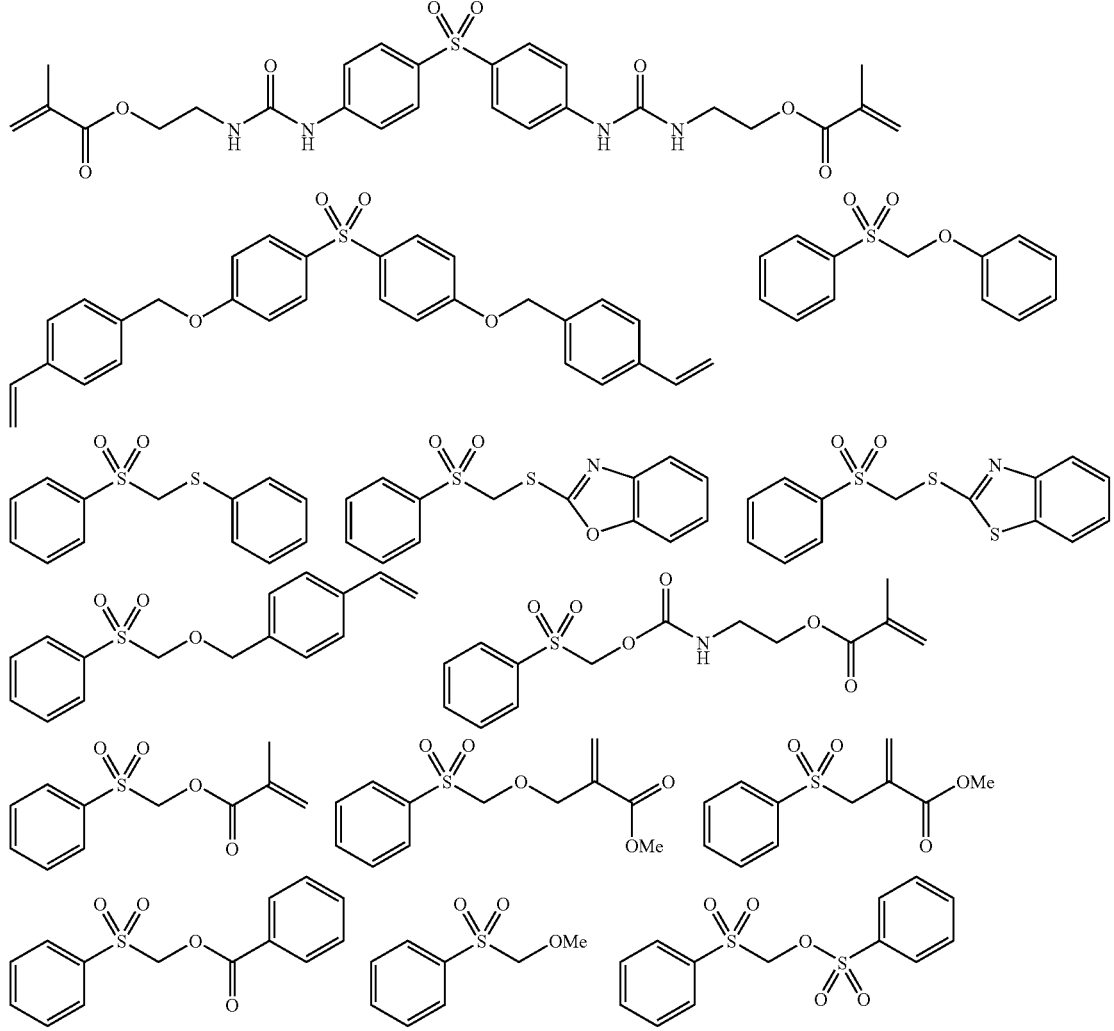

Among these compounds represented by the foregoing general formulas (i) to (iv) and (vii) to (ix) used in the present invention as the co-sensitizing agents, preferably used herein are those represented by the general formulas (i), (iii), (vii) and (viii) since they can simultaneously satisfy the requirements for the sensitivity and the stability with time, with the compounds of Formula (i) being most preferably used in the invention.

The compound represented by the foregoing general formula (i) to (iv) or (vii) to (ix) is preferably incorporated into the ink jet-recording ink according to the present invention in an amount ranging from 0.5 to 40% by mass, preferably 1 to 30% by mass and more preferably 2 to 20% by mass on the basis of the total mass of the ink.

(1-2) Polymerization Initiator

Now, the polymerization initiators for radical polymerization or cationic polymerization will be detailed below, which are used in the ink jet-recording ink of the present invention.

The polymerization initiator used in the invention is a compound which undergoes a chemical change through the action of light rays or the interaction with a sensitizing dyestuff in its electronic excitation state to thus generate at least one of a radical, an acid and a base.

Specifically, the polymerization initiators usable herein may be any initiator conventionally known to those having ordinary skill in the art without any restriction and specific examples thereof are a large number of compounds and/or systems as disclosed in, for instance, Bruce M. Monroe et al., Chemical Revue, 1993, 93:435; R. S. Davidson, Journal of Photochemistry and Biology A: Chemistry, 1993, 73:81; J. P. Faussier, "Photoinitiated Polymerization-Theory and Applications": Rapra Review, vol. 9, Report, Rapra Technology (1998); and M. Tsunooka et al., Prog. Polym. Sci., 1996, 21:1. In addition, various kinds of chemically sensitizable photoresists or compounds used in the photolytic cationic polymerization are likewise disclosed in "Organic Materials for Use in Imaging", pp. 187-192, edited by Society of Organic Electronics Materials, published by BUNSHIN Publishing Company (1993). Moreover, there have also been known a group of compounds capable of undergoing oxidative or reductive cleavage through the interaction with a sensitizing dyestuff in its electronic excitation state such as those disclosed in, for instance, F. D. Saeva, Topics in Current Chemistry, 1990, 156:59; G. G. Maslak, Topics in Current Chemistry, 1993, 168:1; H. B. Shuster et al., JACS, 1990, 112:6329; and I. D. F. Eaton et al., JACS, 1980, 102:3298.

Examples of preferred polymerization initiators are (a) aromatic ketones, (b) aromatic onium salt compounds, (c) organic peroxides, (d) hexaaryl-biimidazole compounds, (e) ketoxime ester compounds, (f) borate compounds, (g) azinium compounds, (h) metallocene compounds, (i) active ester compounds and (j) compounds having carbon-halogen bonds.

(a) Aromatic Ketones: Preferred examples of aromatic ketones are compounds having benzophenone skeletons or thioxanthone skeletons, disclosed in "RADIATION CURING IN POLYMER SCIENCE AND TECHNOLOGY", J. P. FOUASSIER, J. F. RABEK (1993), pp. 77-117. Examples of aromatic ketones more preferably used herein include α-thiobenzophenone compounds disclosed in Japanese Examined Patent Publication (hereunder referred to as "J.P. KOKOKU") Sho 47-6416; benzoin ether compounds disclosed in J.P. KOKOKU Sho 47-3981; α-substituted benzoin compounds disclosed in J.P. KOKOKU Sho 47-22326; benzoin derivatives disclosed in J.P. KOKOKU Sho 47-23664; aroyl phosphonic acid esters disclosed in Japanese Un-Examined Patent Publication (hereunder referred to as "J.P. KOKAI") Sho 57-30704; di-alkoxy-benzophenones disclosed in J.P. KOKOKU Sho 60-26483; benzoin ethers disclosed in J.P. KOKOKU Sho 60-26403 and J.P. KOKAI Sho 62-81345; α-amino-benzophenones disclosed in J.P. KOKOKU Hei 1-34242, U.S. Pat. No. 4,318,791 and E.P. No. 0284561A1; p-di-(dimethylamino-benzoyl)benzene disclosed in J.P. KOKAI Hei 2-211452; thio-substituted aromatic ketones disclosed in J.P. KOKAI Sho 61-194062; acyl-phosphine sulfides disclosed in J.P. KOKOKU Hei 2-9597; acyl-phosphines disclosed in J.P. KOKOKU Hei 2-9596; thio-xanthones disclosed in J.P. KOKOKU Sho 63-61950; and coumarins disclosed in J.P. KOKOKU Sho 59-42864.

(b) Aromatic Onium Salts: The aromatic onium salts usable herein include, for instance, those of the elements belonging to Groups V, VI and VII of Periodic Table such as N, P, As, Sb, Bi, O, S, Se, Te and I. Examples thereof are iodonium salts disclosed in E.P. No. 1-4143, U.S. Pat. No. 4,837,124, and J.P. KOKAI Nos. Hei 2-150848 and Hei 2-96514; sulfonium salts disclosed in E.P. Nos. 370693, 233567, 297443, 297442, 279210 and 422570, and U.S. Pat. Nos. 3,902,144, 4,933,377, 4,760,013, 4,734,444 and 2,833,827; diazonium salts (such as substituted or unsubstituted benzene diazoniums); resins of diazonium salts (such as formaldehyde resins of diazo-diphenylamine); N-alkoxy pyridinium salts (for instance, those disclosed in, for instance, U.S. Pat. No. 4,743,528, J.P. KOKAI Nos. Sho 63-138345, Sho 63-142345 and Sho 63-142346 and J.P. KOKOKU Sho 46-42363 such as 1-methoxy-4-phenyl pyridinium tetrafluoro-borate); and further compounds disclosed in J.P. KOKOKU Nos. Sho 52-147277, Sho 52-14278 and Sho 52-14279. These aromatic onium salts allow the formation of radicals and/or acids as active species.

(c) Organic Peroxides: The organic peroxide may include almost all of the organic compounds each having at least one oxygen-oxygen bond in the molecule and specific examples thereof preferably used herein are peroxy ester type ones such as 3,3',4,4'-tetra-(t-butyl-peroxycarbonyl) benzophenone, 3,3', 4,4'-tetra-(t-amyl-peroxy-carbonyl) benzophenone, 3,3',4,4'-tetra-(t-hexyl-peroxycarbonyl) benzophenone, 3,3', 4,4'-tetra-(t-octyl-peroxycarbonyl) benzophenone, 3,3',4,4'-tetra-(cumyl-peroxycarbonyl) benzophenone, 3,3',4,4'-tetra-(p-isopropyl-cumyl-peroxycarbonyl) benzophenone, and di-t-butyl-peroxy isophthalate.

(d) Hexaaryl Biimidazoles: Examples of such hexaaryl biimidazoles include lophine dimers disclosed in J.P. KOKOKU Nos. Sho 45-37377 and Sho 44-86516 such as 2,2'-bis-(o-chlorophenyl)-4,4',5,5'-tetraphenyl biimidazole, 2,2'-bis (o-bromophenyl)-4,4',5,5'-tetraphenyl biimidazole, 2,2'-bis(o,p-di-chlorophenyl)-4,4',5,5'-tetraphenyl biimidazole, 2,2'-bis(o-chlorophenyl)-4,4',5,5'-tetra-(m-methoxyphenyl)-biimidazole, 2,2'-bis(o,o'-di-chlorophenyl)-4,4',5,5'-tetraphenyl biimidazole, 2,2'-bis(o-nitrophenyl)-4,4', 5,5'-tetra-phenyl biimidazole and 2,2'-bis(o-trifluoro-phenyl)-4,4',5,5'-tetraphenyl biimidazole.

(e) Ketoxime Esters: Specific examples thereof are 3-benzoyloxy-iminobutan-2-one, 3-acetoxy-iminobutan-2-one, 3-propionyloxy-iminobutan-2-one, 2-acetoxy-iminopentan-3-one, 2-acetoxy-imino-1-phenylpropan-1-one, 2-benzoyloxy-imino-1-phenylpropan-1-one, 3-p-toluenesulfonyloxy-iminobutan-2-one and 2-ethoxycarbonyloxy-imino-1-phenylpropan-1-one.

The borate salts (f) used herein as other examples of the polymerization initiators include, for instance, compounds disclosed in U.S. Pat. Nos. 3,567,453 and 4,343,891 and E.P. Nos. 109,772 and 109,773.

The azinium salts (g) used herein as other examples of the polymerization initiators include, for instance, a group of compounds each having an N—O bond, such as those disclosed in J.P. KOKAI Nos. Sho 63-138345, Sho 63-142345, Sho 63-142346 and Sho 63-143537 and J.P. KOKOKU Sho 46-42363.

The metallocene compounds (h) usable herein as other examples of the polymerization initiators include, for instance, titanocene compounds disclosed in J.P. KOKAI Nos. Sho 59-152396, Sho 61-151197, Sho 63-41484, Hei 2-249 and Hei 2-4705; and iron-allene complexes disclosed in J.P. KOKAI Nos. Hei 1-304453 and Hei 1-152109.

Specific examples of the foregoing titanocene compounds are dicyclo-pentadienyl-Ti-di-chloride, dicyclo-pentadienyl-Ti-bis-phenyl, dicyclo-pentadienyl-Ti-bis-2,3,4,5,6-pentafluorophen-1-yl, dicyclo-pentadienyl-Ti-bis-2,3,5,6-tetrafluorophen-1-yl, dicyclo-pentadienyl-Ti-bis-2,4,6-trifluorophen-1-yl, dicyclo-pentadienyl-Ti-2,6-difluorophen-1-yl, dicyclo-pentadienyl-Ti-bis-2,4-difluorophen-1-yl, dimethyl-cyclopentadienyl-Ti-bis-2,3,4,5,6-pentafluorophen-1-yl, dimethyl-cyclopentadienyl-Ti-bis-2,3,5,6-tetrafluorophen-1-yl, dimethyl-cyclopentadienyl-Ti-bis-2,4-difluorophen-1-yl, bis (cyclopentadienyl)-bis-(2,6-difluoro-3-(pyr-1-yl) phenyl titanium, bis(cyclopentadienyl)-bis-[2,6-di-fluoro-3-(methyl-sulfonamide)phenyl] titanium, bis(cyclopentadienyl)-bis-[2,6-difluoro-3-(N-butyl-biaroyl-amino) phenyl] titanium.

(i) Active Ester Compounds: Specific examples thereof usable herein are nitro-benzil ester compounds disclosed in E.P. Nos. 0,290,750, 046,083, 156, 153, 271,851 and 0,388,343, U.S. Pat. Nos. 3,901,710 and 4,181,531, and J.P. KOKAI Nos. Sho 60-198538 and Sho 53-133022; imino-sulfonate compounds disclosed in E.P. Nos. 0,199, 672, 84,515, 199, 672, 044,115 and 0,101,122, U.S. Pat. Nos. 4,618,564, 4,371,605 and 4,431,774, and J.P. KOKAI Nos. Sho 64-18143, Hei 2-245756 and Hei 4-365048; and compounds as disclosed in J.P. KOKOKU Nos. Sho 62-6223 and Sho 63-14340 and J.P. KOKAI Sho 59-174831.

(j) Compounds Each Having Carbon-Halogen Bond: Examples thereof preferably used in the invention are compounds disclosed in WAKABAYASHI et al., Bull. Chem. Soc. Japan, 1969, 42:2924; compounds disclosed in G.B.

Patent No. 1,388,492; compounds disclosed in J.P. KOKAI Sho 53-133428; and compounds disclosed in German Patent No. 3,337,024.

Examples of such compounds further include those disclosed in F. C. Schaefer et al., J. Org. Chem., 1964, 29:1527; those disclosed in J.P. KOKAI Sho 62-58241; those disclosed in J.P. KOKAI Hei 5-281728; those disclosed in German Patent No. 2,641,100; compounds disclosed in German Patent No. 3,333,450; a group of compounds disclosed in German Patent No. 3,021,590; and a group of compounds disclosed in German Patent No. 3,021,599.

The following are specific examples of the compounds belonging to the foregoing groups (a) to (j):

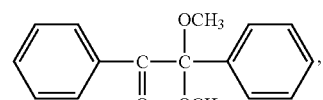

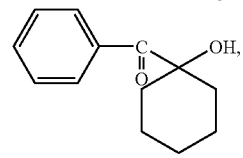

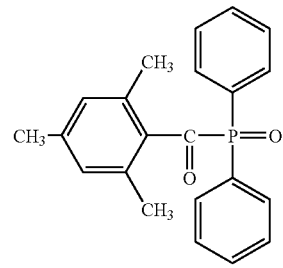

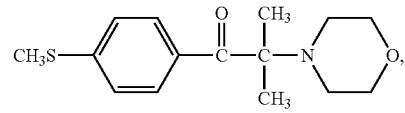

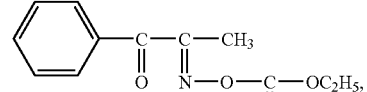

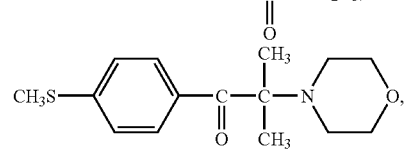

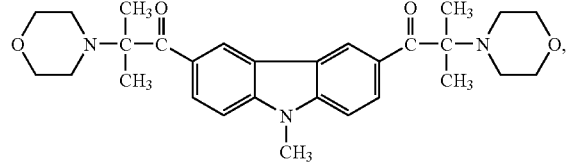

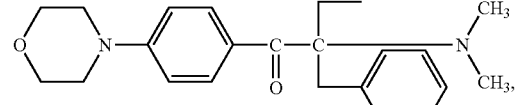

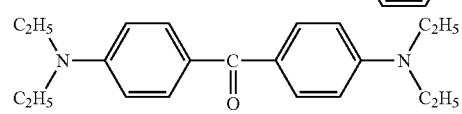

-continued

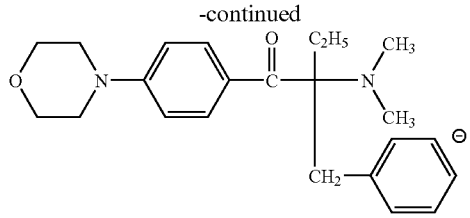

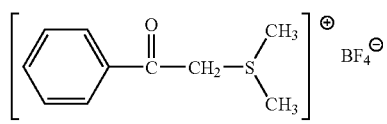

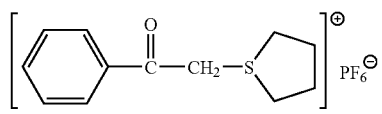

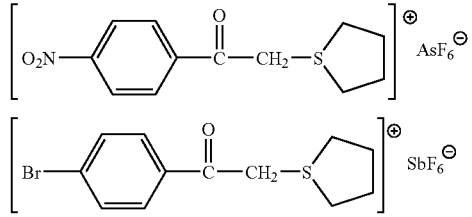

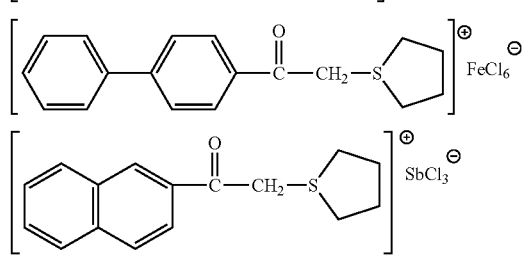

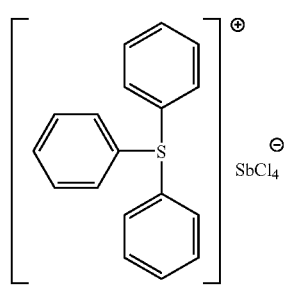

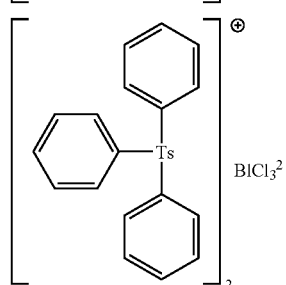

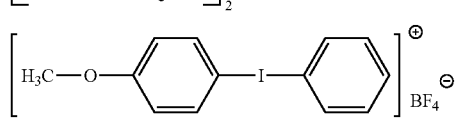

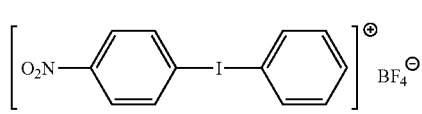

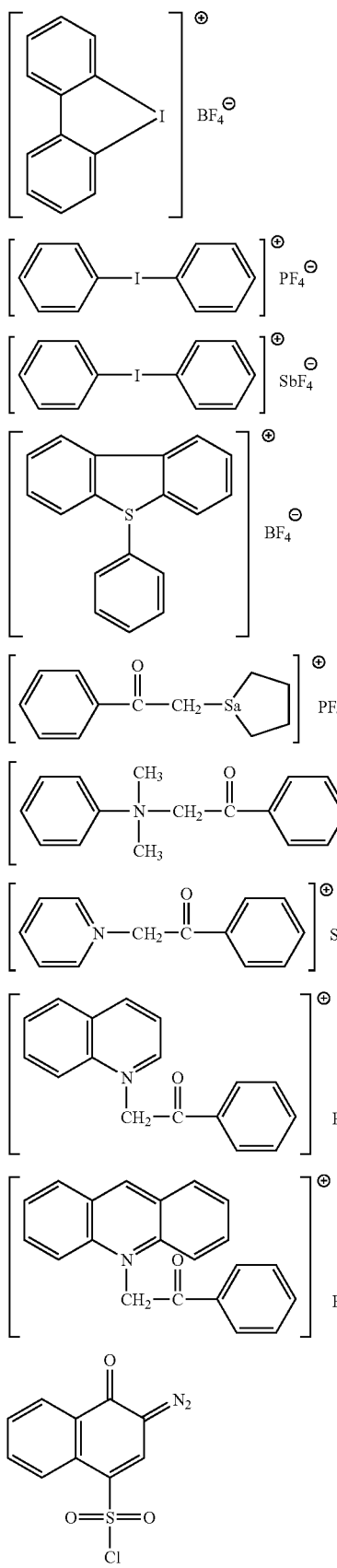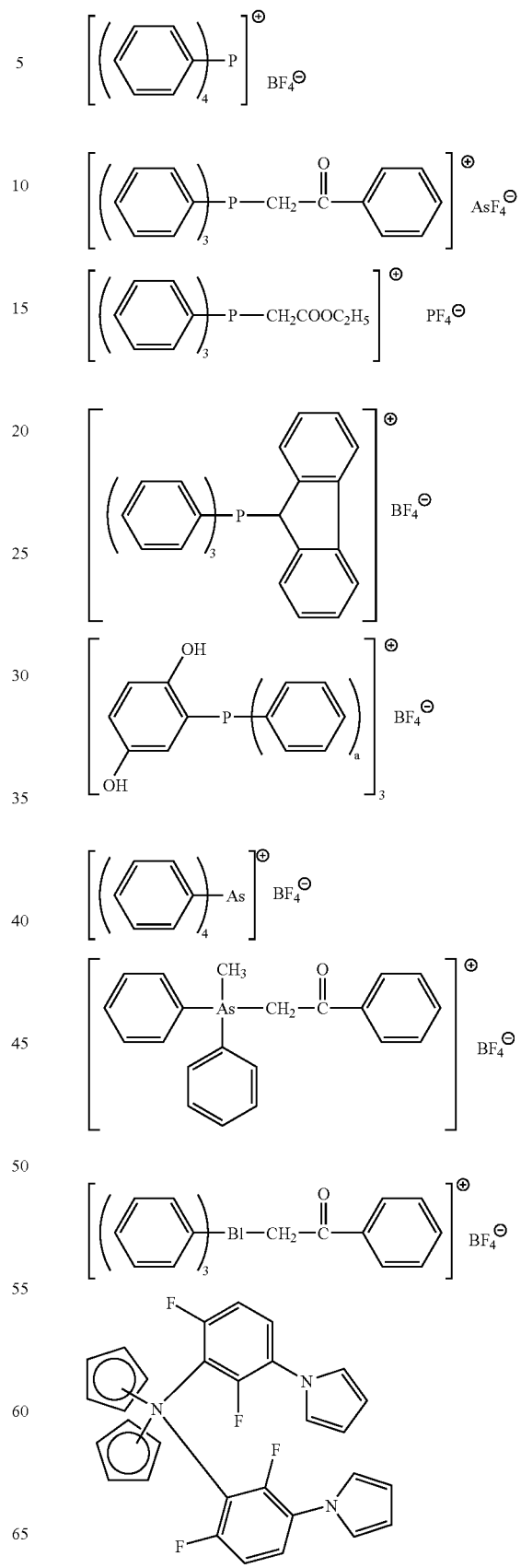

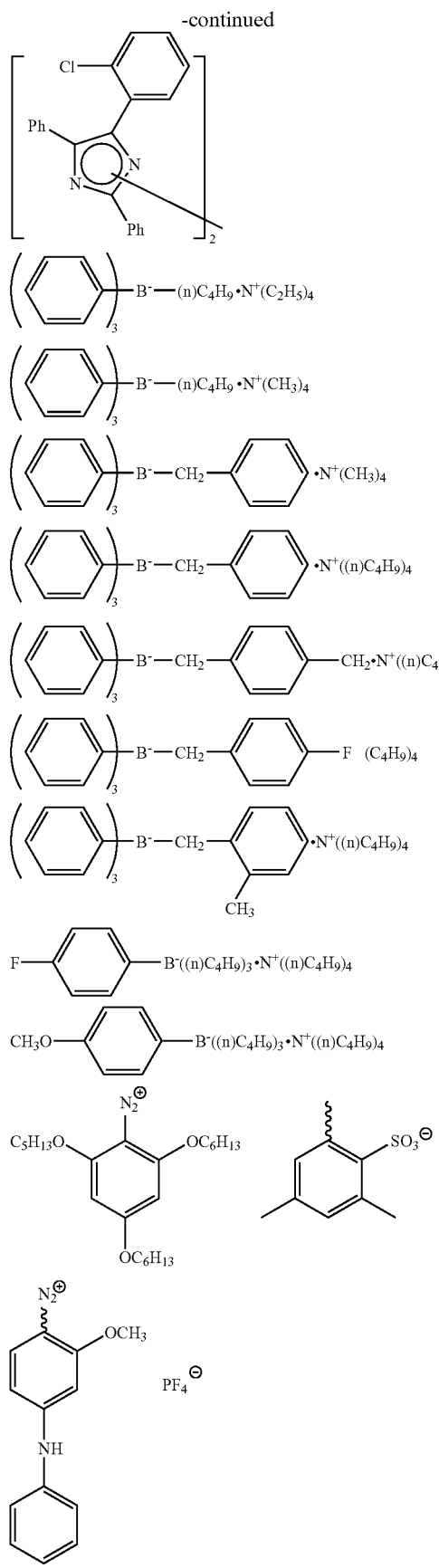
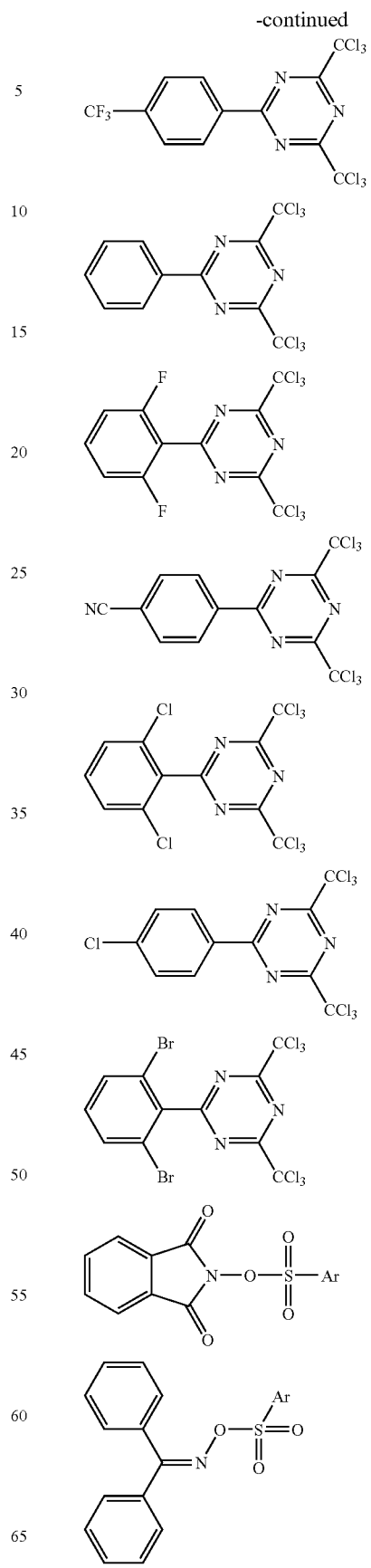

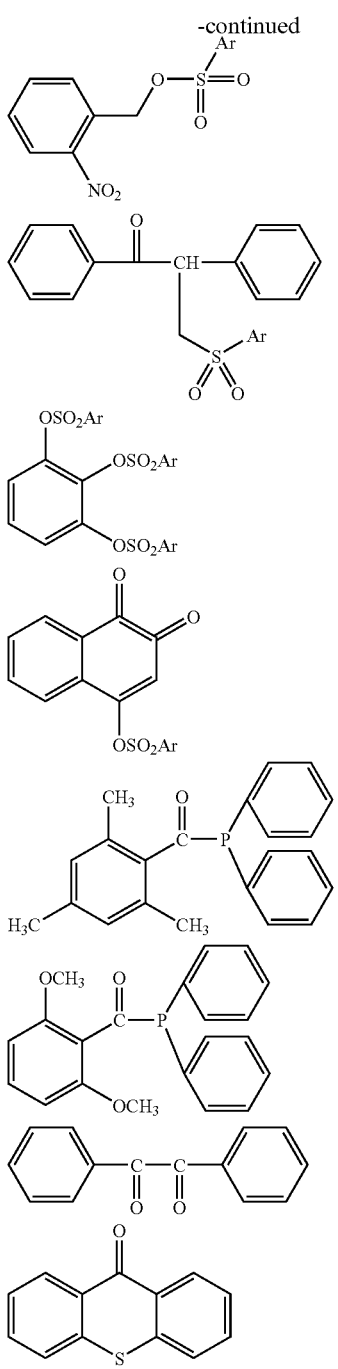

stuff) ranging from 200:1 to 1:200, preferably 50:1 to 1:50 and more preferably 20:1 to 1:5.

(1-3) Sensitizing Dyestuffs:

In the present invention, a sensitizing dyestuff may be added to the polymerization initiator for the purpose of improving the sensitivity of the latter. The addition of such a sensitizing dyestuff is preferred from the viewpoint of accelerating the decomposition of, in particular, a radical polymerization initiator for the increase of the quantity of radical generated. Preferred examples of sensitizing dyestuffs are those belonging to the following groups of compounds and capable of absorbing light rays whose wavelengths fall within the range of from 350 to 450 nm:

Polynuclear aromatic compounds (such as pyrene, perylene and triphenylene); xanthenes (such as fluorescein, eosine, erythrosine, Rhodamine B and Rose Bengale); Cyanines (such as thio-carbocyanine and oxa-carbocyanine); Merocyanines (such as Merocyanine and Carbo-Merocyanine); Thiazines (such as Thionine Blue, Methylene Blue and Toluidine Blue); Acridines (such as Acridine Orange, Chloroflavin and Acriflavine); anthraquinones (such as anthraquinone); squaliums (such as squalium); and coumarins (such as 7-diethylamino-4-methyl coumarin).

More preferred examples of sensitizing dyestuffs are compounds represented by the following general formulas (IX) to (XIII):

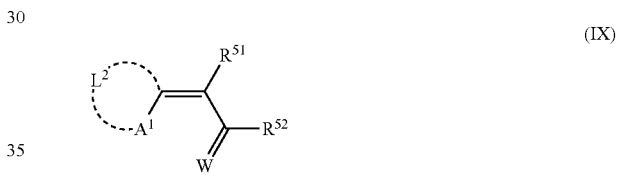
(IX)

(X)

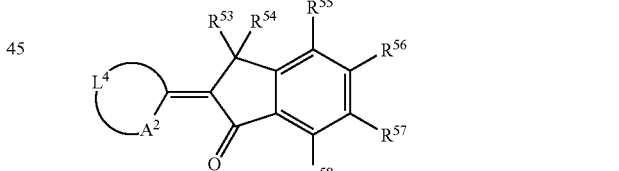
(XI)

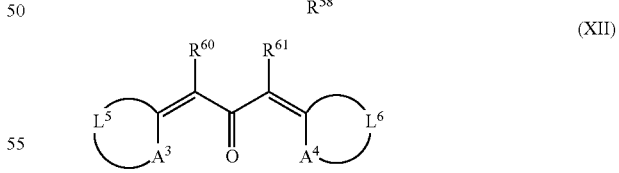
(XII)

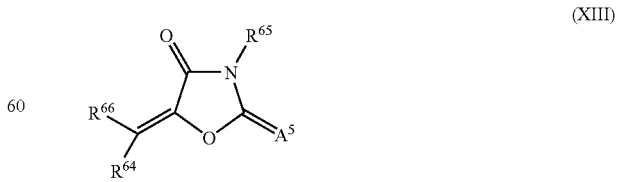
(XIII)

In the present invention, the polymerization initiators may suitably be used alone or in any combination of at least two of them. These polymerization initiators are suitably incorporated into the polymerizable compound in an amount ranging from 0.01 to 20 parts by mass and preferably 0.5 to 10 parts by mass per 100 parts by mass of the polymerizable compound. In addition, the polymerization initiators may be used in combination with the foregoing sensitizing dyestuffs in the form of a polymerization initiator system according to the present invention and in this case, the former is suitably incorporated into the polymerization initiator system in a ratio (by mass): (polymerization initiator): (sensitizing dye- In Formula (IX), $A^1$ represents a sulfur atom or a group: $-NR_{50}$ wherein $R_{50}$ represents an alkyl group, or an aryl group, $L^2$ represents a non-metallic atomic group forming the basic nucleus of the dyestuff in cooperation with the neighboring $A^1$ and the neighboring carbon atom(s), and $R^{51}$ and $R^{52}$ each independently represents a hydrogen atom or a monovalent non-metallic atomic group, provided that $R^{51}$ and $R^{52}$ may be combined with one another to form an acidic nucleus of the dyestuff. W represents an oxygen or sulfur atom.

In Formula (X), $Ar^1$ and $Ar^2$ each independently represents an aryl group, and they are connected to one another through a bond: $-L^3-$, wherein $-L^3-$ represents —O— or —S—. Further, W is identical to that specified above in connection with Formula (IX).

In Formula (XI), $A_2$ represents a sulfur atom or a group: $—NR^{59}$, $L^4$ represents a non-metallic atomic group forming the basic nucleus of the dyestuff in cooperation with the neighboring $A_2$ and the neighboring carbon atom(s), wherein each of $R^{53}$, $R^{54}$, $R^{55}$, $R^{56}$, $R^{57}$ and $R^{58}$, independently represents a monovalent non-metallic atomic group, and $R_{59}$ represents an alkyl group or an aryl group.

In Formula (XII), $A^3$ and $A^4$ each independently represents —S— or a group: $—NR^{62}—$ or a group: $—NR^{63}—$, wherein $R^{62}$ and $R^{63}$ each independently represents a substituted or unsubstituted alkyl group or a substituted or unsubstituted aryl group, $L^5$ and $L^6$ each independently represents a non-metallic atomic group forming the basic nucleus of the dyestuff in cooperation with the neighboring $A^3$ or $A^4$ and the neighboring carbon atom(s), and $R^{60}$ and $R^{61}$ each independently represents a hydrogen atom or a monovalent non-metallic atomic group or they may be combined with one another to form an aliphatic or aromatic ring.

In Formula (XIII), $R^{66}$ represents a substituted or unsubstituted aromatic ring or a heterocyclic ring, $A^5$ represents an oxygen or sulfur atom or a group: $—NR^{67}—$, wherein $R^{64}$, $R^{65}$ and $R^{67}$ each independently represents a hydrogen atom or a monovalent non-metallic atomic group, provided that $R^{64}$ and $R^{66}$, or $R^{65}$ and $R^{67}$ may be bonded together to form an aliphatic or aromatic ring.

Specific examples of the compounds represented by Formulas (IX) to (XIII) preferably used herein are those listed below:

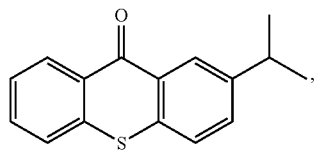
(A-6)

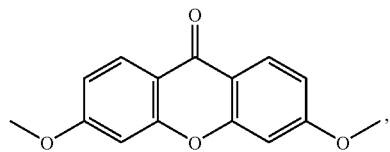
(A-7)

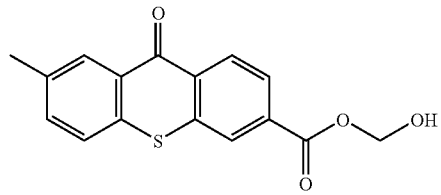
(A-8)

-continued

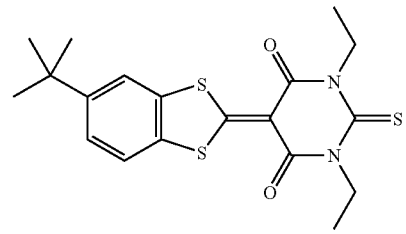
(A-1)

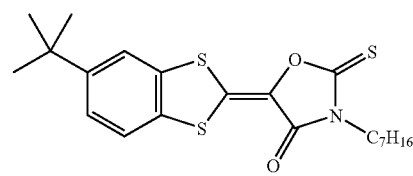
(A-12)

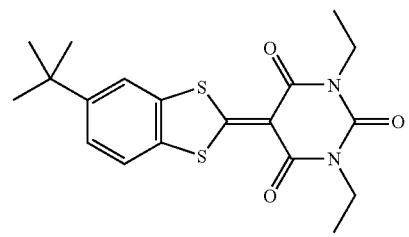
(A-2)

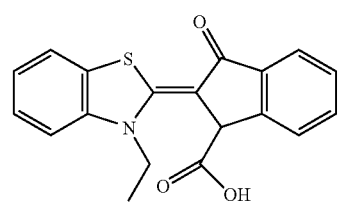
(A-4)

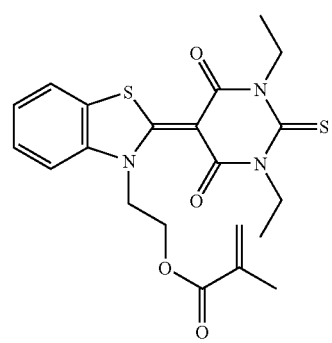
(A-5)

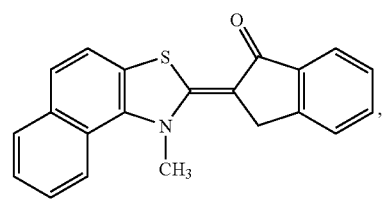
(A-9)

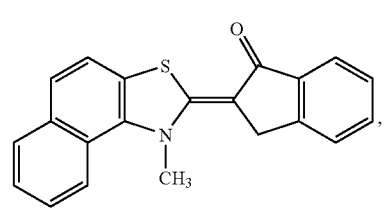
(A-10)

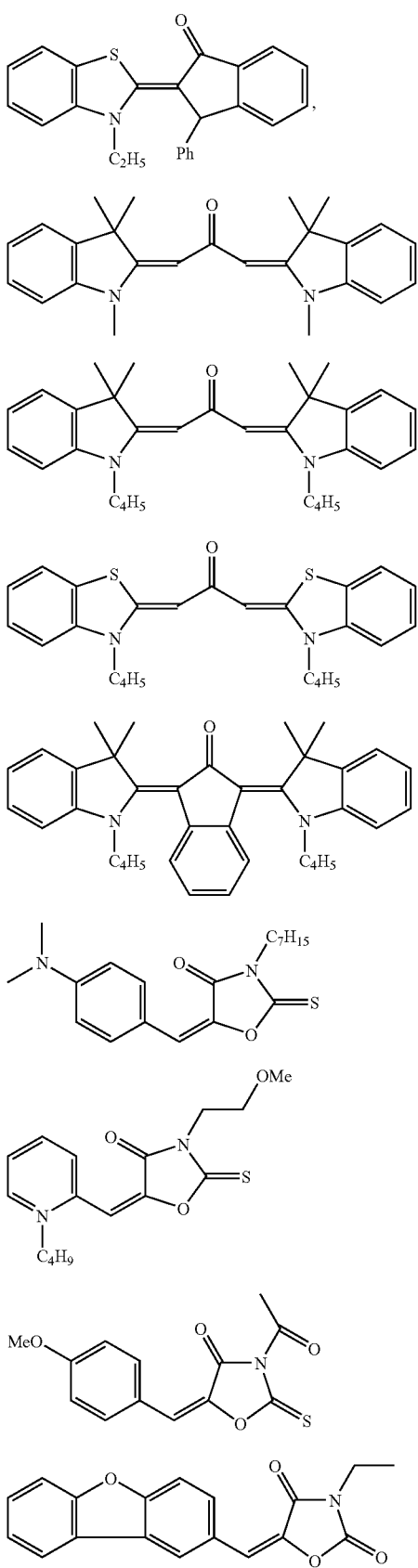

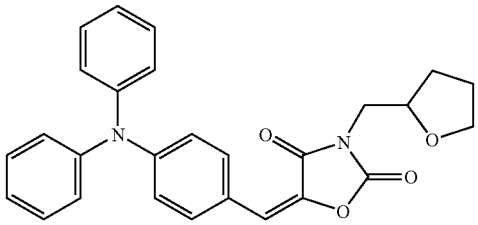

(1-4) Other Additives:

The ink jet-recording ink according to the present invention may, if necessary, comprise optional other additives such as co-sensitizing agents other than those listed above, chain transfer agents, polymerization inhibitors, solvents and/or cationic polymerizable monomers.

(1-4-1) Other Co-Sensitizing Agents:

Furthermore, the ink jet-recording ink according to the present invention may comprise other co-sensitizing agent such as known compounds which can, for instance, further improve the sensitivity of the ink and control the polymerization-inhibitory effect of oxygen.

Examples of such other co-sensitizing agents include amines such as compounds disclosed in, for instance, M. R. Sander et al., Journal of Polymer Society, 1972, 10:3173; J.P. KOKOKU Sho 44-20189; J.P. KOKAI Nos. Sho 51-82102, Sho 52-134692, Sho 59-138205, Sho 60-84305, Sho 62-18537 and Sho 64-33104; and Research Disclosure 33,825, and specific examples thereof are triethanolamine, ethyl ester of p-dimethyl-amino-benzoic acid, p-formyl-dimethyl-aniline, and p-methyl-thio-dimethyl-aniline.

Examples of such other co-sensitizing agents further include thiols and sulfides such as thiol compounds disclosed in J.P. KOKAI Nos. Sho 53-702 and Hei 5-142772 and J.P. KOKOKU Sho 55-500806; and disulfide compounds disclosed in J.P. KOKAI Sho 56-75643 and specific examples thereof are 2-mercapto-benzothiazole, 2-mercapto-benzoxazole, 2-mercapto-benzimidazole, 2-mercapto-4(3H)-quinazoline, and β-mercapto-naphthalene.

Examples of such other co-sensitizing agents also include amino acid compounds (such as N-phenyl glycine); organometal compounds (such as tributyl tin acetate) disclosed in J.P. KOKOKU Sho 48-42965; hydrogen-donors disclosed in J.P. KOKOKU Sho 55-34414; sulfur-containing compounds (such as trithiane) disclosed in J.P. KOKAI Hei 6-308727; phosphorus-containing compounds (such as diethyl phosphite) disclosed in J.P. KOKAI Hei 6-250387; and Si—H and Ge—H compounds disclosed in Japanese Patent Appln. Serial No. Hei 6-191605.

(1-4-2) Polymerization Inhibitors:

The polymerization inhibitors may be incorporated into the ink jet-recording ink according to the present invention from the standpoint of improving the shelf life of the ink. In addition, the ink jet-recording ink according to the present invention is preferably injected after heating the same to a temperature ranging from 40 to 80° C. to thus reduce the viscosity thereof and accordingly, it is quite preferred to add a polymerization inhibitor to the ink in order to prevent any clogging of the head of an ink jet-recording machine due to the heat polymerization of the ink. The polymerization inhibitor is added to the ink jet-recording ink according to the present invention in an amount ranging from 200 to 20000 ppm on the basis of the total amount of the ink. Examples of polymerization inhibitors are hydroquinone, benzoquinone, p-methoxy phenol, TEMPO, TEMPOL and CUPERON A1.

When the ink jet-recording ink according to the present invention is a radiation-curable type one, the ink is preferably substantially free of any solvent such that the ink can rapidly undergo a desired reaction and curing immediately after the ink impacts an intended target. However, the ink may comprise a desired solvent insofar as the addition thereof never adversely affects, for instance, the curing rate of the ink. In the present invention, such solvents are, for instance, organic solvents and water. In particular, an organic solvent may be added to the ink to improve the adhesion of the resulting ink to a recording medium (a substrate such as paper). The addition of an organic solvent having a high boiling point is quite effective since the problems concerning VOC can be solved or eliminated. The amount of the organic solvent ranges from 0.1 to 5% by mass and preferably 0.1 to 3% by mass on the basis of the total mass of the ink jet-recording ink according to the present invention.

The ink jet-recording ink of the present invention may be realized in the form of a hybrid type curable ink by the simultaneous use of a cationic polymerizable monomer; a combination of an initiator and a radical polymerizable monomer; or a combination of an initiator and a radical cation, as a means for preventing any reduction of the sensitivity due to the light-shielding effect of a coloring material to be incorporated into the ink.

(1-4-3)

In addition to the foregoing components, the ink jet-recording ink of the present invention may likewise comprise, if necessary, known compounds. These known compounds may appropriately be selected from the group consisting of surfactants, additives for leveling, matting agents and substances for controlling the characteristic properties of the resulting film such as polyester resins, polyurethane resins, vinyl resins, acrylic resins, rubbery resins and waxes. It is also preferred to incorporate a tackifier, which never inhibits the polymerization of the ink components, for the purpose of improving the adhesion of the ink to a recording medium such as those made of a polyolefin or PET. Specific examples of such tackifiers are high molecular weight adhesive polymers disclosed in J.P. KOKAI 2001-49200 (such as copolymerized products comprising esters of (meth)acrylic acids and alcohols whose alkyl group has 1 to 20 carbon atoms, esters of (meth)acrylic acids and alicyclic alcohols having 3 to 14 carbon atoms and esters of (meth)acrylic acids and aromatic alcohols having 6 to 14 carbon atoms), and low molecular weight tackifiers having polymerizable unsaturated bonds.

(1-4-4) Contents of Other Additives:

The foregoing other additives used in the present invention are suitably incorporated into the ink jet-recording ink according to the present invention, for instance, in an amount ranging from 0 to 40% by mass and preferably 1 to 30% by mass for the co-sensitizing agent; 0 to 40% by mass and preferably 1 to 30% by mass for the chain transfer agent; and 0 to 40% by mass and preferably 1 to 30% by mass for the polymerization inhibitor, on the basis of the total mass of the ink jet-recording ink.

(1-5) Content of Polymerization Initiator System

The polymerization initiator system used in the invention desirably comprises a co-sensitizing agent in an amount ranging from 0.2 to 40% by mass and preferably 0.5 to 30% by mass; a polymerization initiator in an amount ranging from 0.5 to 40% by mass and preferably 1.0 to 30% by mass; a sensitizing dyestuff in an amount ranging from 0 to 40% by mass and preferably 1 to 30% by mass; and other additives in an amount ranging from 0 to 30% by mass and preferably 0.5 to 20% by mass, on the basis of the total mass of the ink jet-recording ink.

(2) Ink Jet-Recording Ink

The ink jet-recording ink of the present invention comprises the foregoing polymerization initiator system, a polymerizable compound, a coloring material and other components.

(2-1) Polymerizable Compounds

As such polymerizable compounds usable herein, there have been known, for instance, radical-polymerizable compounds such as those disclosed in, for instance, J.P. KOKAI Nos. Hei 7-159983, Hei 8-224982 and Hei 10-863, J.P. KOKOKU Hei 7-31399 and Japanese Patent Appln. (hereunder referred to as "J.P.A.") Serial No. Hei 7-231444; photocurable materials which make use of photo-polymerizable compositions disclosed in J.P.A. Serial No. Hei 7-231444; cationic polymerizable compounds such as photo-curable resins comprising cation-polymerizable systems. In addition, there have recently been known, for instance, photo-curable resins comprising photolytically cation-polymerizable systems such as those disclosed in, for instance, J.P. KOKAI Nos. Hei 6-43633 and Hei 8-324137.

(2-1-1) Radical-Polymerizable Compounds

The radical-polymerizable compound is one having a radical-polymerizable ethylenically unsaturated bond in the molecule, it may be any compound insofar as it has at least one radical-polymerizable ethylenically unsaturated bond in the molecule and examples thereof include those each having such a chemical form as a monomer, an oligomer or a polymer. These radical-polymerizable compounds may be used alone or as a mixture containing at least two of them in any rate in order to improve the intended characteristic properties of the ink of the invention. Moreover, it is preferred to use a polyfunctional compound carrying at least two functional groups rather than a monofunctional compound. It is more preferred to use at least two polyfunctional compounds in combination for the purpose of controlling various characteristic properties such as the reactivity and physical properties of the resulting ink.

Examples of the polymerizable compound used in the present invention having a radical-polymerizable ethylenically unsaturated bond in the molecule are unsaturated carboxylic acids such as acrylic acid, methacrylic acid, itaconic acid, crotonic acid, isocrotonic acid and maleic acid as well as salts, esters, urethanes, amides and anhydrides thereof; acrylonitrile, styrene; and a variety of radical-polymerizable compounds such as unsaturated polyesters, unsaturated polyethers, unsaturated polyamides and unsaturated urethanes. Specific examples thereof are acrylic acid derivatives such as 2-ethylhexyl acrylate, 2-hydroxyethyl acrylate, butoxy-ethyl acrylate, carbitol acrylate, cyclohexyl acrylate, tetrahydrofurfuryl acrylate, benzyl acrylate, bis(4-acryloxy polyethoxy-phenyl) propane, neopentyl glycol diacrylate, 1,6-hexanediol diacrylate, ethylene glycol diacrylate, diethylene glycol diacrylate, triethylene glycol diacrylate, tetraethylene glycol diacrylate, polyethylene glycol diacrylate, polypropylene glycol diacrylate, pentaerythritol triacrylate, pentaerythritol tetra-acrylate, di-pentaerythritol tetra-acrylate, trimethylolpropane triacrylate, tetra-methylol methane tetra-acrylate, oligo-ester acrylate, N-methylol acrylamide, diacetone acrylamide and epoxy acrylate; methacrylic acid derivatives such as methyl methacrylate, n-butyl methacrylate, 2-ethylhexyl methacrylate, lauryl methacrylate, allyl methacrylate, glycidyl methacrylate, benzyl methacrylate, dimethyl-aminomethyl methacrylate, 1,6-hexanediol dimethacrylate, ethylene glycol dimethacrylate, triethylene glycol dimethacrylate, polyethylene glycol dimethacrylate, polypropylene glycol dimethacrylate, trimethylol-ethane tri-methacrylate, trimethylolpropane tri-methacrylate and 2,2-bis(4-mathacryloxy polyethoxy-phenyl) propane; and derivatives of allyl compounds such as allyl glycidyl ether, di-allyl phthalate, tri-allyl trimellitate and more specifically, commercially available products disclosed in, for instance, "Handbook of Cross-linking Agents", edited by YAMASHITA Shinzo, published by TAISEI-Sha, 1981; "Handbook of UV- and EB-Curing (Raw Material)", edited by KATO Kiyoshi, published by KOBUNSHI KANKO-Kai, 1985; "Application and Market of UV- and EB-Curing Techniques", edited by Rad-Tech Research Laboratory, p. 79, published by C.M.C. Company, 1989; "Polyester Resin Handbook", written by TAKIYAMA Ei-ichiro, 1988, published by NIKKAN KOGYO SHINBUN as well as radical-polymerizable and/or cross-linkable monomers, oligomers and polymers which are known in this art.

(2-1-2) Cation-Polymerizable Compounds

The cation-polymerizable compounds usable herein are, for instance, various kinds of known cation-polymerizable ones (monomers). Specific examples thereof are epoxy compounds, vinyl ether compounds, and oxetane compounds such as those disclosed in J.P. KOKAI Nos. Hei 6-9714, 2001-31892, 2001-40068, 2001-55507, 2001-310938, 2001-310937 and 2001-220526. In the present invention, there can thus be used, for instance, oxetane compounds, epoxy compounds, vinyl ether compounds and mixture thereof.

(2-1-3) Preferred Polymerizable Compounds

Examples of the polymerizable compounds preferably used herein are (meth)acrylic monomers or prepolymers, epoxy type monomers or prepolymers, and urethane type monomers or prepolymers. More preferably used herein are those listed below:

2-Ethylhexyl di-glycol acrylate, 2-hydroxy-3-phenoxypropyl acrylate, 2-hydroxy-butyl acrylate, hydroxy pivalic acid neopentyl glycol diacrylate, 2-acryloyloxy ethyl phthalate, methoxy-polyethylene glycol acrylate, tetramethylolmethane triacrylate, 2-acryloyloxy-ethyl-2-hydroxyethyl phthalate, di-methylol-tricyclodecane diacrylate, Ethoxylated phenyl acrylate, 2-acryloyloxyethyl succinate, acrylates of EO-added nonyl-phenol, modified glycerin triacrylate, bisphenol A diglycidyl ether-acrylic acid adduct, modified bisphenol A diacrylate, phenoxy-polyethylene glycol acrylate, 2-acryloyloxy-ethyl hexahydro-phthalate, diacrylate of PO-added bisphenol A, diacrylate of EO-added bisphenol A, di-pentaerythritol hexa-acrylate, pentaerythritol triacrylate tolylene diisocyanate urethane prepolymer, lactone-modified flexible acrylate, butoxy-ethyl acrylate, propylene glycol diglycidyl ether-acrylic acid adduct, pentaerythritol triacrylate hexa-methylene diisocyanate urethane prepolymer, 2-hydroxyethyl acrylate, methoxy di-propylene glycol acrylate, di-trimethylol propane tetra-acrylate, stearyl acrylate, isoamyl acrylate, iso-myristyl acrylate and iso-stearyl acrylate.

These acrylate compounds are inferior in the ability of stimulating and sensitizing the skin (the eruption of the skin) as compared with the polymerizable compounds conventionally used in the UV-curable ink, would permit the reduction of the viscosity of the resulting ink to a relatively low level and likewise permit the achievement of a stable ability to inject the resulting ink and can ensure the high susceptibility of the ink to polymerization and the good adhesion of the ink to recording media. In the present invention, when using the foregoing acrylate compound as the polymerizable compound, the content of the acrylate compound in the ink jet-recording ink, for instance, ranges from 20 to 95% by mass, preferably 50 to 95% by mass and more preferably 70 to 95% by mass on the basis of the total mass of the ink.

In the present invention, the monomers listed above as the polymerizable compounds have low sensitizing ability even when they are low molecular weight compounds, while they have high reactivity, low viscosity and they are excellent in the adhesion to the recording media.

The ink of the present invention may further be improved in the sensitivity, resistance to bleeding and adhesion to recording media by appropriately combining these polymerizable compounds. For instance, the foregoing mono-acrylate can be used in combination with a polyfunctional acrylate monomer or a polyfunctional acrylate oligomer having a molecular weight of not less than 400 and preferably not less than 500, for the improvement of the sensitivity and the adhesion to the recording media. In addition, it is particularly preferred to use a monofunctional, difunctional, trifunctional or higher polyfunctional monomer simultaneous with the foregoing acrylate monomer. Further it would likewise be possible to further improve the sensitivity, resistance to bleeding and adhesion to recording media, while holding the safety. The oligomers particularly preferably used herein are, for instance, epoxy acrylate oligomers and urethane acrylate oligomers.

When recording an image on a soft or flexible recording medium such as a PET film or a PP film, it would be preferred to simultaneously use a monoacrylate selected from the foregoing group of compounds and a polyfunctional acrylate monomer or a polyfunctional acrylate oligomer since the simultaneous use of these compounds would permit the improvement of the adhesion to the recording medium and the film strength while imparting the flexibility to the resulting film. Stearyl acrylate, isoamyl acrylate, iso-myristyl acrylate and iso-stearyl acrylate are preferably used in the invention since they can allow the prevention of the occurrence of any curling, the achievement of high sensitivity, high resistance to bleeding, the elimination of any bad smell of the printed matter and the reduction of the cost required for an irradiation device.

In this respect, the methacrylate has an ability to stimulate the skin lower than that observed for the acrylate.

In addition, it is preferred to use an alkoxy acrylate in an amount of less than 70% by mass, among the foregoing compounds, and the balance of an acrylate, since the resulting ink has good sensitivity and good resistance to bleeding and never gives out any bad smell due to the residual monomers.

(2-1-4) Amount of Polymerizable Compounds to be Added

The amount of the polymerizable compound to be incorporated into the ink of the invention, for instance, ranges from 1 to 97% by mass and more preferably 30 to 95% by mass on the basis of the total mass of the ink jet-recording ink.

(2-2) Coloring Materials

The coloring material used in the present invention is not restricted to any specific one, but it is preferred to use a pigment excellent in the weatherability and the coloring material may be any known ones such as soluble dyes and oil dyes. Conventionally, currently used pigments have not been able to be used as the coloring materials usable in the ink jet-recording ink. This is because, the pigment would serve as a polymerization inhibitor in the polymerization reaction and this becomes a cause of such a problem that the resulting ink has a reduced sensitivity to a radioactive ray. However, the polymerization initiator system used in the invention generates a large quantity of active species and therefore, such a coloring material can thus be used in the ink of the present invention.

The coloring material used in the invention is not particularly restricted to specific one and usable herein include, for instance, organic or inorganic pigments specified by the following numbers and disclosed in Color Index:

Red or magenta pigments such as Pigment Red 3, 5, 19, 22, 31, 38, 43, 48:1, 48:2, 48:3, 48:4, 48:5, 49:1, 53:1, 57:1, 57:2, 58:4, 63:1, 81, 81:1, 81:2, 81:3, 81:4, 88, 104, 108, 112, 122, 123, 144, 146, 149, 166, 168, 169, 170, 177, 178, 179, 184, 185, 208, 216, 226 and 257, Pigment Violet 3, 19, 23, 29, 30, 37, 50 and 88, and Pigment Orange 13, 16, 20 and 36; blue or cyan pigments such as Pigment Blue 1, 15, 15:1, 15:2, 15:3, 15:4, 15:6, 16, 17-1, 22, 27, 28, 29, 36 and 60; green pigments such as Pigment Green 7, 26, 36 and 50; yellow pigments such as Pigment Yellow 1, 3, 12, 13, 14, 17, 34, 35, 37, 55, 74, 81, 83, 93, 94, 95, 97, 108, 109, 110, 137, 138, 139, 153, 154, 155, 157, 166, 167, 168, 180, 185 and 193; black pigments such as Pigment Black 7, 28 and 26; and white pigments such as Pigment White 6, 18 and 21. These coloring materials can be selected and used depending on the specific purposes.

In this respect, when the coloring material used in the invention is added to the ink jet-recording ink according to the present invention, it should appropriately be dispersed throughout the ink. The coloring material can be dispersed in the ink using various kinds of dispersing machines such as a ball mill, a sand mill, an attritor, a roll mill, an agitator, a Henschel mixer, a colloid mill, an ultrasonic homogenizer, a pearl mill, a wet jet mill, and a paint shaker.

In addition, when dispersing the coloring material, a dispersant may be added to the ink. The kind of such dispersant is not restricted to specific one, but preferred are high molecular weight dispersants and examples thereof are Solsperse series commercially available from Zeneca Company. Moreover, it is also possible to use a synergist corresponding to each specific pigment as a dispersing agent. These dispersant and dispersing agent may preferably be added to the coloring material in an amount ranging from 1 to 50 parts by mass per 100 parts by mass of the coloring material used in the invention.

The coloring material may directly be incorporated into the ink jet-recording ink according to the present invention, but it can be added, in advance, to a solvent or a dispersing medium such as the polymerizable compound used in the invention in order to improve the dispersibility of the coloring material. In this respect, the coloring material is preferably added to the polymerizable compound used in the invention to eliminate any problem concerning the deterioration of the resistance to solvents encountered when the solvent remains within the cured image as well as the problem concerning VOC (Volatile Organic Compound) or the remaining solvent. Further, the polymerizable compound is preferably selected from monomers having the lowest viscosity from the viewpoint of the dispersibility thereof.

The average particle size of the coloring material used in the invention desirably ranges from, for instance, 0.08 to 0.5 μm, preferably 0.1 to 0.45 μm and more preferably 0.15 to 0.4 μm. Moreover, the maximum particle size thereof suitably ranges from, for instance, 0.3 to 10 μm and preferably 0.3 to 3 μm. Accordingly, it is quite desirable to select pigments, dispersants and dispersion media and to set conditions for dispersion and for filtration such that the coloring material can satisfy the foregoing requirement for the maximum particle size. Such control of the particle size of the coloring material would permit the prevention of any clogging of the head nozzle, the improvement of the storage stability of the ink, the maintenance of the good transparency and susceptibility to curing of the ink.

The coloring material used in the invention is suitably incorporated into the ink jet-recording ink in an amount ranging from, for instance, 1 to 10% by mass and preferably 2 to 8% by mass on the basis of the total mass of the ink.

(2-3) Other Components

The ink jet-recording ink of the present invention may, if necessary, comprise other components. Such other components are, for instance, a polymerization inhibitor, a solvent and a cation-polymerizable monomer.

The polymerization inhibitor is added thereto from the viewpoint of improving the storage life of the resulting ink. In addition, the ink jet-recording ink of the invention is preferably injected after heating the same to a temperature ranging from 40 to 80° C. to thus reduce the viscosity thereof. Accordingly, it is also preferred to incorporate, into the ink, a polymerization inhibitor for the purpose of preventing the occurrence of any clogging of the recording head. Thus, the amount of the polymerization inhibitor to be added preferably ranging from 200 to 20,000 ppm on the basis of the total mass of the ink jet-recording ink of the invention. Examples of such polymerization inhibitors are hydroquinone, benzoquinone, p-methoxy phenol, TEMPO, TEMPOL and CUPERON A1.

The ink jet-recording ink according to the present invention is preferably substantially free of any solvent so that the ink may rapidly undergo a desired reaction and curing immediately after the ink impacts an intended target, while taking into consideration the fact that the ink is a radiation-curable type one. However, the ink may comprise a desired solvent insofar as the addition thereof never adversely affects the desired characteristic properties of the ink such as the curing rate of the ink. In the present invention, such solvents are, for instance, organic solvents and water. In particular, an organic solvent may be added to the ink to improve the adhesion of the resulting ink to a recording medium (a substrate such as paper). The addition of an organic solvent having a high boiling point is quite effective since the problems concerning VOC can be solved or eliminated. The amount of the organic solvent ranges from 0.1 to 5% by mass and preferably 0.1 to 3% by mass on the basis of the total mass of the ink jet-recording ink of the present invention.

In addition to the foregoing components, the ink jet-recording ink of the present invention may likewise comprise, if necessary, any known compounds. These known compounds may appropriately be selected from the group consisting of surfactants, additives for leveling, matting agents and substances for controlling the characteristic properties of the resulting film such as polyester resins, polyurethane resins, vinyl resins, acrylic resins, rubbery resins and waxes. It is also preferred to incorporate a tackifier, which never inhibits the polymerization of the ink components, for the purpose of improving the adhesion of the ink to a recording medium such as those made of a polyolefin or PET. Specific examples of such tackifiers are high molecular weight adhesive polymers disclosed in J.P. KOKAI 2001-49200, pp. 5-6 (such as copolymerized products comprising esters of (meth)acrylic acids and alcohols whose alkyl group has 1 to 20 carbon atoms, esters of (meth)acrylic acids and alicyclic alcohols having 3 to 14 carbon atoms and esters of (meth)acrylic acids and aromatic alcohols having 6 to 14 carbon atoms), and low molecular weight tackifiers having polymerizable unsaturated bonds.

(2-4) Characteristic Properties of Ink Jet-Recording Ink

As has been discussed above, the ink jet-recording ink of the present invention comprises a coloring material, a polymerizable compound and a polymerization initiator system. The amounts of these components to be incorporated into the ink jet-recording ink are suitably adjusted, on the basis of the total mass of the ink jet-recording ink, in such a manner that the content of the coloring material ranges from 1 to 10% by mass and preferably 2 to 8% by mass; that of the polymerizable compound ranges from 1 to 97% by mass and preferably 3 to 95% by mass; and that of the polymerization initiator system ranges from 0.01 to 20% by mass and preferably 0.1 to 20% by mass, provided that the sum of these components amounts to 100% by mass.

The resulting ink jet-recording ink preferably has a viscosity as determined at a temperature, at which it is projected (for instance, 40 to 80° C. and preferably 25 to 30° C.), falling within the range of from 7 to 30 mPa·s and preferably 7 to 20 mPa·s, while taking into consideration the ability of the resulting ink to impact the recording media. For instance, the viscosity of the ink jet-recording ink of the present invention as determined at room temperature (25 to 30° C.) ranges from 35 to 500 mPa·s and preferably 35 to 200 mPa·s. Accordingly, it is preferred that the composition of the ink or the mixing ratio of the components included therein is appropriately adjusted such that the viscosity of the resulting ink falls within the range specified above. The use of an ink, whose viscosity at room temperature is high, would permit the prevention of any penetration of the ink even into a porous recording medium and, in turn, the reduction of the amount of any uncured monomer and the elimination of the generation of any bad smell. Moreover, this would likewise permit the control of any bleeding of the ink upon the impact of the recording medium with the ink and in turn, the improvement of the quality of the resulting image.

The surface tension of the ink jet-recording ink of the present invention ranges from, for instance, 20 to 30 mN/m and preferably 23 to 28 mN/m. When recording image on a variety of recording media such as those made of polyolefins, PET's, coated paper and non-coated paper, the viscosity of the ink is preferably not less than 20 mN/m from the viewpoint of the resistance to bleeding and penetration and not more than 30 mN/m for the purpose of ensuring good wettability.

(3) Method and Device for Ink Jet-Recording

Now, the methods and devices for ink jet-recording suitably employed in the invention will be described in detail below.

(3-1) Ink Jet-Recording Method

The present invention herein provides a method for forming an image by injecting the foregoing ink jet-recording ink onto the surface of a substrate (recording material) and then irradiating the ink injected on the substrate with a radioactive ray to thus induce the curing of the ink. More specifically, the ink jet-recording method of the present invention comprises the following steps:

(a) applying the ink jet-recording ink onto the surface of a substrate;
(b) irradiating the foregoing ink jet-recording ink applied onto the substrate with a radioactive ray whose peak wavelength ranges from 200 to 600 nm, preferably 300 to 450 nm and more preferably 350 to 420 nm at an output (a irradiation energy) of not more than 2000 mJ/cm$^2$, preferably 10 to 2000 mJ/cm$^2$, more preferably 20 to 1000 mJ/cm$^2$ and still more preferably 50 to 800 mJ/cm$^2$, to cure the foregoing applied ink jet-recording ink; and
(c) forming an image of the cured ink jet-recording ink on the substrate.

The ink jet-recording method according to the present invention will further be described in more detail while taking a method for forming a lithographic printing plate comprising the step of injecting an ink jet-recording ink on a substrate for forming a lithographic printing plate to thus form an image thereon, by way of example.

The lithographic printing plate capable of being prepared according to the method of the present invention comprises a substrate and an image formed on the substrate. The lithographic printing plate can be prepared by the method comprising the following steps:

(1) A step for applying the ink jet-recording ink of the present invention onto the surface of the foregoing substrate; and
(2) A step of irradiating the foregoing ink jet-recording ink applied onto the surface of the substrate with a radioactive ray to cure the foregoing applied ink jet-recording ink and to thus form an image of the cured ink jet-recording ink on the substrate.

(3-1-1) Lithographic Printing Plate

In this respect, the lithographic printing plate comprises a substrate, preferably a hydrophilic substrate and an image, preferably a hydrophobic image, formed on the substrate.

Conventionally, as the lithographic printing plate, there has widely been used the so-called PS plate having a structure in which a lipophilic light-sensitive resin layer is formed on a hydrophilic substrate. Such a PS plate is in general exposed to light rays through a lithfilm according to the mask exposure technique (plane exposure) and then the unexposed area is removed through dissolution to thus form a desired lithographic printing plate. However, there has recently been widely spread the digitization technique in which the image information is electronically processed, accumulated and outputted using a computer and accordingly, there has been desired for the development of a novel image-outputting system in response to the progress of such digitization technique. In particular, there has been developed the computer-to-plate (CPT) technique which comprises the steps of scanning light rays having a high directivity such as a laser beam in response to desired digitized image-information to thus directly prepare a printing plate.

As a means for obtaining a lithographic printing plate through the foregoing scanning exposure, there can be listed a method for directly preparing a lithographic printing plate using an ink jet-recording ink. This technique comprises the steps of injecting an ink on a substrate, preferably a hydrophilic substrate according to, for instance, the ink jet-recording system, then exposing the ink injected onto the substrate to a radioactive ray to thus give a printing plate provided thereon with a desired image (preferably a hydrophobic image). The ink jet-recording ink according to the present invention can suitably be used in such plate-making process according to the ink jet-recording system.

The substrate (recording medium), on which the ink jet-recording ink of the invention is injected, is not restricted to any specific one inasmuch as it is a dimensionally stable plate-like substrate. Examples of such substrates are paper; paper laminated with plastic films (such as polyethylene, polypropylene and polystyrene films); metal plates (such as aluminum, zinc and copper plates); plastic films (such as films of cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate and polyvinyl acetal); and paper or plastic films laminated with foils of the foregoing metals; or paper or plastic films on which the foregoing metals are deposited. Preferably used herein as such substrates are, for instance, polyester films and aluminum plates. Among them, aluminum plates are particularly preferred since they have high dimensional stability and they are relatively cheap.

Examples of aluminum plates are pure aluminum plates, aluminum alloy plates comprising aluminum as a principal component and trace amounts of foreign elements, and aluminum or aluminum alloy thin films laminated with plastic films. The foreign elements included in the aluminum alloys are, for instance, silicon, iron, manganese, copper, magnesium, chromium, zinc, bismuth, nickel and titanium. The content of these foreign elements included in the aluminum alloy is preferably not more than 10% by mass. In the present invention, it is preferred to use a pure aluminum plate, but it is impossible to prepare a completely pure aluminum plate because of the limit in the refining technique and accordingly, the substrate used herein may be an aluminum plate containing trace amounts of such foreign elements. The aluminum plate is not restricted to one having a specific composition and therefore, it may appropriately be selected from those made of known materials.

The substrate preferably has a thickness ranging from 0.1 to 0.6 mm and more preferably 0.15 to 0.4 mm.

Such an aluminum plate is preferably subjected to a surface-treatment such as a surface-roughening treatment and/or an anodization treatment prior to use the same as a substrate for the printing plate. These surface treatments would make it easy to improve the hydrophilicity of the plate and to ensure the good adhesion of an image-recording layer to the substrate. Prior to the surface treatment, the aluminum plate is, if necessary, degreased with, for instance, a surfactant, an organic solvent or an alkaline aqueous solution for the removal of the rolling oil adhered to the surface of the plate.

The aluminum plate may be surface-roughened according to a variety of methods and examples of such surface-roughening methods are a mechanical surface-roughening treatment, an electrochemical surface-roughening treatment (the surface-roughening treatment in which the surface of the plate is electrochemically dissolved), and a chemical surface-roughening treatment (the surface-roughening treatment in which the surface is selectively and chemically dissolved).

Examples of such mechanical surface-roughening treatments are any known methods such as a ball-polishing method, a brush-polishing method, a blast-polishing method and a buff-polishing method. Moreover, the aluminum plate may likewise be treated according to the transfer method in which unevenness can be transferred to the surface of the aluminum plate using a roll having corresponding unevenness during the rolling step of a raw plate of aluminum.

The electrochemical surface-roughening treatment may, for instance, be carried out in an electrolyte containing an acid such as hydrochloric acid or nitric acid using an alternating or direct current. Moreover, the electrochemical surface-roughening treatment may likewise be carried out according to the method disclosed in J.P. KOKAI Sho 54-63902 which makes use of a mixed acid.

The aluminum plate thus surface-roughened is, if necessary, subjected to an alkali-etching treatment using an aqueous solution of potassium hydroxide, sodium hydroxide and the plate is further neutralized. Thereafter, the plate is if necessary anodized in order to improve the wear resistance.

The electrolytes used in the anodization treatment of the aluminum plate may be, for instant, various kinds of electrolytes which permit the formation of a porous oxidized layer on the aluminum plate. Examples thereof currently used are sulfuric acid, hydrochloric acid, oxalic acid, chromic acid and mixed acids or mixtures thereof. The concentration of these electrolytes is appropriately determined depending on the kinds of acids used.

The conditions for the anodization treatment cannot unconditionally be determined since they are variously changed depending on each particular electrolyte used, but the treatment is in general carried out preferably under the following conditions: an electrolyte concentration ranging from 1 to 80% by mass; an electrolyte temperature ranging from 5 to 70° C.; a current density ranging from 5 to 60 A/dm$^2$; an electric voltage ranging from 1 to 100 V; and an electrolyzation time ranging from 10 seconds to 5 minutes. The amount of the anodized layer thus formed preferably ranges from 1.0 to 5.0 g/m$^2$ and more preferably 1.5 to 4.0 g/m$^2$. The formation of the anodized layer in an amount falling within the foregoing range would permit the preparation of a lithographic printing plate having good printing durability and having non-image area excellent in the resistance to scratches.

The aluminum plate obtained after the foregoing surface treatment and anodization treatment may be used as the substrate for the printing plate used in the present invention, but the aluminum plate may, if necessary, additionally be subjected to a treatment appropriately selected from the enlargement of micropores present on the anodized layer and a sealing treatment disclosed in J.P. KOKAI Nos. 2001-253181 and 2001-322365, and a surface-hydrophilization treatment wherein the plate is dipped in an aqueous solution containing a hydrophilic compound, in order to further improve various properties such as the adhesion thereof to the upper layer, the hydrophilicity, the insusceptibility to contamination or stain and the thermal insulating properties. In this respect, it is a matter of course that these enlarging and sealing treatments are not restricted to those disclosed in the foregoing patent articles and any conventionally known methods can be used in the present invention.

[Sealing Treatment]

The sealing treatments usable herein include, for instance, a vapor sealing treatment, a sealing treatment with an aqueous solution containing an inorganic fluorine atom-containing compound such as fluoro-zirconic acid alone or sodium fluoride, a vapor sealing treatment while using lithium chloride, and a sealing treatment with hot water.

Among them, preferably used herein include the sealing treatment with an aqueous solution containing an inorganic fluorine atom-containing compound, the sealing treatment with water vapor and the sealing treatment with hot water. Each of these preferred sealing treatments will be detailed below:

<Sealing Treatment with Aqueous Solution of Inorganic Fluorine Atom-Containing Compound>

Metal fluorides are preferably used, as such inorganic fluorine atom-containing compounds, in the sealing treatment with an aqueous solution containing the inorganic compound. Specific examples thereof are sodium fluoride, potassium fluoride, calcium fluoride, magnesium fluoride, sodium fluorozirconate, potassium fluorozirconate, sodium fluorotitanate, potassium fluorotitanate, ammonium fluorozirconate, ammonium fluorotitanate, potassium fluorotitanate, fluorozirconic acid, fluoro-titanic acid, hexafluoro-silicic acid, nickel fluoride, iron fluoride, fluoro-phosphoric acid, and ammonium fluorophosphates. among these, preferably used in the invention are sodium fluorozirconate, sodium fluorotitanate, fluoro-zirconic acid and fluorotitanic acid.

The concentration of the inorganic fluorine atom-containing compound in the aqueous solution is preferably not less than 0.01% by mass and more preferably not less than 0.05% by mass for ensuring the sufficient sealing of the micropores present on the anodized layer; and preferably not more than 1% by mass and more preferably not more than 0.5% by mass for ensuring good resistance to stain.

It is preferred that the aqueous solution of an inorganic fluorine atom-containing compound also comprises a phosphate compound. The presence of a phosphate compound in the aqueous solution would permit the further improvement of the hydrophilicity of the surface of the anodized layer and this in turn permits the improvement of the resulting printing plate in its developing ability on the machine and its resistance to stain.

Such phosphate compounds may be, for instance, phosphoric acid salts of metals such as alkali metals and alkaline earth metals.

Specific examples thereof include zinc phosphate, aluminum phosphate, ammonium phosphate, di-ammonium hydrogen phosphate, ammonium dihydrogen phosphate, mono-ammonium phosphate, mono-potassium phosphate, mono-sodium phosphate, potassium dihydrogen phosphate, di-potassium hydrogen phosphate, calcium phosphate, ammonium sodium hydrogen phosphate, magnesium hydrogen phosphate, magnesium phosphate, ferrous phosphate, ferric phosphate, sodium dihydrogen phosphate, sodium phosphate, di-sodium hydrogen phosphate, lead phosphate, di-ammonium phosphate, calcium dihydrogen phosphate, lithium phosphate, phospho-tungstic acid, ammonium phospho-tungstate, sodium phospho-tungstate, ammonium phospho-molybdate, sodium phospho-molybdate, sodium phosphite, sodium tripolyphosphate and sodium pyrophosphate. Among these, preferably used herein are sodium dihydrogen phosphate, di-sodium hydrogen phosphate, potassium dihydrogen phosphate and di-potassium hydrogen phosphate.

The inorganic fluorine atom-containing compounds can arbitrarily be combined with the phosphate compounds without any particular restriction, but the aqueous solution preferably comprises at least sodium fluoro-zirconate as such an inorganic fluorine atom-containing compound and at least sodium dihydrogen phosphate as such a phosphate compound.

The concentration of the phosphate compound in the aqueous solution is preferably not less than 0.01% by mass and more preferably not less than 0.1% by mass from the viewpoint of the improvement of the developing ability on the machine and the resistance to stain, and preferably not more than 20% by mass and more preferably not more than 5% by mass from the viewpoint of its solubility in aqueous medium.

The rate of each compound in the aqueous solution is not restricted to any specific range, but the ratio (by mass) of the inorganic fluorine atom-containing compound to the phosphate compound preferably ranges from 1/200 to 10/1 and more preferably 1/30 to 2/1.

In addition, the temperature of the aqueous solution is preferably not less than 20° C., more preferably not less than 40° C. and it is preferably not more than 100° C. and more preferably not more than 80° C.

The aqueous solution preferably has a pH value of not less than 1 and more preferably not less than 2, and the pH value thereof is preferably not more than 11 and more preferably not more than 5.

The method for carrying out the sealing treatment with an aqueous solution containing an inorganic fluorine atom-containing compound is not restricted to specific ones and the sealing treatment may be carried out according to any known technique such as a dipping or spraying technique. These methods may be carried out once or over several times; or they may be used in any combination of at least two of them.

Among them, preferred are dipping methods. When the sealing treatment is carried out according to such a dipping method, the treating time is preferably not less than one second and more preferably not less than 3 seconds, and it is preferably not more than 100 seconds and more preferably not more than 20 seconds.

<Sealing Treatment with Water Vapor>

The sealing treatment with water vapor is, for instance, carried out by continuously or intermittently bringing the anodized layer on the aluminum plate into close contact with water vapor under ordinary pressure or pressurized water vapor.

The water vapor preferably has a temperature of not less than 80° C. and more preferably not less than 95° C., and the temperature of the vapor is preferably not more than 105° C.

The pressure of the water vapor preferably ranges from (atmospheric pressure−50 mmAq) to (atmospheric pressure+ 300 mmAq)($1.008 \times 10^5$ to $1.043 \times 10^5$ Pa).

In addition, the time required for the contact between them is preferably not less than one second and more preferably not less than 3 seconds, and it is preferably not more than 100 seconds and more preferably not more than 20 seconds.

<Sealing Treatment with Hot Water>

This sealing treatment with hot water is, for instance, carried out by dipping the aluminum plate on which an anodized layer has been formed in hot water.

This hot water may comprise an inorganic salt (such as a phosphate) or an organic salt.

The temperature of the hot water is preferably not less than 80° C. and more preferably not less than 95° C., and the temperature of the hot water is preferably not more than 100° C.

In addition, the time required for dipping the aluminum plate in hot water is preferably not less than one second and more preferably not less than 3 seconds, and it is preferably not more than 100 seconds and more preferably not more than 20 seconds.

Examples of the hydrophilization treatments used in the present invention are those which make use of alkali metal silicates such as those disclosed in, for instance, U.S. Pat. Nos. 2,714,066, 3,181,461, 3,280,734 and 3,902,734. In these methods, a substrate is dipped in an aqueous solution of sodium silicate or it is electrolyzed in such an aqueous solution. Examples of the hydrophilization treatments used herein also include a method in which an aluminum plate is treated with potassium fluorozirconate as disclosed in J.P. KOKOKU Sho 36-22063; and a method in which an aluminum plate is treated with polyvinyl phosphonic acid as disclosed in U.S. Pat. Nos. 3,276,868, 4,153,461 and 4,689,272.

The substrate used in the invention preferably has a central line-averaged surface roughness ranging from 0.10 to 1.2 μm. The use of a substrate having such a surface roughness falling within the range would permit the achievement of good adhesion to the image-recording layer, and the preparation of a printing plate having excellent printing durability and high resistance to stain.

(3-1-2) Step for Injecting Ink Jet-Recording Ink onto the Foregoing Substrate

When injecting the ink jet-recording ink according to the present invention onto the surface of the substrate, it is preferred that the ink jet-recording ink is injected thereon after heating the same to a temperature ranging from 40 to 80° C., preferably 25 to 30° C. to thus reduce the viscosity of the ink to a level of 7 to 30 mPa·s, preferably 7 to 20 mPa·s. A considerably excellent effect can be obtained, in particular, when using an ink composition having a viscosity as determined at 25° C. ranging from 35 to 500 MP·s. The use of this method would permit the realization of high injection stability. The radiation-curable ink jet-recording ink like that of the present invention in general has a viscosity higher than that observed for the water-based ink used in the currently used ink jet-recording ink and accordingly, the former shows a larger fluctuation in its viscosity in response to the temperature change encountered during printing. The fluctuation in the ink viscosity would greatly affect the changes in the size of droplets and the rate of the droplets injected and this in turn results in the deterioration of the image quality. For this reason, it is necessary to keep the temperature of the ink constant as much as possible during printing. Accordingly, the temperature should be controlled, in the invention, to a level of [set (predetermined) temperature]±5° C., preferably (set temperature)±2° C., and more preferably (set temperature)±1° C.

(3-1-3) Step for Irradiating the Substrate Carrying the Injected Ink with a Radioactive Ray to Cure the Ink The ink injected on the surface of the substrate is hardened through the irradiation of the same with a radioactive ray. More specifically, the polymerization initiator present in the polymerization initiator system included in the ink jet-recording ink of the invention undergoes decomposition with the help of the co-sensitizing agent used herein to induce the radical polymerization of the polymerizable compound and to thus cure the ink.

Examples of the radioactive ray herein used include α-beam, γ-beam, electron beam, X-ray, ultraviolet ray, visible light ray or infrared light ray. The wavelength of such radioactive ray suitably ranges from 200 to 600 nm, preferably 300 to 450 nm, and more preferably 350 to 450 nm. In addition, the polymerization initiator system used in the present invention is highly sensitive even to a radioactive ray having low output powers. Accordingly, the output power of the radioactive ray used in the invention ranges from, for instance, 10 to 2000 mJ/cm$^2$, preferably 20 to 1000 mJ/cm$^2$, and more preferably 50 to 800 mJ/cm$^2$. Moreover, the ink is suitably irradiated with a radioactive ray at an luminous intensity, as determined on the exposed plane, ranging from, for instance, 10 to 2000 mW/cm$^2$ and preferably 20 to 1000 mW/cm$^2$.

The ink jet-recording ink of the present invention is desirably irradiated with such radioactive ray for a time ranging from, for instance, 0.01 to 120 seconds and preferably 0.1 to 90 seconds.

The conditions for irradiating with a radioactive ray and the basic irradiation methods are disclosed in J.P. KOKAI Sho 60-132767. More specifically, the irradiation is carried out by arranging light sources on the both sides of the head unit including an ink-injection device and then scanning the head unit and the light sources according to the so-called shuttle system. The irradiation with a radioactive ray is in general carried out after the elapse of a predetermined time (for instance, 0.01 to 0.5 second, preferably 0.01 to 0.3 second and more preferably 0.01 to 0.15 second) from the impact of the ink on the substrate. As has been discussed above, the time extending from the impact of the ink to the irradiation with a radioactive ray can thus be controlled to such a short period of time and accordingly, this would permit the prevention of any bleeding of the ink projected on a recording medium prior to the curing of the same. Moreover, in case of a porous recording medium, the ink projected thereon can be exposed to light rays prior to the penetration of the ink even into such deeper portions where any light rays emitted from light sources never reach and any unreacted monomer thus never remains within the ink projected and as a result, the resulting product does not give out any bad smell possibly due to the presence of the unreacted monomers.

Further, the curing may likewise be completed using a different light source free of any driving means. In this respect, WO99/54415 discloses a light-irradiation method which makes use of an optical fiber or a method in which collimated light rays emitted from a light source are incident upon a mirror plane positioned on the side of a head unit to thus irradiate the recording area with the collimated light rays.

If adopting the foregoing ink jet-recording method, the diameter of dots projected on a recording medium can be kept at a constant value for a variety of different recording media which differ in the surface wettability from one another and the quality of the resulting image can be improved. Incidentally, a color image can preferably be obtained by superimposing colors in order of their brightness. Thus, the radioactive ray may easily arrive at even the ink present at the lowermost position and as a result, it would be expected to achieve good sensitivity to curing, to reduce the amount of any residual monomer, to control the generation of bad smells and to improve the adhesion. In addition, all the colors can be projected in bulk and collectively irradiated with a radioactive ray, but it is preferred to expose colors one by one in order to accelerate the curing thereof.

In this way, the ink jet-recording ink according to the present invention is cured through the irradiation with a radioactive ray to thus form an image on the surface of the foregoing substrate.

(3-2) Ink Jet-Recording Device

The ink jet-recording device used in the invention is not restricted to any specific one and may be any commercially available one. In other words, image can be recorded on a recording medium using a commercially available ink jet-recording device, according to the present invention.

The ink jet-recording device usable herein comprises, for instance, an ink-supply system, a temperature sensor, and a source of a radioactive ray.

The ink-supply system comprises, for instance, a main tank containing the ink jet-recording ink of the invention, a supply piping system, a piezoelectrically operating ink jet-recording head, an ink-supply tank positioned immediately before the ink jet-recording head and a filter. Such a piezoelectrically operating ink jet-recording head can be operated in such a manner that it can project multi-sized dots ranging from 1 to 100 pl and preferably 8 to 30 pl, while keeping a resolution on the order of 320×320 to 4000×4000 dpi (dots per inch), preferably 400×400 to 1600×1600 dpi and more preferably 720× 720 dpi.

As has been discussed above in detail, the temperature of the ink to be projected should desirably be kept constant in case of the radiation-curable ink and therefore, the ink can thermally be isolated and can be warmed within the zone existing between the ink-supply tank and the ink jet-recording head. The method for controlling the temperature of the ink is not restricted to any specific one, but it is preferred that a plurality of temperature sensors are arranged throughout the piping system for the ink to thus heat the ink or control the temperature thereof depending on, for instance, the flow rate of the ink and the environmental temperature. These temperature sensors can be positioned on the ink-supply tank and in the proximity to the nozzle of the ink jet-recording head. In addition, the head unit to be heated is preferably thermally shielded or isolated so that the body of the device is never affected by the outside air. To reduce the rise time of a printer required for heating the same, or to reduce the loss of heat energy, the head unit should thermally be isolated from other parts of the device and the heat capacity of the overall heating unit should be reduced to a level as low as possible.

As the sources of a radioactive ray, there have mainly been used a mercury lamp and gas/solid lasers and there have widely been known a mercury lamp and a metal halide lamp for curing the ultraviolet light-curable ink jet-recording ink. However, there has presently been a strong need for the use or development of light sources free of mercury from the viewpoint of the environmental protection and the switching over from the mercury light sources to ultraviolet light-emission devices of GaN semiconductors would significantly be effective from not only industrial standpoints, but also environmental standpoints. In addition, a light emitting diode (LED such as UV-LED) and a laser diode (LD such as UV-LD) are small sized light-emitting devices, which show a quite long service life and a very high efficiency and which are less expensive and accordingly, they are expected as light sources for curing photo-curable ink jet-recording ink.

Moreover, the light emitting diode (LED) and the laser diode (LD) can be used as sources of a radioactive ray. In particular, when an ultraviolet light source should be used, an ultraviolet LED and an ultraviolet LD can be employed. For instance, NICHIA Chemical Co., Ltd. develops or manufactures an ultraviolet LED which has a main emission spectrum falling within the range of from 365 to 420 nm and which has already been put on the market. When a light source emitting light rays having more shorter wavelengths should be used, a light source disclosed in U.S. Pat. No. 6,084,250 can be used, which is an LED element capable of emitting a radioactive ray whose spectral center falls within the range of from 300 to 370 nm. Other ultraviolet LED elements are likewise available and they can emit ultraviolet rays falling within different wavelength ranges. The sources of a radioactive ray particularly preferably used in the invention are UV-LED elements and particularly preferably those having peak wavelengths falling within the range of from 350 to 420 nm.

EXAMPLES

The present invention will hereunder be described in more detail with reference to the following Examples, but the present invention is not restricted to these specific Examples at all.

<Preparation of Coloring Material-Containing Dispersions>

A dispersion containing each coloring material was prepared using each of yellow, magenta, cyan and black pigments according to the method specified below. Each pigment was dispersed using a polymeric dispersant and the resulting product was used as a pigment dispersion. More specifically, each pigment dispersion was prepared using a known dispersing device (a paint maker) while appropriately adjusting the conditions for dispersing in such a manner that the average particle size of the pigment particles falls within the range of from 0.2 to 0.3 μm, followed by the application of heat and the subsequent screening through a filter to thus give a desired pigment dispersion.

| (Yellow Coloring Material Dispersion 1) | |
|---|---|
| C.I. Pigment Yellow 12 | 10 parts by mass |
| Polymeric Dispersant (Solsperse Series available from Zeneca Company) | 5 parts by mass |
| Stearyl acrylate | 85 parts by mass |
| (Magenta Coloring Material Dispersion 1) | |
| C.I. Pigment Red 57:1 | 15 parts by mass |
| Polymeric Dispersant (Solsperse Series available from Zeneca Company) | 5 parts by mass |
| Stearyl acrylate | 80 parts by mass |
| (Magenta Coloring Material Dispersion 2) | |
| C.I. Pigment Red 57:1 | 15 parts by mass |
| Polymeric Dispersant (Solsperse Series available from Zeneca Company) | 5 parts by mass |
| Isobornyl acrylate | 80 parts by mass |
| (Cyan Coloring Material Dispersion 1) | |
| C.I. Pigment Blue 15:3 | 20 parts by mass |
| Polymeric Dispersant (Solsperse Series available from Zeneca Company) | 5 parts by mass |
| Stearyl acrylate | 75 parts by mass |
| (Black Coloring Material Dispersion 1) | |
| C.I. Pigment Black 7 | 20 parts by mass |
| Polymeric Dispersant (Solsperse Series available from Zeneca Company) | 5 parts by mass |
| Stearyl acrylate | 75 parts by mass |

Example 1

Preparation of Ink Jet-Recording Ink

An ink jet-recording ink having an intended color was prepared using each corresponding coloring material dispersion 1 prepared above according to the procedures detailed below.

| (Yellow Ink 1: Example 1-1) | |
|---|---|
| Yellow coloring material dispersion 1 | 20 parts by mass |
| Stearyl acrylate | 60 parts by mass |
| Di-functional aromatic urethane acrylate A (Molecular weight (Mw): 1500)[1] | 10 parts by mass |
| Hexa-functional aliphatic urethane acrylate B (Mw: 1000)[2] | 5 parts by mass |
| Sensitizing dyestuff A[3] | 1 part by mass |
| Polymerization initiator (CGI 784 available from Chiba Specialty Chemicals) | 3 parts by mass |
| Co-sensitizing agent F[4] | 1 part by mass |

1) Di-functional aromatic urethane acrylate A (Mw: 1500) is a product obtained by capping the end of the condensate (Mw: 1500) of the following Di-functional aromatic urethane acrylate A:

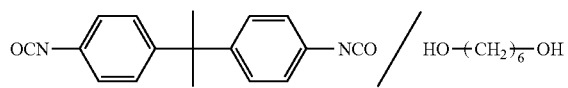

with the following compound:

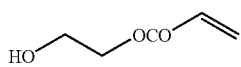

2) Hexa-functional aliphatic urethane acrylate B (Mw: 1000) is a product obtained by capping the end of the condensate (Mw: 1000) of the following Hexa-functional aliphatic urethane acrylate B:

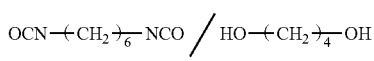

with the following compound:

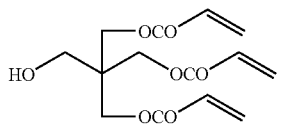

3) Sensitizing Dyestuff A is a compound represented by the following formula:

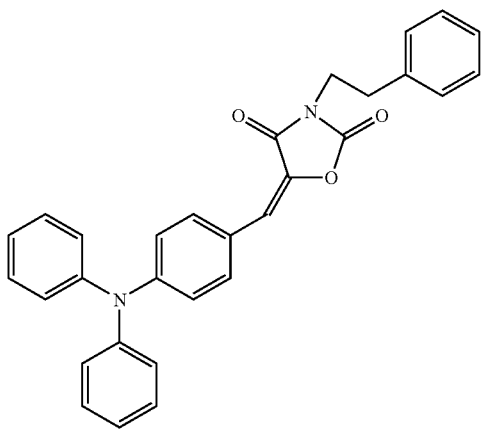

4) Co-sensitizing agent F is a compound represented by the following formula:

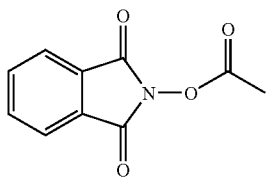

(Magenta Ink 1: Example 1-2)

| | |
|---|---|
| Magenta coloring material dispersion 1 | 20 parts by mass |
| Stearyl acrylate | 60 parts by mass |
| Di-functional aromatic urethane acrylate A (Mw: 1500) | 10 parts by mass |

-continued

| | |
|---|---|
| Hexa-functional aliphatic urethane acrylate B (Mw: 1000) | 5 parts by mass |
| Sensitizing dyestuff B[1)] | 1 part by mass |
| Polymerization initiator (LD-5)[2)] | 3 parts by mass |
| Co-sensitizing agent A[3)] | 1 part by mass |

1) Sensitizing dyestuff B is a compound represented by the following formula:

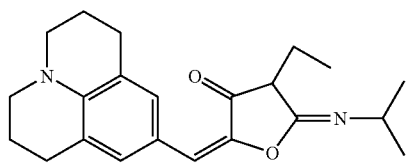

2) Polymerization initiator (LD-5) is a compound represented by the following formula:

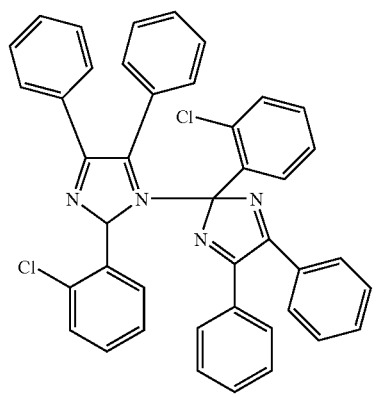

3) Co-sensitizing agent A is a compound represented by the following formula:

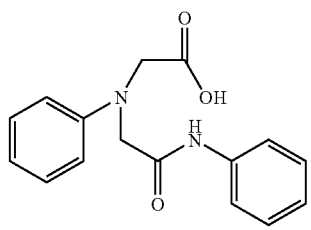

(Cyan Ink 1: Example 1-3)

| | |
|---|---|
| Cyan coloring material dispersion 1 | 15 parts by mass |
| Stearyl acrylate | 60 parts by mass |
| Di-functional aromatic urethane acrylate A (Mw: 1500) | 10 parts by mass |
| Hexa-functional aliphatic urethane acrylate B (Mw: 1000) | 5 parts by mass |
| Sensitizing dyestuff C[1)] | 1 part by mass |
| Polymerization initiator A[2)] | 3 parts by mass |
| Co-sensitizing agent B[3)] | 1 part by mass |

1) Sensitizing dyestuff C is a compound represented by the following formula:

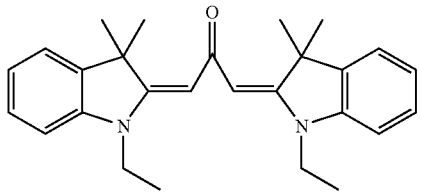

2) Polymerization initiator A is a compound represented by the following formula:

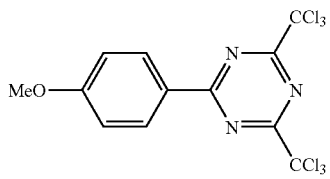

3) Co-sensitizing agent B is a compound represented by the following formula:

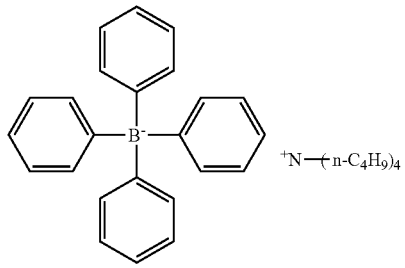

(Black Ink 1: Example 1-4)

| | |
|---|---|
| Black coloring material dispersion 1 | 15 parts by mass |
| Stearyl acrylate | 60 parts by mass |
| Di-functional aromatic urethane acrylate A (Mw: 1500) | 10 parts by mass |
| Hexa-functional aliphatic urethane acrylate B (Mw: 1000) | 5 parts by mass |
| Sensitizing dyestuff D[1] | 1 part by mass |
| Polymerization initiator (CGI-7460 available from Chiba Specialty Chemicals) | 3 parts by mass |
| Co-sensitizing agent C[2] | 1 part by mass |

1) Sensitizing dyestuff D is a compound represented by the following formula:

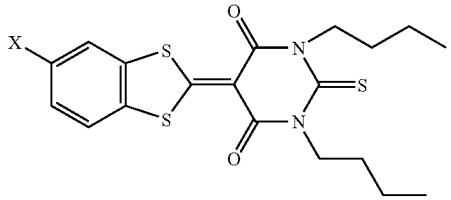

2) Co-sensitizing agent C is a compound represented by the following formula:

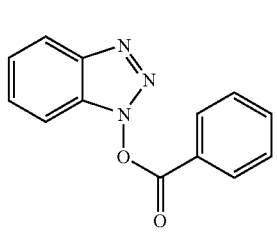

Each crude ink 1 having each specific color prepared above was filtered through a filter having an absolute filtration accuracy of 2 μm to thus form each product which was used as an ink 1 of each corresponding color.

Examples 2 to 5

Preparation of Ink

Magenta ink Nos. 2 to 5 were prepared using the foregoing magenta coloring material dispersion Nos. 1 and 2, according to the method described below.

(Magenta Ink 2: Example 2)

| | |
|---|---|
| Magenta coloring material dispersion 1 | 20 parts by mass |
| Isobornyl acrylate | 40 parts by mass |
| Di-functional aromatic urethane acrylate A (Mw: 1500) | 10 parts by mass |
| Hexa-functional aliphatic urethane acrylate B (Mw: 1000) | 5 parts by mass |
| Sensitizing dyestuff B | 1 part by mass |
| Polymerization initiator (LD-5) | 3 parts by mass |
| Co-sensitizing agent A | 1 part by mass |

(Magenta Ink 3: Example 3)

| | |
|---|---|
| Magenta coloring material dispersion 1 | 20 parts by mass |
| Isobornyl acrylate | 50 parts by mass |
| Lactone-modified acrylate A (Mw: 458)[1] | 20 parts by mass |
| Hexa-functional aliphatic urethane acrylate B (Mw: 1000) | 5 parts by mass |
| Sensitizing dyestuff C | 1 part by mass |
| Polymerization initiator A | 3 parts by mass |
| Co-sensitizing agent B | 1 part by mass |

1) Lactone-modified acrylate A (Mw: 458) is a compound represented by the following structural formula:

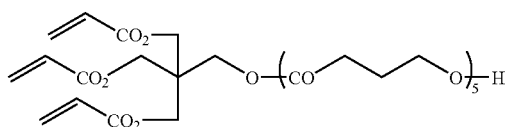

(Magenta Ink 4: Example 4)

| | |
|---|---|
| Magenta coloring material dispersion 2 | 20 parts by mass |
| Isobornyl acrylate | 70 parts by mass |

-continued

| | |
|---|---|
| Hexa-functional aliphatic urethane acrylate B (Mw: 1000) | 5 parts by mass |
| Sensitizing dyestuff D | 1 part by mass |
| Polymerization initiator A | 2 parts by mass |
| Co-sensitizing agent D[1)] | 2 parts by mass |

1) Co-sensitizing agent D is a compound represented by the following structural formula:

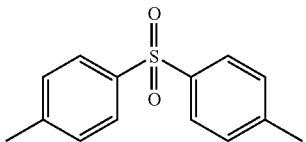

(Magenta Ink 5: Example 5)

| | |
|---|---|
| Magenta coloring material dispersion 2 | 20 parts by mass |
| Isobornyl acrylate | 60 parts by mass |
| Tetramethylol-methane triacrylate | 15 parts by mass |
| Sensitizing dyestuff E[1)] | 1 part by mass |
| Polymerization initiator (CGI 784 available from Chiba Specialty Chemicals) | 3 parts by mass |
| Co-sensitizing agent E[2)] | 1 part by mass |

1) Sensitizing dyestuff E is a compound represented by the following structural formula:

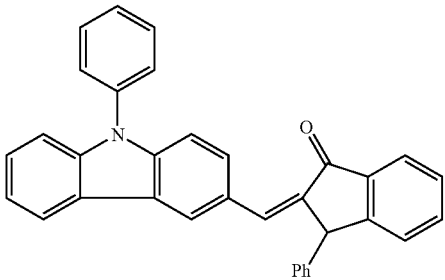

2) Co-sensitizing agent E is a compound represented by the following structural formula:

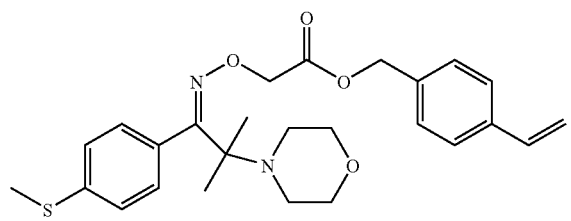

Comparative Examples 1 to 2

Preparation of Ink

Magenta inks 6 to 7 were prepared according to the method described below.

(Magenta Ink 6: Comparative Example 1)

| | |
|---|---|
| Magenta coloring material dispersion 1 | 20 parts by mass |
| Stearyl acrylate | 60 parts by mass |
| Di-functional aromatic urethane acrylate A (Mw: 1500) | 10 parts by mass |
| Hexa-functional aliphatic urethane acrylate B (Mw: 1000) | 5 parts by mass |
| Polymerization initiator (IRGACURE 184 available from Chiba Specialty Chemicals) | 5 parts by mass |

(Magenta Ink 7: Comparative Example 2)

| | |
|---|---|
| Magenta coloring material dispersion 2 | 20 parts by mass |
| Isobornyl acrylate | 70 parts by mass |
| Hexa-functional aliphatic urethane acrylate B (Mw: 1000) | 5 parts by mass |
| Polymerization initiator (IRGACURE 184 available from Chiba Specialty Chemicals) | 5 parts by mass |

The ink compositions prepared in the foregoing Examples and Comparative Examples were inspected for the viscosity values at the projection temperature and it was found that they fell within the range of from 7 to 20 mPa·s.

<Ink Jet Image-Recording>

Images were printed using the inks thus prepared according to the foregoing Examples and Comparative Examples.

More specifically, the images were printed on the surface of a substrate (a recording medium) using a commercially available ink jet-recording device equipped with a piezo-electrically operating ink jet-recording nozzle.

The substrates (recording media) used in these experiments were a surface-grained aluminum substrate, a transparent biaxially oriented polypropylene film which had been surface-treated so as to improve the printability thereof, a soft polyvinyl chloride sheet, cast-coated paper and commercially available regenerated paper.

The ink-supply system for the ink jet-recording device comprises a main tank, a supply-piping system, a piezo-electrically operating ink jet-recording head, an ink-supply tank immediately before the ink jet-recording head and a filter and the zone extending from the ink-supply tank to the ink jet-recording head portion was thermally isolated and heated. Temperature sensors were arranged on the ink-supply tank and on the ink jet head in the proximity to the nozzle thereof so that the temperature of the nozzle portion could always controlled to a level of 70° C.±2° C. This piezo-electrically operating ink jet-recording head was operated in such a manner that it could project multi-sized dots of 8 to 30 pl at a resolution on the order of 720×720 dpi. After the impact of the substrate with each ink, the light-exposure system, the main scanning speed and the frequency of the light to be projected were adjusted such that the light rays emitted from a UV-LED element whose peak wavelength was 395 nm were condensed to an luminous intensity, as determined on the exposed plane, of 100 mW/cm$^2$ and that the irradiation of the projected ink with the radioactive ray was initiated after 0.1 second from the impact of the ink onto the recording medium. Moreover, the exposure energy was projected while variously changing the exposure time. In this connection, "dpi" herein used means the number of dots per unit length (2.54 cm).

Each of the inks prepared in the foregoing Examples and Comparative Examples was projected on the surface of a substrate at an environmental temperature of 25° C. and then irradiated with the light rays from the foregoing UV-LED. The projection was carried out according to the order of the black, cyan, magenta and yellow colors for Examples 1-1 to 1-4 and the light rays from UV-LED was irradiated after the application of each color (these experiments were collectively referred to as Example 1). The energy required for the complete curing of the ink (the energy to be applied till the ink lost its stickiness as determined by the examination by touch) was determined and it (or the total exposed light energy per color) was found to be 300 mJ/cm$^2$.

<Evaluation of Ink Jet-recorded Images>

Each image thus formed was inspected for the susceptibility of the same to curing, the penetrability of the ink into the commercially available regenerated paper, the bleeding of the ink observed on the surface-grained aluminum substrate, the adhesion of the ink to the aluminum substrate, the printing durability and the storage stability, according to the methods specified below.

(Determination of Susceptibility to Curing)

The quantity of the exposed light energy (mJ/cm$^2$) applied onto the image plane after the irradiation with UV light rays (the energy to be applied till the ink lost its stickiness) was defined to be the intended susceptibility to curing. In this respect, the smaller the numerical value thus determined, the higher the susceptibility to curing.

(Evaluation of Penetrability of Ink into Commercially Available Regenerated Paper)

The image printed on commercially available regenerated paper was evaluated for the penetrability of the ink into the same according to the following evaluation standards:

○: There was observed almost no penetration of the ink and the printed image never gave out any smell of residual monomers;

Δ: The ink underwent slight penetration into the paper and the printed image gave out a slight smell of residual monomers; and X: The ink was definitely penetrated even to the back side of the paper and the image also gave out a strong smell of residual monomers.

(Inspection for Bleeding of Ink Observed on Surface-Grained Aluminum Substrate)

Images were printed on the surface of a surface-grained aluminum substrate and each of them was evaluated for the bleeding of the ink observed thereon according to the following evaluation standards:

○: There was not observed any bleeding between neighboring dots;

Δ: There was observed slight bleeding between neighboring dots; and

X: There was observed severe bleeding between neighboring dots and the image definitely became dim.

(Inspection for Adhesion of Ink to Surface-Grained Aluminum Substrate)

Using printed images formed above, there were prepared a sample free of any scratch and a sample on which 11×11 lines of cuts at equal intervals of 1 mm were formed on the image-printed surface of the substrate to thus form a lattice pattern including 100 squares having a size of 1 mm×1 mm according to JIS K 5400, Cellotape (registered trade mark) was adhered to each printed plane of the substrate, then quickly peeled off at an angle of 90 degrees and the printed images or the squares remaining on the printed plane were evaluated on the basis of the following evaluation criteria:

○: There was not observed any peeling off of the printed image, even in the foregoing lattice pattern cutting test;

Δ: There was observed slight removal of printed image (or the ink) in the lattice pattern cutting test, but the image was not removed at all inasmuch as any scratch was formed on the image per se; and X: There were observed easy peeling off of the images for the both samples, in the foregoing peeling tests.

(Evaluation of Printing Durability)

Printed matters were prepared using the surface-grained aluminum substrate prepared above and carrying images printed thereon as a printing plate on Heidel KOR-D Printing Press and the number of printed matters for each printing plate was used as an indication of the printing durability and these values were compared with one another to obtain relative values (the value observed for the product of Example 1 was defined to be 100). In this connection, the larger the value, the higher the printing durability and the better the printing plate.

(Evaluation of Storage Stability)

Each ink prepared above was stored at 75% RH and 60° C. for 3 days and the viscosity thereof at the projection temperature was determined to calculate an increase of the viscosity, which was expressed in terms of the ratio: (viscosity observed after storage)/(viscosity observed before storage). When the ink never showed any viscosity change or the ratio was closer to 1.0, the ink had excellent storage stability. In this respect, the ratio of less than 1.5 was defined to be the upper acceptable limit of storage stability.

The following Table A shows the results of the foregoing evaluation tests:

| Ex. No. | Ink No. | Sensitivity to curing (mJ/cm$^2$) | Penetrability | Bleeding of Ink | Adhesion | Printing durability | Storage stability |
|---|---|---|---|---|---|---|---|
| 1 | 1 | 130 | ○ | ○ | ○ | 110 | 1.1 |
| 2 | 2 | 120 | ○ | ○ | ○ | 120 | 1.2 |
| 3 | 3 | 140 | ○ | ○ | ○ | 120 | 1.1 |
| 4 | 4 | 110 | ○ | ○ | ○ | 130 | 1.2 |
| 5 | 5 | 140 | ○ | ○ | ○ | 110 | 1.1 |
| 1* | 6 | 200 | X | X | X | 50 | 1.6 |
| 2* | 7 | 200 | Δ | Δ | Δ | 80 | 1.5 |

*Comparative Example.

The data listed in Table A clearly indicate that the ink jet-recording ink containing the co-sensitizing agent according to the present invention is highly sensitive to a radioactive ray, permits the formation of high quality images on a recording medium such as paper and have good storage stability and that when the ink is used in the preparation of a printing plate, the ink permits the formation of printing plates having high printing durability and the formation of high quality images.

In particular, Example 1, in which the inks prepared in Examples 1-1 to 1-4 are used in combination, provides images free of any bleeding at a high degree of resolution for all of the colors employed. Further, the ink sufficiently undergoes curing even on the wood-free paper without causing any penetration to the back face and the cured ink never gives out any smell of the residual unreacted monomers. Moreover, the ink recorded on a film has sufficient flexibility, it is never cracked even when it is folded and any problem does not arise even in the adhesion test or peeling test using Cellotape (registered trade mark).

What is claimed is:

1. An ink jet-recording ink capable of being cured through the irradiation with a radioactive ray, comprising a coloring material, a polymerizable compound and a polymerization initiator system, wherein said polymerization initiator system comprises a polymerization initiator and at least one co-sensitizing agent selected from the group consisting of compounds represented by the following general formulas (i), (iii), (iv), (viii), (ix-1) and (ix-2):

General Formula (i):

wherein $R_1$, $R_2$ and $R_3$ may be the same or different and each represents a monovalent organic group;

General Formula (iii):

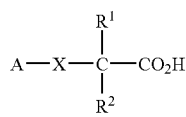

wherein A represents a phenyl group or a naphthyl group, —X— represents —N($R^3$)—, wherein $R^3$ represents a substituted or unsubstituted alkyl, alkenyl, alkynyl, aryl or heterocyclic group, and $R^1$ and $R^2$ each independently represents a hydrogen atom or a monovalent substituent selected from the group consisting of halogen atoms, amino groups which may have substituents, alkoxycarbonyl groups, hydroxyl group, ether groups, thiol groups, thio-ether groups, silyl groups, a nitro group, cyano groups, and alkyl, alkenyl, alkynyl, aryl and heterocyclic groups which may have substituents;

General Formula (iv):

wherein Ar represents an aromatic group or a heterocyclic group, —X— represents —O—, —S—, —$SO_2$—, or —N($R^3$)—, $R^1$, $R^2$ and $R^3$ each independently represents a hydrogen atom or a monovalent substituent comprising non-metallic atoms, and —Y represents —$OR^4$ or —$NR^5R^6$, wherein $R^4$ represents a monovalent substituent comprising non-metallic atoms, other than a hydroxyl group, and $R^5$ and $R^6$ each independently represents a hydrogen atom or a monovalent substituent comprising non-metallic atoms;

General Formula (viii):

wherein X and Y each independently represents linear or branched, chain or cyclic alkyl groups having 1 to 20 carbon atoms; linear or branched, chain or cyclic alkenyl groups having 2 to 20 carbon atoms; alkynyl groups having 2 to 20 carbon atoms; aryl groups having 6 to 20 carbon atoms; acyloxy groups having 1 to 20 carbon atoms; alkoxy-carbonyloxy groups having 2 to 20 carbon atoms; aryloxy-carbonyloxy groups having 7 to 20 carbon atoms; carbamoyloxy groups having 1 to 20 carbon atoms; carbonamide groups having 1 to 20 carbon atoms; sulfonamide groups having 1 to 20 carbon atoms; carbamoyl groups having 1 to 20 carbon atoms; sulfamoyl groups having 0 to 20 carbon atoms; alkoxy groups having 1 to 20 carbon atoms; aryloxy groups having 6 to 20 carbon atoms; aryloxycarbonyl groups having 7 to 20 carbon atoms; alkoxycarbonyl groups having 2 to 20 carbon atoms; N-acyl-sulfamoyl groups having 1 to 20 carbon atoms; N-sulfamoyl-carbamoyl groups having 1 to 20 carbon atoms; alkylsulfonyl groups having 1 to 20 carbon atoms; arylsulfonyl groups having 6 to 20 carbon atoms; alkoxy-carbonylamino groups having 2 to 20 carbon atoms; aryloxy-carbonylamino groups having 7 to 20 carbon atoms; imino groups having 1 to 20 carbon atoms; ammonio groups having 3 to 20 carbon atoms; carboxyl groups, sulfo groups, oxy groups, mercapto groups; alkylsulfinyl groups having 1 to 20 carbon atoms; arylsulfinyl groups having 6 to 20 carbon atoms; alkylthio groups having 1 to 20 carbon atoms; arylthio groups having 6 to 20 carbon atoms; ureido groups having 1 to 20 carbon atoms; heterocyclic groups having 2 to 20 carbon atoms; acyl groups having 1 to 20 carbon atoms; sulfamoyl-amino groups having 0 to 20 carbon atoms; silyl groups having 2 to 20 carbon atoms; isocyanate groups, isocyanide groups, halogen atoms, cyano groups, nitro groups, and onium groups, and n represents an integer ranging from 0 to 4, provided that, when n is not less than 2, a plurality of Ys present in the formula may be the same or different or may form a ring structure;

General Formulas (ix-1) and (ix-2):

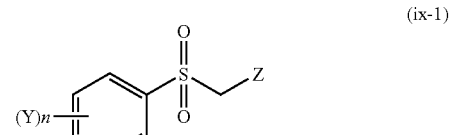

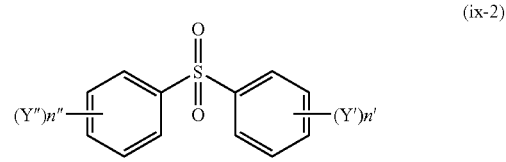

wherein Z, Y, Y' and Y" each independently represents a monovalent substituent, and n, n' and n" each independently represents an integer ranging from 1 to 5, provided that, when n, n' and n" are not less than 2, a plurality of each substituent Ys, Y's and Y"s present in the formula may be the same or different or may form a ring structure.

2. The ink jet-recording ink of claim 1 wherein said co-sensitizing agent is selected from the group consisting of the following Co-sensitizing agents A, and C to F:

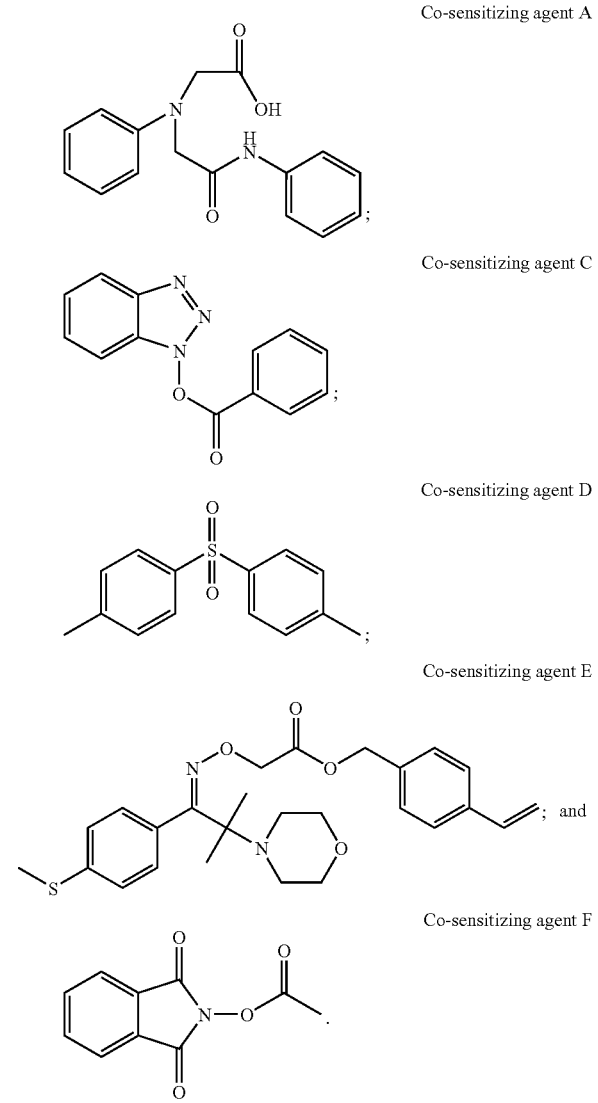

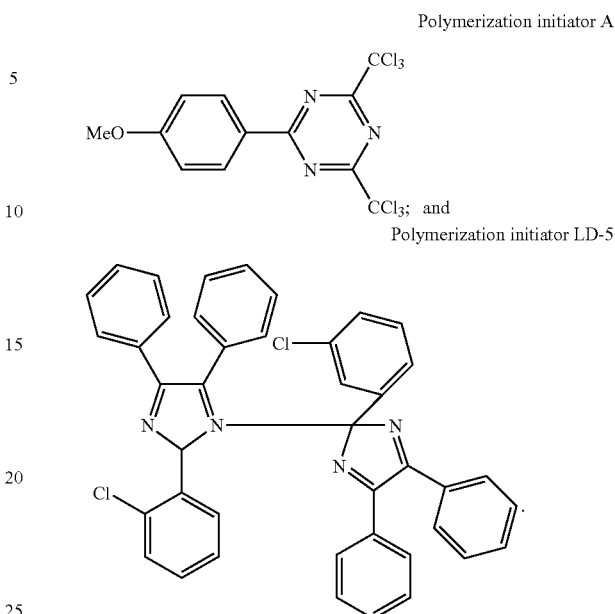

3. The ink jet-recording ink of claim 1 wherein said co-sensitizing agent is incorporated into the ink jet-recording ink in an amount ranging from 0.5 to 40% by mass on the basis of the total mass of the ink jet-recording ink.

4. The ink jet-recording ink of claim 1 wherein said co-sensitizing agent is incorporated into said ink jet-recording ink in an amount ranging from 1 to 30% by mass on the basis of the total mass of said ink jet-recording ink.

5. The ink jet-recording ink of claim 1 wherein said polymerization initiator is selected from the group consisting of (a) aromatic ketones, (b) aromatic onium salt compounds, (c) organic peroxides, (d) hexaaryl-biimidazole compounds, (e) ketoxime ester compounds, (f) borate compounds, (g) azinium compounds, (h) metallocene compounds, (i) active ester compounds and (j) compounds having carbon-halogen bonds.

6. The ink jet-recording ink of claim 1 wherein said polymerization initiator is selected from the group consisting of the following polymerization initiators:

7. The ink jet-recording ink of claim 1 wherein said polymerization initiator is incorporated into said polymerizable compound in an amount ranging from 0.01 to 20 parts by mass per 100 parts by mass of said polymerizable compound.

8. The ink jet-recording ink of claim 1 wherein said polymerization initiator is incorporated into said polymerizable compound in an amount ranging from 0.5 to 10 parts by mass per 100 parts by mass of said polymerizable compound.

9. The ink jet-recording ink of claim 1 wherein said polymerizable compound is selected from the group consisting of radical-polymerizable compounds, and cationic polymerizable compounds.

10. The ink jet-recording ink of claim 1 wherein said polymerizable compound is selected from the group consisting of (meth)acrylic monomers or prepolymers, epoxy type monomers or prepolymers, and urethane type monomers or prepolymers.

11. The ink jet-recording ink of claim 1 further comprising a sensitizing dyestuff.

12. The ink jet-recording ink of claim 11 wherein said sensitizing dyestuff is selected from the group consisting of Polynuclear aromatic compounds; xanthenes; Cyanines; Merocyanines; Thiazines; Acridines; anthraquinones; squaliums; and coumarins.

13. A method for preparing a lithographic printing plate which comprises a substrate and an image formed on the surface of said substrate, said method comprising the steps of:
 (1) injecting the ink jet-recording ink as set forth in claim 1 on the surface of said substrate; and
 (2) curing the ink by the irradiation of said substrate carrying the injected ink thereon with a radioactive ray to thus form an image of cured ink on said substrate.

14. The method for preparing a lithographic printing plate of claim 13 wherein the irradiation is a radioactive ray which has a peak wavelength ranging from 350 to 420 nm, and the irradiation is irradiated at an irradiation energy of not more than 2000 mJ/cm$^2$.

15. A method for forming an image on a substrate comprising the steps of:
   (a) applying the ink jet-recording ink as set forth in claim 1 onto the surface of a substrate; and
   (b) curing said ink jet-recording ink applied onto the substrate by the irradiation of the ink with a radioactive ray which have a peak wavelength ranging from 200 to 600 nm at an irradiation energy of not more than 2000 mJ/cm$^2$ to thus form a desired image of cured ink on the surface of the substrate.

16. The method of claim 15 wherein the a radioactive ray have a peak wavelength ranging from 350 to 420 nm.

17. The method of claim 15 wherein the irradiation energy is ranging from 10 to 2000 mJ/cm$^2$.

18. The ink jet-recording ink of claim 1 wherein said co-sensitizing agent is selected from the group consisting of compounds represented by the following general formulas (i), and (iv):

General Formula (i):

(i)

wherein $R_1$, $R_2$ and $R_3$ may be the same or different and each represents a monovalent organic group;

General Formula (iv):

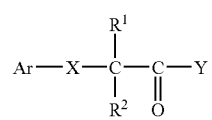
(iv)

wherein Ar represents an aromatic group or a heterocyclic group, —X— represents —O—, —S—, —SO$_2$—, or —N(R$^3$)—, R$^1$, R$^2$ and R$^3$ each independently represents a hydrogen atom or a monovalent substituent comprising non-metallic atoms, and —Y represents —OR$^4$ or —NR$^5$R$^6$, wherein R$^4$ represents a monovalent substituent comprising non-metallic atoms, other than a hydroxyl group, and R$^5$ and R$^6$ each independently represents a hydrogen atom or a monovalent substituent comprising non-metallic atoms.

* * * * *